(12) United States Patent
Masuoka et al.

(10) Patent No.: US 7,872,287 B2
(45) Date of Patent: Jan. 18, 2011

(54) SOLID-STATE IMAGING DEVICE

(75) Inventors: Fujio Masuoka, Chuo-ku (JP); Hiroki Nakamura, Chuo-ku (JP)

(73) Assignee: Unisantis Electronics (Japan) Ltd., Tokyo (JP)

( * ) Notice: Subject to any disclaimer, the term of this patent is extended or adjusted under 35 U.S.C. 154(b) by 184 days.

(21) Appl. No.: 12/268,126

(22) Filed: Nov. 10, 2008

(65) Prior Publication Data

US 2009/0065832 A1    Mar. 12, 2009

Related U.S. Application Data

(63) Continuation of application No. PCT/JP2008/055231, filed on Mar. 21, 2008.

(30) Foreign Application Priority Data

Sep. 12, 2007    (JP)    ................. PCT/JP2007/067732

(51) Int. Cl.
*H01L 31/062* (2006.01)
*H01L 31/113* (2006.01)

(52) U.S. Cl. ................ 257/291; 257/292; 257/E25.032; 257/E27.133

(58) Field of Classification Search .................. 257/291, 257/292, E25.032, E27.133
See application file for complete search history.

(56) References Cited

U.S. PATENT DOCUMENTS

2008/0210985 A1 *    9/2008    Ogawa et al. ................ 257/233

FOREIGN PATENT DOCUMENTS

| JP | 1-175775 A | 7/1989 |
|---|---|---|
| JP | 2-89368 A | 3/1990 |
| JP | 2000-244818 A | 9/2000 |
| JP | 2001-339057 A | 12/2001 |
| JP | 2002-246580 A | 8/2002 |
| JP | 2002-246581 A | 8/2002 |

OTHER PUBLICATIONS

Takahashi et al., "A 3.9μm Pixel Pitch VGA Format 10b Digital Image Sensor with 1.5-Transistor/Pixel", ISSCC Dig. Tech. Papers, pp. 108-109, 2004.
Kasano et al., "A 2.0μm Pixel Pitch MOS Image Sensor with an Amorphous Si Film Color Filter", ISSCC Dig. Tech. Papers, pp. 348-349 and p603, 2005.
International Search Report issued Jun. 24, 2008 in PCT/JP2008/055231.
Written Opinion of the International Searching Authority issued Jun. 24, 2008 in PCT/JP2008/055231 (with English version).

* cited by examiner

*Primary Examiner*—Eugene Lee
*Assistant Examiner*—Anthony Ho
(74) *Attorney, Agent, or Firm*—Brinks Hofer Gilson & Lione

(57) ABSTRACT

It is an object of the present invention to provide an image sensor having a high ratio of a surface area of a light receiving element to a surface area of one pixel. The above-described object is achieved by an inventive solid-state imaging device unit comprising solid-state imaging devices arranged on a substrate according to the present invention. The solid-state imaging device comprises a signal line formed on the substrate, an island shaped semiconductor placed over the signal line, and a pixel selection line connected to an upper portion of the island shaped semiconductor. The island shaped semiconductor comprises a first semiconductor layer disposed in a lower portion of the island shaped semiconductor and connected to the signal line, a second semiconductor layer disposed adjacent to an upper side of the first semiconductor layer, a gate connected to the second semiconductor layer via an insulating film, an electric charge accumulator comprising a third semiconductor layer connected to the second semiconductor layer and carrying a quantity of electric charges which varies in response to a light reception, and a fourth semiconductor layer disposed adjacent to an upper side of the second semiconductor layer and the third semiconductor layer and connected to the pixel selection line. The solid-state imaging devices are arranged on the substrate in a honeycomb configuration.

47 Claims, 107 Drawing Sheets

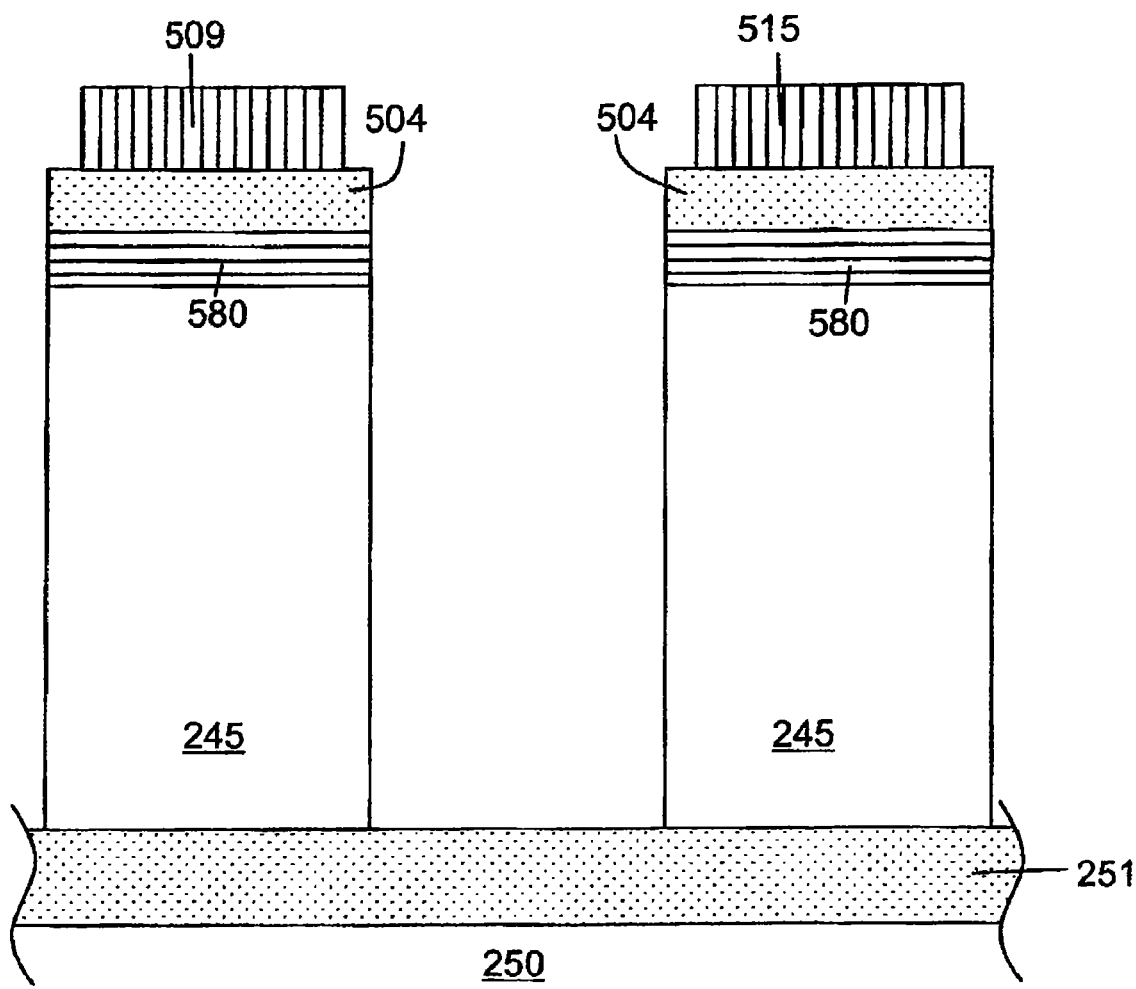

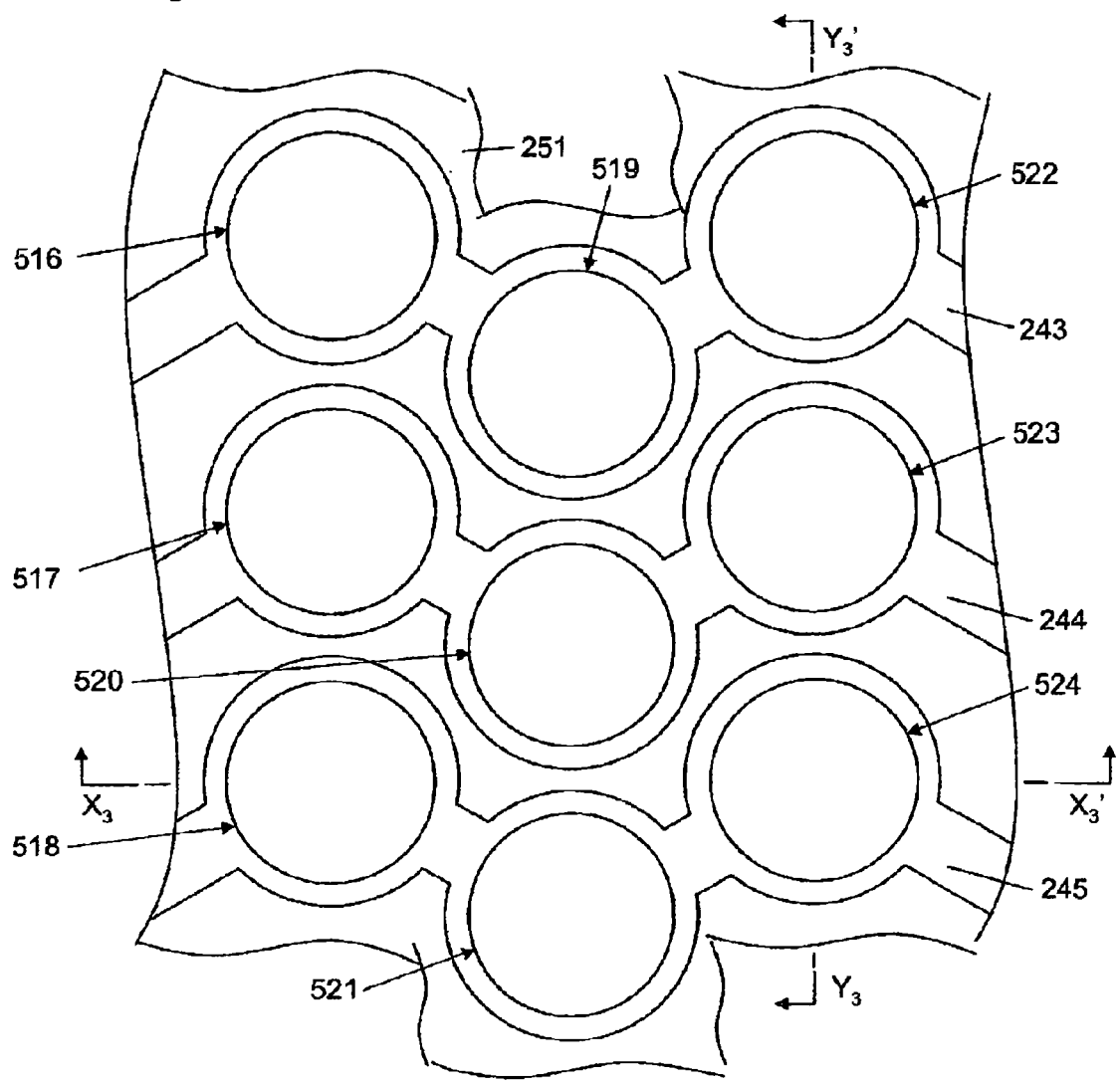

SOLID-STATE IMAGING DEVICE

RELATED APPLICATIONS

This application is a continuation of PCT/JP2008/055231, filed on Mar. 21, 2008, which claims priority to PCT/JP2007/067732 filed on Sep. 12, 2007, the entire content of which is incorporated herein by references.

FIELD OF THE INVENTION

The present invention relates to a solid-state imaging device.

DESCRIPTION OF THE PRIOR ART

There has been suggested an amplifying solid-state imaging device unit or a CMOS image sensor, in which each one of pixels has been given an amplifying function and is read by a scanning circuit. In the CMOS image sensor, a photoelectric converter, an amplifier, a pixel selector and a resetting element are fabricated within a single pixel, in which three MOS transistors are employed in addition to the photoelectric converter comprising a photodiode (see, for example, Japanese Patent Laid-open Publication No. 2000-244818). In other words, the CMOS image sensor of the prior art is constructed with four elements. In the CMOS image sensor, electric charges generated in the photoelectric converter comprising a photodiode are accumulated, which electric charges are then amplified in the amplifier, and thus amplified electric charges are in turn read by using the pixel selector.

FIG. 1 shows a unit pixel in the CMOS image sensor of the prior art. In FIG. 1, reference numeral 5 designates a photoelectric converting photodiode, 101 an amplifying transistor, 102 a reset transistor, 103 a selection transistor, 13 a signal line, 11 a pixel selection clock line, 12 a reset clock line, 14 a power line and 114 a power line for resetting, respectively. The unit pixel of the CMOS image sensor of the prior art has totally four elements: three MOS transistors in addition to the photodiode, all disposed in a flat plane. This implies that increasing a ratio of a surface area of the light receiving element (photodiode) to a surface area of one pixel is difficult.

It has been reported on a CMOS image sensor of the prior art using the 0.35 µm one-polysilicon layer and two-metal layer CMOS process that the ratio of the surface area of the light receiving element (photodiode) to the surface area of one pixel is 17% (H. Takahashi, M. Kinoshita, K. Morita, T. Shirai, T. Sato, T. Kimura, H. Yuzurihara, S. Inoue, "A 3.9 µm Pixel Pitch VGA Format 10b Digital Image Sensor with 1.5-Transistor/Pixel", ISSCC Dig. Tech. Papers, pp. 108-109, 2004). Another report indicates that when using the 0.15 µm wiring-rule process, the ratio of the surface area of the light receiving element (photodiode) to the surface area of one pixel is 30% (M. Kasano, Y. Inaba, M. Mori, S. Kasuga, T. Murata, T. Yamaguchi, "A 2.0 µm Pixel Pitch MOS Image Sensor with an Amorphous Si Film Color Filter", ISSCC Dig. Tech. Papers, pp. 348-349, 2005).

SUMMARY OF THE INVENTION

In the light of the circumstances as stated above, an object of the present invention is to provide an image sensor having an increased ratio of the surface area of the light receiving element to the surface area of one pixel.

In one aspect of the present invention, provided is a solid-state imaging device comprising:

an amplifying transistor comprising a junction transistor whose gate and source together serve as a photoelectric converting photodiode and whose gate serves as an electric charge accumulator, the junction transistor operable to amplify electric charges in the electric charge accumulator;

a reset transistor comprising a MOS transistor whose source is connected to the gate of the amplifying transistor, the MOS transistor operable to reset the electric charge accumulator, a diode whose anode is connected to a drain of the amplifying transistor and whose cathode is connected to a drain of the reset transistor;

a pixel selection line connected to the source of the amplifying transistor; and a signal line connected to the cathode of the diode.

In another aspect of the present invention, a method for driving a solid-state imaging device is provided.

More specifically, the method comprises: applying a first driving voltage to the pixel selection line, applying a second driving voltage to the signal line, applying a third driving voltage to the gate to thereby effect resetting of the electric charge accumulator.

The method further comprises: applying the first driving voltage to the pixel selection line, applying the first driving voltage to the gate and applying the first driving voltage to the signal line to thereby effect a light reception to modify a quantity of electric charge accumulated in the electric charge accumulator.

The method further comprises: applying the second driving voltage to the pixel selection line, applying the first driving voltage to the gate and applying the first driving voltage to the signal line to thereby amplify the electric charges accumulated in the electric charge accumulator and allow a read current to flow to effect reading.

Further, in a preferred aspect of the present invention, provided is a solid-state imaging device unit comprising solid-state imaging devices arranged on a substrate, the solid-state imaging device including:
a signal line formed on a substrate;
an island shaped semiconductor placed over the signal line; and
a pixel selection line connected to an upper portion of the island shaped semiconductor,
the island-shaped semiconductor comprising:
a first semiconductor layer disposed in a lower portion of the island shaped semiconductor and connected to the signal line;
a second semiconductor layer disposed adjacent to an upper side of the first semiconductor layer;
a gate connected to the second semiconductor layer via an insulating film;
an electric charge accumulator comprising a third semiconductor layer connected to the second semiconductor layer and carrying a quantity of electric charges which varies in response to a light reception; and
a fourth semiconductor layer disposed adjacent to an upper side of the second semiconductor layer and the third semiconductor layer and connected to the pixel selection line, wherein
the solid-state imaging devices are arranged on the substrate in a honeycomb configuration.

Further, in a preferred aspect of the present invention, the first semiconductor layer is defined by an n+ type diffusion layer, the second semiconductor layer is defined by a p type impurity-doped region, the third semiconductor layer is defined by an n type diffusion layer and the fourth semiconductor layer is defined by a p+ type diffusion layer.

The p+ type diffusion layer and the n type diffusion layer together serve as a photoelectric converting photodiode;

the p+ type diffusion layer, the n type diffusion layer and the p type impurity-doped region together serve as an amplifying transistor;

the n+ type diffusion layer of the first semiconductor layer, the p type impurity-doped region, the n type diffusion layer and the gate together serve as a reset transistor; and the p type impurity-doped region and the n+ type diffusion layer together serve as a diode.

Still further, in a preferred aspect of the present invention, in a solid-state imaging device, the island shaped semiconductor has a circular column configuration.

Yet further, in a preferred aspect of the present invention, in a solid-state imaging device, the island shaped semiconductor has a hexagonal column configuration.

Still further, in a preferred aspect of the present invention, in a solid-state imaging device unit, the solid-state imaging devices are arranged on a substrate in a matrix of n-row×m-column (n and m no smaller than 1) and the island shaped semiconductor has a circular column configuration.

Yet further, in a preferred aspect of the present invention, in a solid-state imaging device unit, the solid-state imaging devices are arranged on a substrate in a matrix of n-row×m-column (n and m no smaller than 1) and the island shaped semiconductor has a square column configuration in.

Still further, in an aspect of the present invention, the first semiconductor layer is defined by an n+ type diffusion layer, the second semiconductor layer is defined by a p type impurity-doped region, the third semiconductor layer is defined by an n type diffusion layer and the fourth semiconductor layer is defined by a p+ diffusion layer.

The p+ diffusion layer and the n type diffusion layer together serve as a photoelectric converting photodiode;

the p+ type diffusion layer, the n type diffusion layer and the p type impurity-doped region together serve as an amplifying transistor;

the n+ type diffusion layer of the first semiconductor layer, the p type impurity-doped region, the n type diffusion layer and the gate together serve as a reset transistor; and the p type impurity-doped region and the n+ type diffusion layer together serve as a diode.

Yet further, in a preferred aspect of the present invention, provided is a method for fabricating a solid-state imaging device, said method characterized in comprising the steps of:

forming a signal line on a substrate;

forming an island shaped semiconductor over the signal line:

forming a first semiconductor layer connected to the signal line in a lower portion of the island shaped semiconductor;

forming a second semiconductor layer disposed adjacent to an upper side of the first semiconductor layer;

forming a gate connected, via an insulating film, to the second semiconductor layer disposed adjacent to the upper side of the first semiconductor layer;

forming a third semiconductor layer connected to the second semiconductor layer;

forming a fourth semiconductor layer disposed adjacent to an upper portion of the second semiconductor layer and the third semiconductor layer; and forming a pixel selection line connected to the fourth semiconductor layer.

Still further, in a preferred aspect of the present invention, provided is a method for fabricating a solid-state imaging device, said method characterized in further comprising the steps of:

forming a signal line by:

forming a p type silicon over an oxide film, and depositing a nitride film and then a silicon oxide film over the p type silicon;

forming a resist, performing oxide film etching and then nitride film etching and removing the resist to thereby form an oxide film mask and a nitride film mask for forming said signal line; and etching the p type silicon, to thereby form the signal line;

forming an island shaped semiconductor by:

forming a resist for forming the island shaped semiconductor;

etching the oxide film and the nitride film;

removing the resist; and etching the p type silicon, to thereby form the island shaped semiconductor;

further processing by:

depositing an oxide film, planarizing and performing etch back on the oxide film;

performing oxidation to form an oxide film;

depositing polysilicon and etching back the polysilicon to be left in a sidewall configuration for serving as a mask in an ion implantation;

forming a signal line and an n+ type diffusion layer by:

removing the oxide film to expose a site for phosphorus to be implanted;

forming an oxide film for the purpose of preventing ion channeling during the ion implantation; and ion-implanting the phosphorus, performing a thermal process, to thereby form the signal line and the n+ diffusion layer;

forming a gate by:

removing the polysilicon and the oxide film:

depositing, planarizing and etching back an oxide film to form an oxide layer;

performing gate oxidation to form a gate oxide film, depositing polysilicon and performing planarization and etch back; and forming a resist for the gate; and etching the polysilicon, to thereby form the gate;

forming an n type diffusion layer by:

removing the resist;

removing the thin oxide film on the sidewall of the silicon column, and oxidizing the sidewall of the silicon column and the polysilicon of the gate to form an oxide film for the purpose of preventing the ion channeling during the ion implantation; and implanting the phosphorus, to thereby form the n type diffusion layer;

forming a p+ type diffusion layer by:

removing the nitride film;

depositing, planarizing and etching back an oxide film to form an oxide film layer;

performing oxidation to form an oxide film for the purpose of preventing the ion channeling during the ion implantation; and implanting boron and performing a thermal process, to thereby form the p+ type diffusion layer; and forming a pixel selection line by:

removing the oxide film;

depositing, planarizing and etching back metal;

forming a resist for the pixel selection line; and etching the metal, to thereby form the pixel selection line.

Yet further, in a preferred aspect of the present invention, a part of the second semiconductor layer has a circular column configuration and the gate surrounds an outer perimeter of the part of the second semiconductor layer via the insulating film.

Other part of the remaining of the second semiconductor layer has a circular column configuration and the third semiconductor layer surrounds an outer perimeter of the other part of the remaining of the second semiconductor layer.

A unit pixel of a CMOS image sensor of the prior art has totally four elements including three MOS transistors in addition to a photodiode in a plane. It implies that increasing a ratio of a surface area of a light receiving element (photodiode) to a surface area of one pixel is difficult. It has been reported that when using the 0.15 μm wiring-rule process, the ratio of the surface area of the light receiving element (photodiode) to the surface area of one pixel is 30%.

The present invention provides a solid-state imaging device comprising:

an amplifying transistor comprising a junction transistor whose gate and source together serve as a photoelectric converting photodiode and whose gate serves as an electric charge accumulator, the junction transistor operable to amplify electric charges in the electric charge accumulator;

a reset transistor comprising a MOS transistor whose source is connected to the gate of the amplifying transistor, the MOS transistor operable to reset the electric charge accumulator, a diode whose anode is connected to a drain of the amplifying transistor and whose cathode is connected to a drain of the reset transistor;

a pixel selection line connected to the source of the amplifying transistor; and a signal line connected to the cathode of the diode.

More specifically, since the structure to be composed of the photoelectric converter, the amplifier, the pixel selector and the resetting element can be now constructed with a total of three elements including the amplifying transistor comprising the junction transistor, the reset transistor comprising the MOS transistor and the diode, according to the present invention, therefore advantageously the number of elements in one pixel can be reduced.

Further, the present invention provides a solid-state imaging device comprising:

a signal line formed on a substrate;

an island shaped semiconductor disposed over the signal line; and a pixel selection line connected to an upper portion of the island shaped semiconductor, in which the island shaped semiconductor comprises:

a first semiconductor layer disposed in a lower portion of the island shaped semiconductor and connected to the signal line;

a second semiconductor layer disposed adjacent to an upper side of the first semiconductor layer;

a gate connected to the second semiconductor layer via an insulating film;

an electric charge accumulator comprising a third semiconductor layer connected to the second semiconductor layer and carrying a quantity of electric charges which varies in response to a light reception; and a fourth semiconductor layer disposed adjacent to an upper side of the second semiconductor layer and the third semiconductor layer and connected to the pixel selection line.

The third semiconductor layer and the fourth semiconductor layer together serve as the photoelectric converting photodiode;

the second semiconductor layer, the third semiconductor layer and the fourth semiconductor layer together serve as the amplifying transistor; and the first semiconductor layer, the second semiconductor layer, the third semiconductor layer and the gate together serve as the reset transistor.

The above arrangement, in which the photoelectric converter, the amplifier, the pixel selector and the resetting element can be achieved with an area of the photodiode, allows for an image sensor having a higher ratio of the surface area of the light receiving element to the surface area of one pixel.

Further, a solid-state imaging device unit of the present invention, in which the solid-state imaging devices are arranged in the honey comb configuration, allows for an image sensor having a higher ratio of the surface area of the light receiving element to the surface area of one pixel.

BRIEF DESCRIPTION OF THE DRAWINGS

FIG. 24(*b*) is a process drawing in a sectional view taken along the Y$_3$-Y$_3$' line of FIG. 23 illustrating the exemplary production of a solid-state imaging device according to the present invention;

FIG. 26(*b*) is a process drawing in a sectional view taken along the Y$_3$-Y$_3$' line of FIG. 25 illustrating the exemplary production of a solid-state imaging device according to the present invention;

FIG. 28(*b*) is a process drawing in a sectional view taken along the Y$_3$-Y$_3$' line of FIG. 27 illustrating the exemplary production of a solid-state imaging device according to the present invention;

FIG. 30(*b*) is a process drawing in a sectional view taken along the Y$_3$-Y$_3$' line of FIG. 29 illustrating the exemplary production of a solid-state imaging device according to the present invention;

FIG. 32(*b*) is a process drawing in a sectional view taken along the Y$_3$-Y$_3$' line of FIG. 31 illustrating the exemplary production of a solid-state imaging device according to the present invention;

FIG. 33 is a top view showing an exemplary production of a solid-state imaging device according to the present invention;

FIG. 34(*b*) is a process drawing in a sectional view taken along the Y$_3$-Y$_3$' line of FIG. 33 illustrating the exemplary production of a solid-state imaging device according to the present invention;

FIG. 36(*b*) is a process drawing in a sectional view taken along the Y$_3$-Y$_3$' line of FIG. 35 illustrating the exemplary production of a solid-state imaging device according to the present invention;

FIG. 38(*b*) is a process drawing in a sectional view taken along the Y$_3$-Y$_3$' line of FIG. 37 illustrating the exemplary production of a solid-state imaging device according to the present invention;

FIG. 40(*b*) is a process drawing in a sectional view taken along the Y$_3$-Y$_3$' line of FIG. 39 illustrating the exemplary production of a solid-state imaging device according to the present invention;

FIG. 42(*b*) is a process drawing in a sectional view taken along the Y$_3$-Y$_3$' line of FIG. 41 illustrating the exemplary production of a solid-state imaging device according to the present invention;

FIG. 44(*b*) is a process drawing in a sectional view taken along the Y$_3$-Y$_3$' line of FIG. 43 illustrating the exemplary production of a solid-state imaging device according to the present invention;

FIG. 85(a) is a sectional view taken along X₅-X₅' line of FIG. 84;

FIG. 85(b) is an equivalent circuit diagram of FIG. 85(a);

FIG. 86(a) is a sectional view taken along Y₅-Y₅' line of FIG. 84;

FIG. 86(b) is an equivalent circuit diagram of FIG. 86(a);

FIG. 87 is a plan view of image sensors arranged in a matrix, each image sensor having an island shaped semiconductor in a circular column configuration, according to the present invention;

FIG. 88 is an enlarged plan view of one of the pixels;

FIG. 89 is a plan view showing image sensors arranged in a matrix, each image sensor having an island shaped semiconductor in a square column configuration, according to the present invention;

FIG. 90 is an enlarged plan view of one of the pixels;

FIG. 91 is a plan view showing image sensors arranged in a honey comb configuration, each image sensor having an island shaped semiconductor in a circular column configuration, according to the present invention;

FIG. 92 is an enlarged plan view of one of the pixels;

FIG. 93 is a plan view showing image sensors arranged in a honey comb configuration, each image sensor having an island shaped semiconductor in a hexagonal column configuration, according to the present invention; and FIG. 94 is an enlarged plan view of one of the pixels.

DESCRIPTION OF THE PREFERRED EMBODIMENTS

Figure 1:
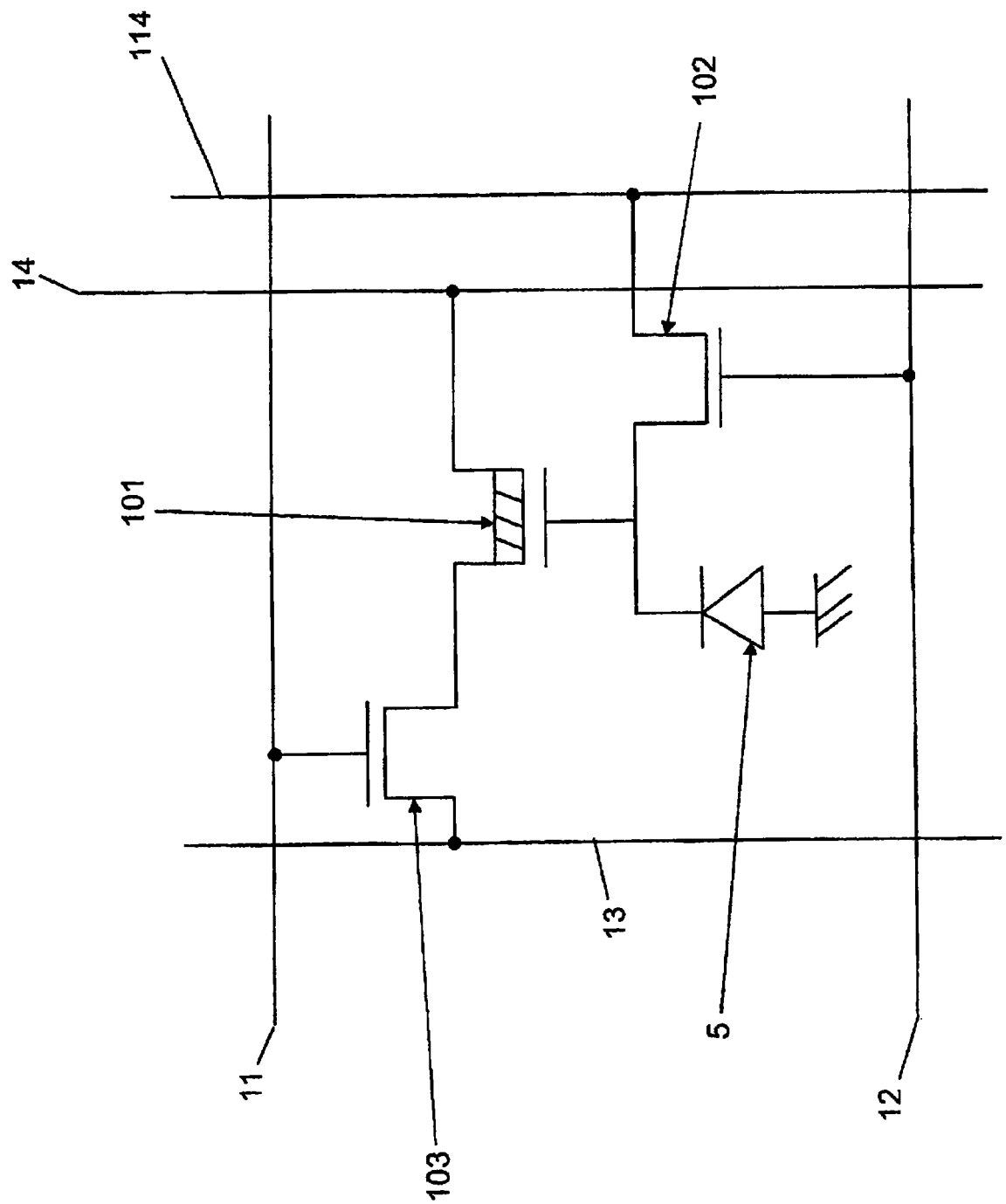
FIG. 1 shows a unit pixel of a CMOS image sensor of the prior art.

The present invention will now be described in accordance to embodiments illustrated in the drawings. It is to be appreciated that the present invention is not limited in nature by those embodiments.

Figure 2:
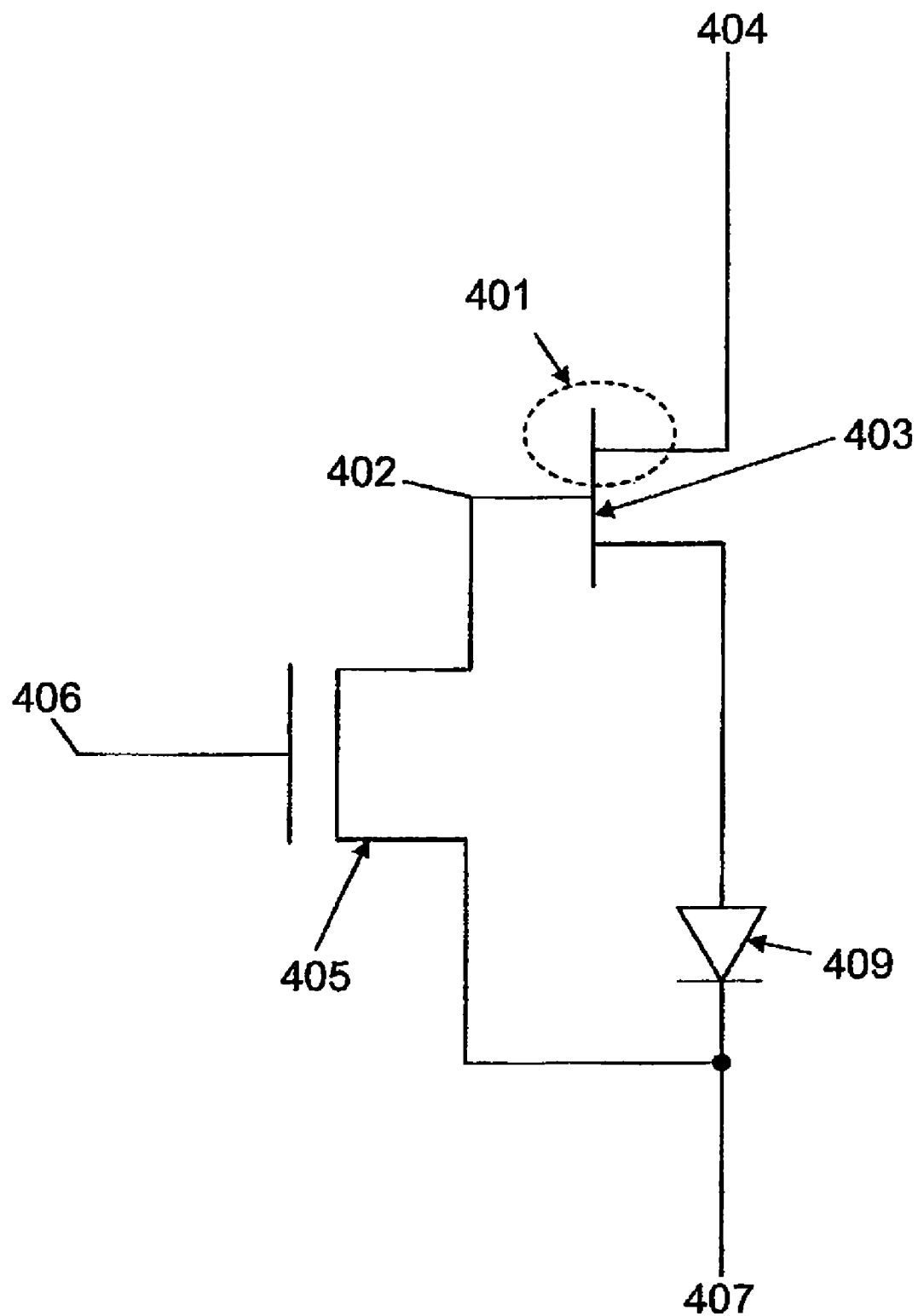
FIG. 2 shows an equivalent circuit of a solid-state imaging device according to the present invention.

FIG. 2 shows an equivalent circuit of a solid-state imaging device according to the present invention. The solid-state imaging device according to the present invention comprises a photodiode 401, an electric charge accumulator 402, am amplifying transistor 403, a gate (reset line) 406, a reset transistor 405, a diode 409, a pixel selection line 404 and a signal line 407.

More specifically, according to the present invention, since the structure to be composed of the photoelectric converter, the amplifier, the pixel selector and the resetting element can be now constructed with a total of three elements including the amplifying transistor comprising a junction transistor, the reset transistor comprising the MOS transistor and the diode, therefore the number of elements in one pixel can be reduced advantageously as compared to the CMOS image sensor according to the prior art.

Figure 3:
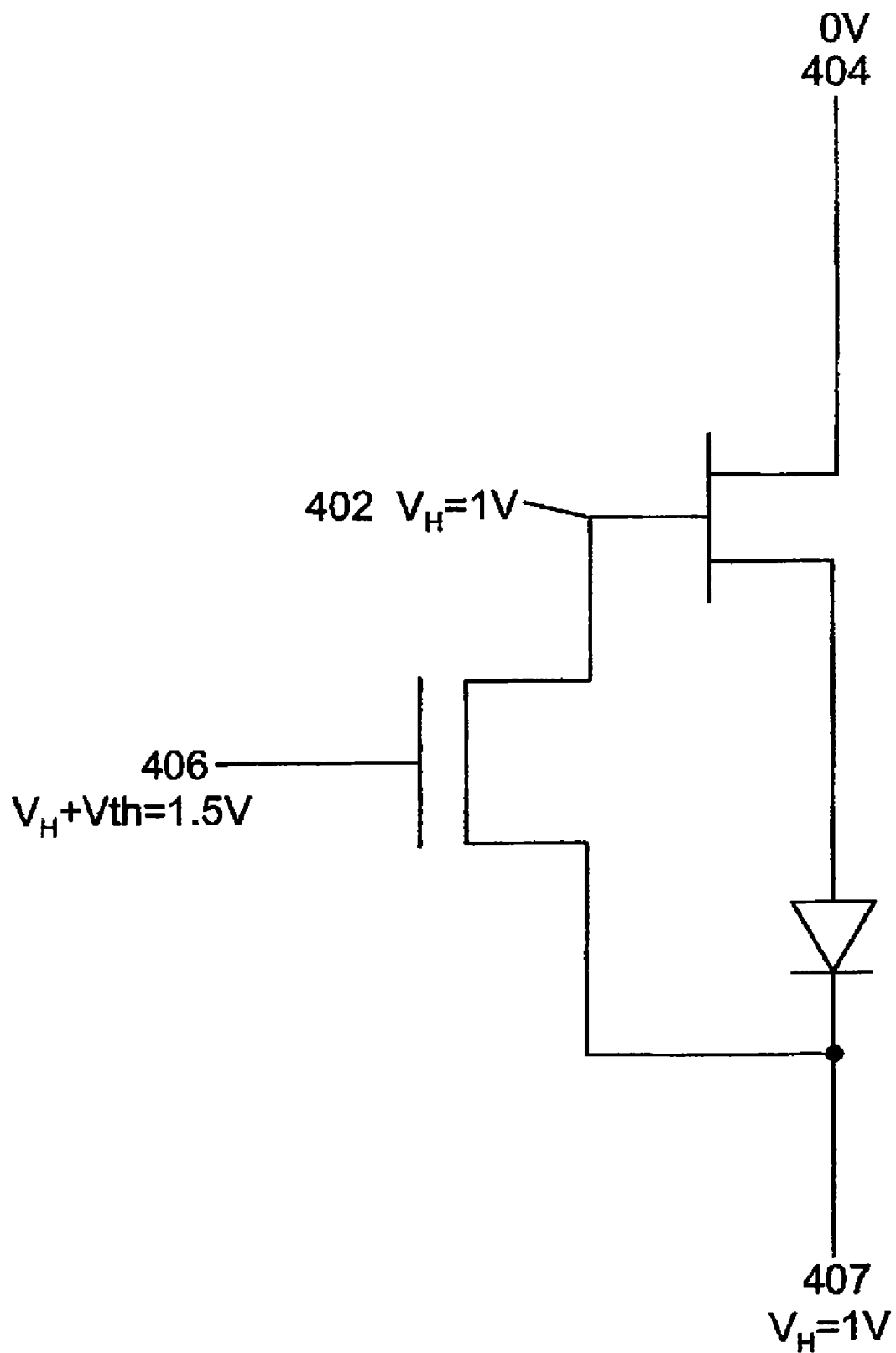
FIG. 3 illustrates a method for driving a solid-state imaging device according to the present invention.

FIGS. 3, 4, 5(a) and 5(b) illustrate a method for driving a solid-state imaging device according to the present invention. Initially, a reset operation is performed by applying 0V to the pixel selection line 404, applying a signal line voltage, $V_H$, for example, 1V to the signal line 407 and applying the $V_H$+Vth to the gate (reset line) so as to make the electric charge accumulator 402 equal to $V_H$ for resetting (FIG. 3). It is to be noticed that Vth is a threshold voltage for the reset transistor, for example, 0.5V.

Figure 4:
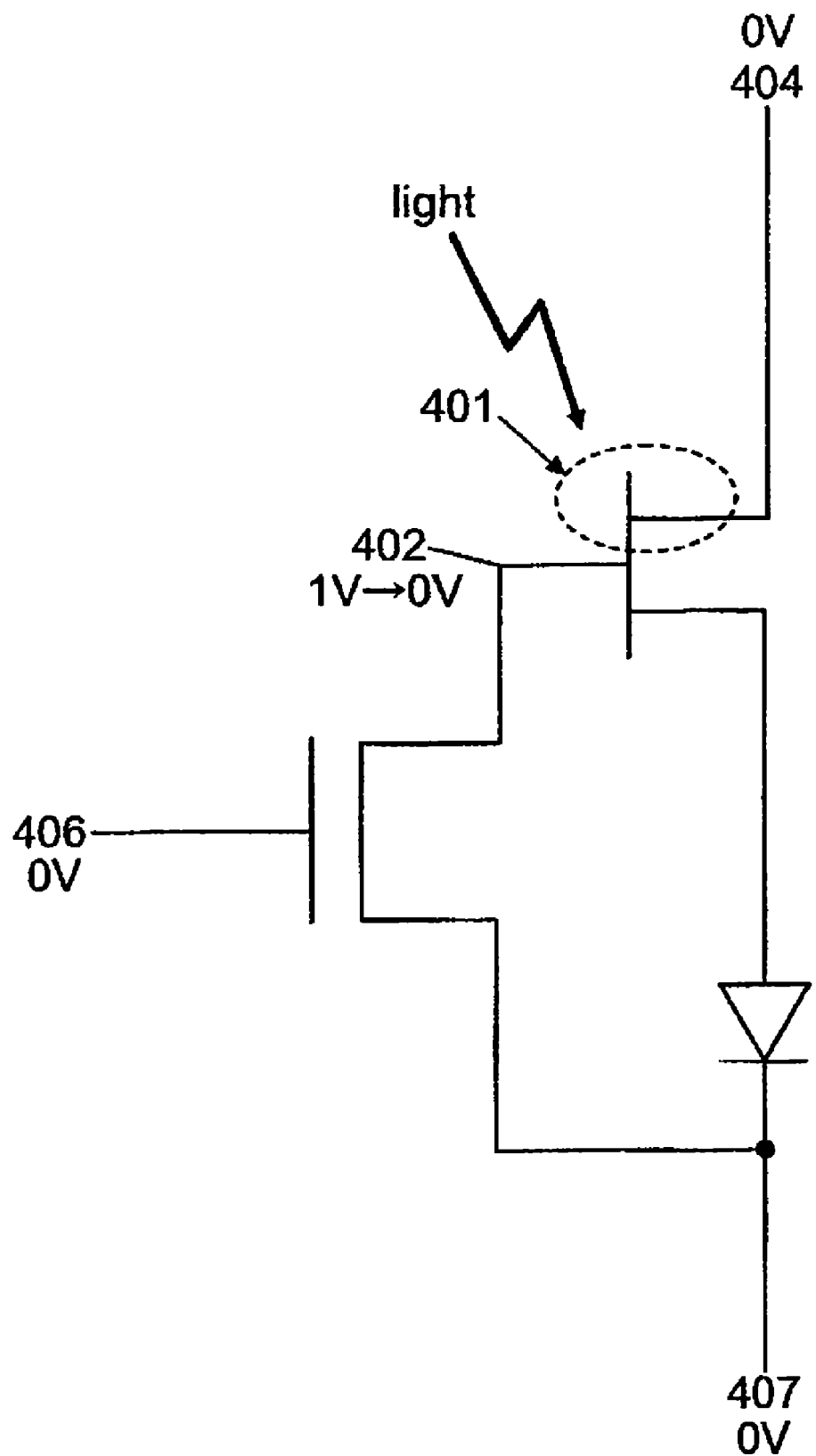
FIG. 4 illustrates a method for driving a solid-state imaging device according to the present invention.
Figure 5A:
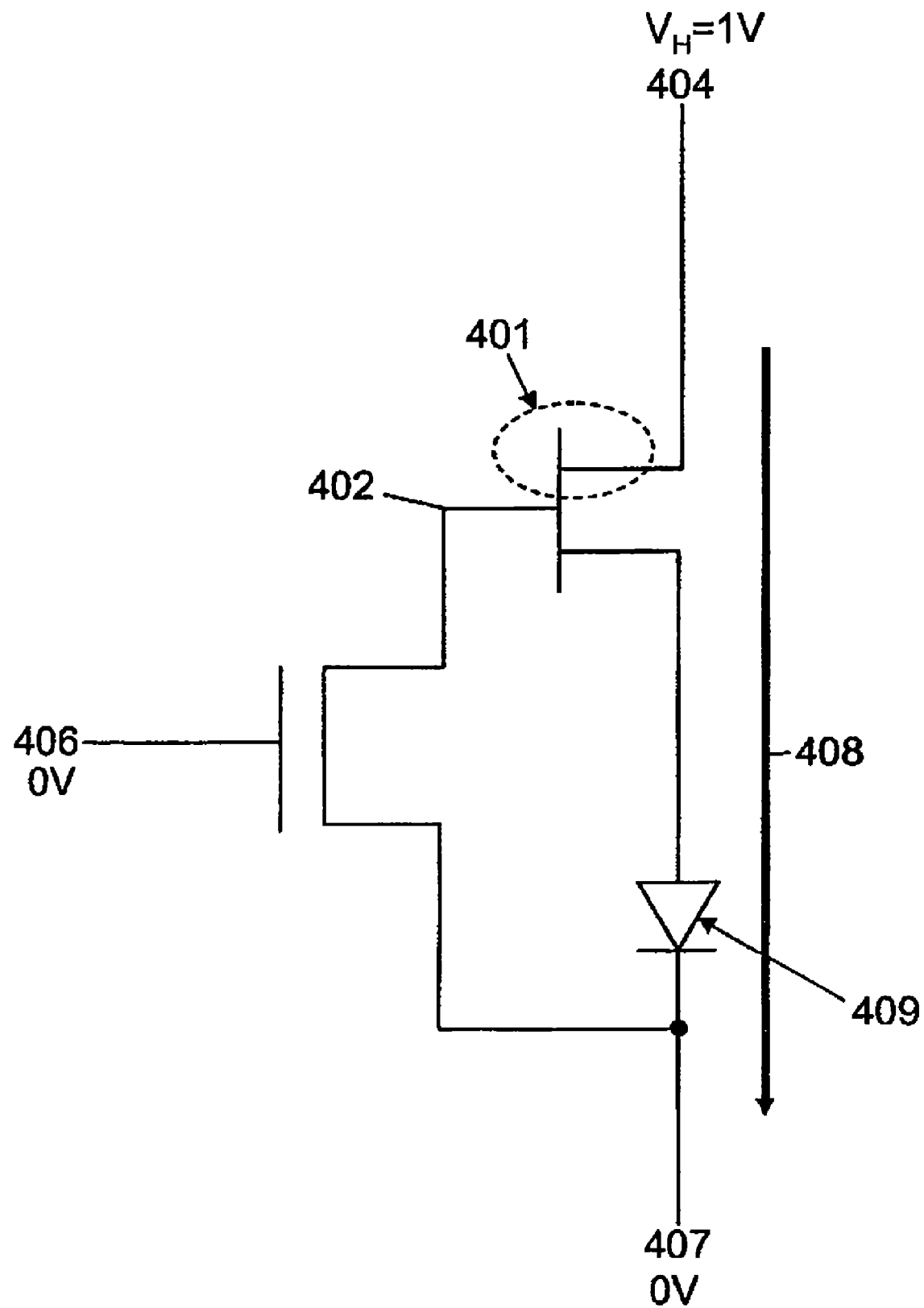
FIG. 5(a) illustrates a method for driving a solid-state imaging device according to the present invention.
Figure 5B:
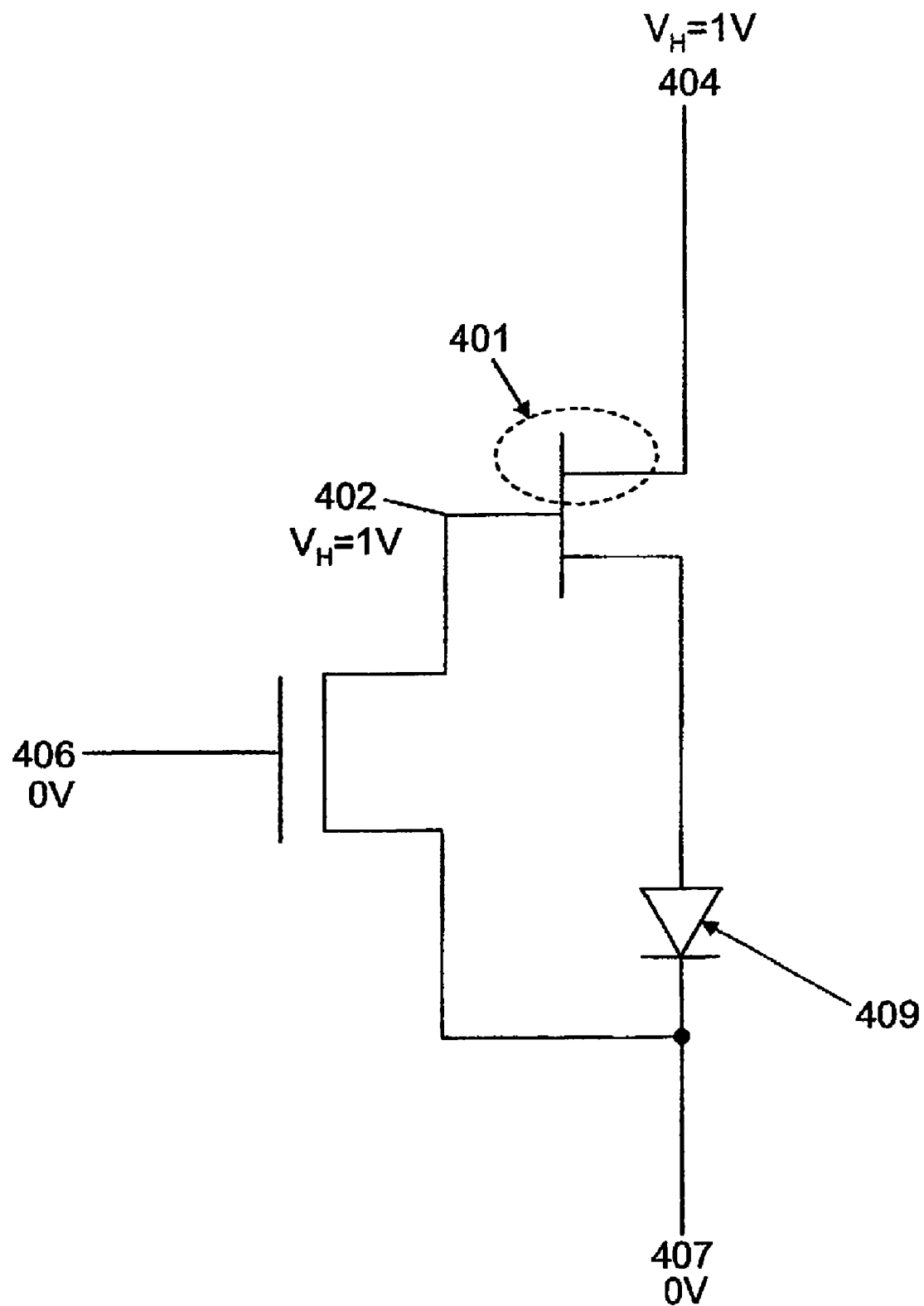
FIG. 5(b) illustrates a method for driving a solid-state imaging device according to the present invention.

Secondly, applying 0V to the pixel selection line 404, 0V to the gate (reset line) 406 and 0V to the signal line 407 can convert an optical signal entering into the photodiode 401 to electric charges, which signal charges are in turn accumulated in the electric charge accumulator 402. This means that as the light enters, then the voltage in the electric charge accumulator 402 will be decreased (FIG. 4).

Subsequently, applying the $V_H$, for example, 1V to the pixel selection line 404, 0V to the gate (reset line) 406 and 0V to the signal line 407 can amplify the electric charges accumulated in the electric charge accumulator 402 to effect a flow of reading current, $I_{read}$, 408, which reading current, $I_{read}$, 408 flows through the diode 409 and read out. As more intensive light enters, then the voltage in the electric charge accumulator 402 may be further decreased and thus an enhanced current may flow (FIG. 5(a)). In contrast, if no light enters, the voltage in the electric charge accumulator 402 may hold the $V_H$, for example, 1V, and no current flows (FIG. 5(b)).

According to the driving method as described above, the electric charges generated in the photoelectric converter comprising the photodiode may be accumulated, thus accumulated electric charges may be amplified in the amplifier and thus amplified electric charges may be read out by using the pixel selector.

Figure 6:
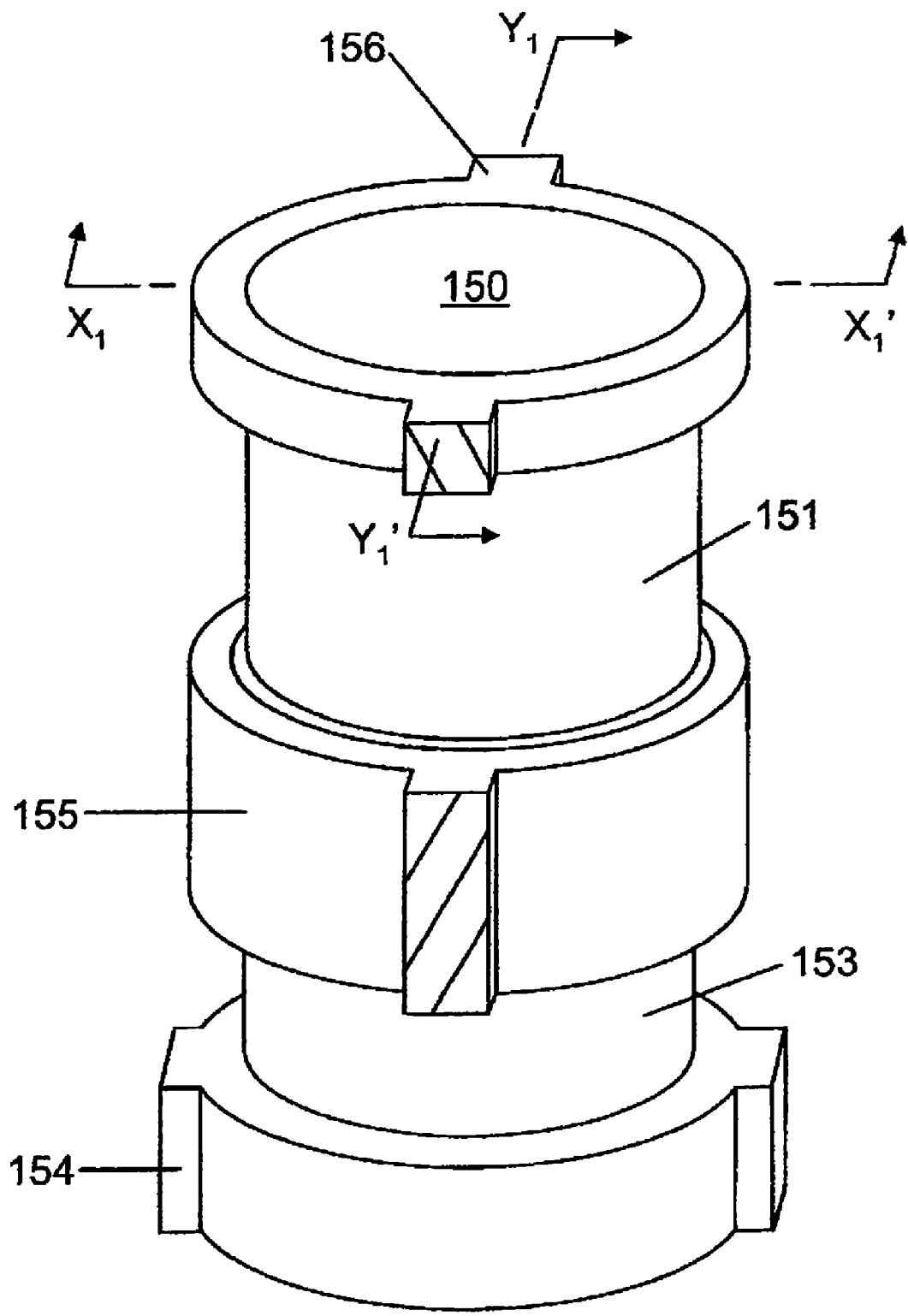
FIG. 6 is a bird's eye view of a single solid-state imaging device according to the present invention.
Figure 7A:
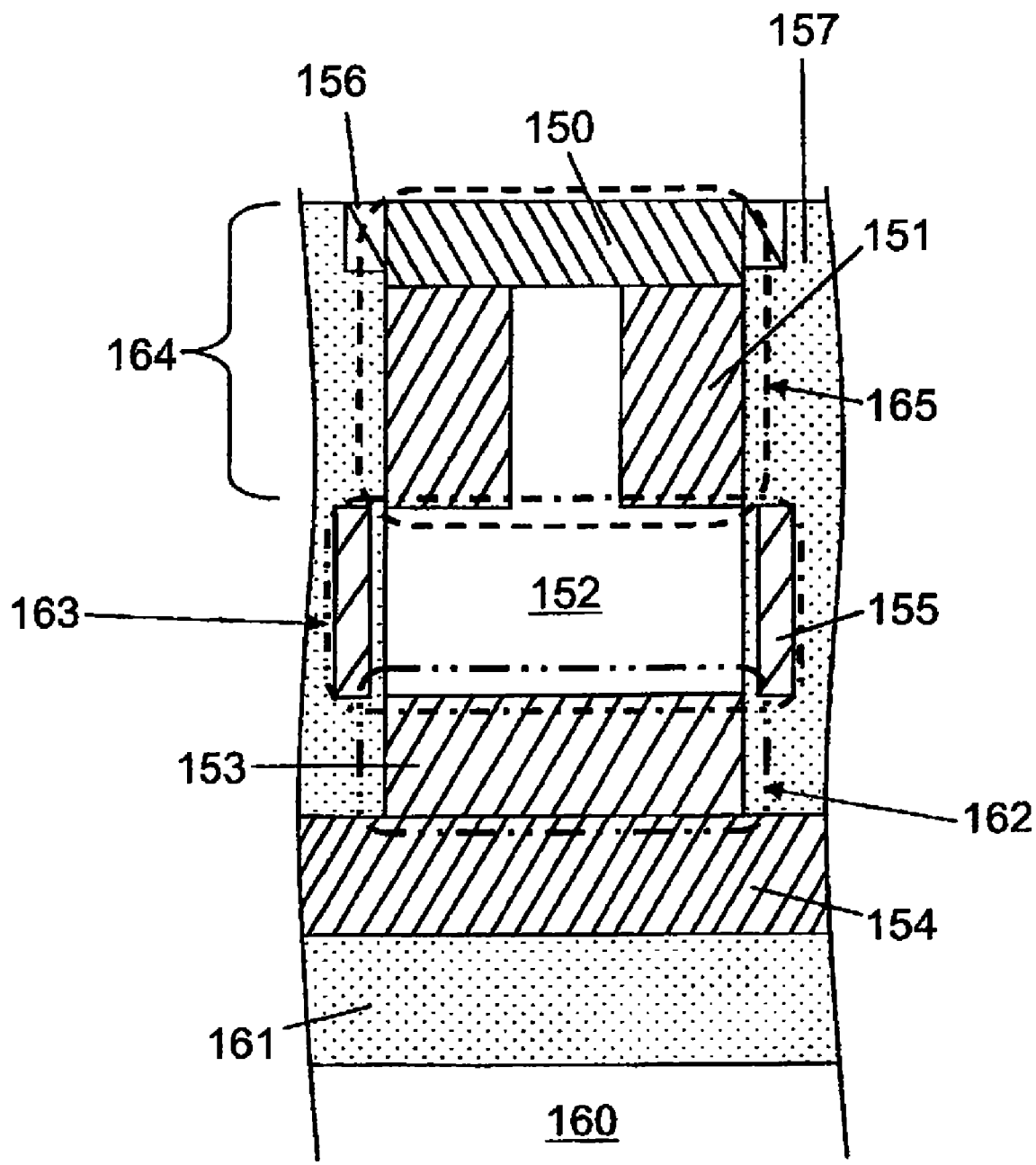
FIG. 7(a) is a sectional view taken along the $X_1$-$X_1'$ line of FIG. 6.
Figure 7B:
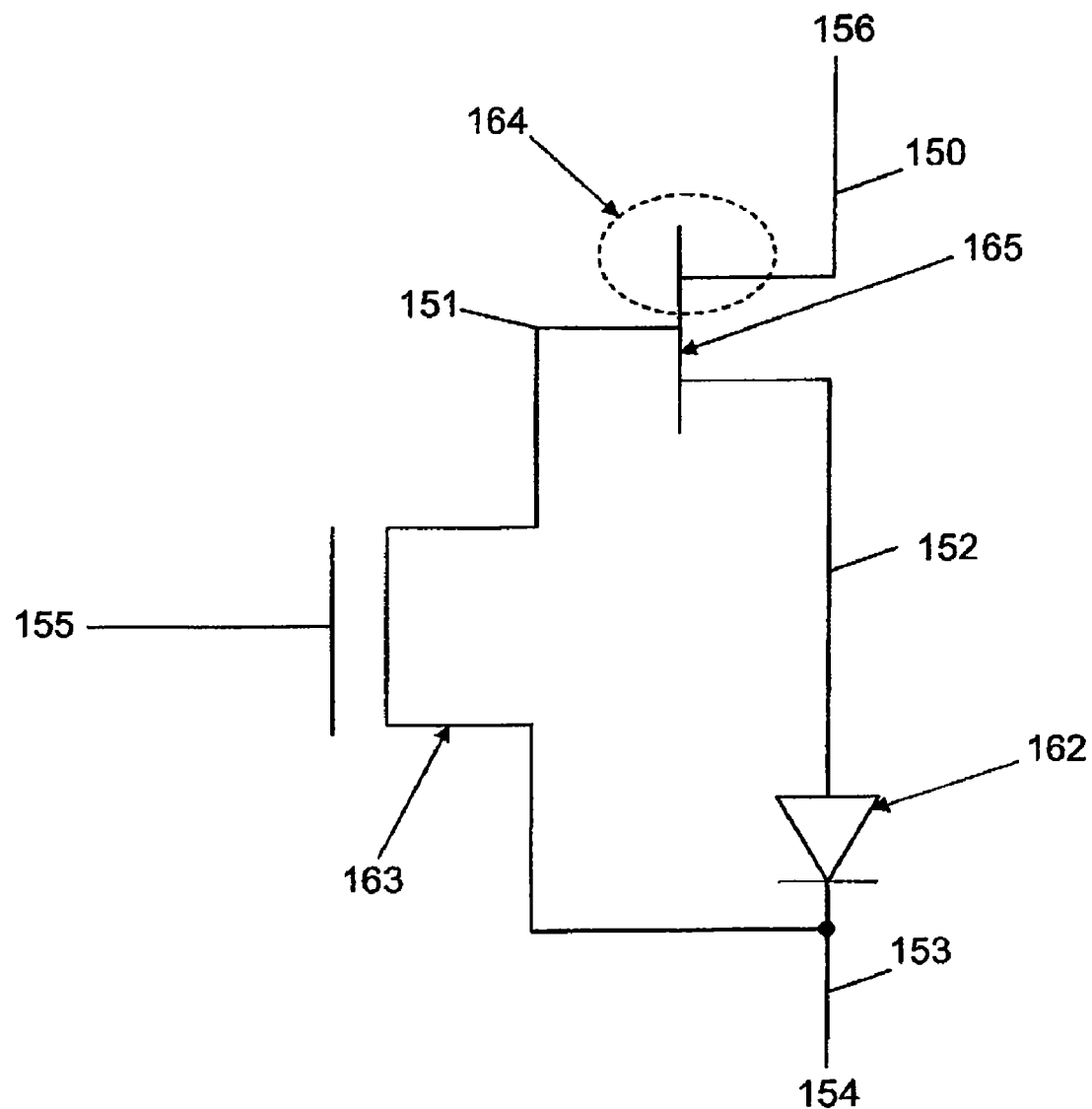
FIG. 7(b) is an equivalent circuit diagram of FIG. 7(a)
Figure 8A:
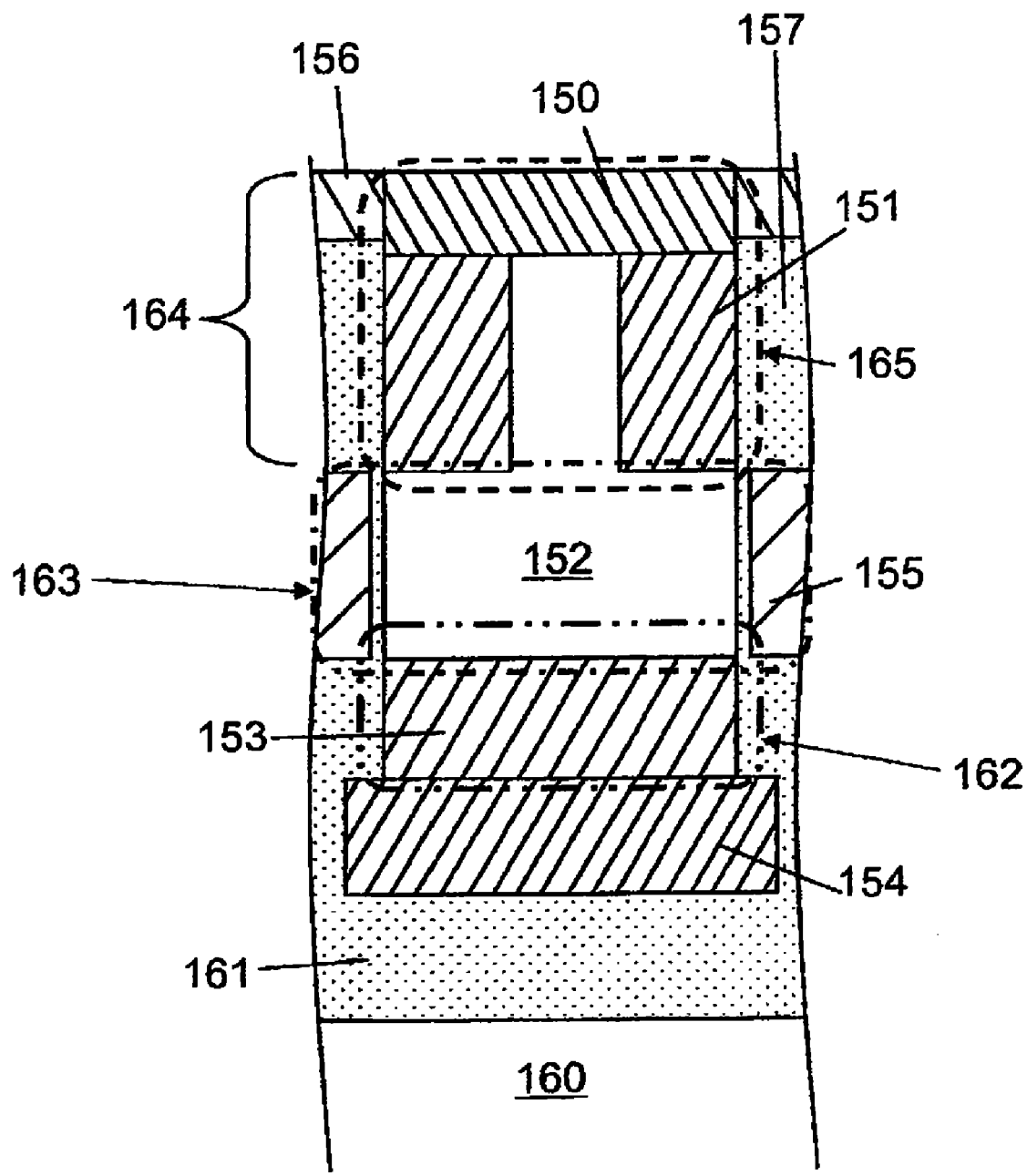
FIG. 8(a) is a sectional view taken along the $Y_1$-$Y_1'$ line of FIG. 6.
Figure 8B:
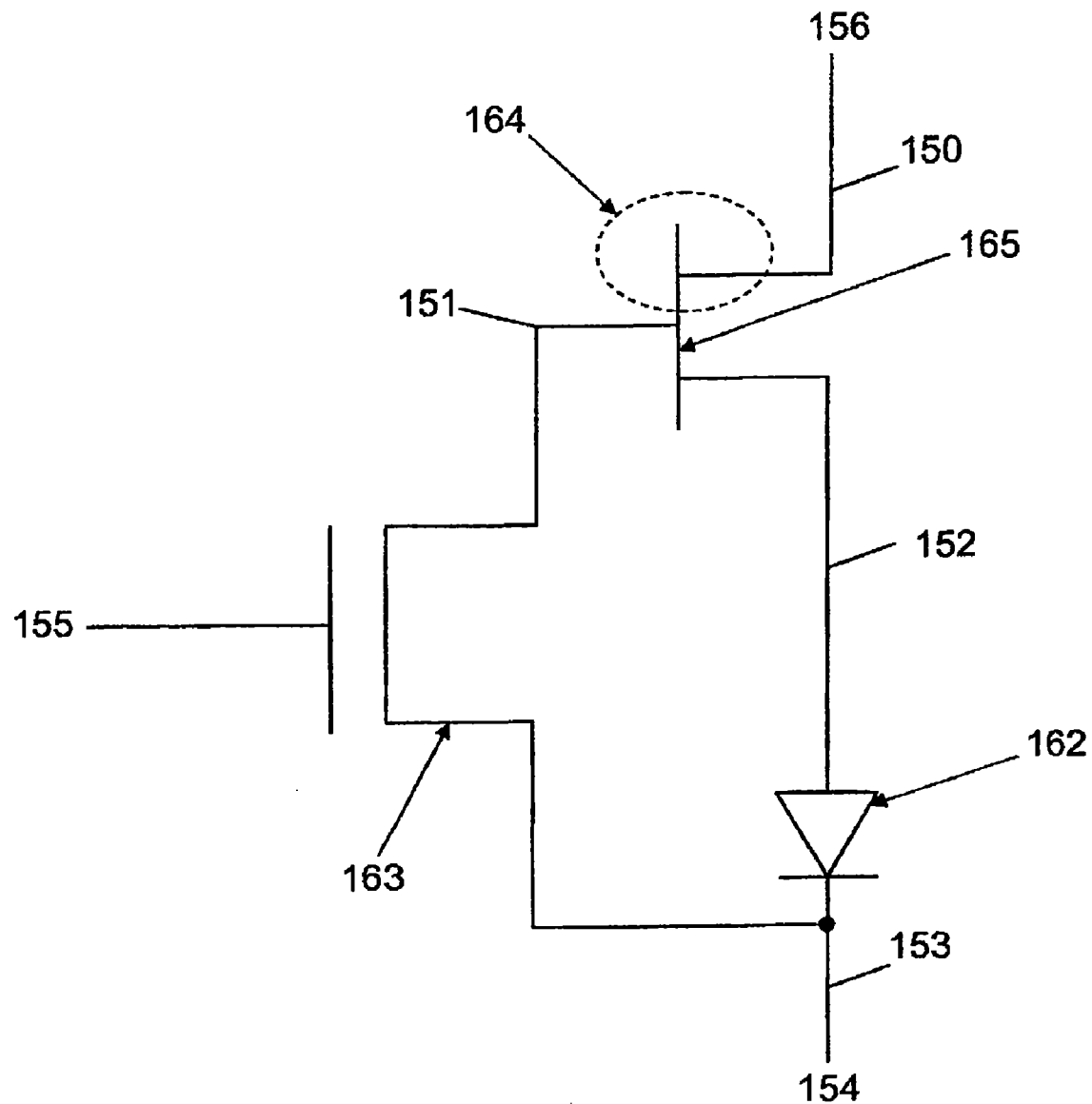
FIG. 8(b) is an equivalent circuit diagram of FIG. 8(a)

FIG. 6 shows a bird's eye view of a single solid-state imaging device according to the present invention. In addition, FIG. 7(a) is a sectional view taken along the $X_1$-$X_1$' line of FIG. 6, FIG. 7(b) is an equivalent circuit diagram of FIG. 7(a), FIG. 8(a) is a sectional view taken along the $Y_1$-$Y_1$' line of FIG. 6 and FIG. 8(b) is an equivalent circuit diagram of FIG. 8(a).

According to the present invention, an oxide film 161 is formed over a silicon substrate 160 and a signal line 154 is formed over the oxide film 161, an island shaped semiconductor is formed over the signal line, which island shaped semiconductor comprises:

an n+ type diffusion layer 513 disposed in a lower portion of the island shaped semiconductor and connected to the signal line;

a p type impurity-doped region 152 disposed adjacent to an upper side of the n+ type diffusion layer;

a gate 155 connected to the p type impurity-doped region via an insulating film;

an electric charge accumulator 151 comprising an n type diffusion layer connected to the p type impurity-doped region and carrying a quantity of electric charges which varies in response to a light reception; and a p+ type diffusion layer 150 disposed adjacent to an upper side of the p type impurity-doped region and the n type diffusion layer, and a pixel selection line 156 is formed, which is to be connected to the p+ type diffusion layer in an upper portion of the island shaped semiconductor.

An oxide film 157 is formed to serve as an interlayer insulating film.

The p+ type diffusion layer 150 and the n type diffusion layer 151 together serve as a photoelectric converting photodiode 164;

the p+ type diffusion layer 150, the n type diffusion layer 151 and the p type impurity-doped region 152 together serve as a amplifying transistor 165;

the n+ type diffusion layer 153, the p type impurity-doped region 152, the n type diffusion layer 151 and the gate 155 together serve as a reset transistor 163; and the p type impurity-doped region 152 and the n+ type diffusion layer 153 together serve as a diode 162.

Figure 9:
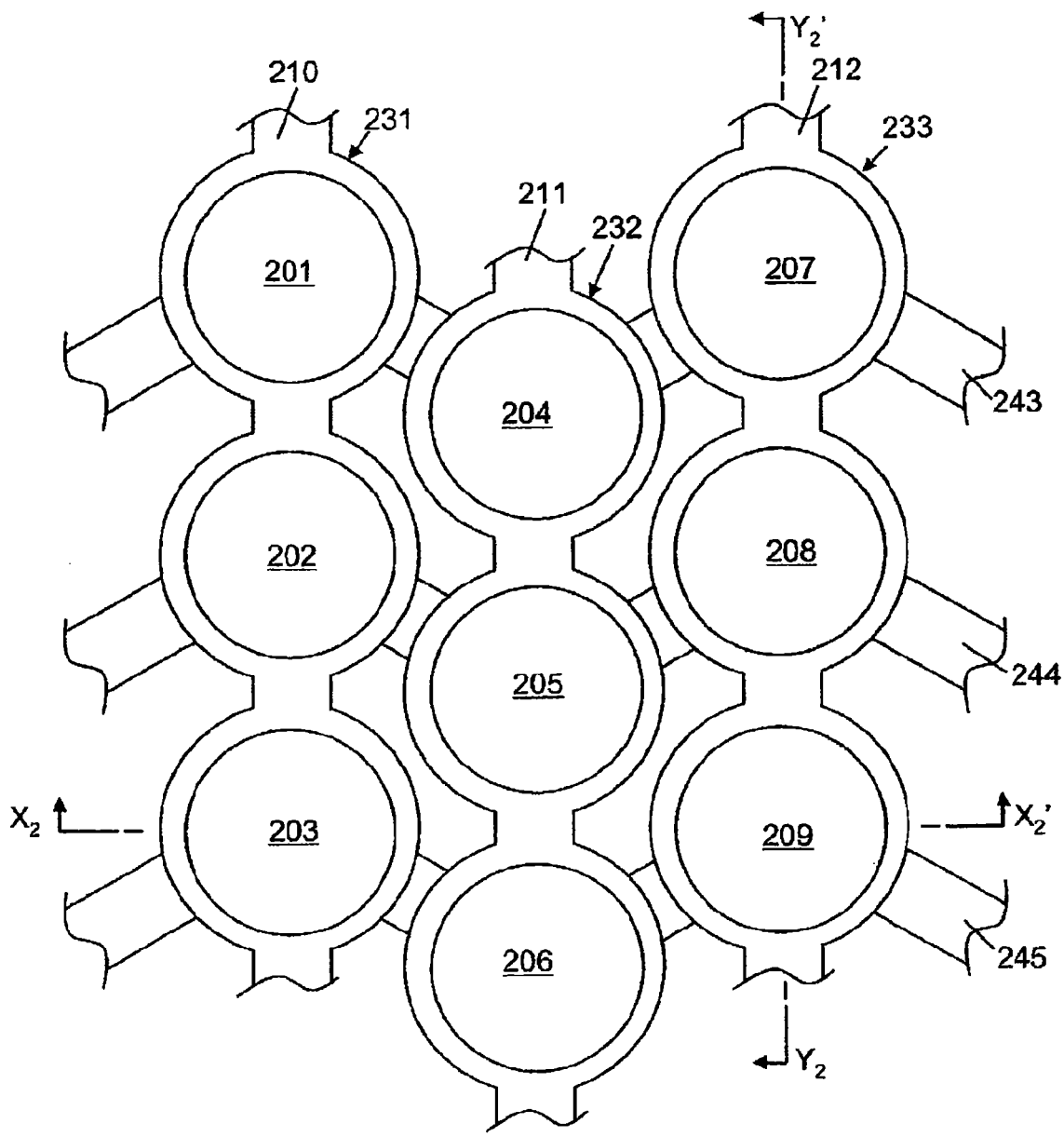
FIG. 9 is a plan view of solid-state imaging devices according to the present invention that are arranged in a honey comb configuration.
Figure 10:
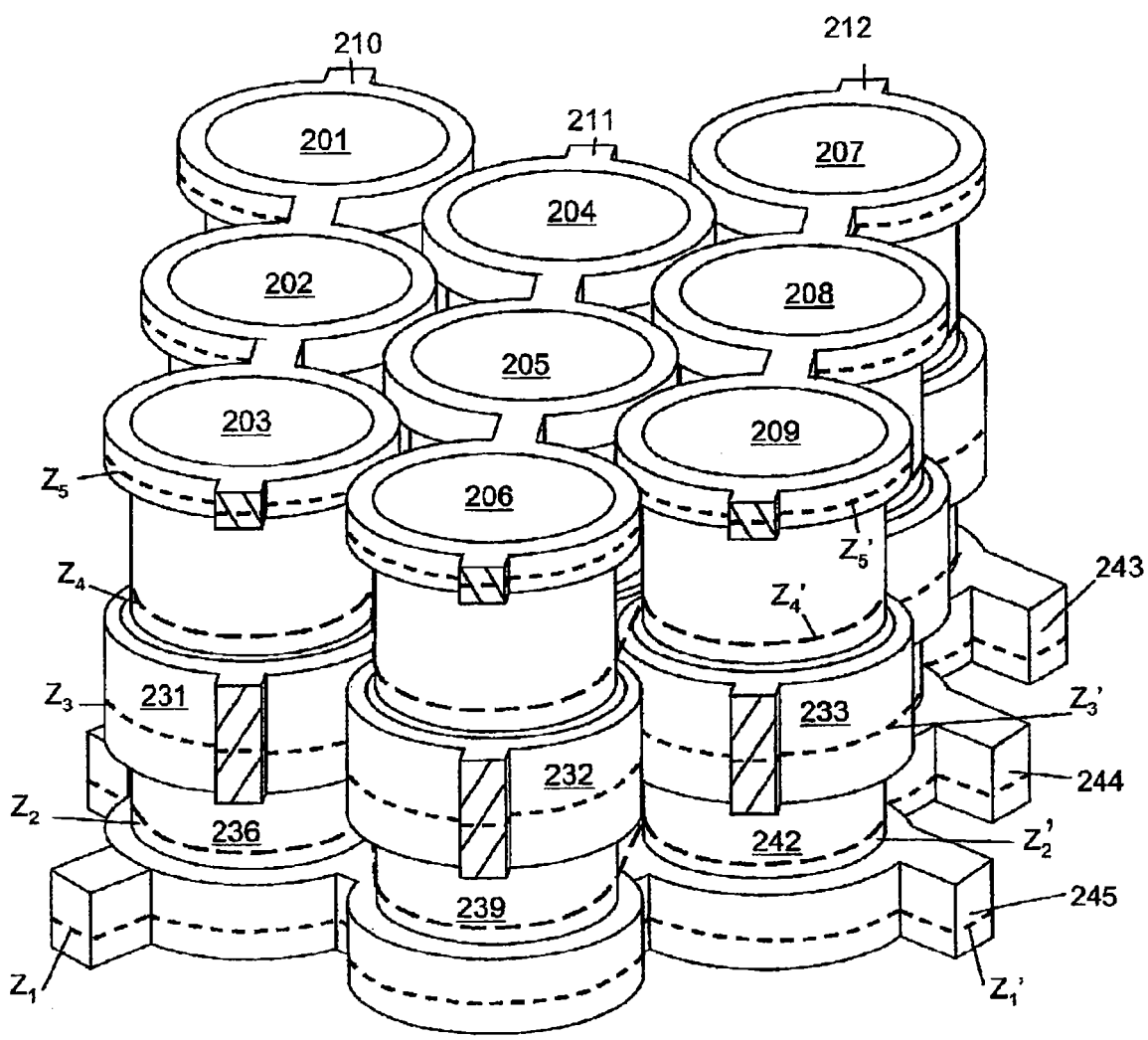
FIG. 10 is a bird's eye view.
Figure 11:
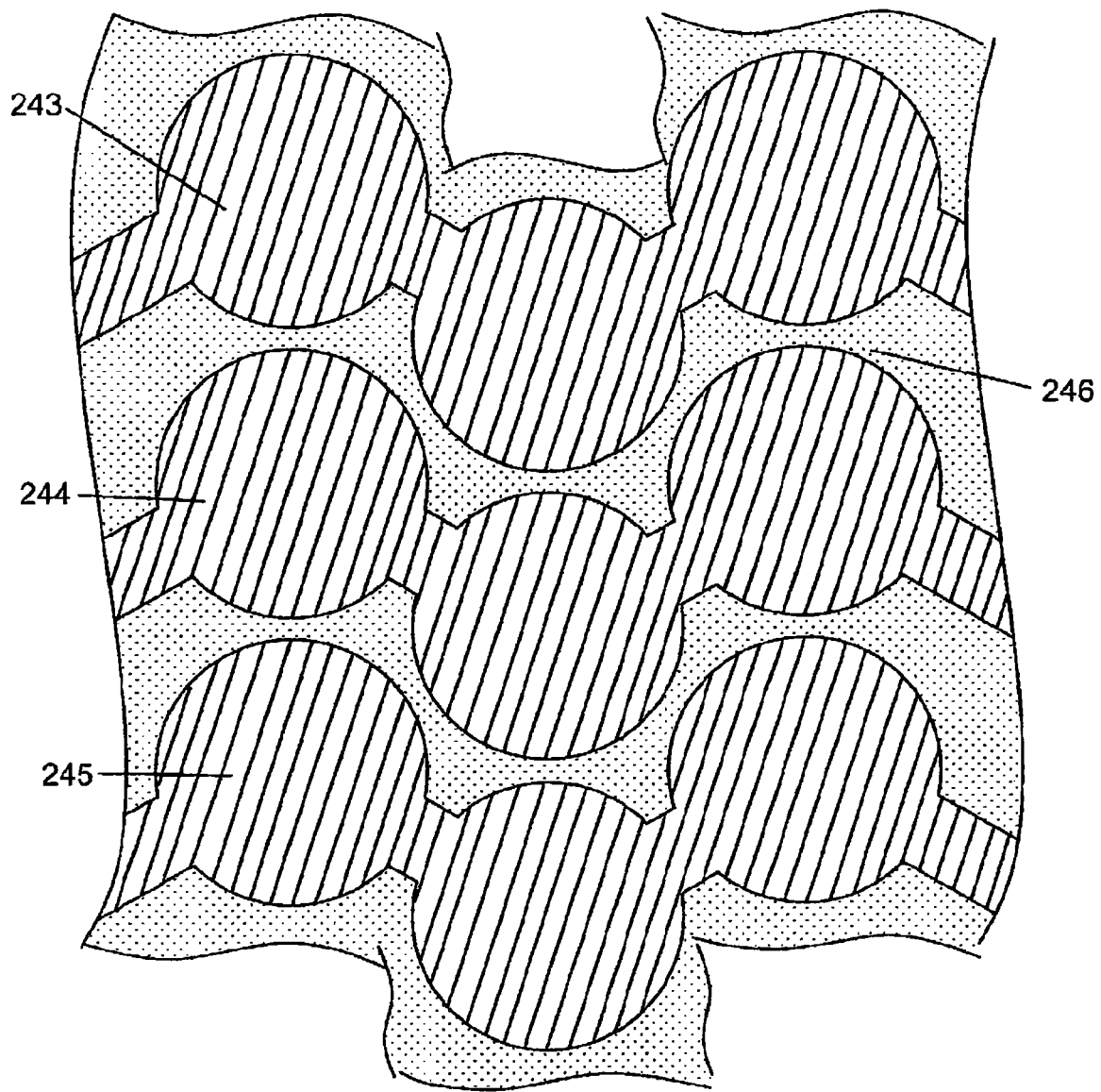
FIG. 11 is a sectional view taken along $Z_1$-$Z_1'$ line of FIG. 10.
Figure 12:
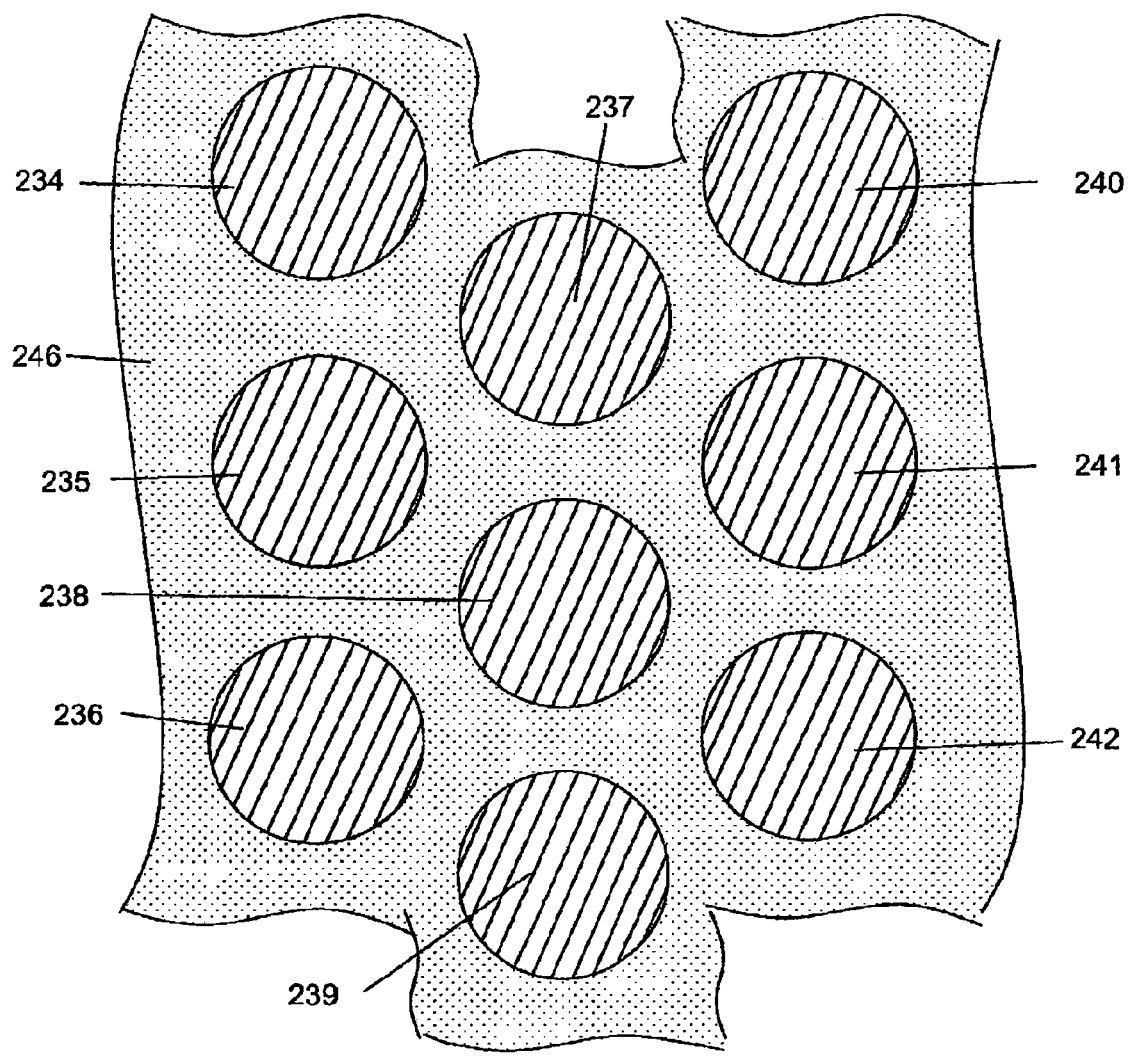
FIG. 12 is a sectional view taken along $Z_2$-$Z_2'$ line of FIG. 10.
Figure 13:
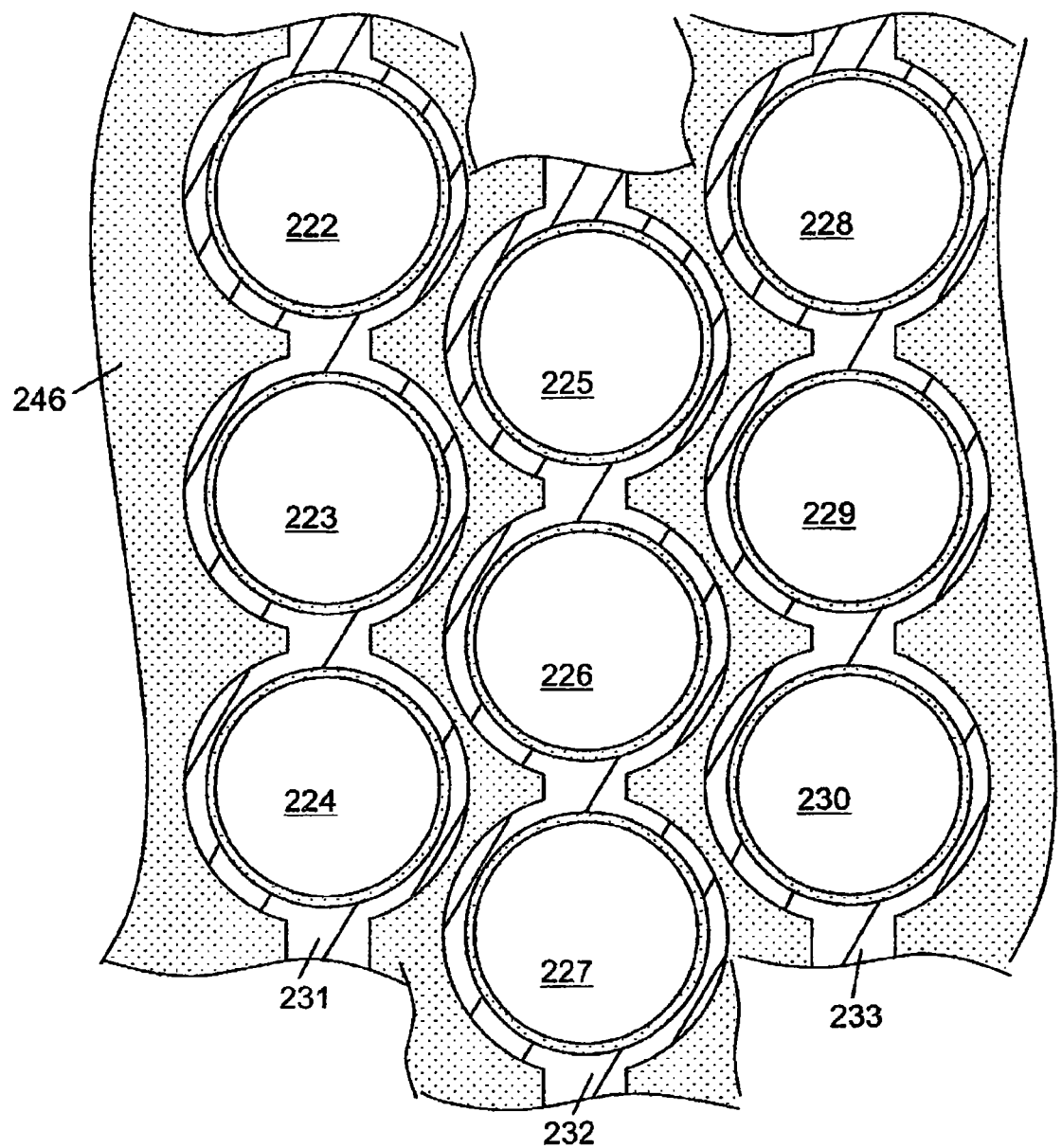
FIG. 13 is a sectional view taken along $Z_3$-$Z_3'$ line of FIG. 10.
Figure 14:
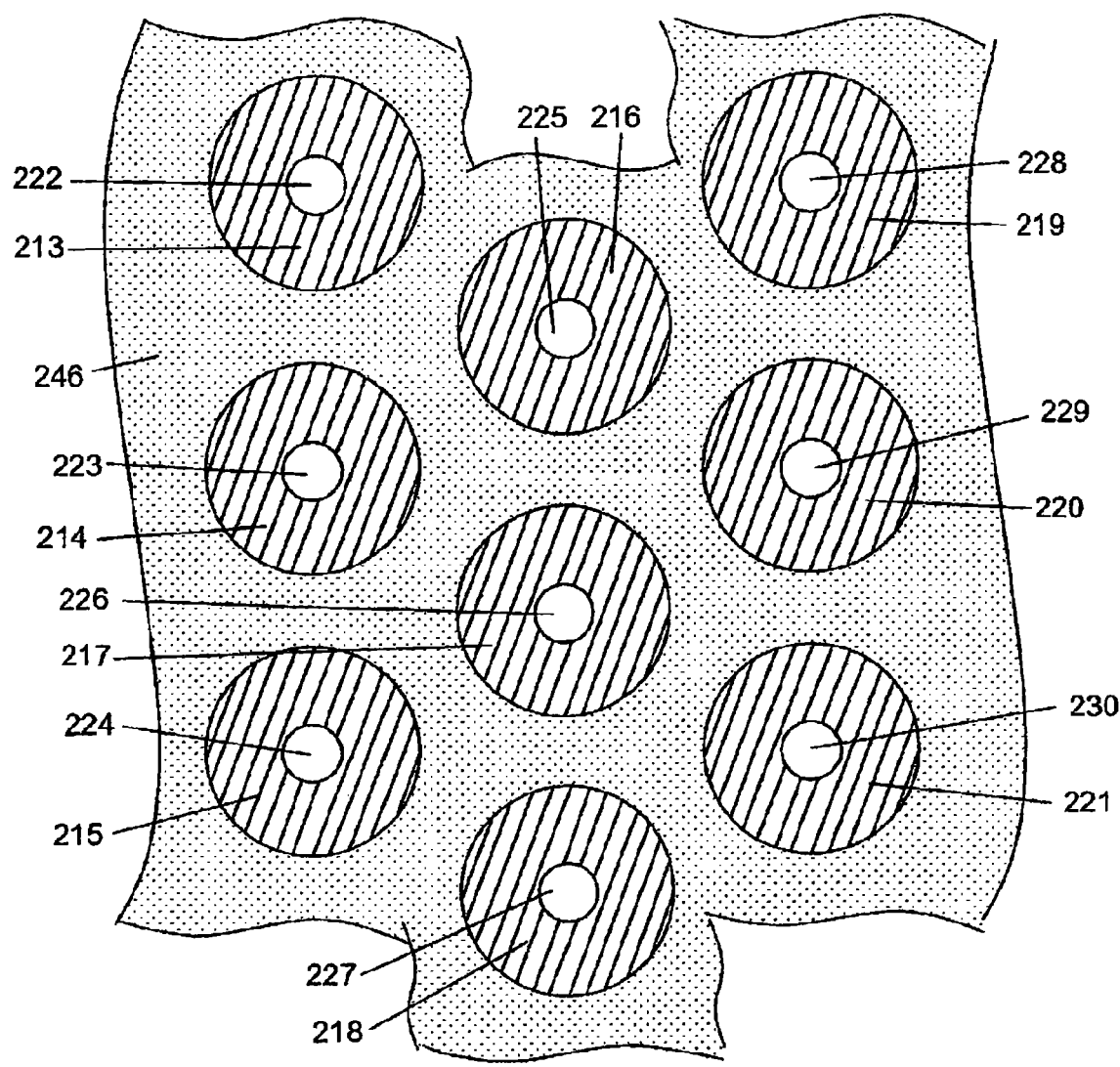
FIG. 14 is a sectional view taken along $Z_4$-$Z_4'$ line of FIG. 10.
Figure 15:
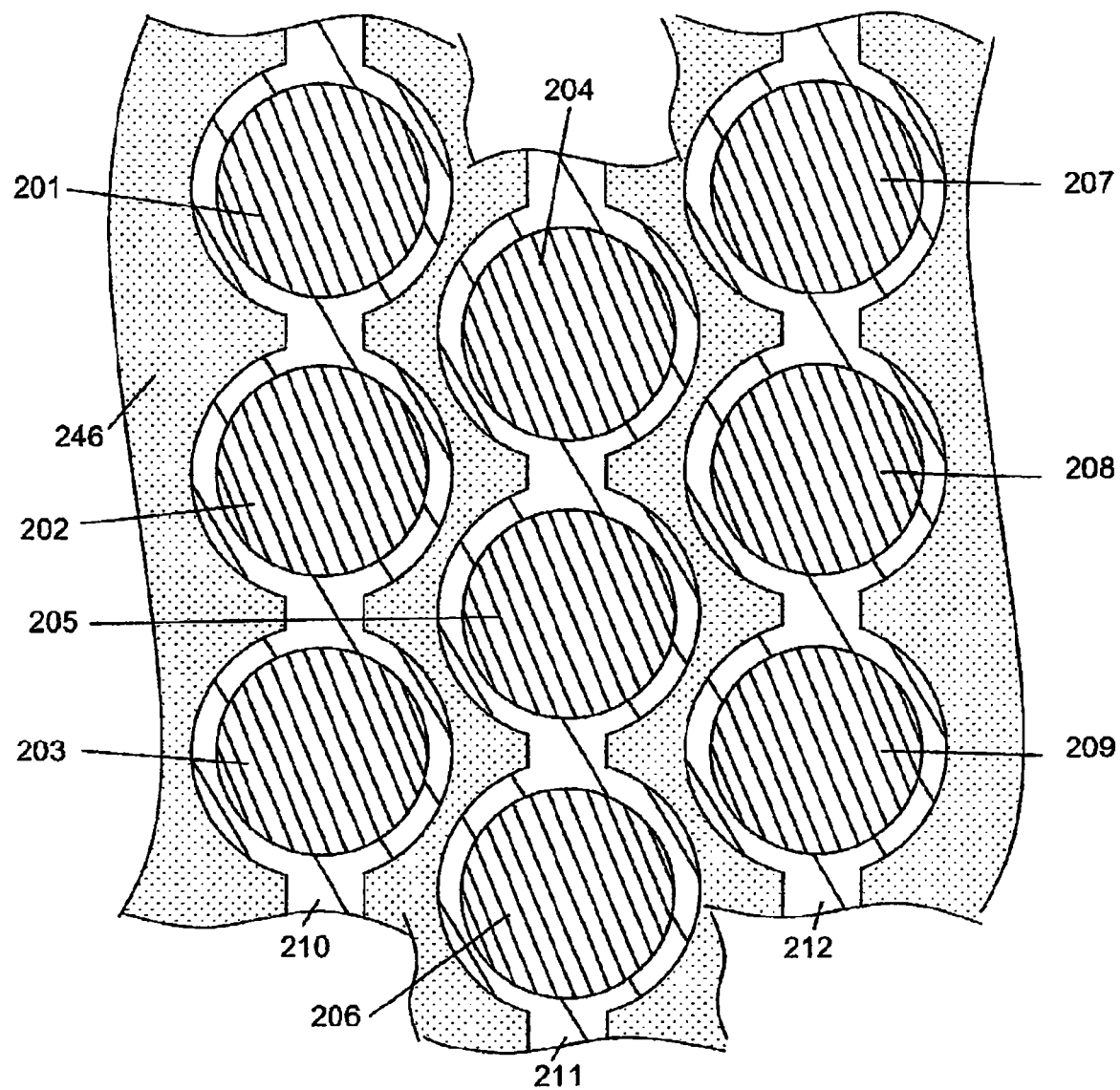
FIG. 15 is a sectional view taken along $Z_5$-$Z_5'$ line of FIG. 10.

FIG. 9 shows a plan view of a solid-state imaging device matrix (a solid-state imaging device unit) comprising the solid-state imaging devices as described above that are herein arranged in a honey comb configuration. In addition, FIG. 10 is a bird's eye view thereof. FIG. 11 is a sectional view taken along $Z_1$-$Z_1$' line of FIG. 10, FIG. 12 is a sectional view taken along $Z_2$-$Z_2$' line of FIG. 10, FIG. 13 is a sectional view taken along $Z_3$-$Z_3$' line of FIG. 10, and FIG. 14 is a sectional view taken along $Z_4$-$Z_4$' line of FIG. 10. FIG. 15 is a sectional view taken along $Z_5$-$Z_5$' line of FIG. 10. In an example as shown in FIG. 10, the solid-state imaging device matrix (the solid-state imaging device unit) comprises a plurality of device arrays aligned horizontally on a silicon substrate, which device arrays comprise:

a first solid-state imaging device array of solid-state imaging devices having the p+ type diffusion layers 201, 202 and 203, which are arranged vertically with a predetermined interval (a vertical pixel pitch, VP) therebetween;

a second solid-state imaging device array of solid-state imaging devices having the p+ type diffusion layers 204, 205 and 206, which are arranged vertically with the interval equal to that in the first solid-state imaging device array therebetween but vertically offset relative to the first solid-state imaging device array by ½ with respect to the vertical pixel pitch VP; and a third solid-state imaging device array of solid-state imaging devices having the p+ type diffusion layer 207, 208 and 209, which are arranged vertically with the interval equal to that in the first solid-state imaging device array therebetween.

The first array of solid-state imaging devices, the second array of solid-state imaging devices and the third array of solid-state imaging devices, which are arranged adjacently with each other, are disposed with a horizontal interval equal to the vertical pixel pitch multiplied by √3/2 (horizontal pixel pitch, HP) therebetween.

More specifically, the solid-state imaging devices are arranged in a so-called honeycomb configuration.

The p+ diffusion layer 201, 202, 203 of the first solid-state imaging device array is connected to a pixel selection line 210.

The p+ diffusion layer 204, 205, 206 of the second solid-state imaging device array is connected to a pixel selection line 211.

The p+ diffusion layer 207, 208, 209 of the third solid-state imaging device array is connected to a pixel selection line 212.

A p type impurity-doped region 222, 223, 224 of the first solid-state imaging device array is connected to a gate 231 via an insulating film.

A p type impurity-doped region 225, 226, 227 of the second solid-state imaging device array is connected to a gate 232 via an insulating film.

A p type impurity-doped region 228, 229, 230 of the third solid-state imaging device array is connected to a gate 233 via an insulating film.

The p type impurity-doped region 222, 223, 224 of the first solid-state imaging device array is connected to an electric charge accumulator 213, 214, 215, respectively, comprising an n type diffusion layer carrying a quantity of electric charges which varies in response to a light reception.

The p type impurity-doped region 225, 226, 227 of the second solid-state imaging device array is connected to an electric charge accumulator 216, 217, 218, respectively, comprising an n type diffusion layer carrying a quantity of electric charges which varies in response to a light reception.

The p type impurity-doped region 228, 229, 230 of the third solid-state imaging device array is connected to an electric charge accumulator 219, 220, 221, respectively, comprising an n type diffusion layer carrying a quantity of electric charges which varies in response to a light reception.

An n type diffusion layer 234, 237, 240 in the solid-state imaging device having the p+ diffusion layer 201, 204, 207, respectively, is connected to a signal line 243.

An n type diffusion layer 235, 238, 241 in the solid-state imaging device having the p+ diffusion layer 202, 205, 208, respectively, is connected to a signal line 244.

An n type diffusion layer 236, 239, 242 in the solid-state imaging device having the p+ diffusion layer 203, 206, 209, respectively, is connected to a signal line 245.

Figure 16:
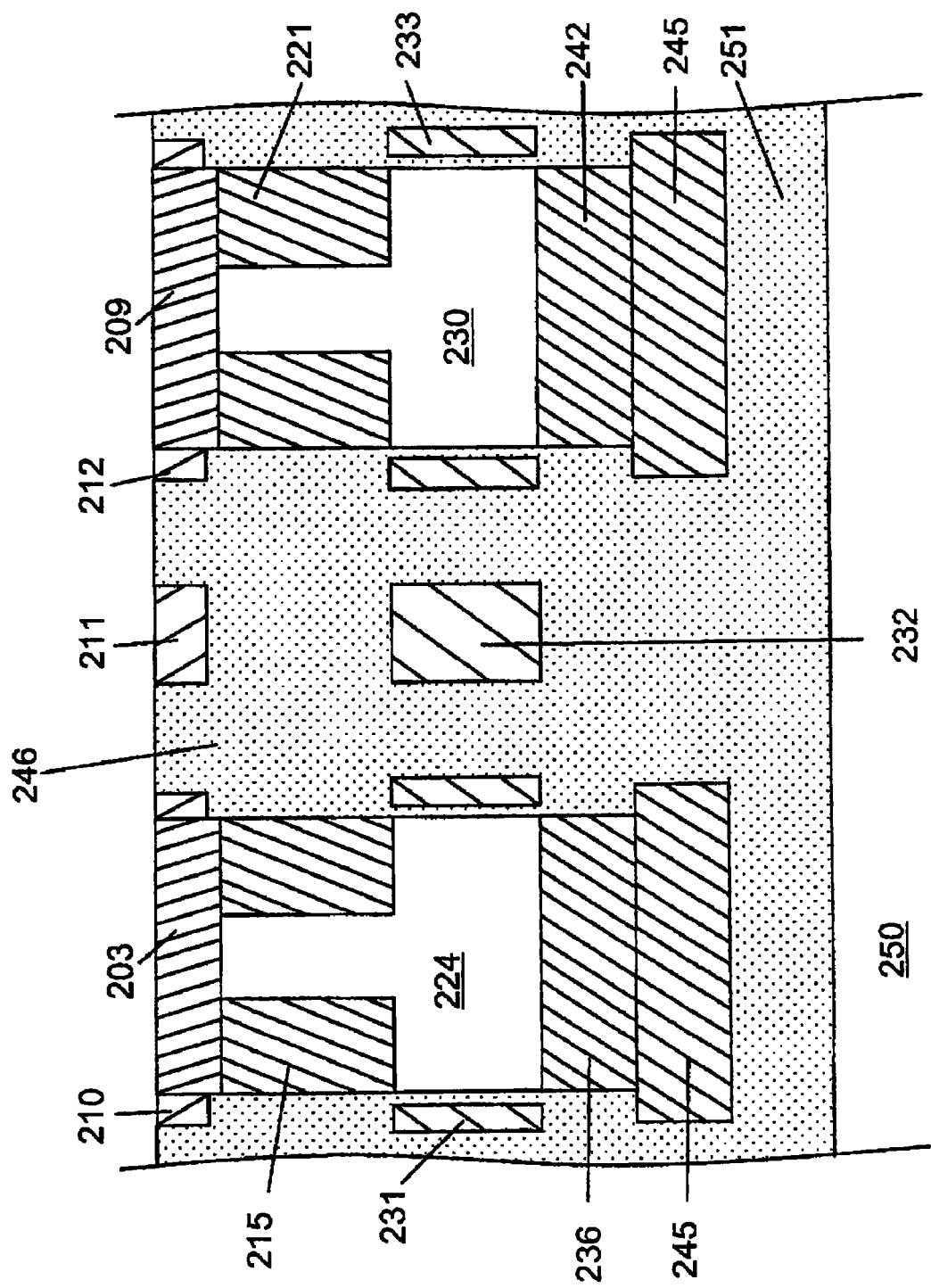
FIG. 16 is a sectional view taken along $X_2$-$X_2'$ line of FIG. 9.
Figure 17:
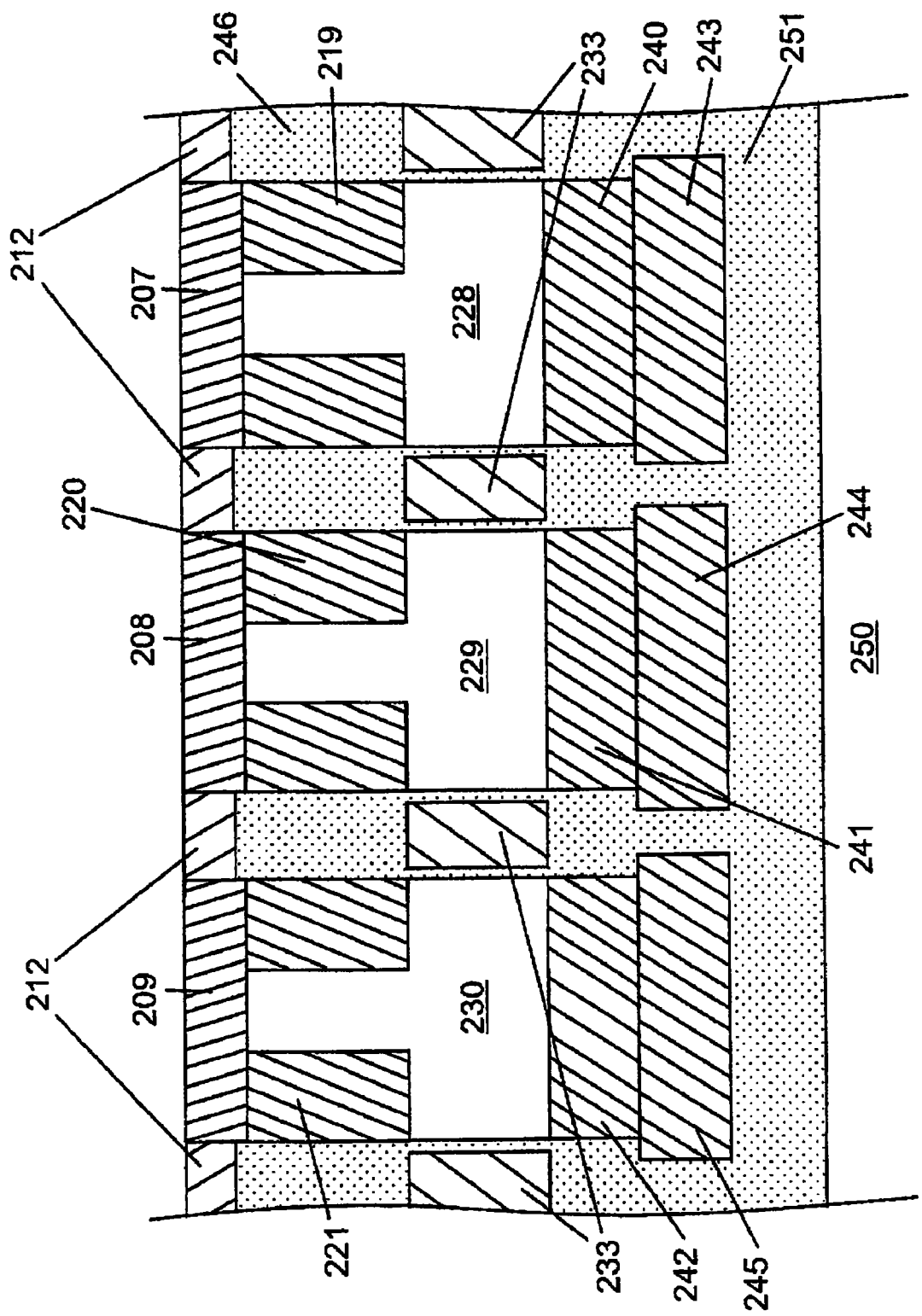
FIG. 17 is a sectional view taken along $Y_2$-$Y_2'$ line of FIG. 9.

Further, FIG. 16 is a sectional view taken along $X_2$-$X_2$' line of FIG. 9 and FIG. 17 is a sectional view taken along $Y_2$-$Y_2$' line of FIG. 9.

An oxide film 251 is formed over a silicon substrate 250 and a signal line 245 is formed over the oxide film 251, and an island shaped semiconductor is formed over the signal line, which island shaped semiconductor comprises:

the n+ type diffusion layer 236 disposed in a lower portion of the island shaped semiconductor and connected to the signal line;

the p type impurity-doped region 224 disposed adjacent to an upper side of the n+ type diffusion layer;

the gate 231 connected to the p type impurity-doped region via an insulating film;

the electric charge accumulator 215 comprising the n type diffusion layer connected to the p type impurity-doped region and carrying a quantity of electric charges which varies in response to a light reception; and the p+ type diffusion layer 203 disposed adjacent to an upper side of the p type impurity-doped region and the n type diffusion layer, and the pixel selection line 210 is formed, which is connected to the p+ type diffusion layer in an upper portion of the island shaped semiconductor, and also the oxide film 251 is formed over the silicon substrate 250 and the signal line 245 is formed over the oxide film 251, and further an island shaped semiconductor is formed over the signal line, which island shaped semiconductor comprises:

the n+ type diffusion layer 242 disposed in a lower portion of the island shaped semiconductor and connected to the signal line;

the p type impurity-doped region 230 disposed adjacent to an upper side of the n+ type diffusion layer;

the gate 233 connected to the p type impurity-doped region via an insulating film;

the electric charge accumulator 221 comprising the n type diffusion layer connected to the p type impurity-doped region and carrying a quantity of electric charges which varies in response to a light reception; and the p+ type diffusion layer 209 disposed adjacent to an upper side of the p type impurity-doped region and the n type diffusion layer, and the pixel selection line 212 is formed, which is connected to the p+ type diffusion layer in an upper portion of the island shaped semiconductor.

The pixel selection line 211 is wired between the pixel selection lines 210 and 212.

The gate 232 is wired between the gates 231 and 233.

An oxide film 246 is formed as the interlayer insulating film.

Similarly, the oxide film 251 is formed over the silicon substrate 250 and the signal line 245 is formed over the oxide film 251, and an island shaped semiconductor is formed over the signal line, which island shaped semiconductor comprises:

the n+ type diffusion layer 242 disposed in a lower portion of the island shaped semiconductor and connected to the signal line;

the p type impurity-doped region 230 disposed adjacent to an upper side of the n+ type diffusion layer;

the gate 233 connected to the p type impurity-doped region via an insulating film;

the electric charge accumulator 221 comprising the n type diffusion layer connected to the p type impurity-doped region and carrying a quantity of electric charges which varies in response to a light reception; and the p+ type diffusion layer 209 disposed adjacent to an upper side of the p type impurity-doped region and the n type diffusion layer, and the pixel selection line 212 is formed, which is connected to the p+ type diffusion layer in an upper portion of the island shaped semiconductor.

The oxide film 251 is formed over the silicon substrate 250 and the signal line 244 is formed over the oxide film 251, and an island shaped semiconductor is formed over the signal line, which island shaped semiconductor comprises:

the n+ type diffusion layer 241 disposed in a lower portion of the island shaped semiconductor and connected to the signal line;

the p type impurity-doped region 2329 disposed adjacent to an upper side of the n+ type diffusion layer;

the gate 233 connected to the p type impurity-doped region via an insulating film;

the electric charge accumulator 220 comprising the n type diffusion layer connected to the p type impurity-doped region and carrying a quantity of electric charges which varies in response to a light reception; and the p+ type diffusion layer 208 disposed adjacent to an upper side of the p type impurity-doped region and the n type diffusion layer, and the pixel selection line 212 is formed, which is connected to the p+ type diffusion layer in an upper portion of the island shaped semiconductor.

The oxide film 251 is formed over the silicon substrate 250 and the signal line 245 is formed over the oxide film 251, and an island shaped semiconductor is formed over the signal line, which island shaped semiconductor comprises:

the n+ type diffusion layer 240 disposed in a lower portion of the island shaped semiconductor and connected to the signal line;

the p type impurity-doped region 228 disposed adjacent to an upper side of the n+ type diffusion layer;

the gate 233 connected to the p type impurity-doped region via an insulating film;

the electric charge accumulator 219 comprising the n type diffusion layer connected to the p type impurity-doped region and carrying a quantity of electric charges which varies in response to a light reception; and the p+ type diffusion layer 207 disposed adjacent to an upper side of the p type impurity-doped region and the n type diffusion layer, and the pixel selection line 212 is formed, which is connected to the p+ type diffusion layer in an upper portion of the island shaped semiconductor.

An oxide film 246 is formed as the interlayer insulating film.

Figure 18:
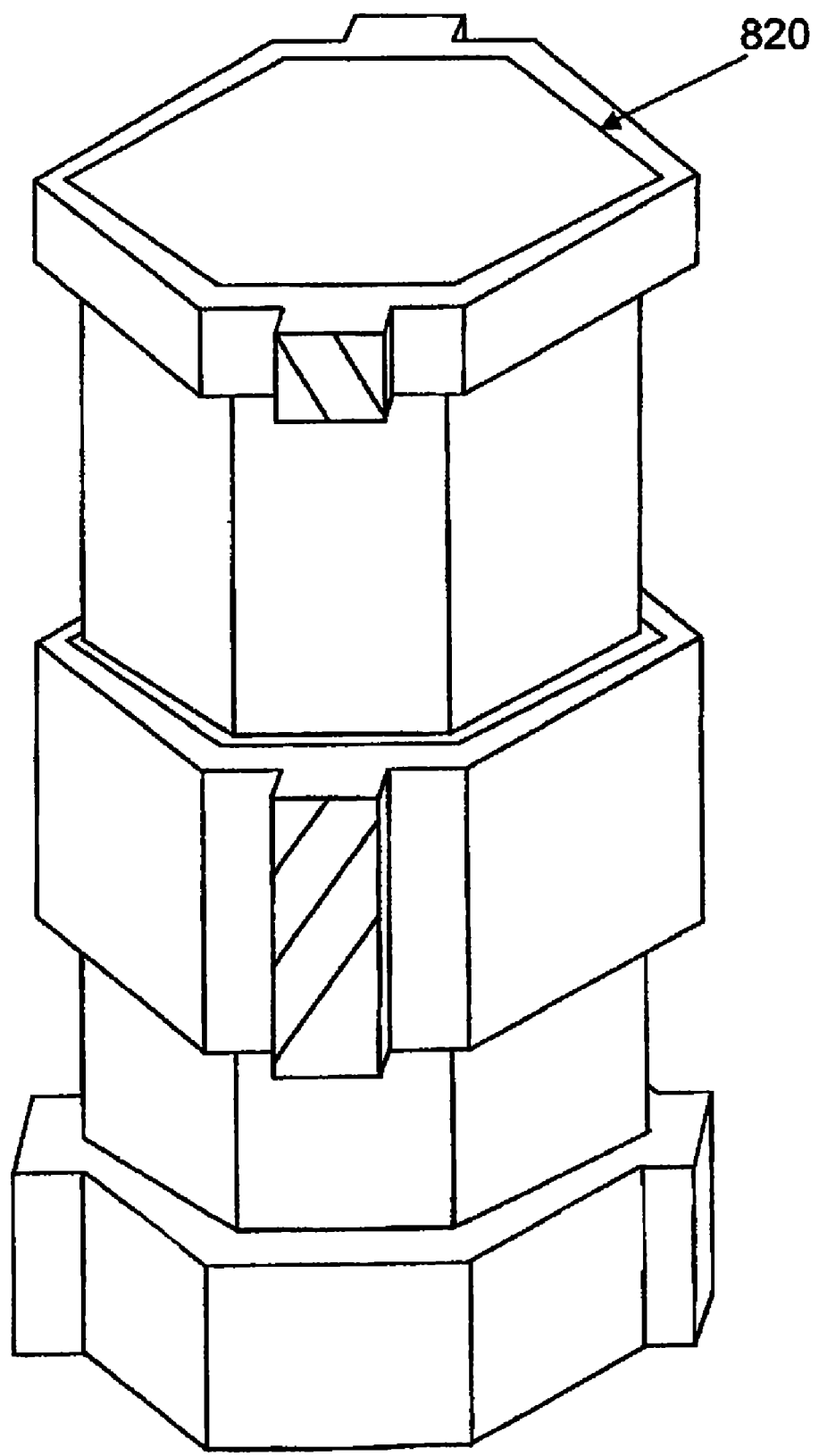
FIG. 18 is a bird's eye view showing an alternative embodiment according to the present invention.

Although the solid-state imaging device including the island shaped semiconductor that is fabricated to have the circular column configuration is used in the embodiment, the solid-state imaging device including such an island shaped semiconductor 820 having a hexagonal column configuration as shown in FIG. 18 may be used.

Figure 19:
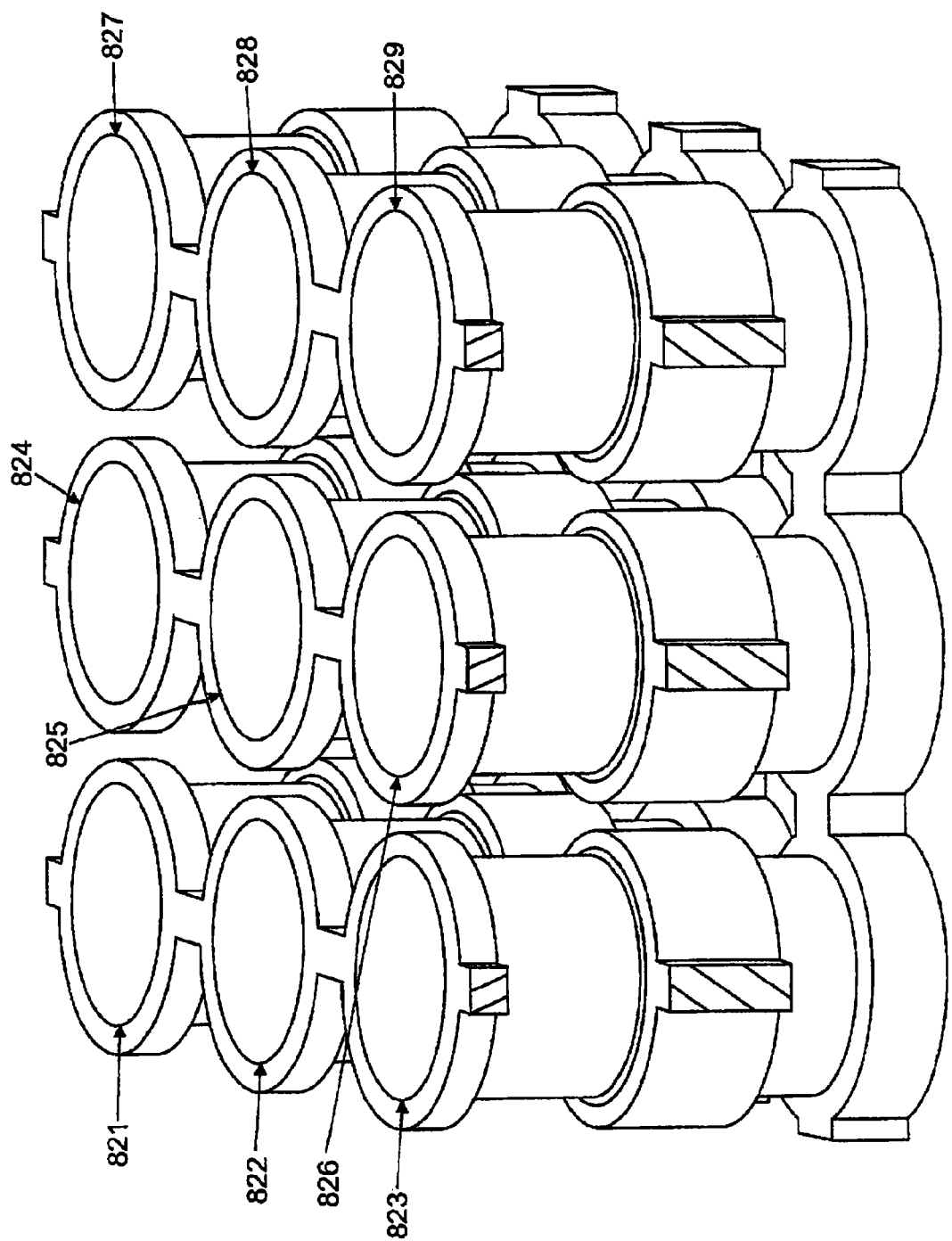
FIG. 19 is a bird's eye view showing another alternative embodiment according to the present invention.

In addition, although the embodiment illustrates the solid-state imaging device arrays comprising the solid-state imaging devices, each having the island shaped semiconductor in the circular column configuration, arranged in such a manner that the first array of solid-state imaging devices, the second array of solid-state imaging devices and the third array of solid-state imaging devices, which are arranged adjacently with each other, are disposed with a horizontal interval equal to the vertical pixel pitch multiplied by √3/2 (horizontal pixel pitch, HP) therebetween, specifically illustrating the solid-state imaging device arrays constructed with the solid-state imaging devices arranged in the honey comb configuration, alternatively, as shown in FIG. 19, it can be a solid-state imaging device matrix (a solid-state imaging device unit) comprising the solid-state imaging devices arranged on the substrate into a n-row×m-column (n and m no smaller than 1), each devices having the island shaped semiconductors 821, 822, 823, 824, 825, 826, 827, 828 and 829, in the circular column configuration.

Figure 20:
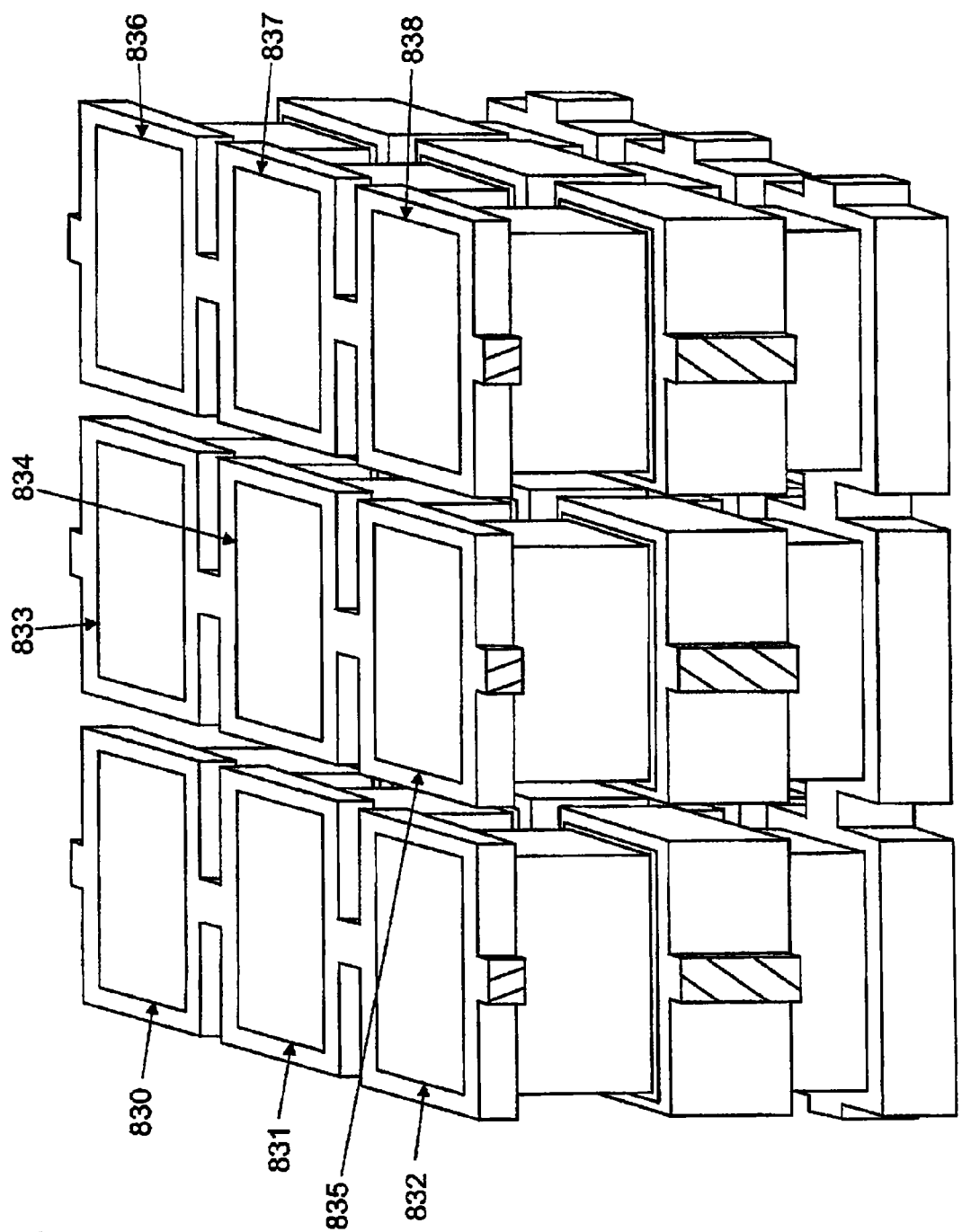
FIG. 20 is a bird's eye view showing yet another alternative embodiment according to the present invention.

Further, although the embodiment illustrates the solid-state imaging device arrays comprising the solid-state imaging devices, each having the island shaped semiconductor in the circular column configuration, arranged in such a manner that the first array of solid-state imaging devices, the second array of solid-state imaging devices and the third array of solid-state imaging devices, which are arranged adjacently with each other, are disposed with a horizontal interval equal to the vertical pixel pitch multiplied by √3/2 (horizontal pixel pitch, HP) therebetween, specifically illustrating the solid-state imaging device arrays constructed with the solid-state imaging devices arranged in the honey comb configuration, alternatively, as shown in FIG. 20, it can be a solid-state imaging device matrix (a solid-state imaging device unit) comprising the solid-state imaging devices arranged on the substrate into a n-row×m-column (n and m no smaller than 1), each devices having the island shaped semiconductors 830, 831, 832, 833, 834, 835, 836, 837 and 838, in the square column configuration.

In these ways as stated above, the shape of the solid-state imaging device may be circular, hexagonal or square column. Further, the configuration of the solid-state imaging device may be a polygonal column having five or more sides. Further, the arrangement of the solid-state imaging devices on the substrate may be in the honey comb arrangement or in the matrix arrangement, depending on the column configuration of the island shaped semiconductor layers. What is important is that the solid-state imaging devices should be arranged on the substrate in conformity to the column configuration inherent to the specific solid-state imaging devices so that the density of the solid-state imaging devices when they have been arranged on the substrate can be increased. Arranging the solid-state imaging devices on the substrate in conformity with the column configuration inherent to the specific solid-state imaging devices can increase the ratio of the surface area of the light receiving element of the solid-state imaging device to the surface area of one pixel in the solid-state imaging device matrix (solid-state imaging device unit).

An example of a production process for fabricating a structure of a solid-state imaging device according to the present invention will be described below, with reference to FIGS. 21-80.

FIGS. 21, 23, 25, 27, 29, 31, 33, 35, 37, 39, 41, 43, 45, 47, 49, 51, 53, 55, 57, 59, 61, 63, 65, 67, 69, 71, 73, 75, 77 and 79 are top views.

Figure 22A:
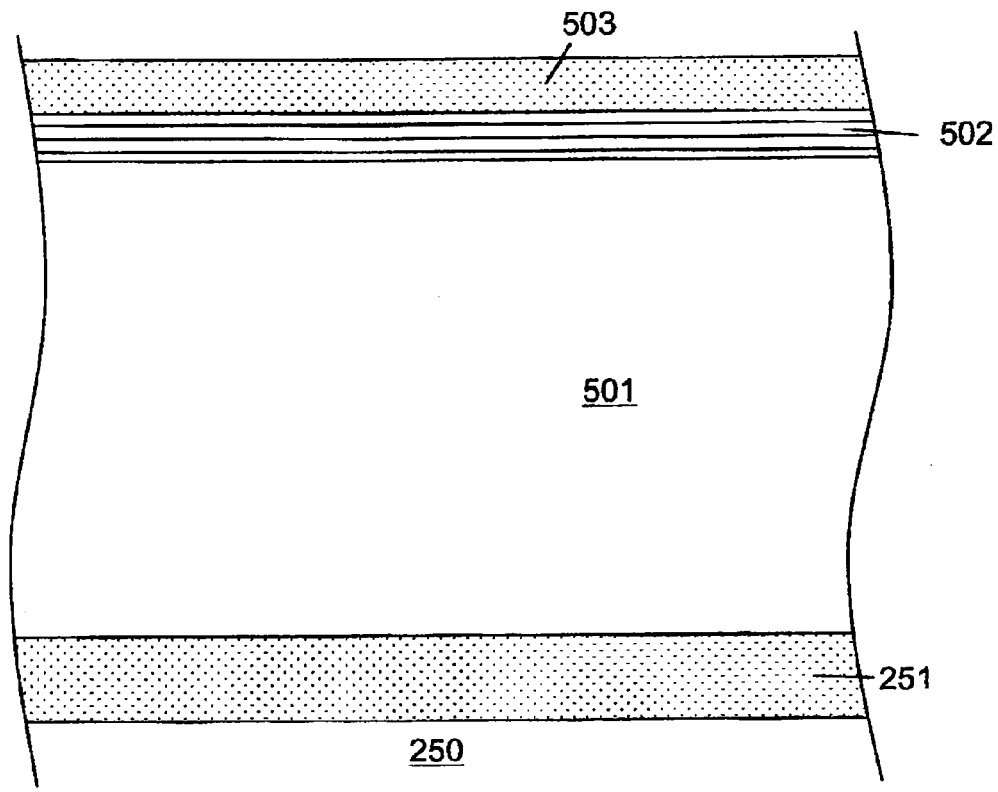
FIG. 22(a) is a process drawing in a sectional view taken along the $X_3$-$X_3'$ line of FIG. 21 illustrating the exemplary production of a solid-state imaging device according to the present invention.
Figure 22B:
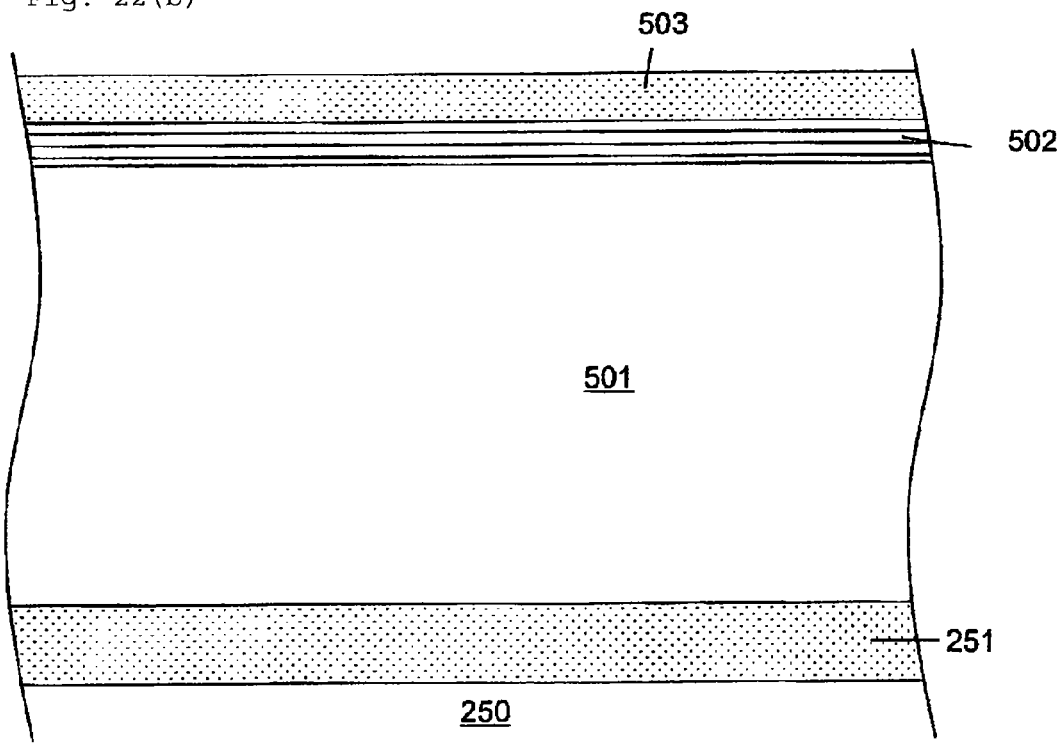
FIG. 22(*b*) is a process drawing in a sectional view taken along the Y$_3$-Y$_3$' line of FIG. 21 illustrating the exemplary production of a solid-state imaging device according to the present invention.
Figure 23:
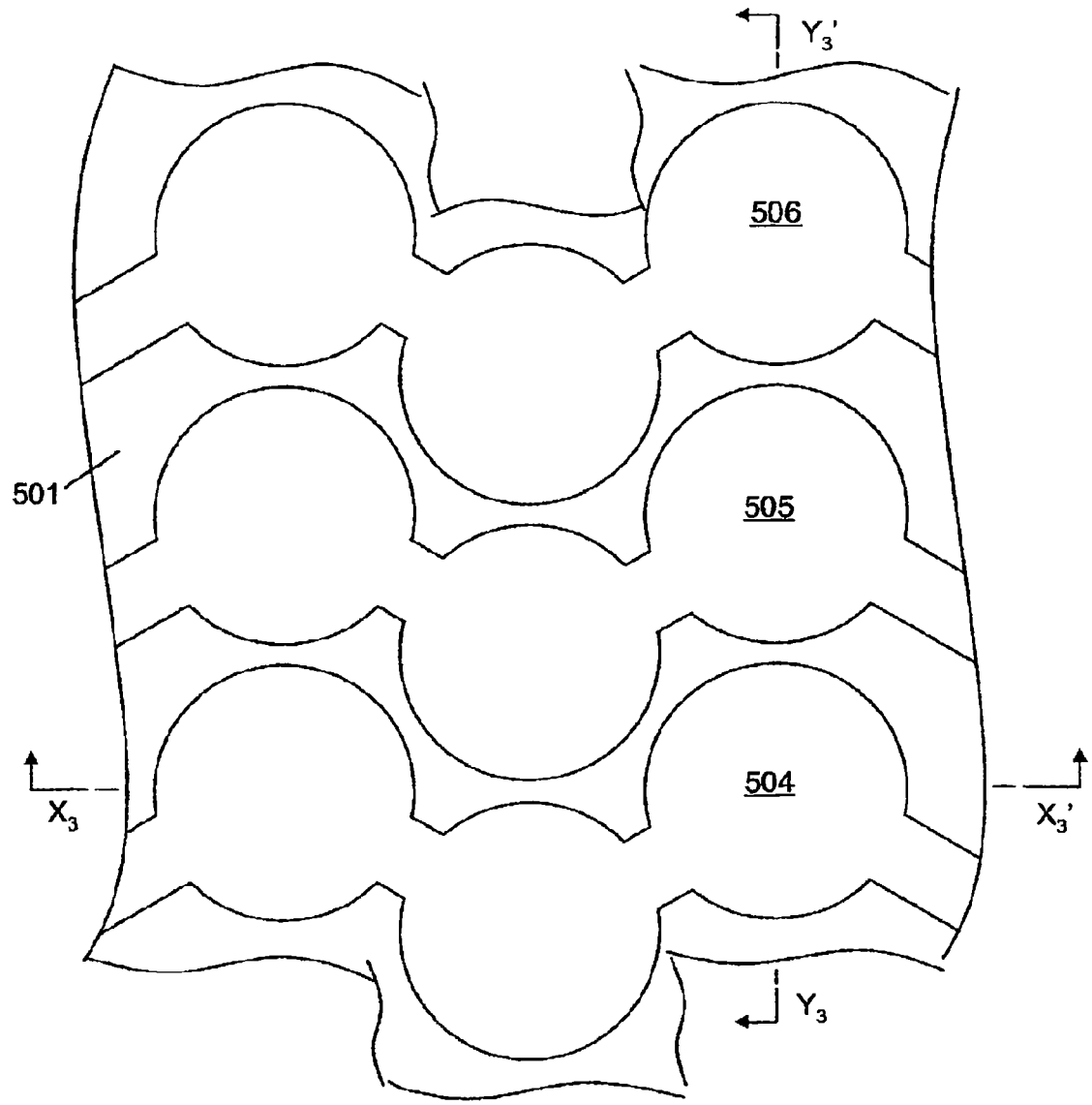
FIG. 23 is a top view showing an exemplary production of a solid-state imaging device according to the present invention.

FIGS. 22(*a*), 24(*a*), 26(*a*), 28(*a*), 30(*a*), 32(*a*), 34(*a*), 36(*a*), 38(*a*), 40(*a*), 42(*a*), 44(*a*), 46(*a*), 48(*a*), 50(*a*), 52(*a*), 54(*a*), 56(*a*), 58(*a*), 60(*a*), 62(*a*), 64(*a*), 66(*a*), 68(*a*), 70(*a*), 72(*a*), 74(*a*), 76(*a*), 78(*a*) and 80(*a*) are sectional views taken along the X$_3$-X$_3$' lines of those top views.

FIGS. 22(*b*), 24(*b*), 26(*b*), 28(*b*), 30(*b*), 32(*b*), 34(*b*), 36(*b*), 38(*b*), 40(*b*), 42(*b*), 44(*b*), 46(*b*), 48(*b*), 50(*b*), 52(*b*), 54(*b*), 56(*b*), 58(*b*), 60(*b*), 62(*b*), 64(*b*), 66(*b*), 68(*b*), 70(*b*), 72(*b*), 74(*b*), 76(*b*), 78(*b*) and 80(*b*) are sectional views taken along the Y$_3$-Y$_3$' lines of those top views.

Figure 21:
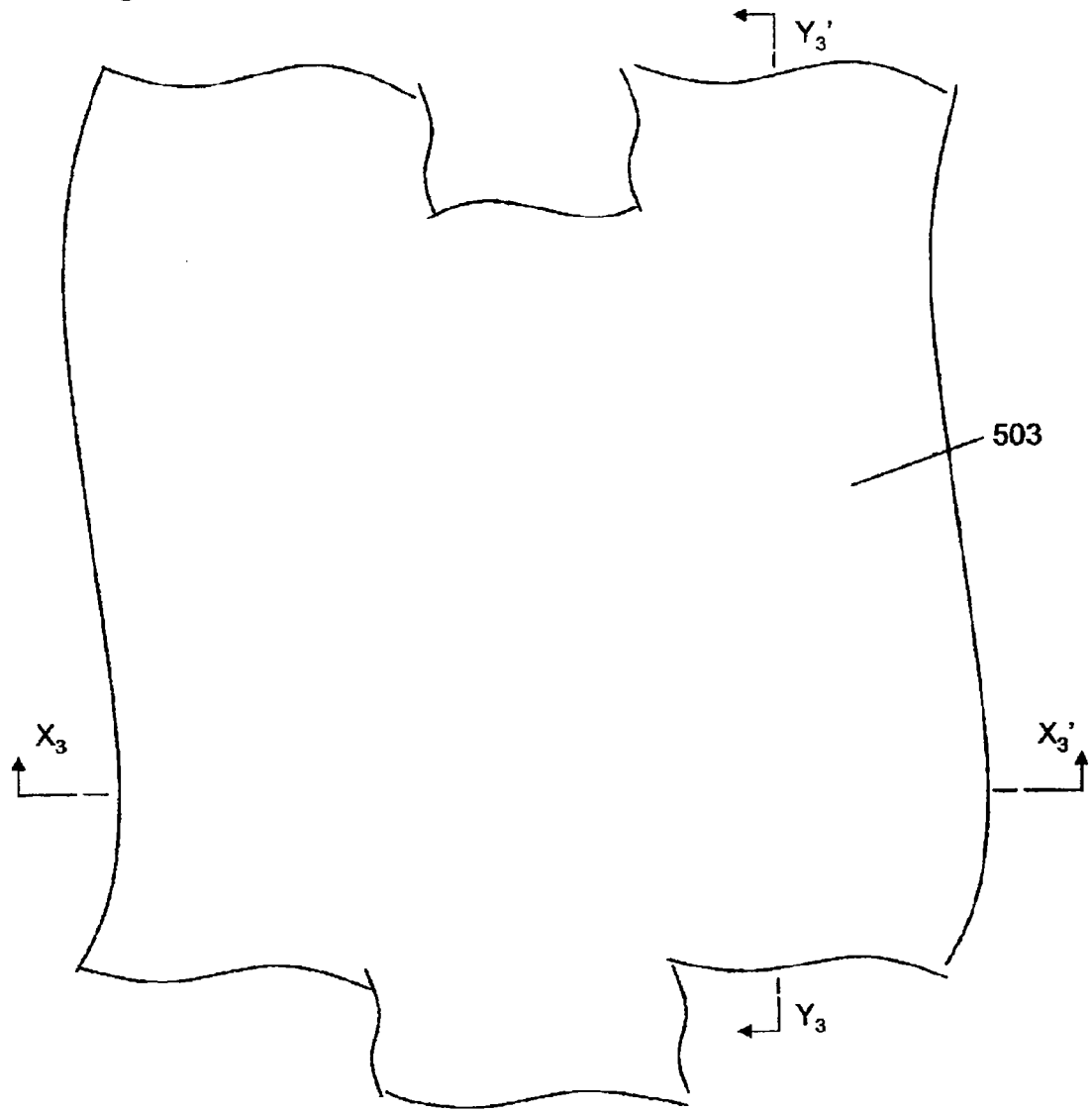
FIG. 21 is a top view showing an exemplary production of a solid-state imaging device according to the present invention.

Initially, the oxide film 251 is formed over the silicon substrate 250, a p type silicon 501 is formed over the oxide film 251, a nitride film (SiN) 502 is deposited over the p type silicon 501 and a silicon oxide film 503 is deposited on the top (FIG. 21 and FIGS. 22(*a*) and 22(*b*)).

Figure 24A:
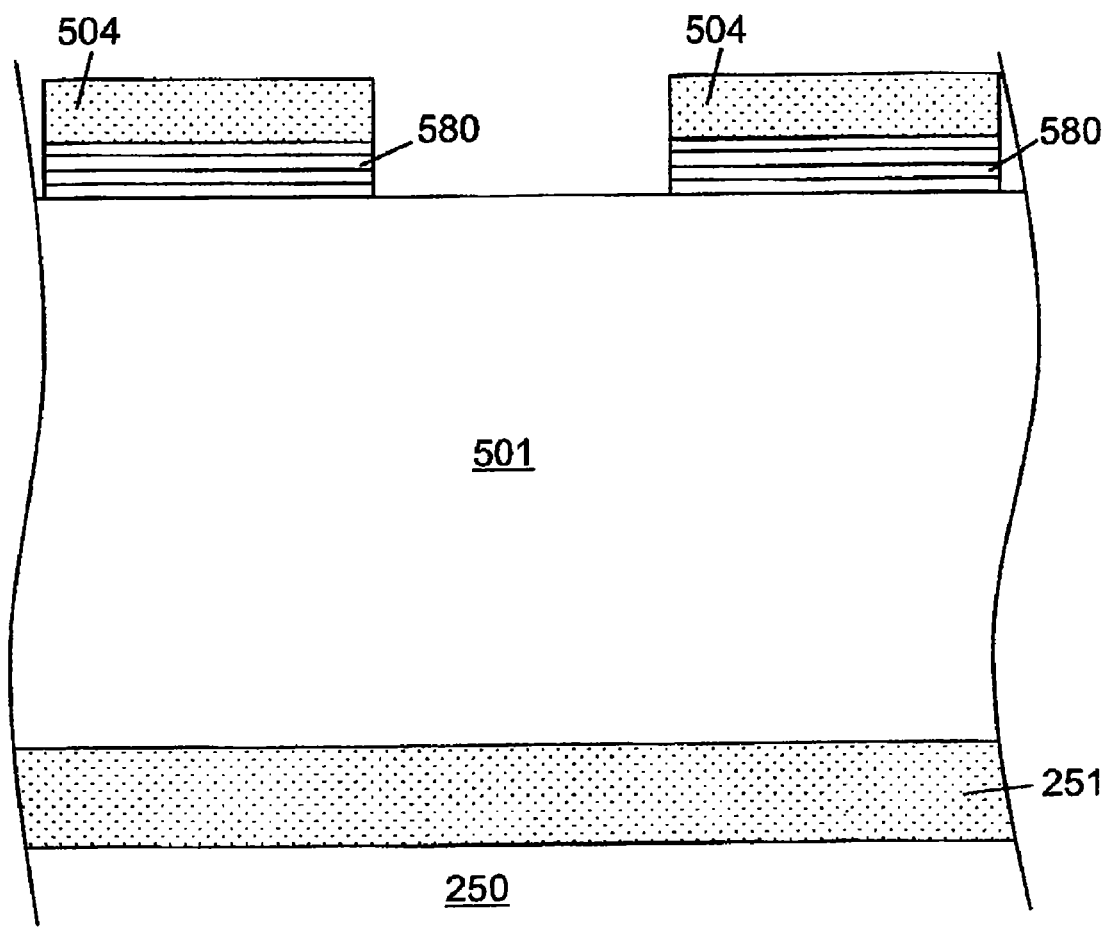
FIG. 24(*a*) is a process drawing in a sectional view taken along the X$_3$-X$_3$' line of FIG. 23 illustrating the exemplary production of a solid-state imaging device according to the present invention.
Figure 24B:
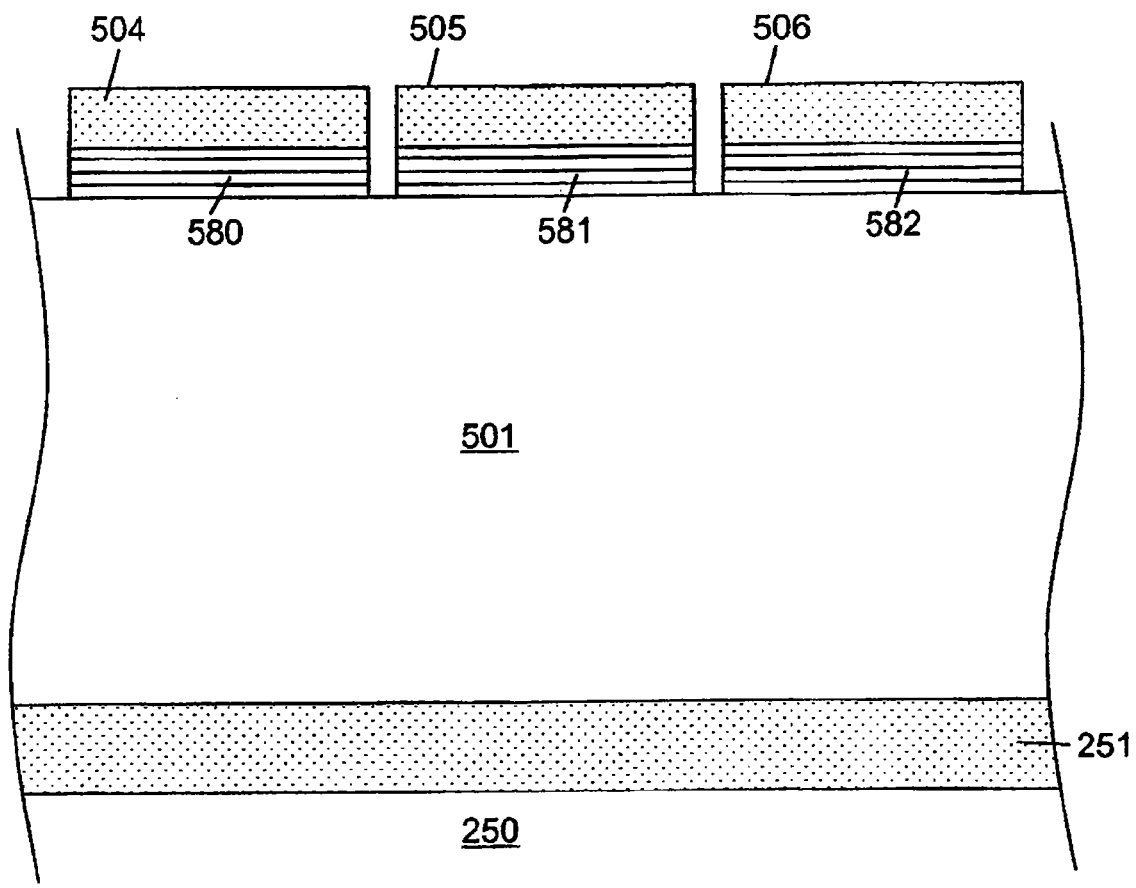

After a resist has been formed, an oxide film etching and then a nitride film etching are performed, the resist is removed, and then a nitride film mask 580, 581, 582 and an oxide film mask 504, 505, 506 are formed. (FIG. 23 and FIGS. 24(*a*) and 24(*b*)).

Figure 25:
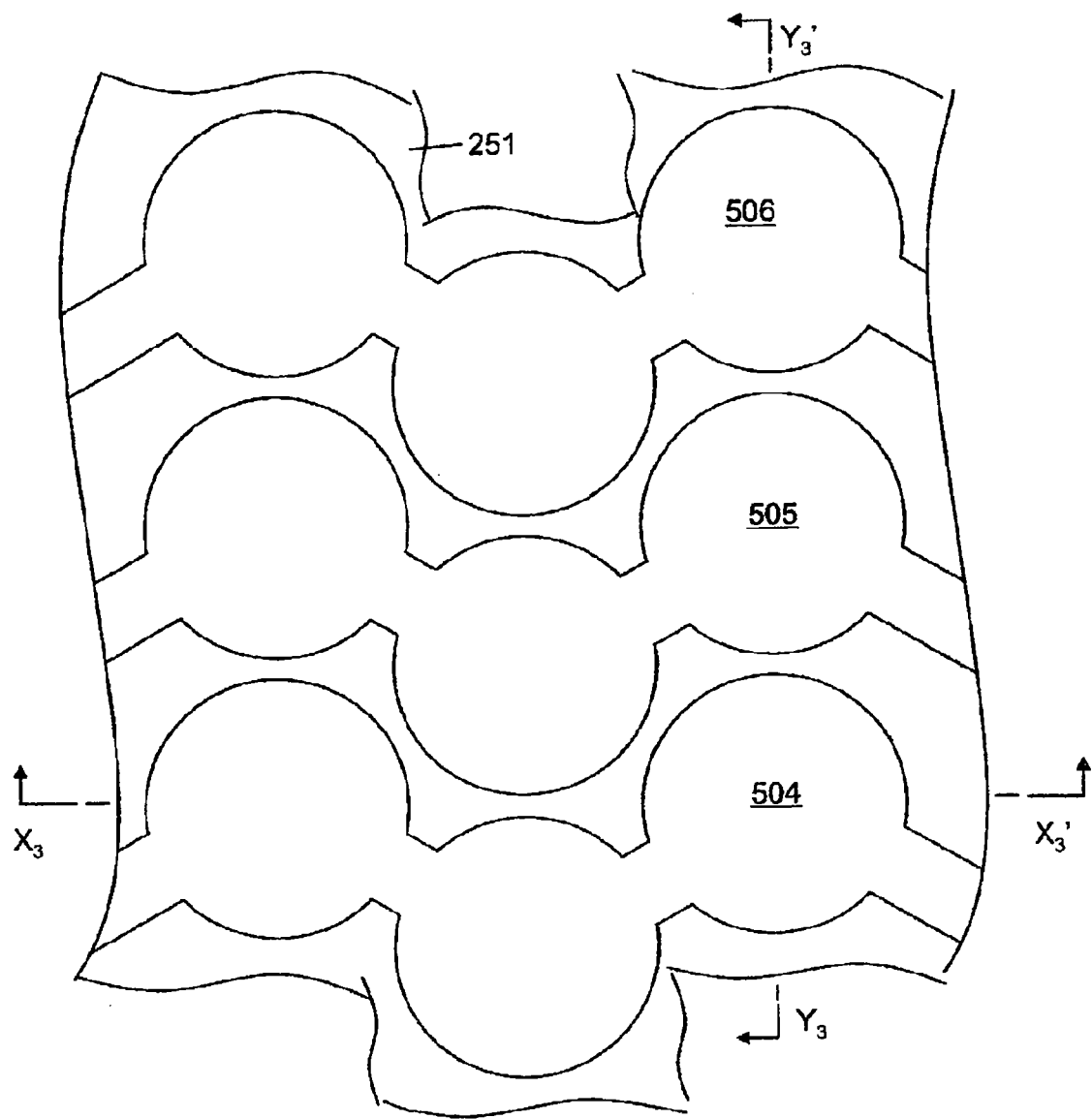
FIG. 25 is a top view showing an exemplary production of a solid-state imaging device according to the present invention.
Figure 26A:
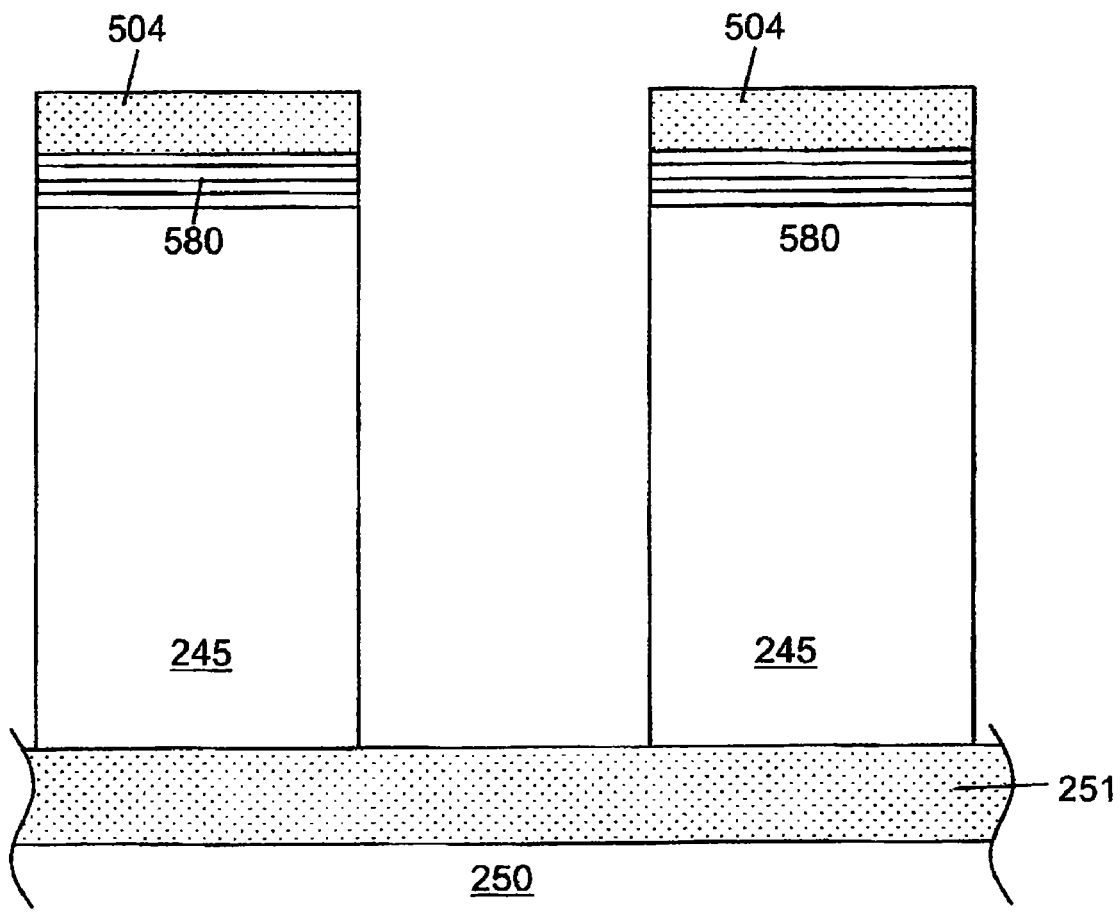
FIG. 26(*a*) is a process drawing in a sectional view taken along the X$_3$-X$_3$' line of FIG. 25 illustrating the exemplary production of a solid-state imaging device according to the present invention.
Figure 26B:
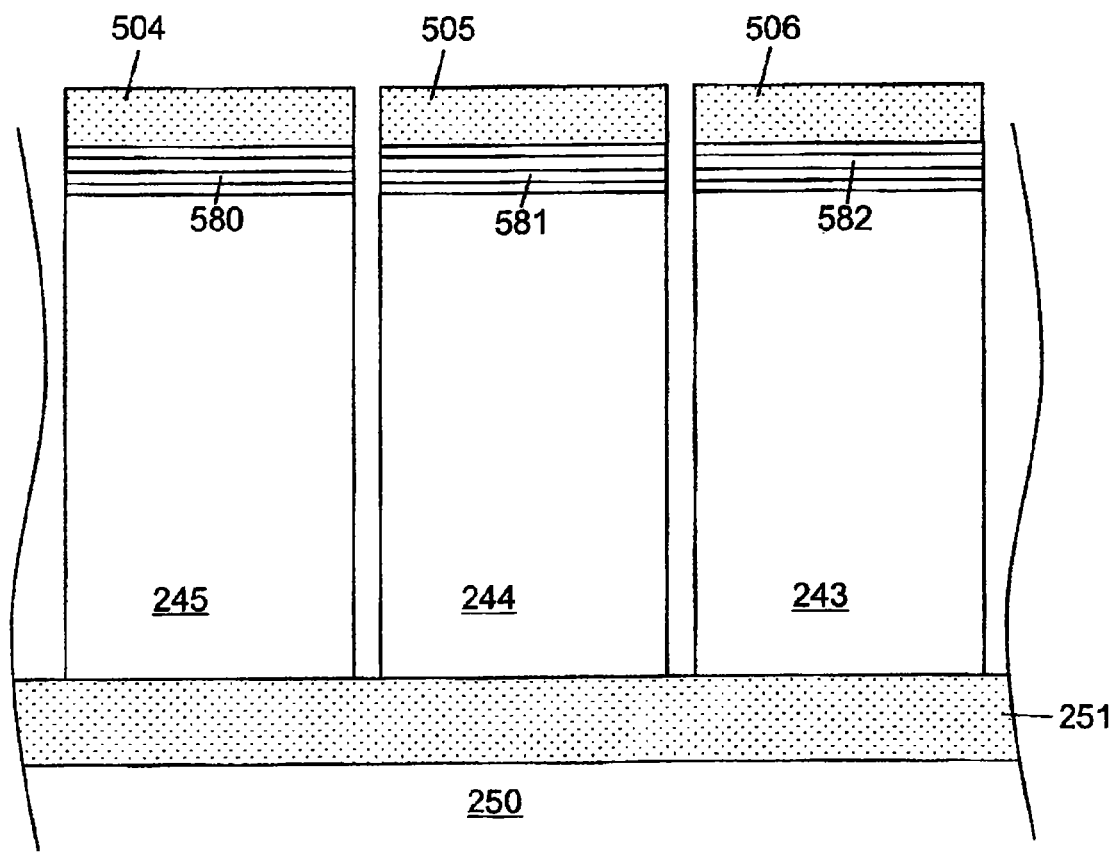

The p type silicon is then etched to form the signal line 243, 244, 245 (FIG. 25 and FIGS. 26(*a*) and 26(*b*)).

Figure 27:
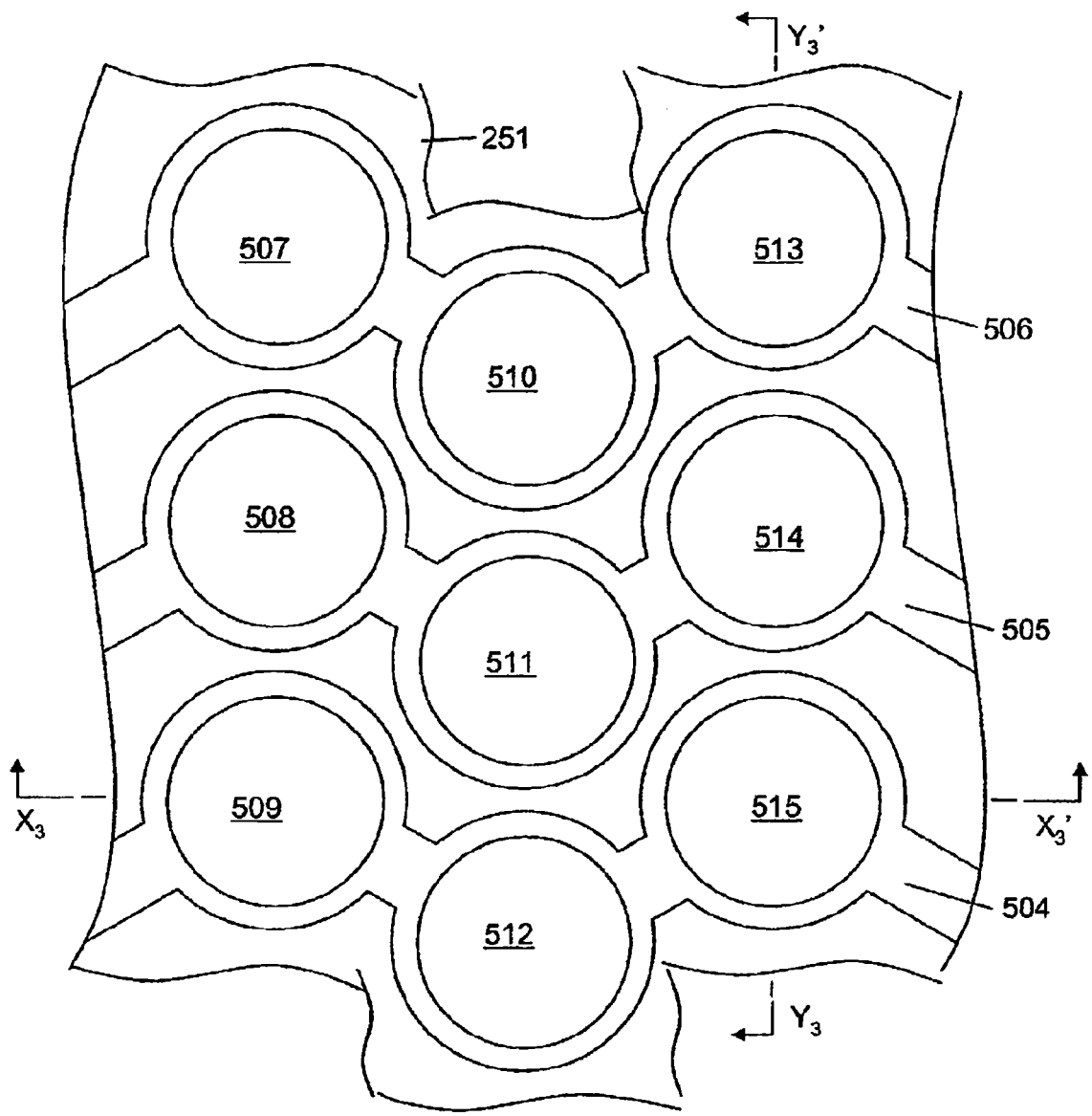
FIG. 27 is a top view showing an exemplary production of a solid-state imaging device according to the present invention.
Figure 28B:
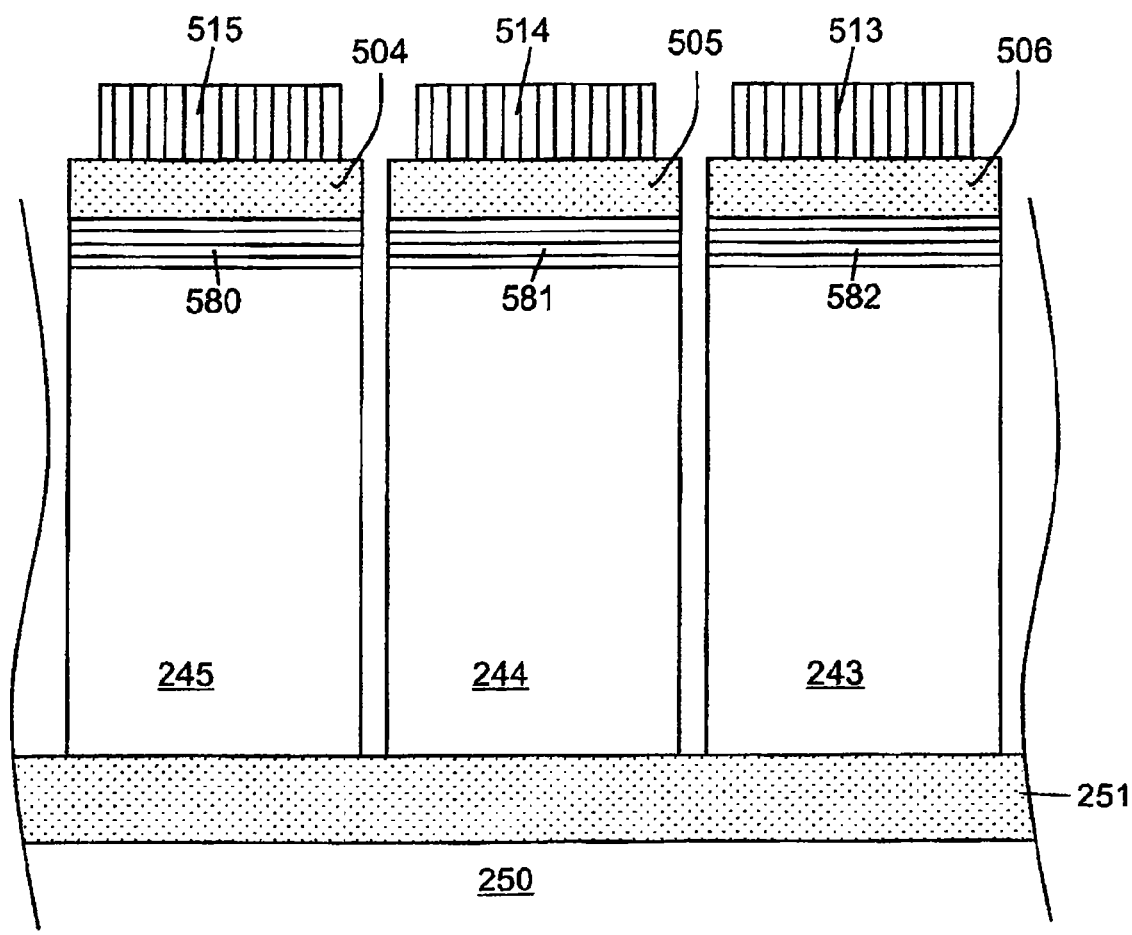
FIG. 28(*a*) is a process drawing in a sectional view taken along the X$_3$-X$_3$' line of FIG. 27 illustrating the exemplary production of a solid-state imaging device according to the present invention.

A resist 507, 508, 509, 510, 511, 512, 513, 514, 515 is formed (FIG. 27 and FIGS. 28(*a*) and 28(*b*)).

Figure 29:
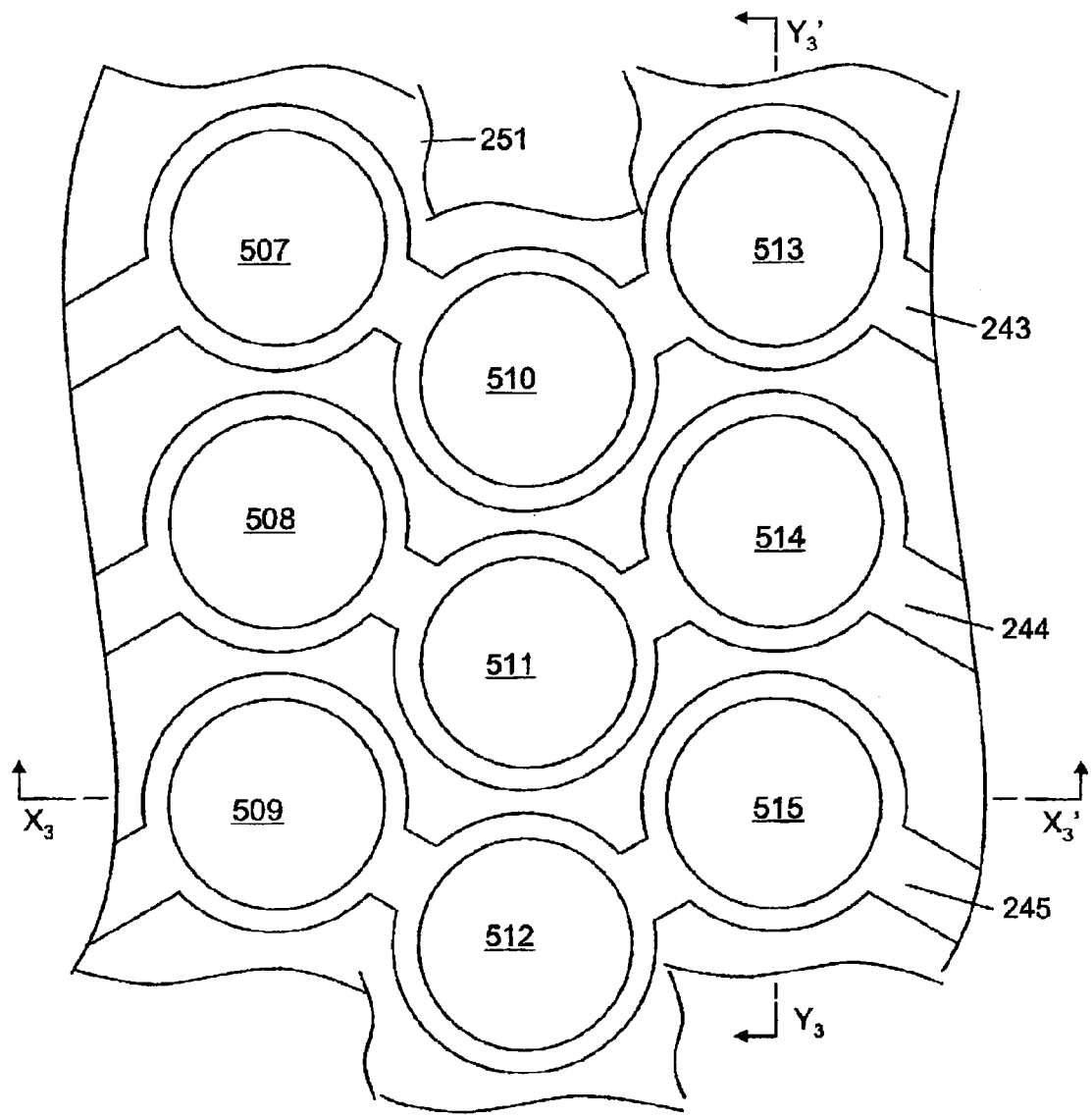
FIG. 29 is a top view showing an exemplary production of a solid-state imaging device according to the present invention.
Figure 30A:
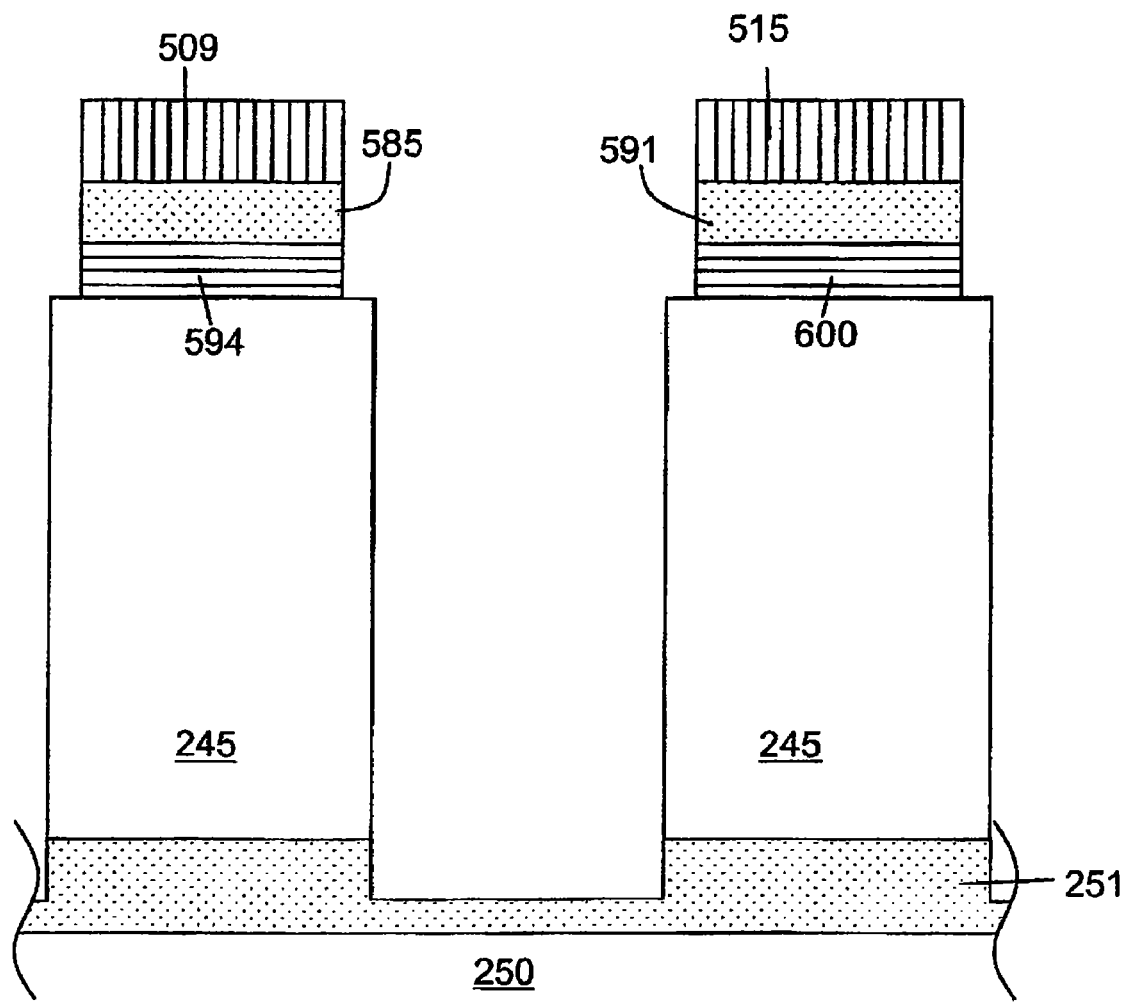
FIG. 30(*a*) is a process drawing in a sectional view taken along the X$_3$-X$_3$' line of FIG. 29 illustrating the exemplary production of a solid-state imaging device according to the present invention.
Figure 30B:
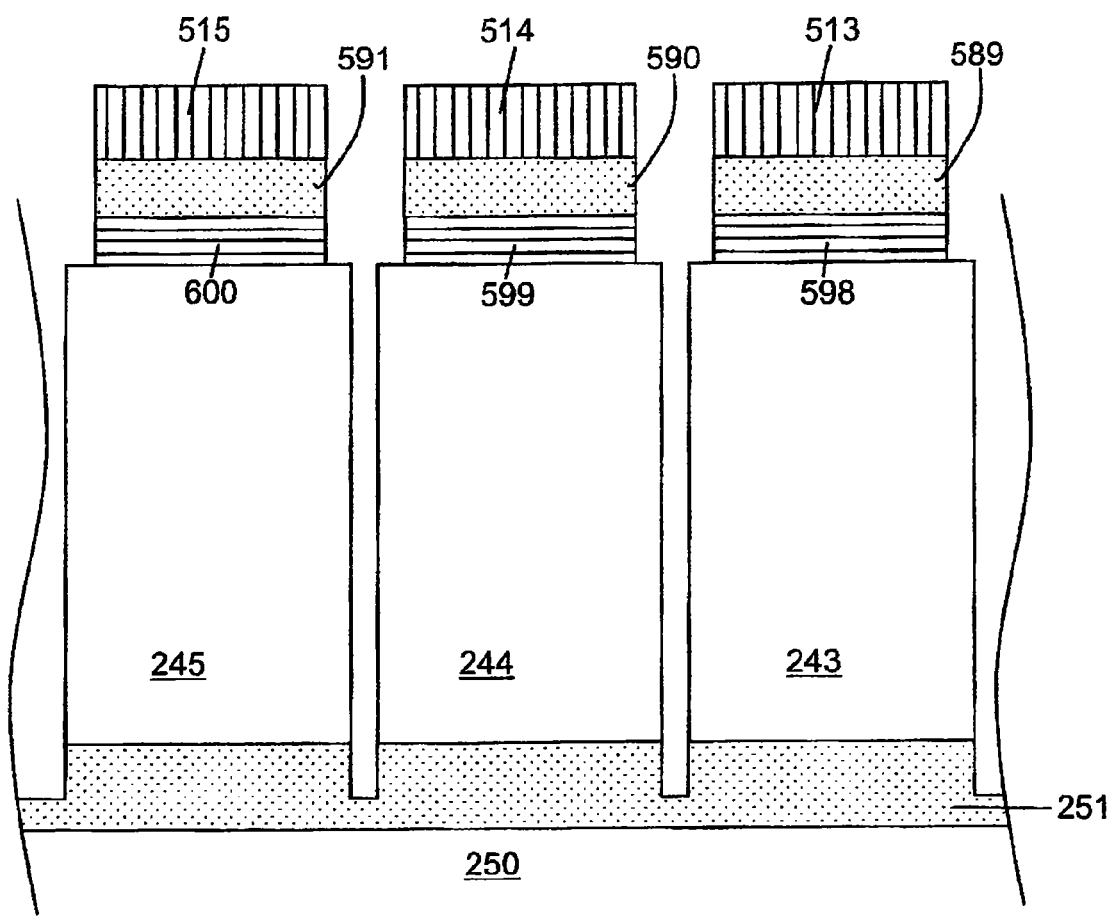

The oxide film and the nitride film are etched to form the oxide film mask 583, 584, 585, 586, 587, 588, 589, 590, 591 as well as the nitride film mask 592, 593, 594, 595, 596, 597, 598, 599, 600 (FIG. 29 and FIGS. 30(*a*) and 30(*b*)).

Figure 31:
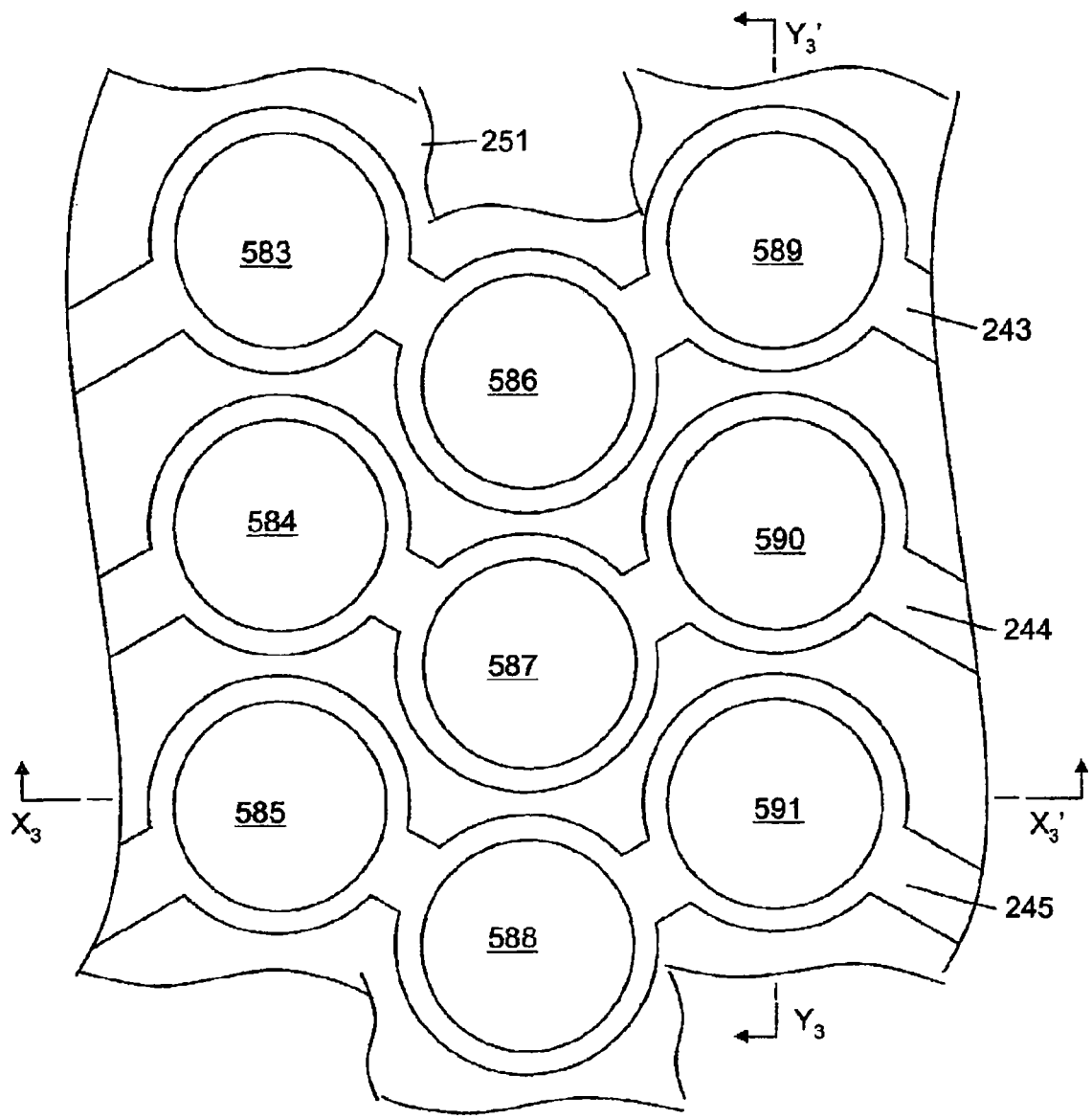
FIG. 31 is a top view showing an exemplary production of a solid-state imaging device according to the present invention.
Figure 32A:
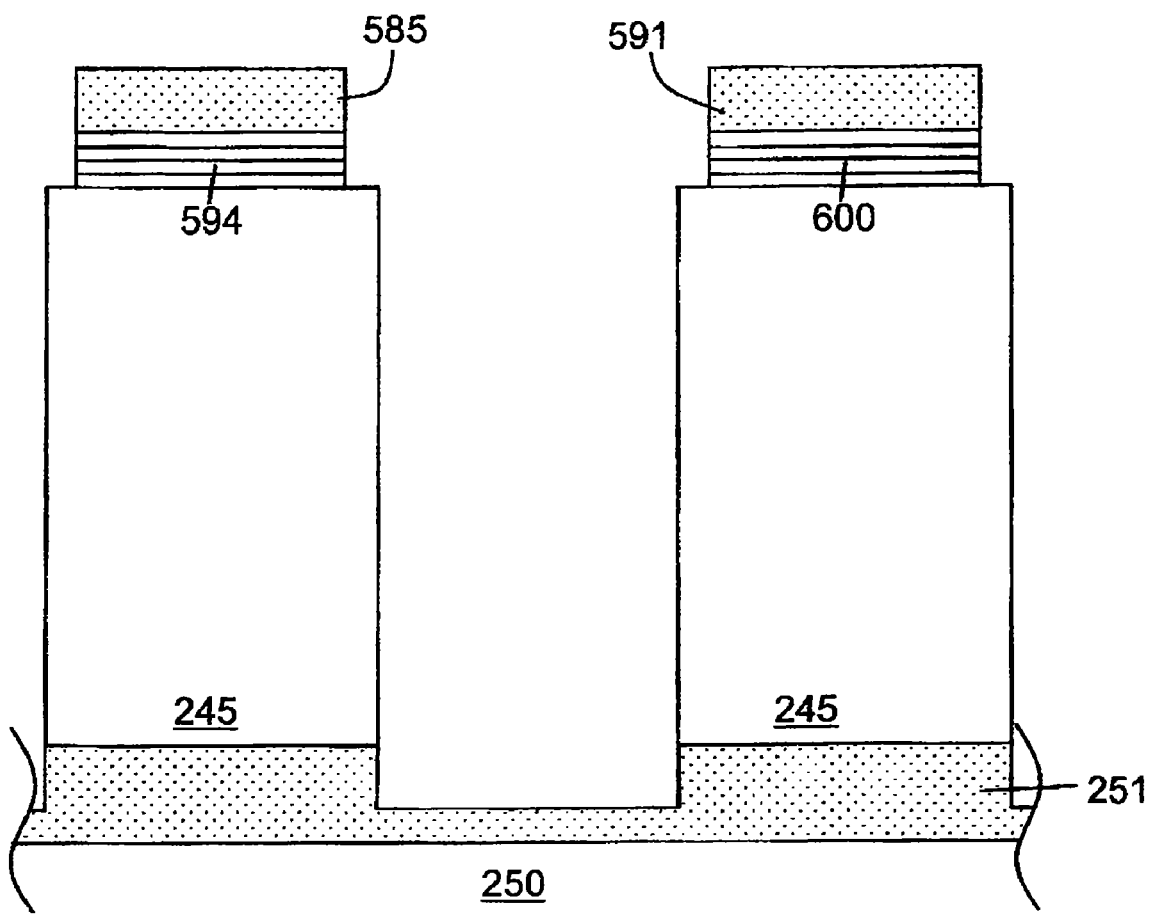
FIG. 32(*a*) is a process drawing in a sectional view taken along the X$_3$-X$_3$' line of FIG. 31 illustrating the exemplary production of a solid-state imaging device according to the present invention.
Figure 32B:
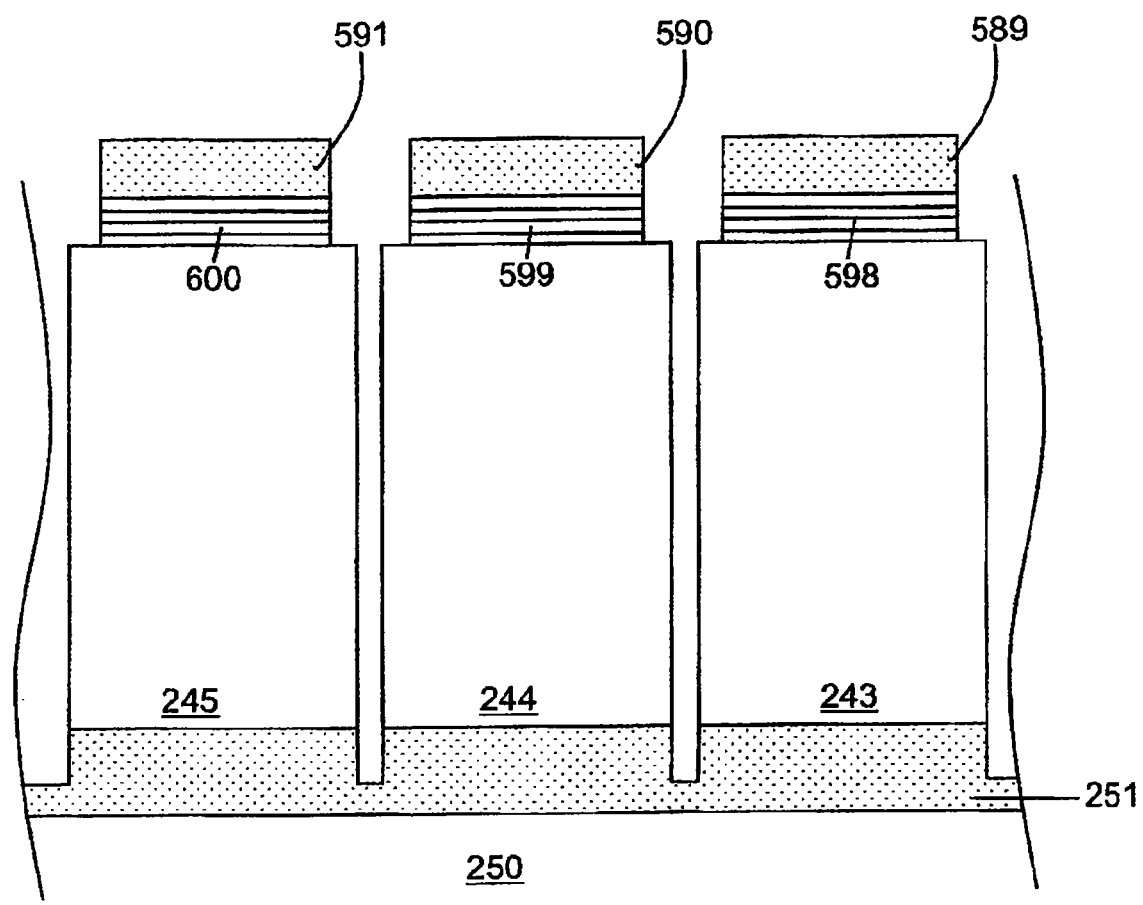

The resist is then removed (FIG. 31 and FIGS. 32(*a*) and 32(*b*).

Figure 34A:
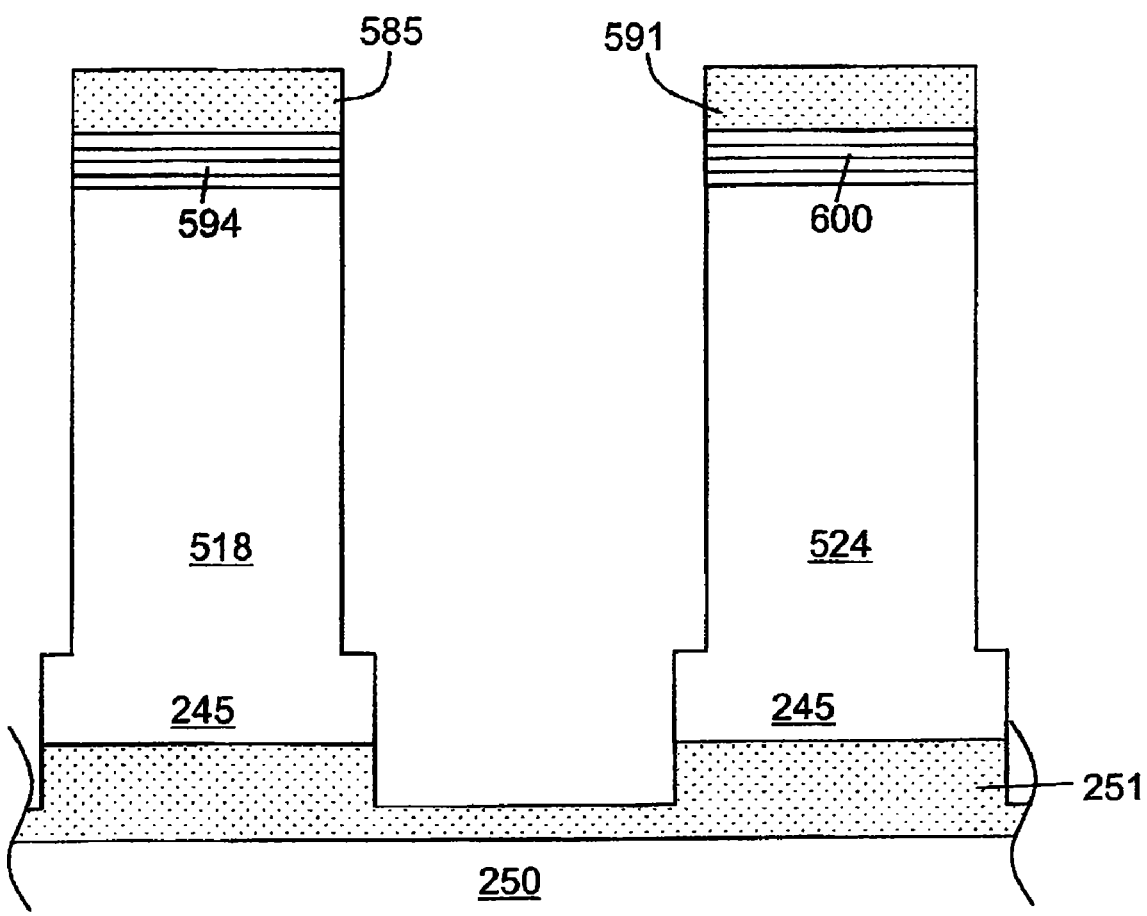
FIG. 34(*a*) is a process drawing in a sectional view taken along the X$_3$-X$_3$' line of FIG. 33 illustrating the exemplary production of a solid-state imaging device according to the present invention.
Figure 34B:
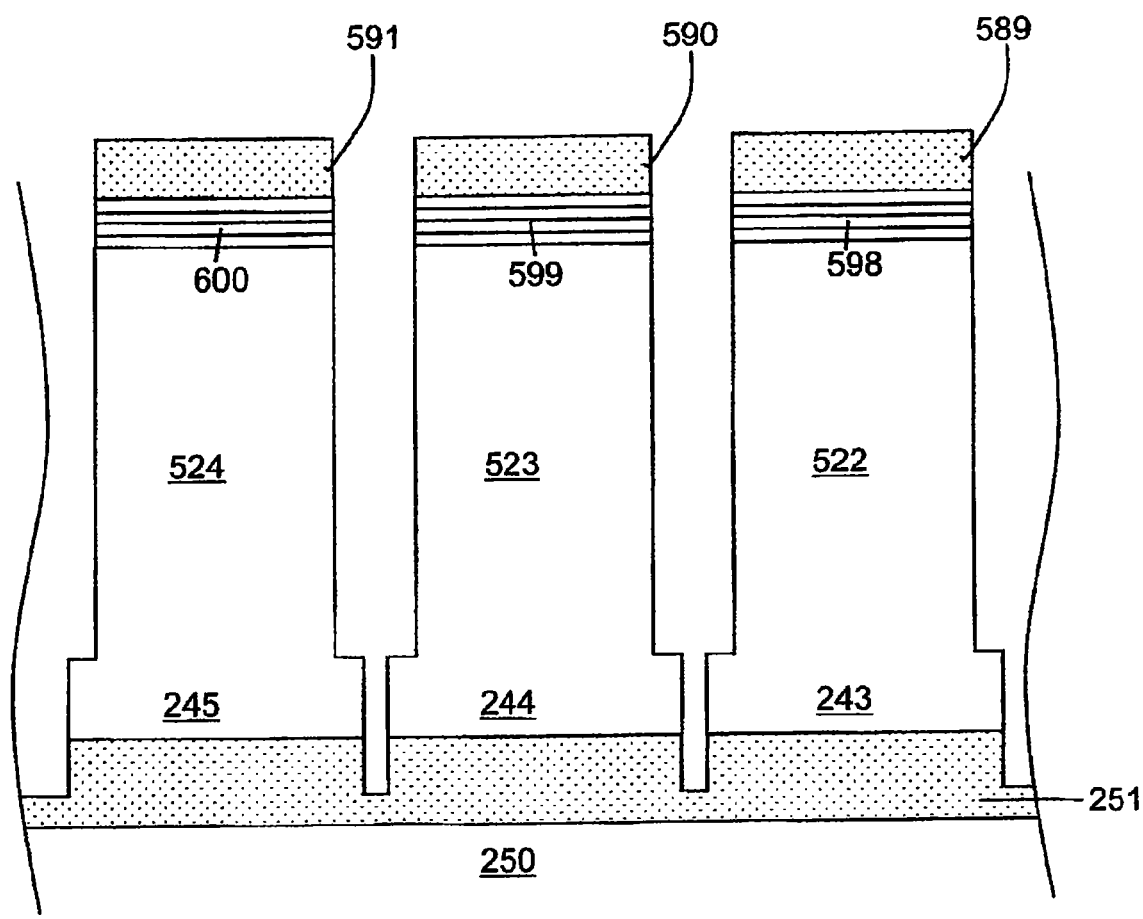

The p type silicon is etched to form an island shaped semiconductor 516, 517, 518, 519, 520, 521, 522, 523, 524 (FIG. 33 and FIGS. 34(*a*) and 34(*b*)).

Figure 35:
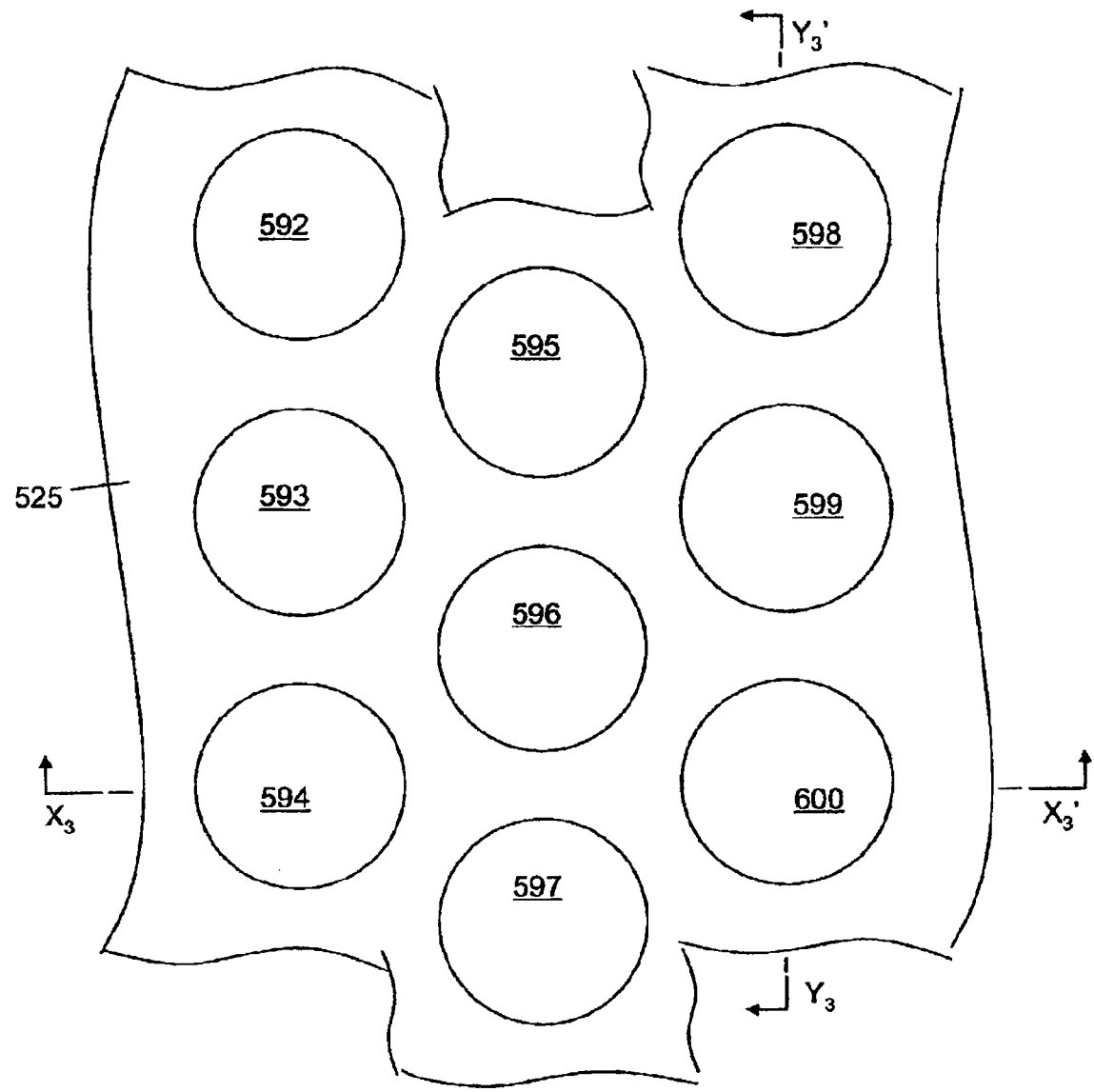
FIG. 35 is a top view showing an exemplary production of a solid-state imaging device according to the present invention.
Figure 36A:
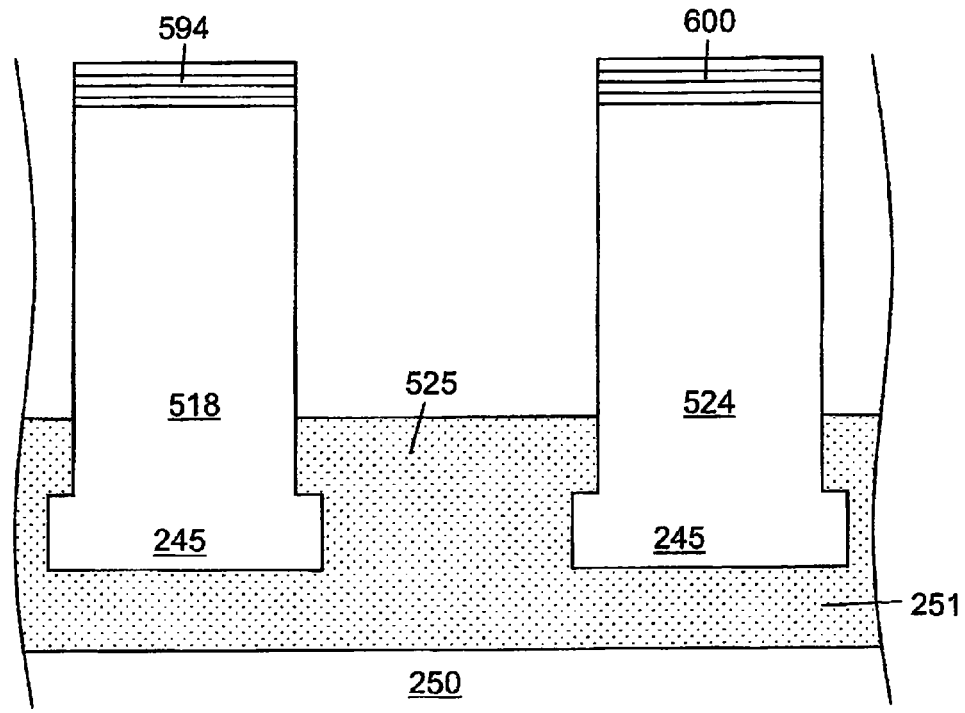
FIG. 36(*a*) is a process drawing in a sectional view taken along the X$_3$-X$_3$' line of FIG. 35 illustrating the exemplary production of a solid-state imaging device according to the present invention.
Figure 36B:
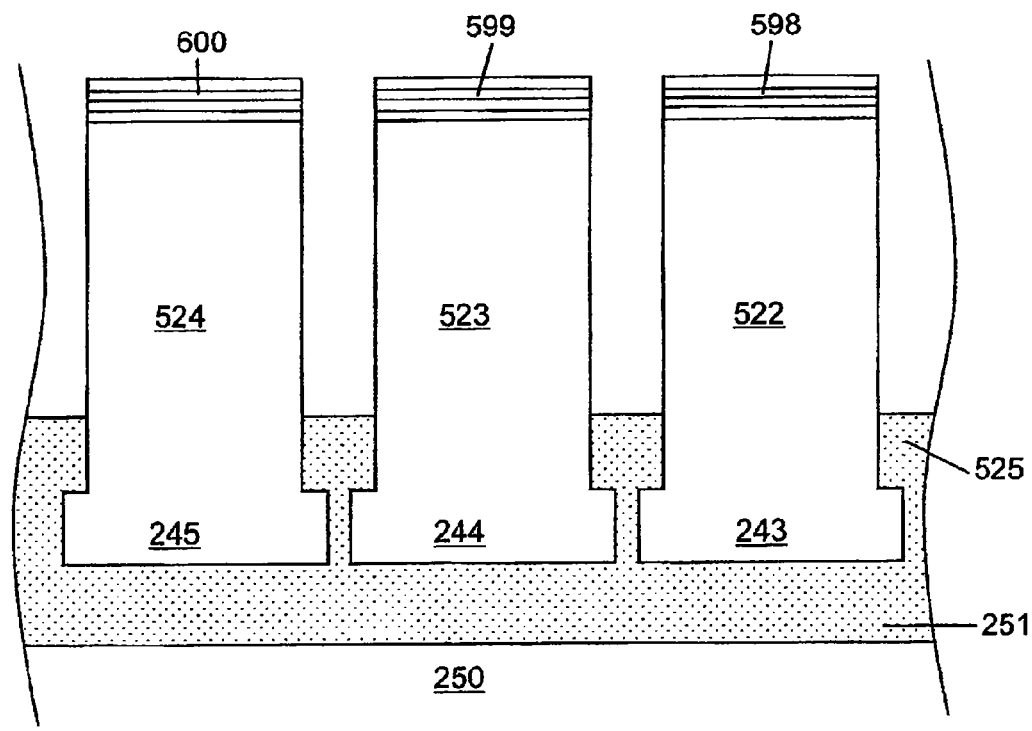

An oxide film 525 is deposited, and then planarization and etch back are performed (FIG. 35 and FIGS. 36(*a*) and 36(*b*)).

Figure 37:
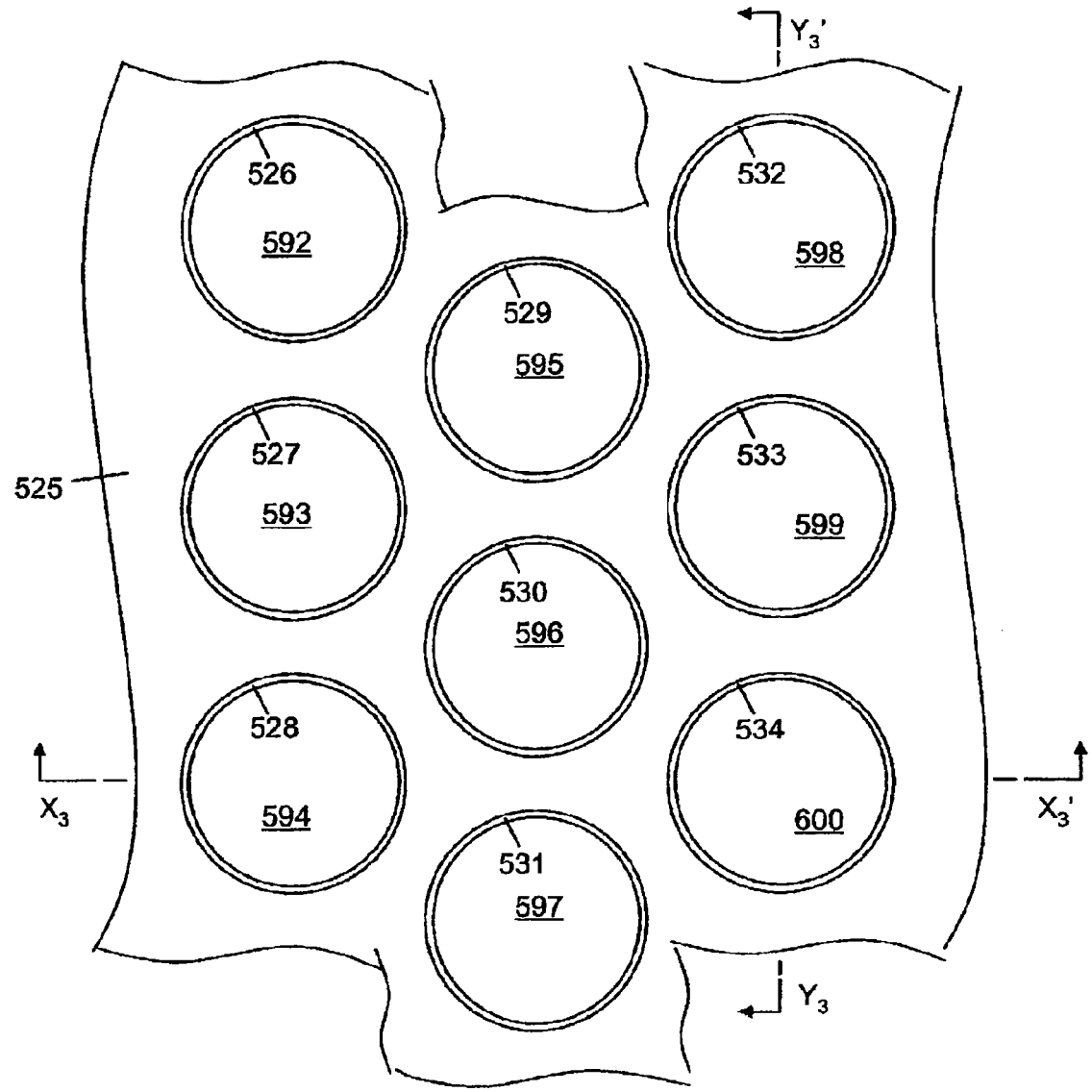
FIG. 37 is a top view showing an exemplary production of a solid-state imaging device according to the present invention.
Figure 38A:
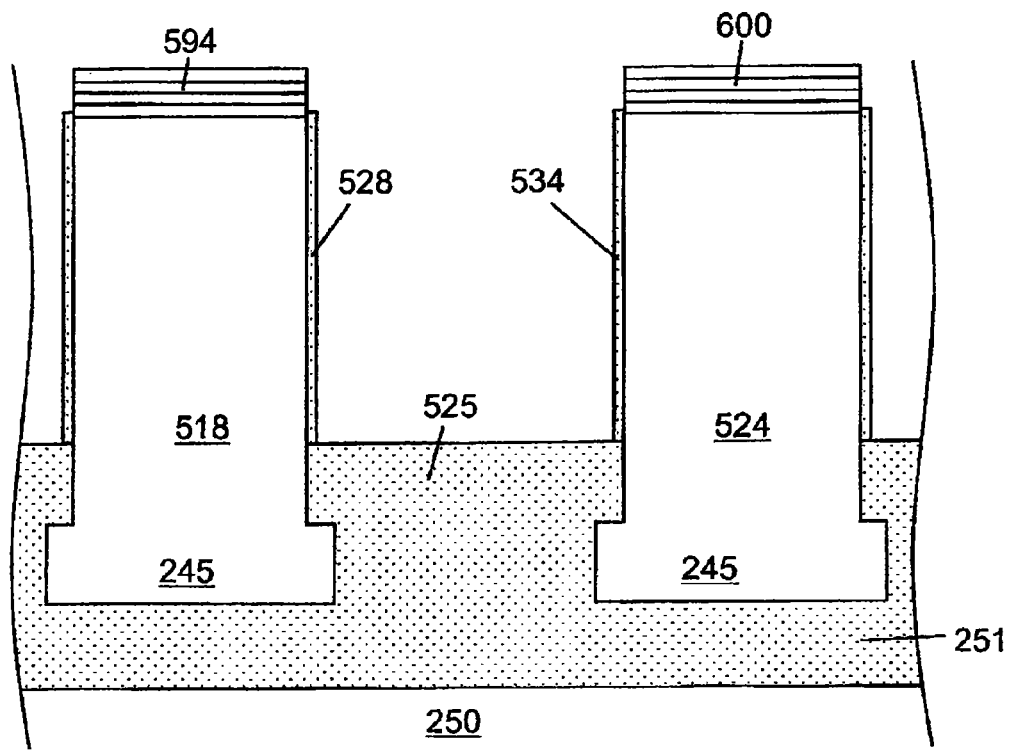
FIG. 38(*a*) is a process drawing in a sectional view taken along the X$_3$-X$_3$' line of FIG. 37 illustrating the exemplary production of a solid-state imaging device according to the present invention.
Figure 38B:
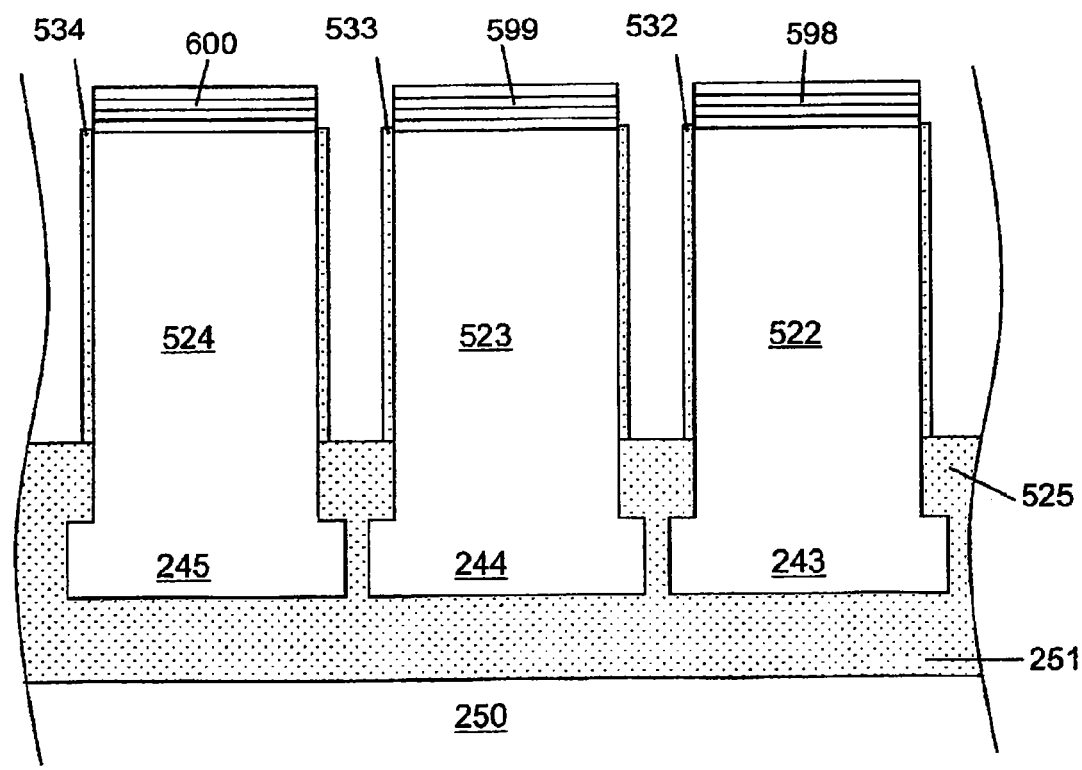

Oxidation is performed to form an oxide film 526, 527, 528, 529, 530, 531, 532, 533, 534 (FIG. 37 and FIGS. 38(*a*) and 38(*b*).

Figure 39:
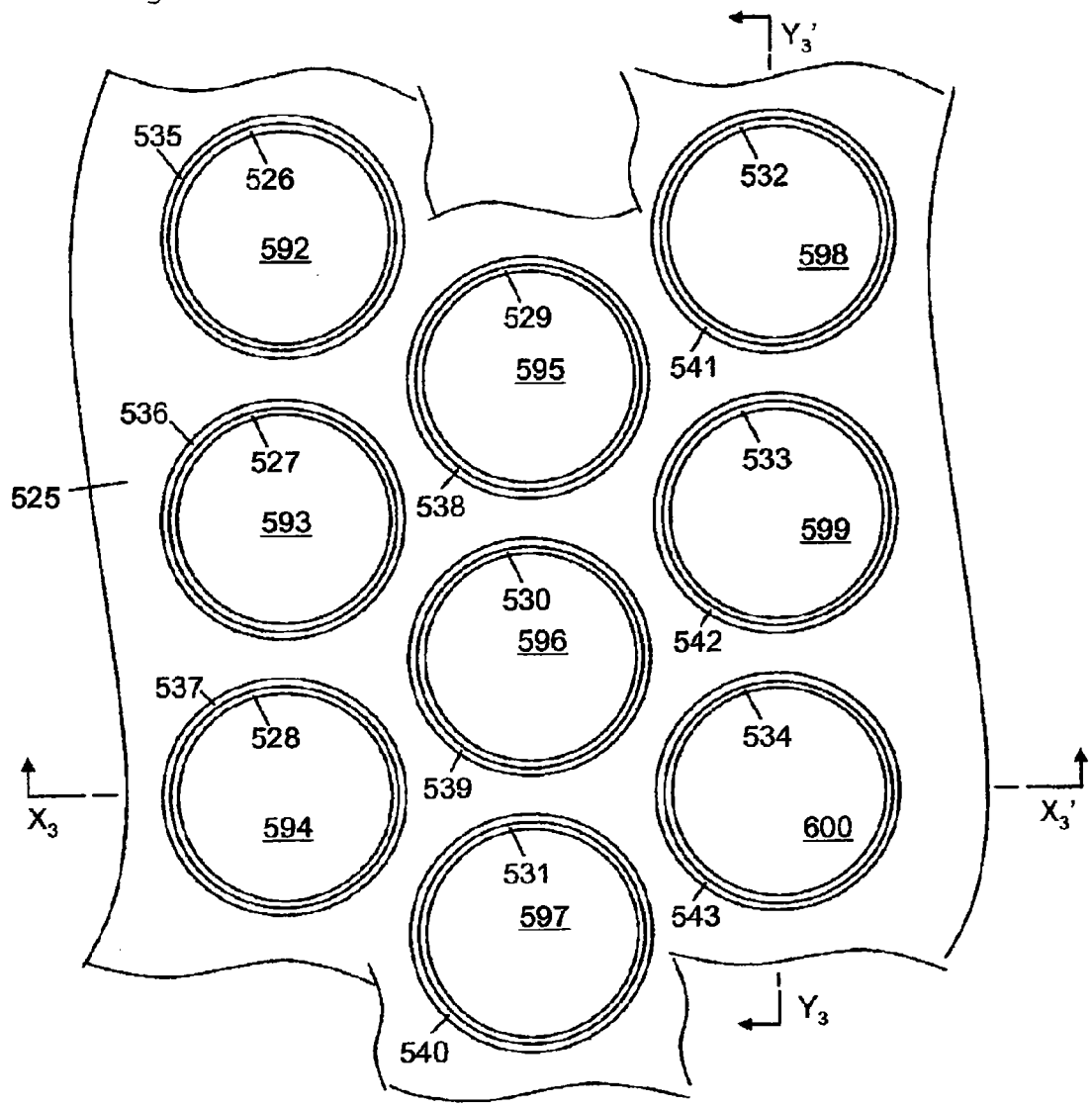
FIG. 39 is a top view showing an exemplary production of a solid-state imaging device according to the present invention.
Figure 40A:
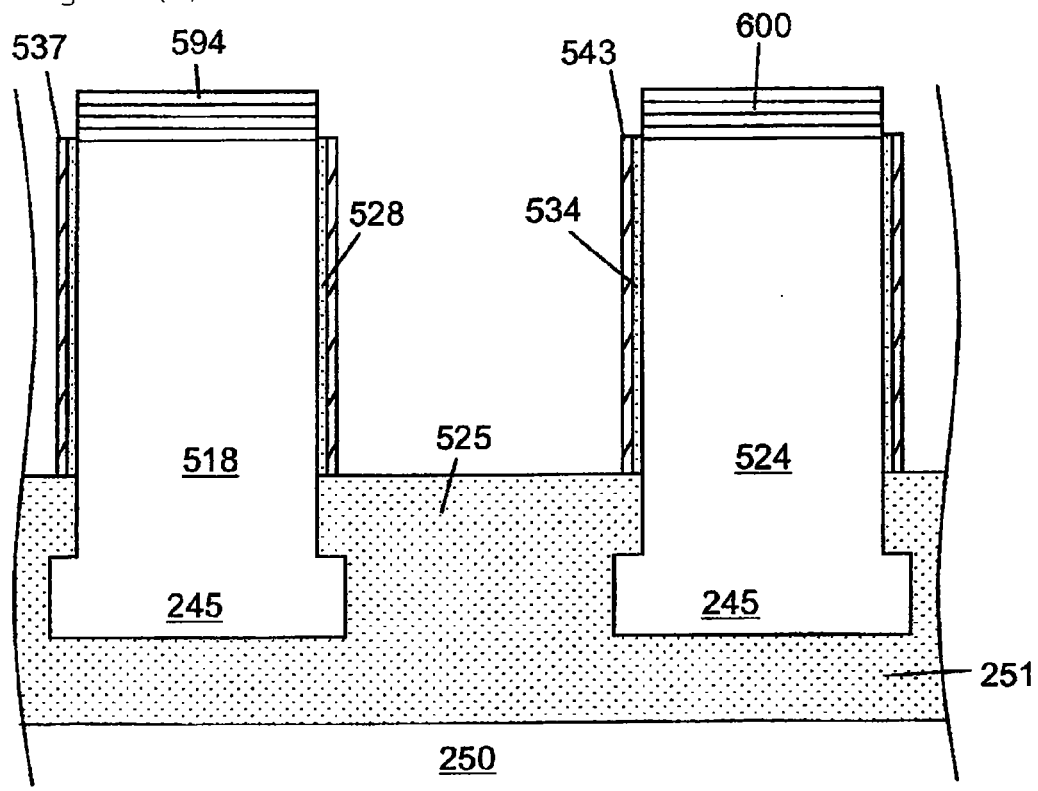
FIG. 40(*a*) is a process drawing in a sectional view taken along the X$_3$-X$_3$' line of FIG. 39 illustrating the exemplary production of a solid-state imaging device according to the present invention.
Figure 40B:
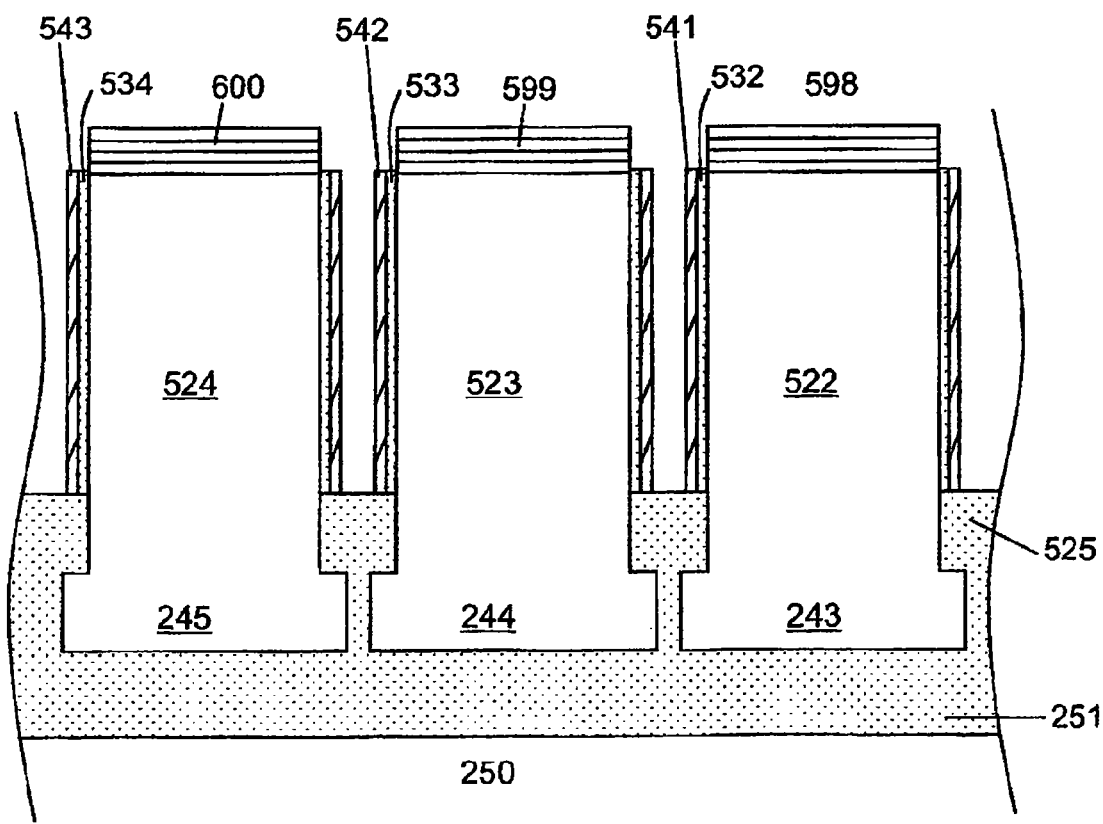

For the purpose of providing a mask to be used during ion implantation, polysilicon is deposited, and then etched back to leave a region 535, 536, 537, 538, 539, 541, 542, 543 in a sidewall configuration (FIG. 39 and FIGS. 40(*a*) and 40(*b*)).

Figure 41:
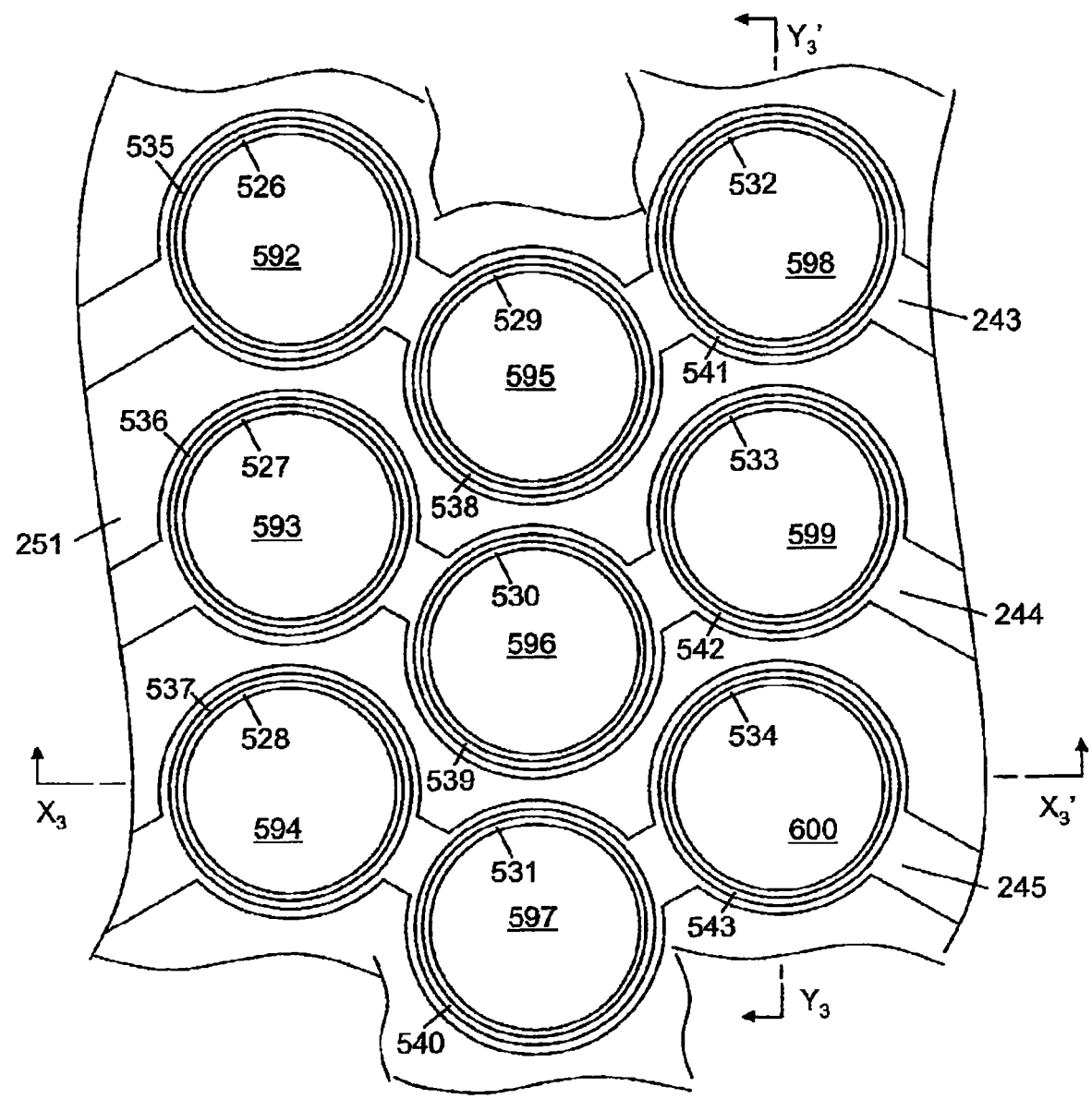
FIG. 41 is a top view showing an exemplary production of a solid-state imaging device according to the present invention.
Figure 42A:
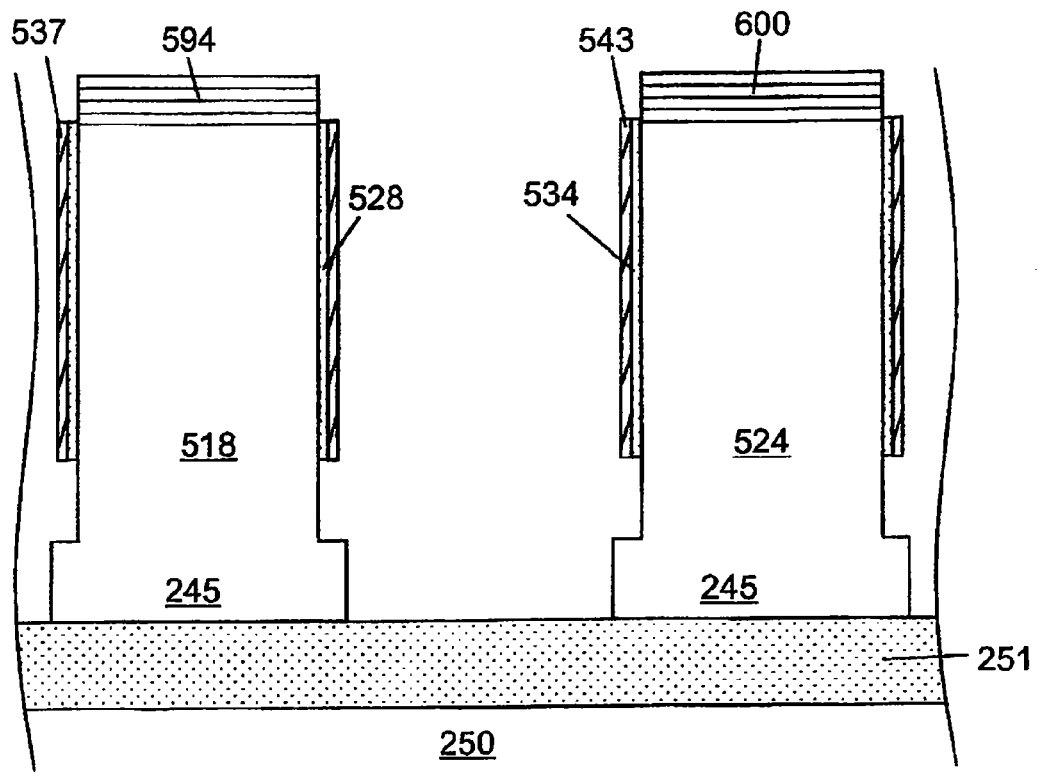
FIG. 42(*a*) is a process drawing in a sectional view taken along the X$_3$-X$_3$' line of FIG. 41 illustrating the exemplary production of a solid-state imaging device according to the present invention.
Figure 42B:
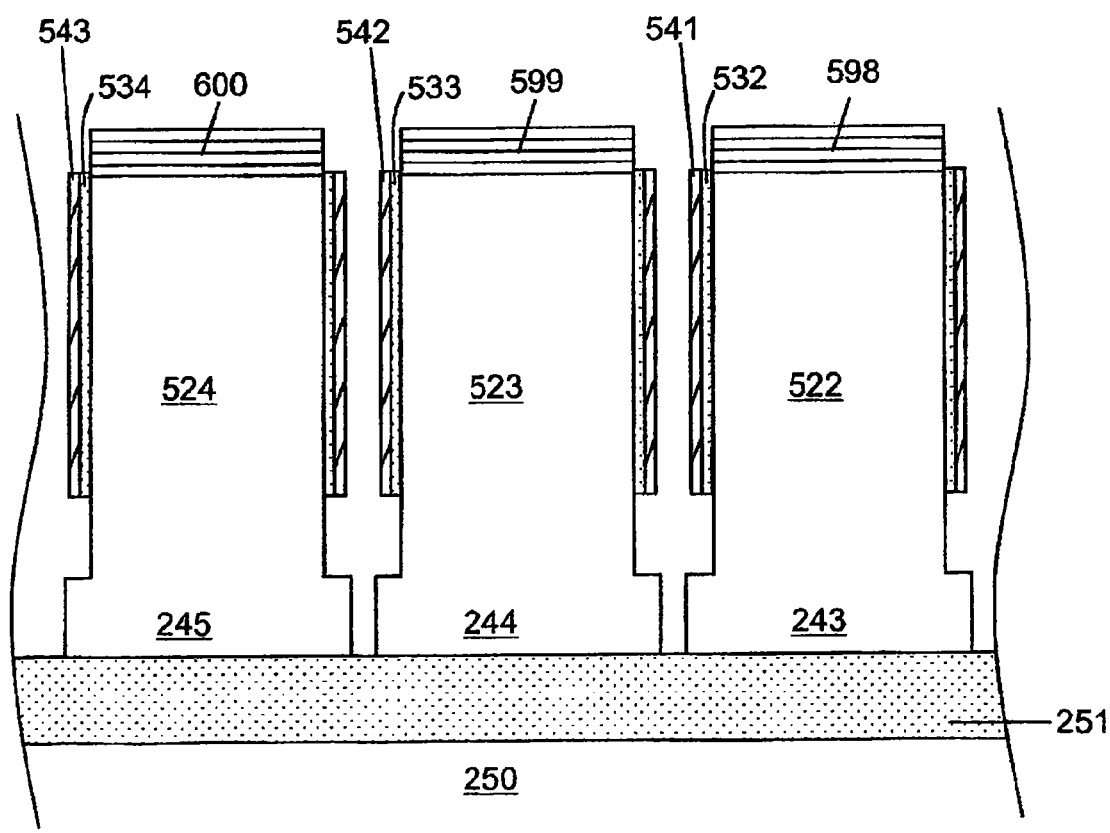

The oxide film is removed to expose a site for phosphorous to be implanted (FIG. 41 and FIGS. 42(*a*) and 42(*b*)).

Figure 43:
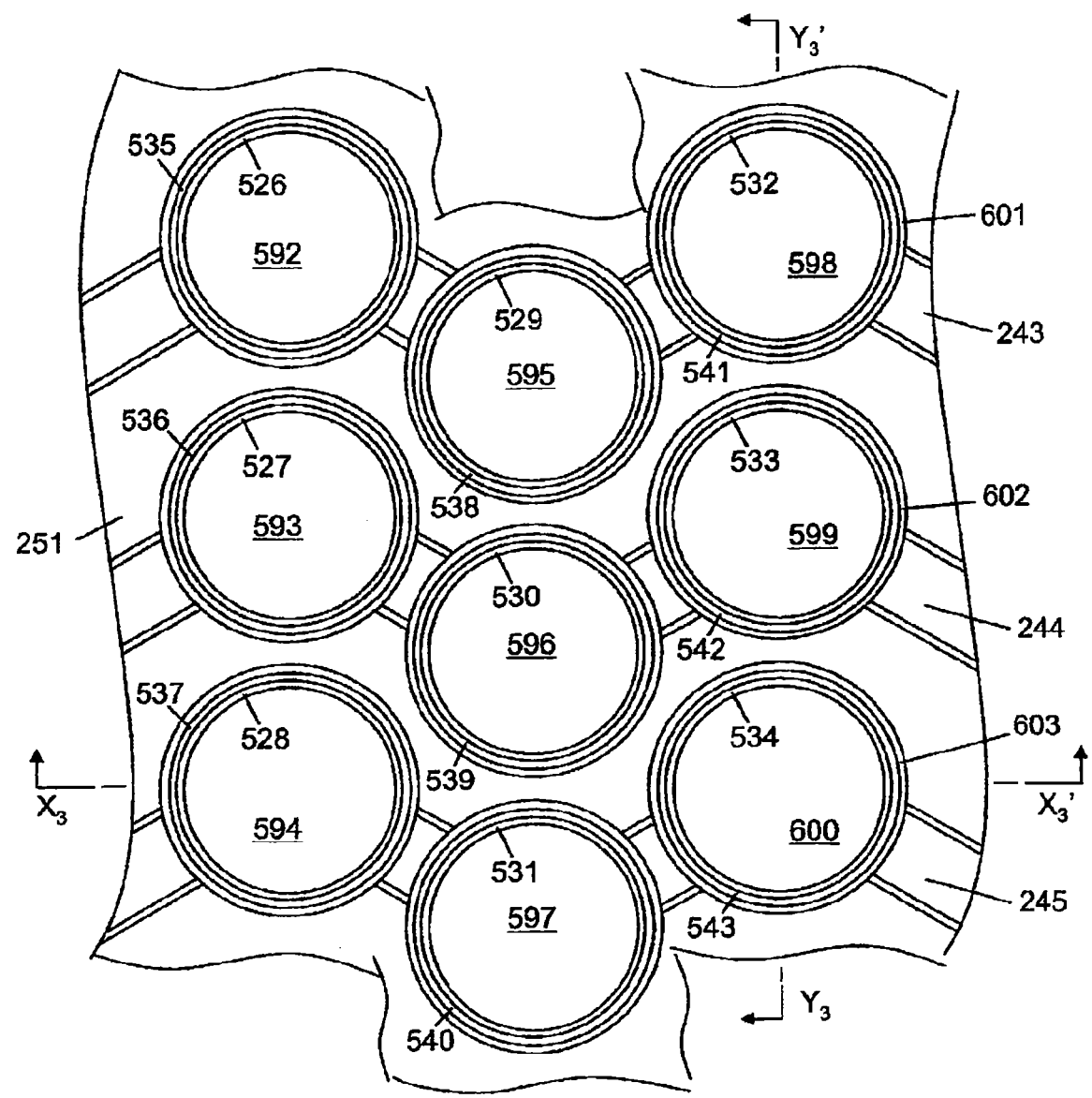
FIG. 43 is a top view showing an exemplary production of a solid-state imaging device according to the present invention.
Figure 44A:
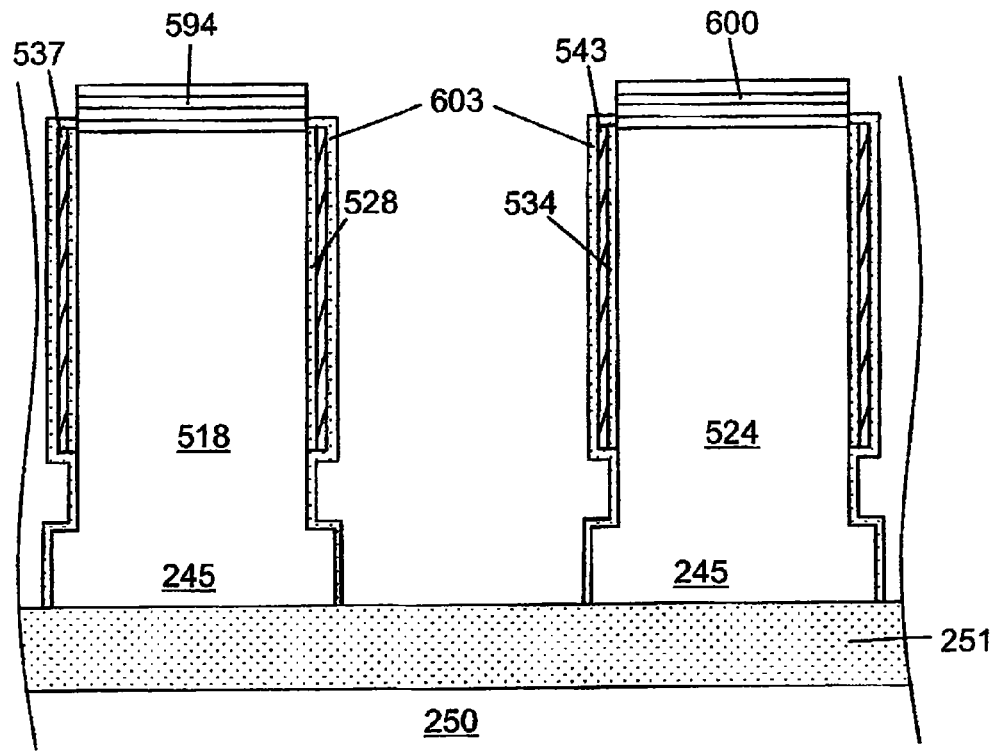
FIG. 44(*a*) is a process drawing in a sectional view taken along the X$_3$-X$_3$' line of FIG. 43 illustrating the exemplary production of a solid-state imaging device according to the present invention.
Figure 44B:
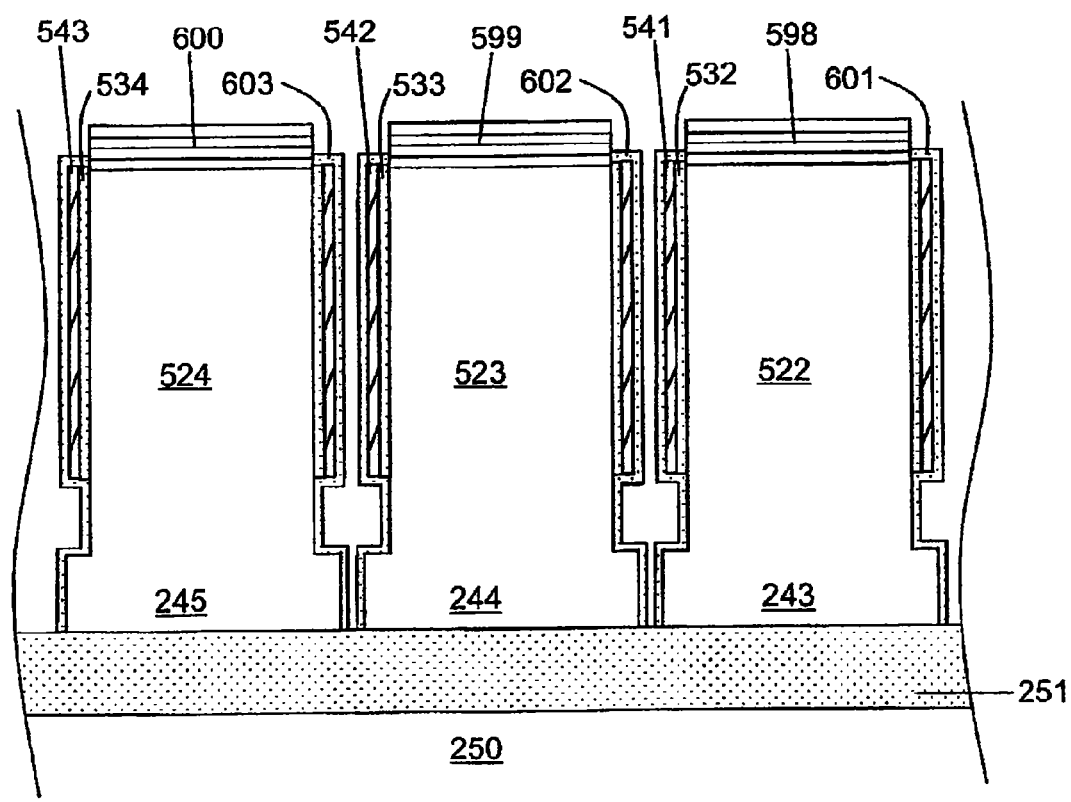

For the purpose of preventing ion channeling during the ion implantation, an oxide film 601, 602, 603 is formed (FIG. 43 and FIGS. 44(*a*) and 44(*b*)).

Figure 45:
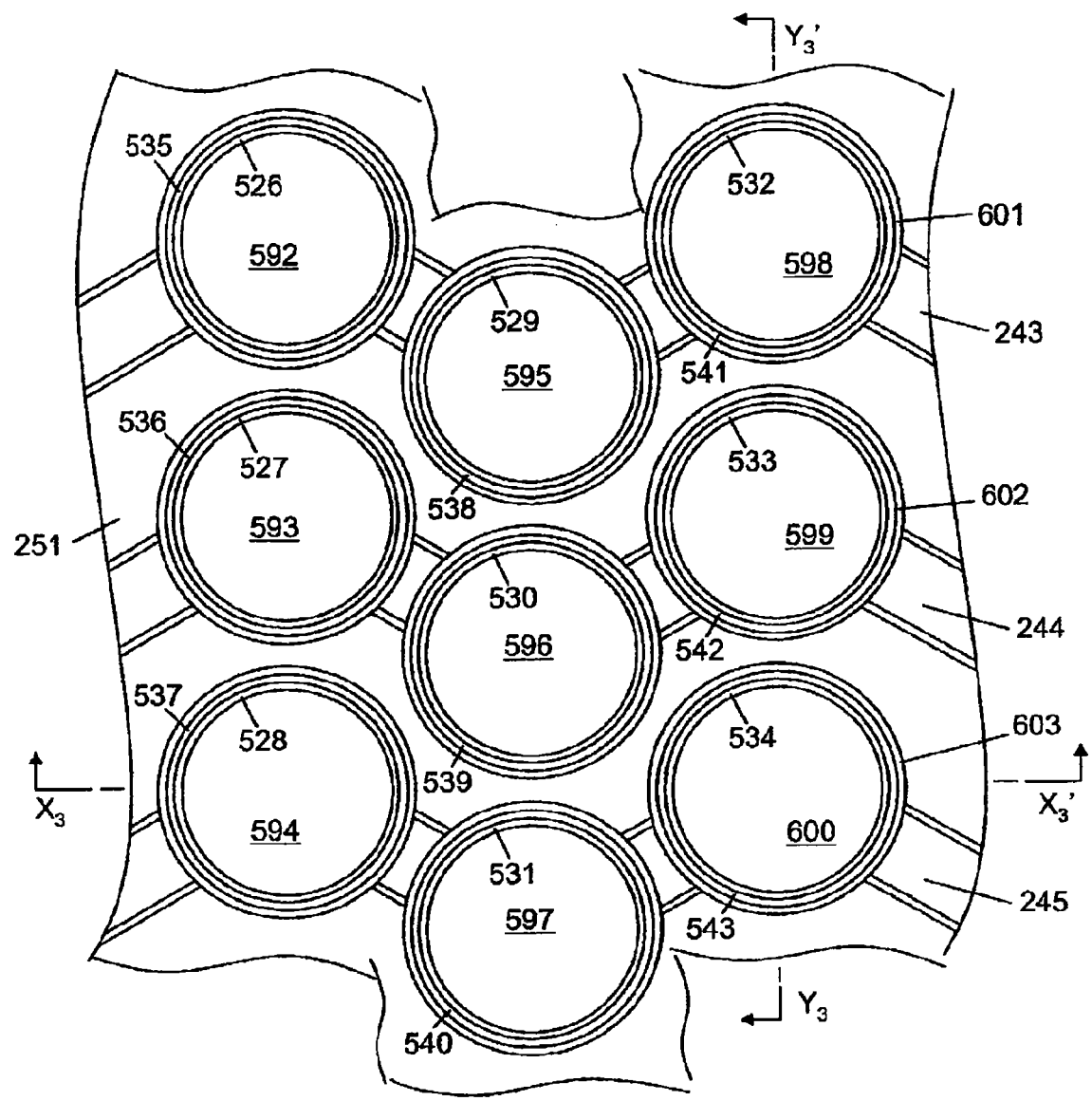
FIG. 45 is a top view showing an exemplary production of a solid-state imaging device according to the present invention.
Figure 46A:
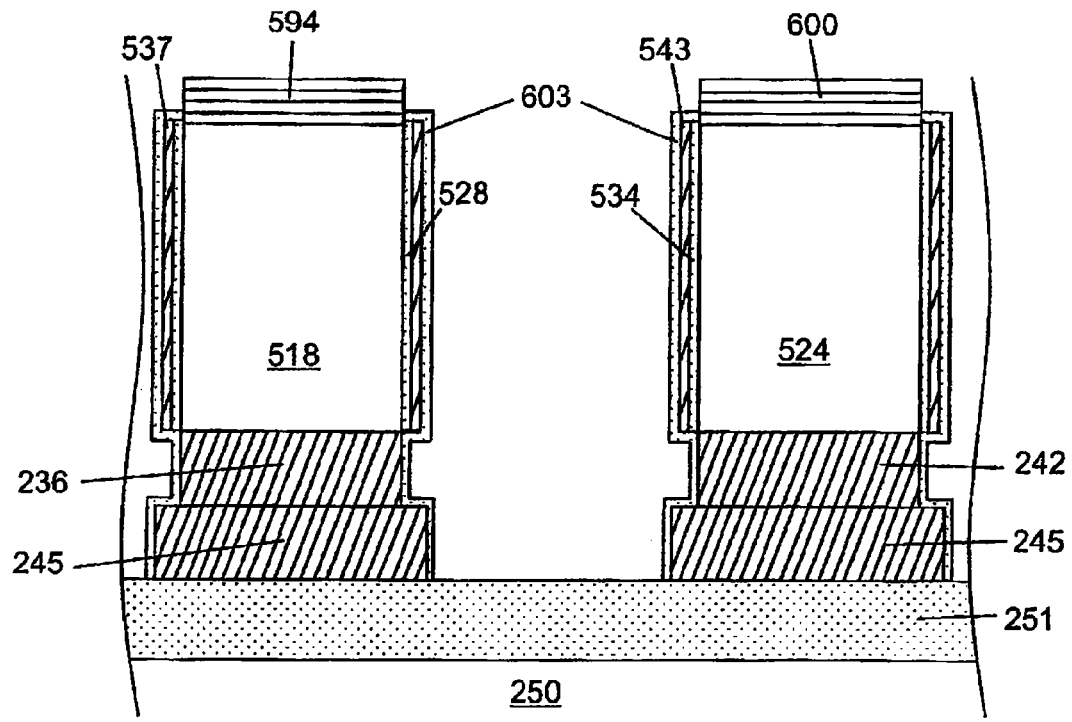
FIG. 46(*a*) is a process drawing in a sectional view taken along the X$_3$-X$_3$' line of FIG. 45 illustrating the exemplary production of a solid-state imaging device according to the present invention.
FIG. 46(b) is a process drawing in a sectional view taken along the $Y_3$-$Y_3$' line of FIG. 45 illustrating the exemplary production of a solid-state imaging device according to the present invention.
Figure 46B:
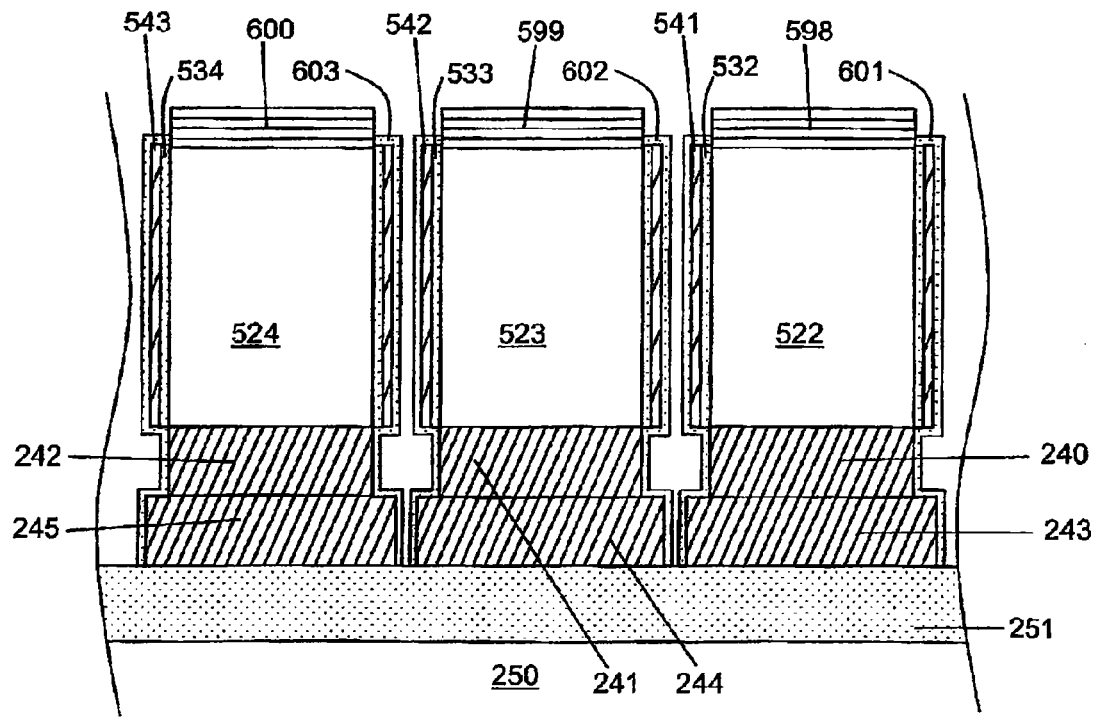

The phosphorous is ion implanted and annealing is applied to form the signal line 243, 244, 245 as well as the n+ type diffusion layer 234, 235, 236, 237, 238, 239, 240, 241, 242 (FIG. 45 and FIGS. 46(*a*) and 46(*b*)).

Figure 47:
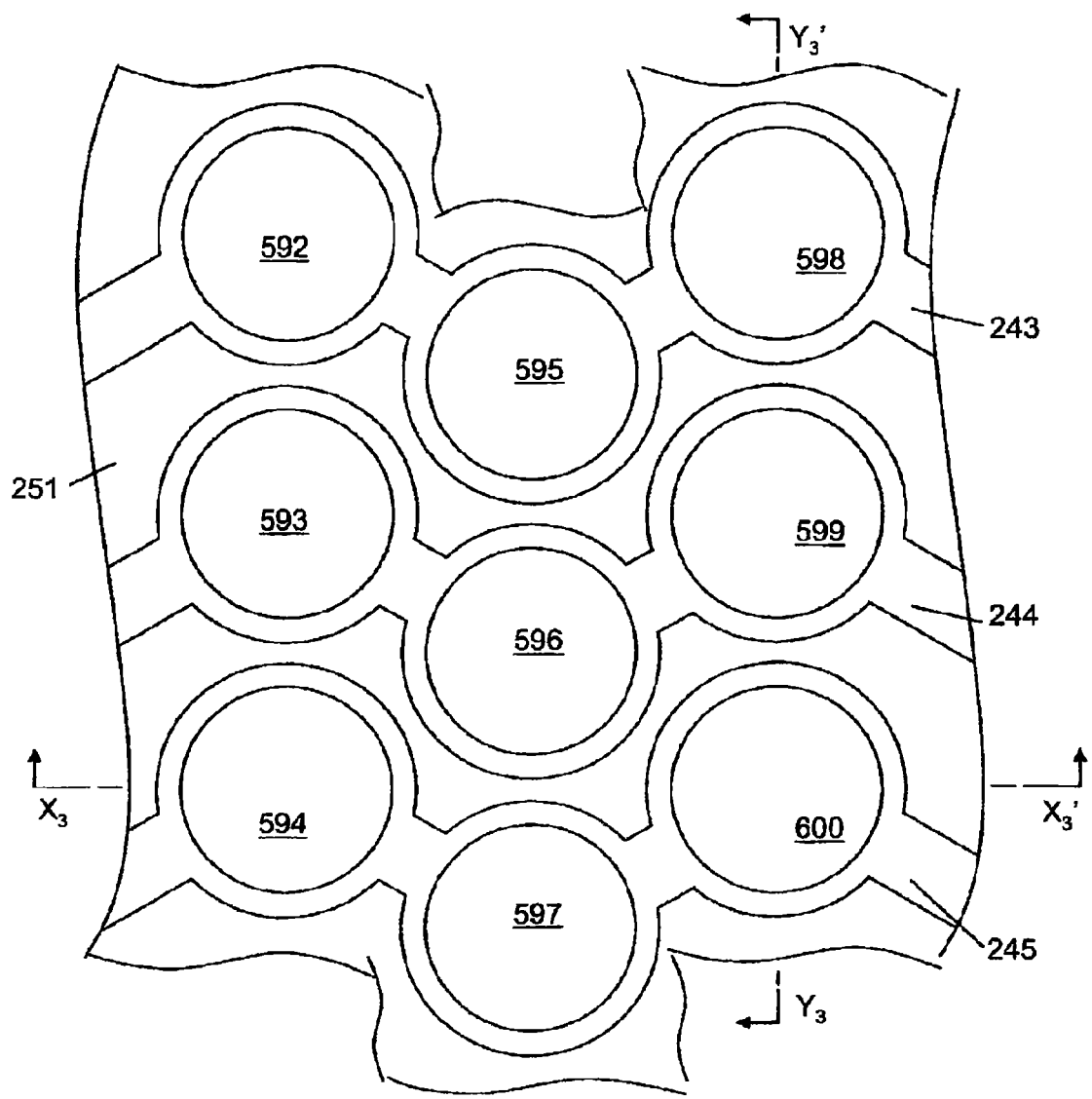
FIG. 47 is a top view showing an exemplary production of a solid-state imaging device according to the present invention.
Figure 48A:
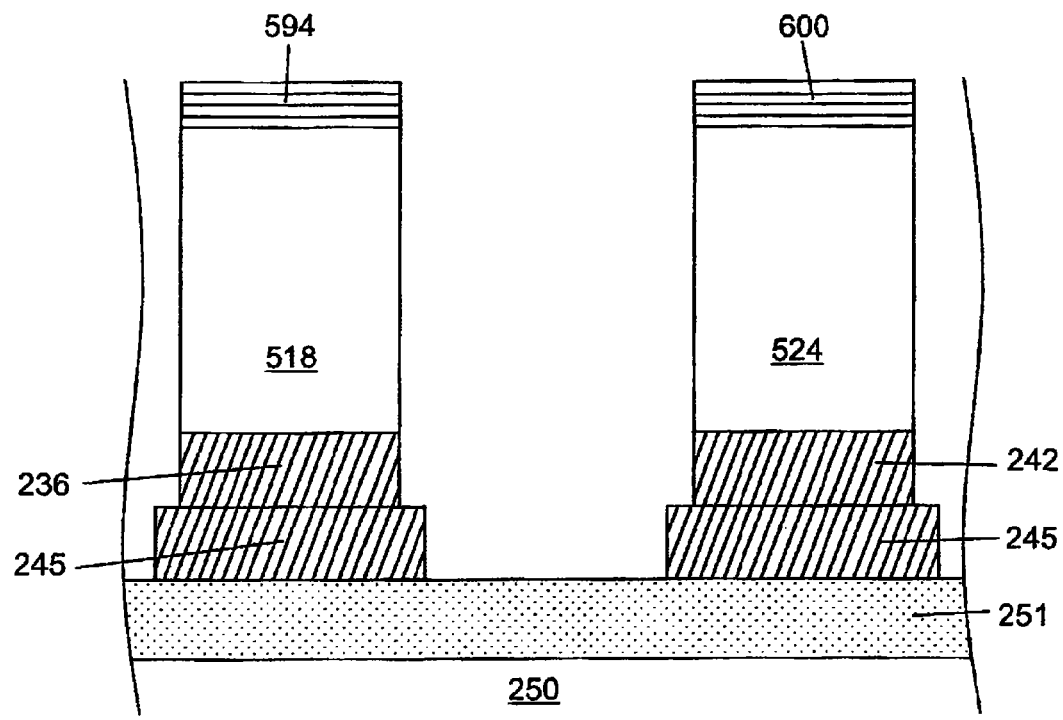
FIG. 48(a) is a process drawing in a sectional view taken along the $X_3$-$X_3$' line of FIG. 47 illustrating the exemplary production of a solid-state imaging device according to the present invention.
Figure 48B:
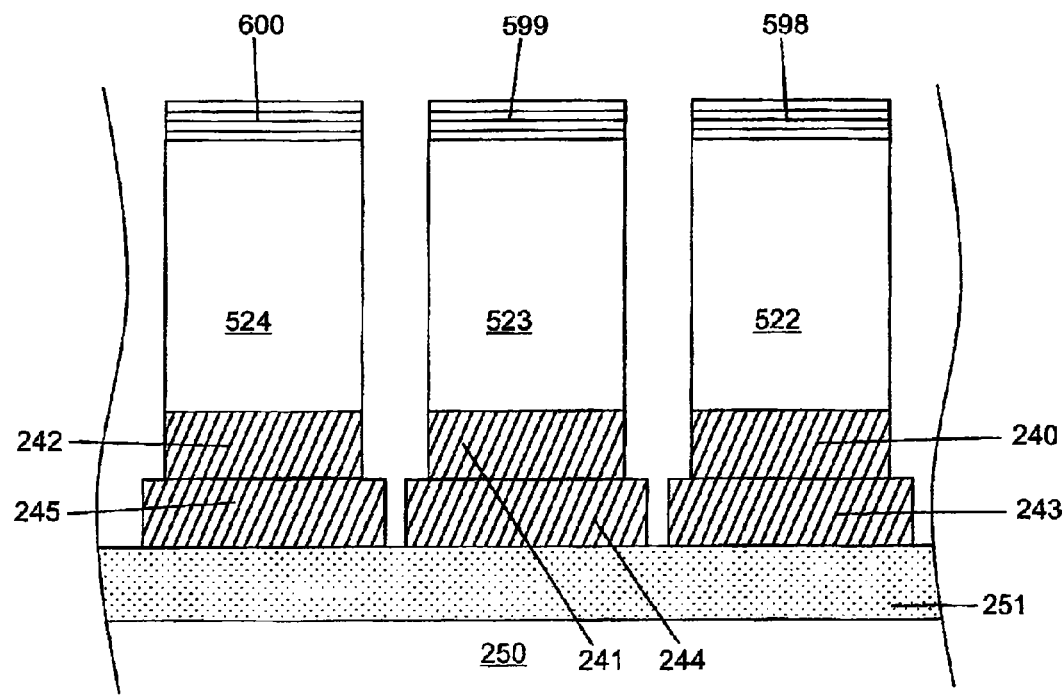
FIG. 48(b) is a process drawing in a sectional view taken along the $Y_3$-$Y_3$' line of FIG. 47 illustrating the exemplary production of a solid-state imaging device according to the present invention.

The polysilicon and the oxide film are removed (FIG. 47 and FIGS. 48(*a*) and 48(*b*)).

Figure 49:
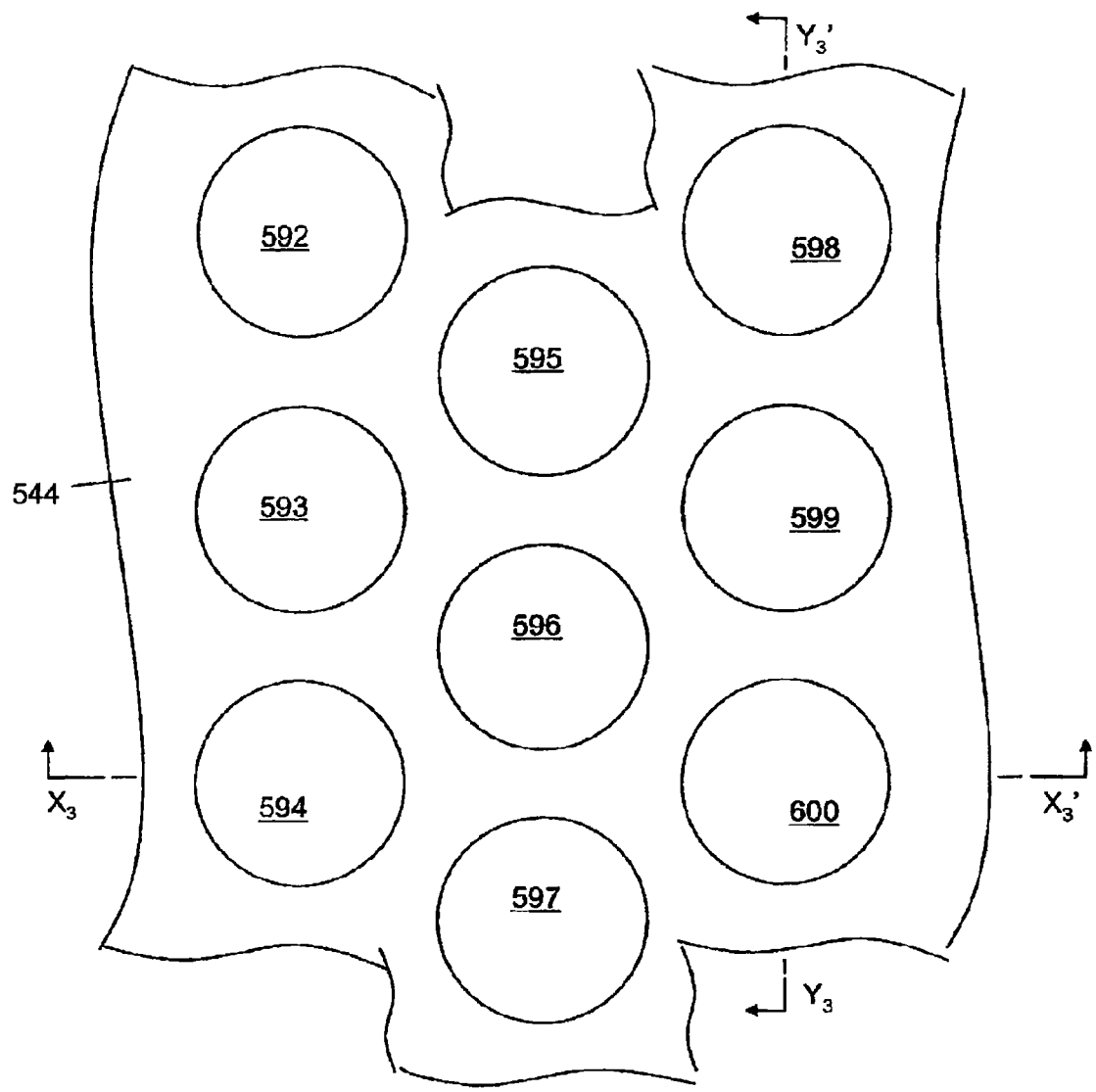
FIG. 49 is a top view showing an exemplary production of a solid-state imaging device according to the present invention.
Figure 50A:
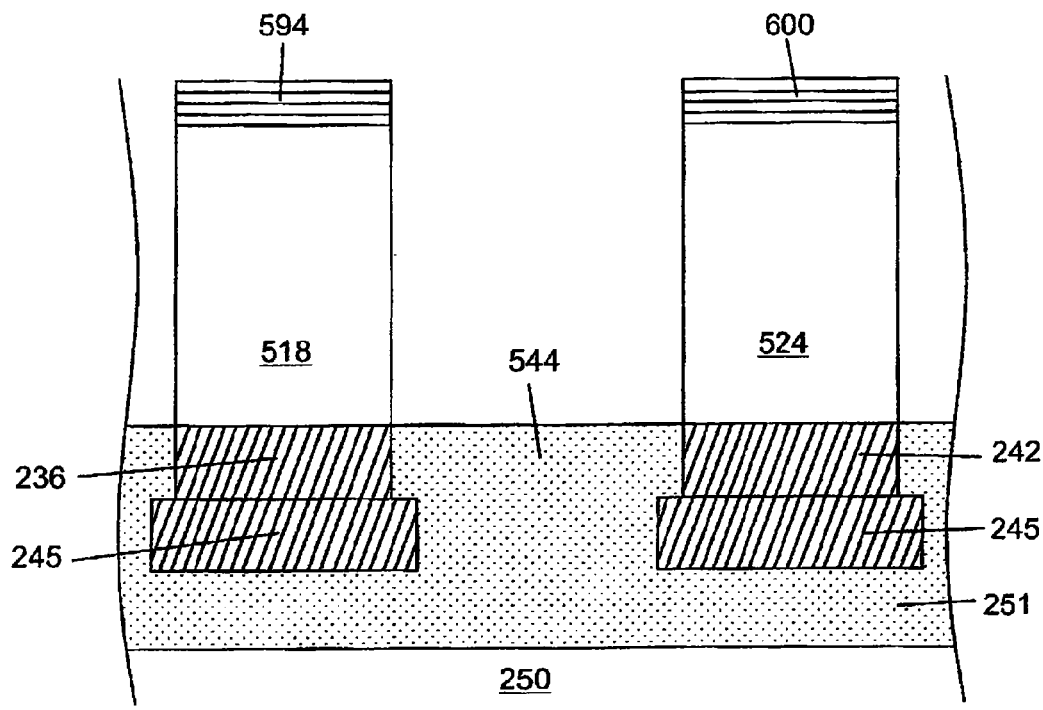
FIG. 50(a) is a process drawing in a sectional view taken along the $X_3$-$X_3$' line of FIG. 49 illustrating the exemplary production of a solid-state imaging device according to the present invention.
Figure 50B:
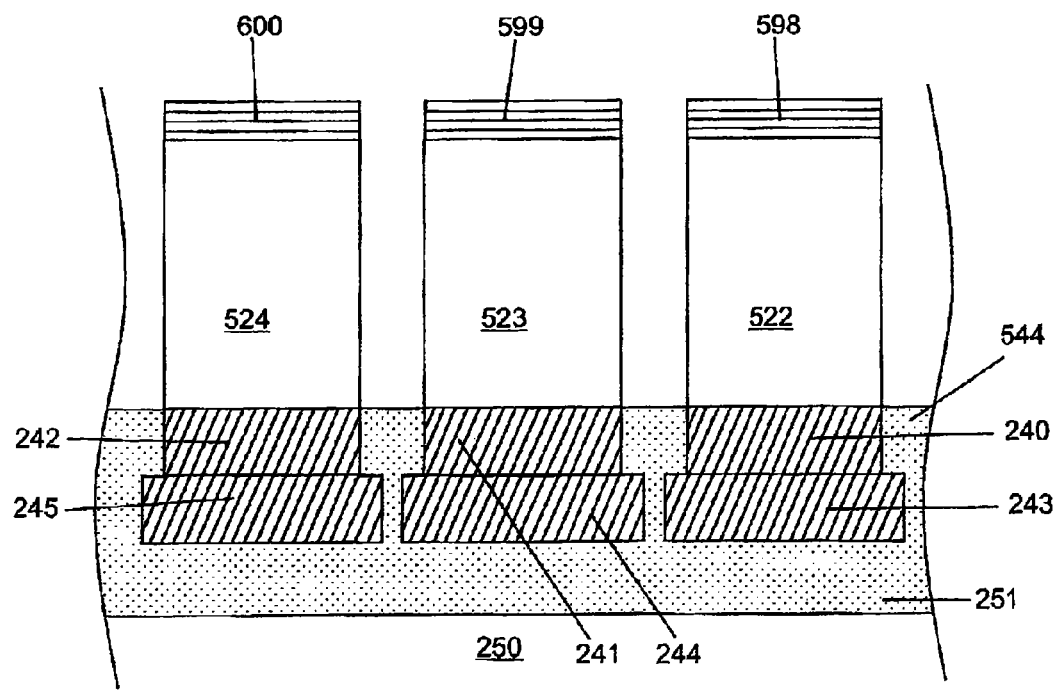
FIG. 50(b) is a process drawing in a sectional view taken along the $Y_3$-$Y_3$' line of FIG. 49 illustrating the exemplary production of a solid-state imaging device according to the present invention.

The oxide film is deposited, planarized and etched back to form an oxide film layer 544 (FIG. 49 and FIGS. 50(*a*) and 50(*b*)).

Figure 51:
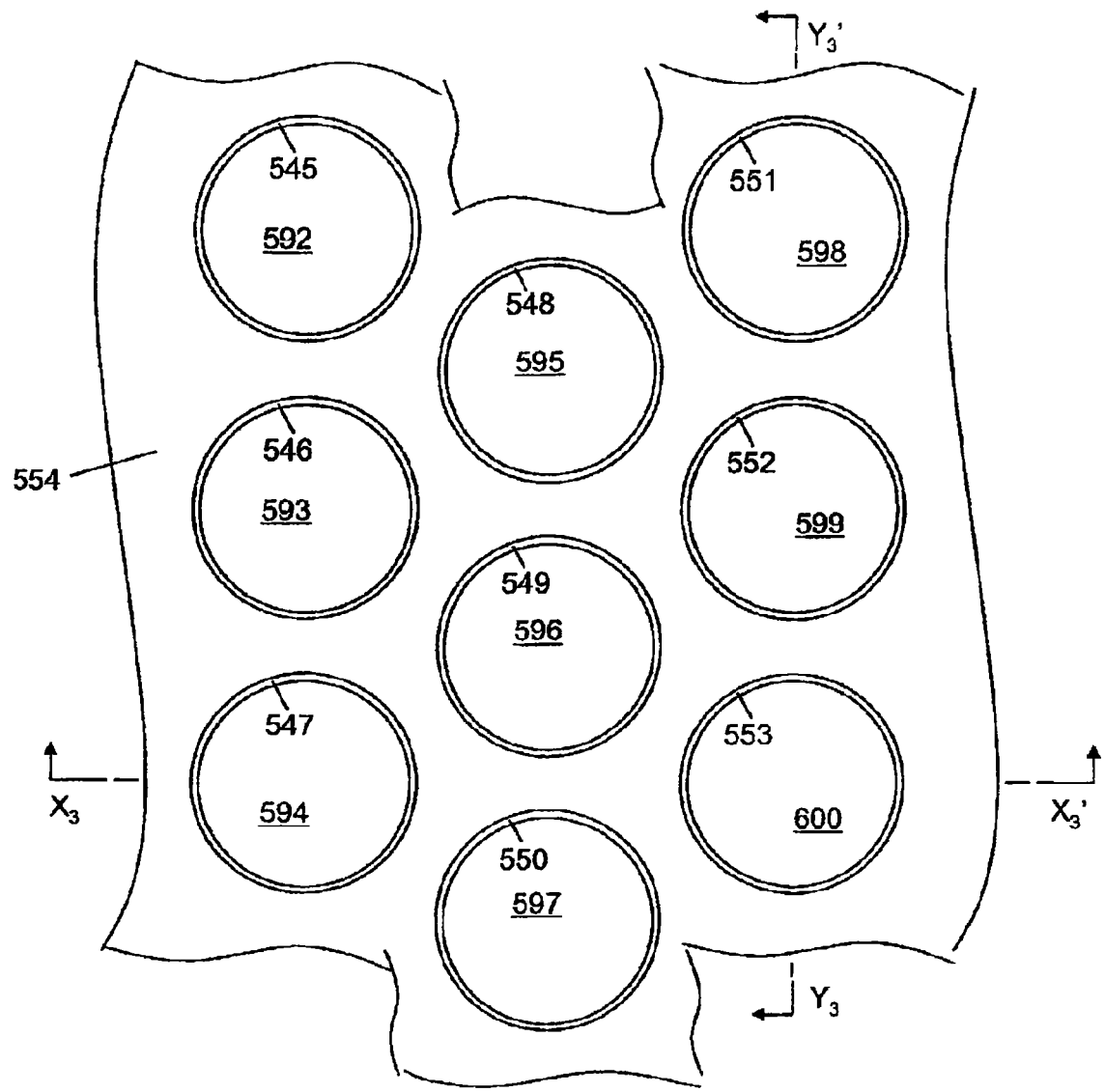
FIG. 51 is a top view showing an exemplary production of a solid-state imaging device according to the present invention.
Figure 52A:
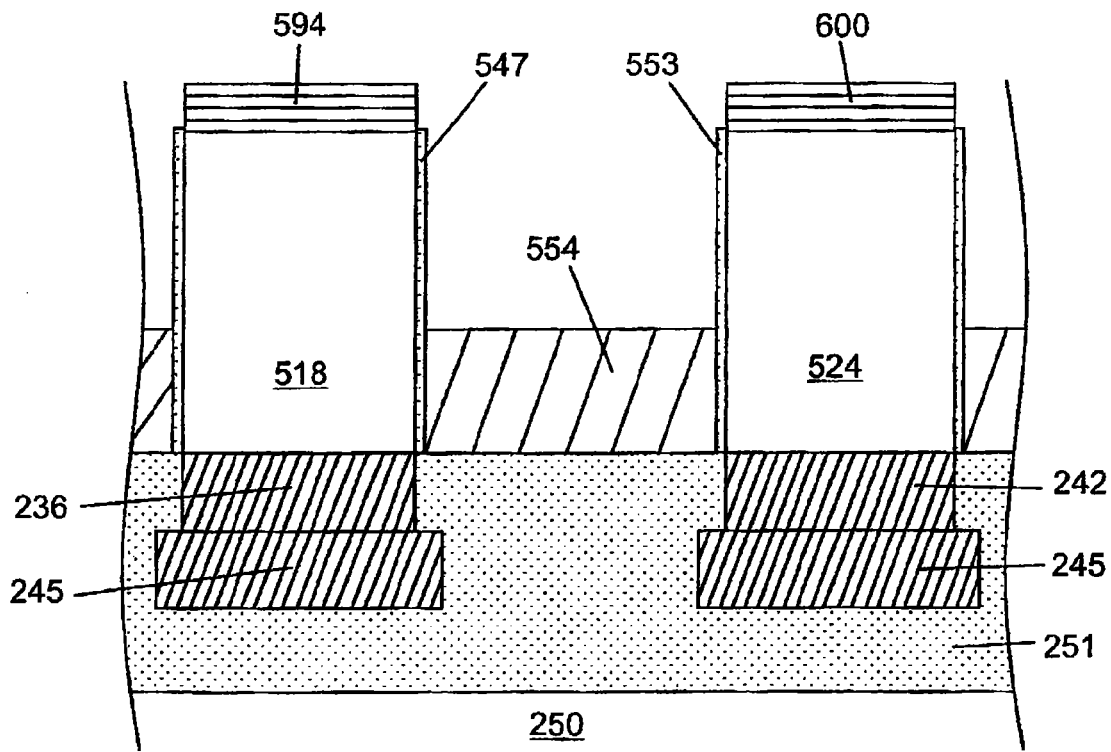
FIG. 52(a) is a process drawing in a sectional view taken along the $X_3$-$X_3$' line of FIG. 51 illustrating the exemplary production of a solid-state imaging device according to the present invention.
Figure 52B:
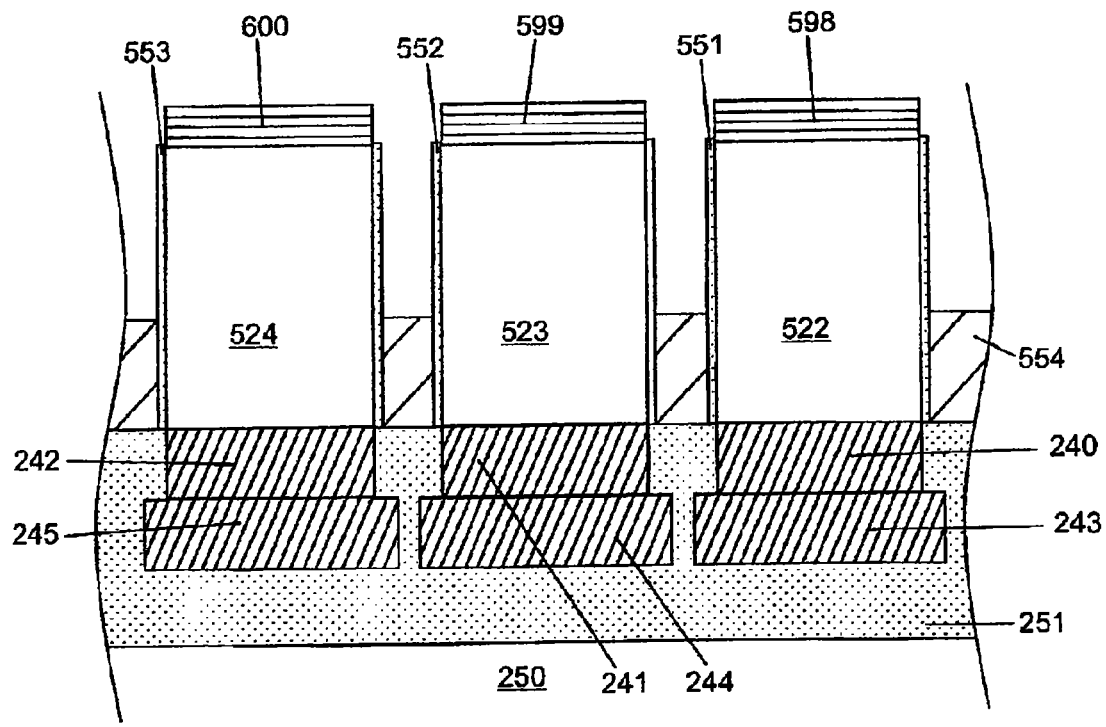
FIG. 52(b) is a process drawing in a sectional view taken along the $Y_3$-$Y_3$' line of FIG. 51 illustrating the exemplary production of a solid-state imaging device according to the present invention.

Gate oxidation is performed to form a gate oxide film 545, 546, 547, 548, 549, 550, 551, 552, 553, and a polysilicon 544 is deposited, planarized and etched back (FIG. 51 and FIGS. 52(*a*) and 52(*b*)).

Figure 53:
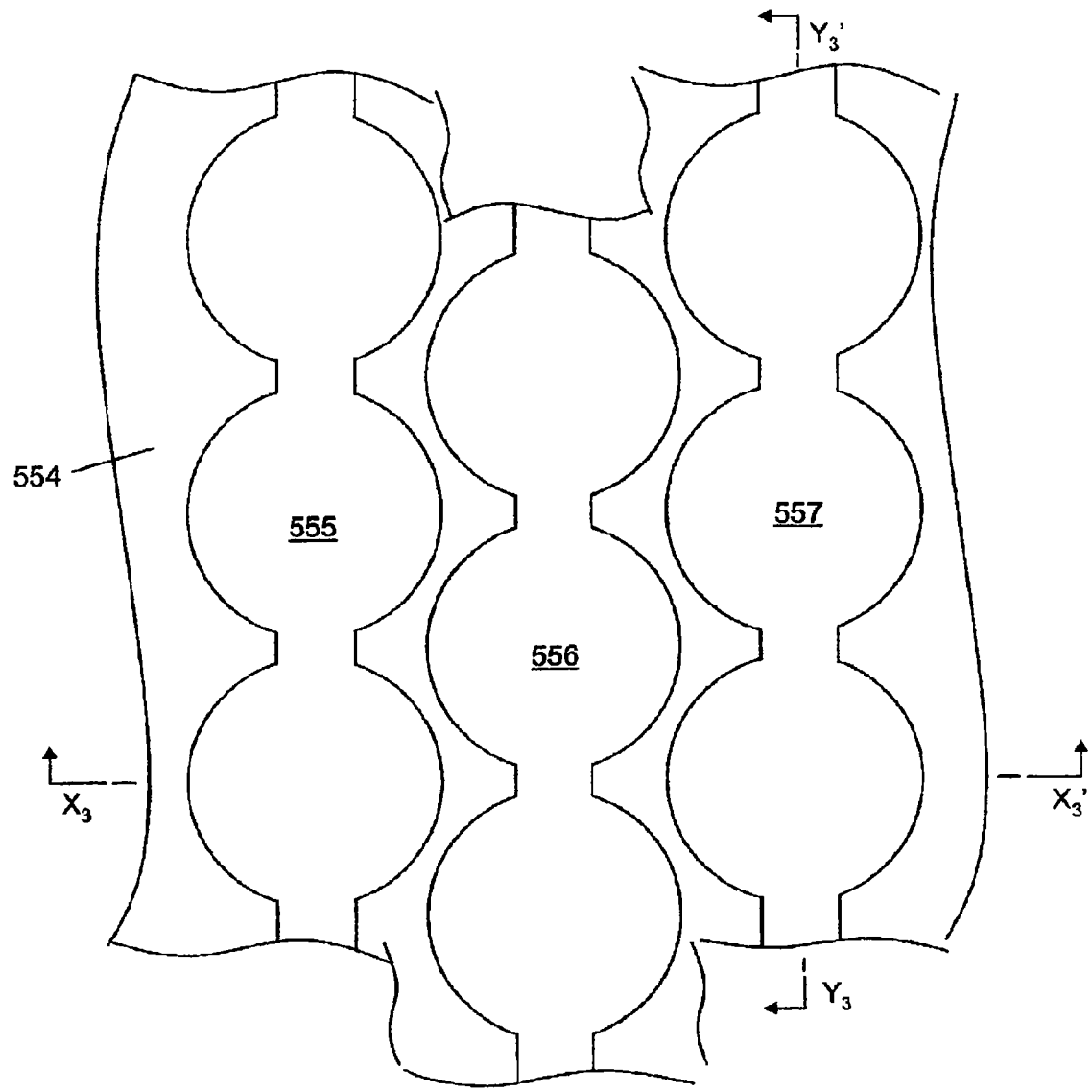
FIG. 53 is a top view showing an exemplary production of a solid-state imaging device according to the present invention.
Figure 54A:
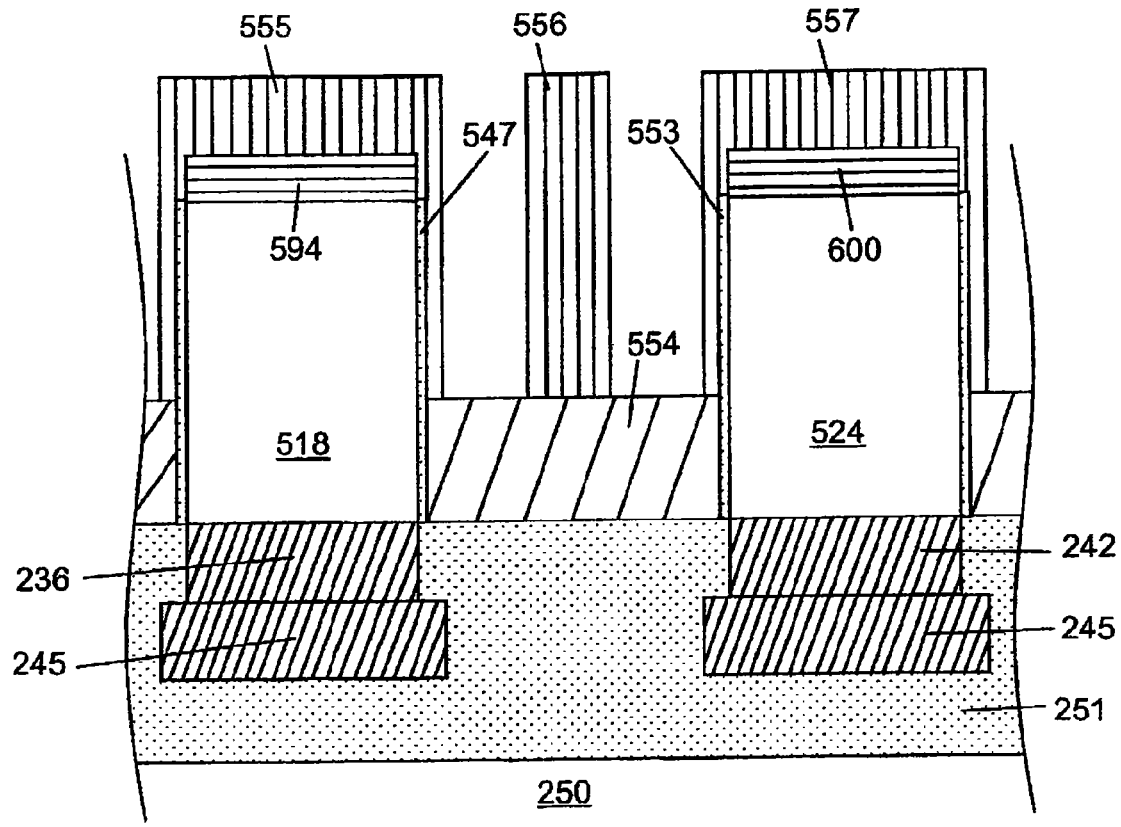
FIG. 54(a) is a process drawing in a sectional view taken along the $X_3$-$X_3$' line of FIG. 53 illustrating the exemplary production of a solid-state imaging device according to the present invention.
Figure 54B:
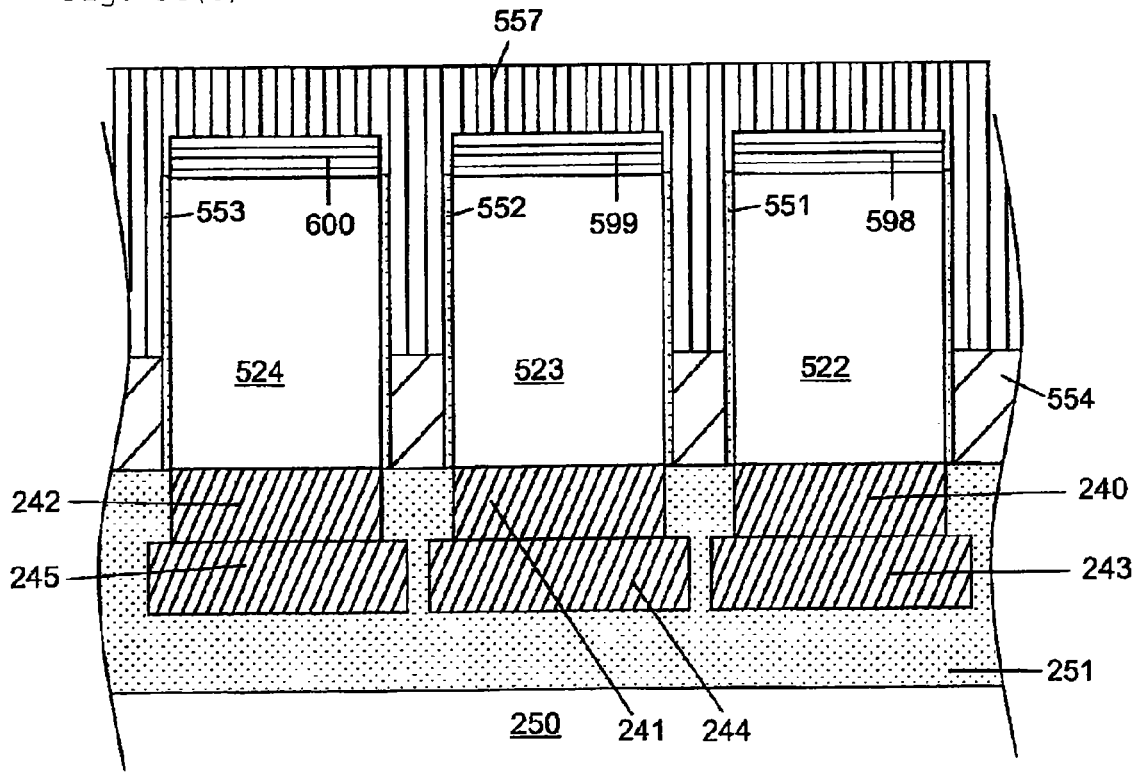
FIG. 54(b) is a process drawing in a sectional view taken along the $Y_3$-$Y_3$' line of FIG. 53 illustrating the exemplary production of a solid-state imaging device according to the present invention.

A resist 555, 556, 557 for a gate (reset line) is formed (FIG. 53 and FIGS. 54(*a*) and 54(*b*)).

Figure 55:
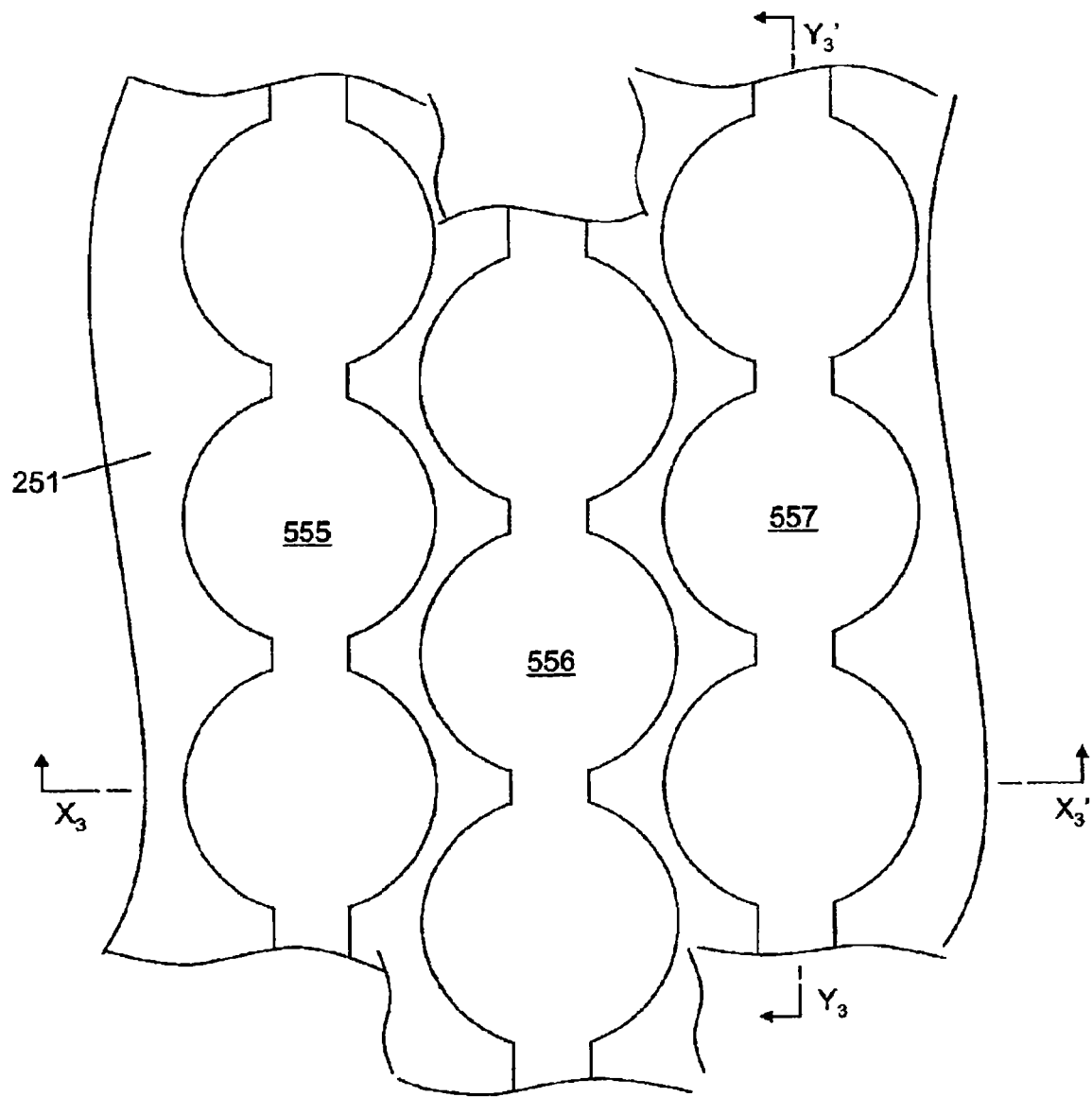
FIG. 55 is a top view showing an exemplary production of a solid-state imaging device according to the present invention.
Figure 56A:
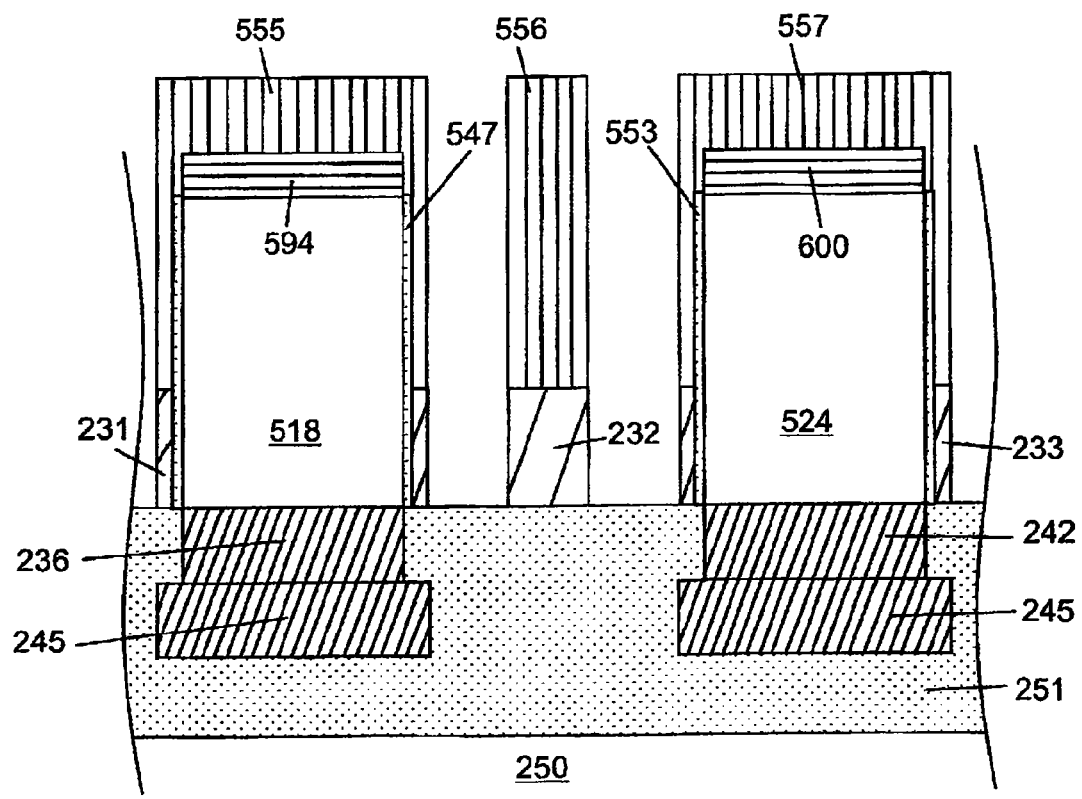
FIG. 56(a) is a process drawing in a sectional view taken along the $X_3$-$X_3$' line of FIG. 55 illustrating the exemplary production of a solid-state imaging device according to the present invention.
Figure 56B:
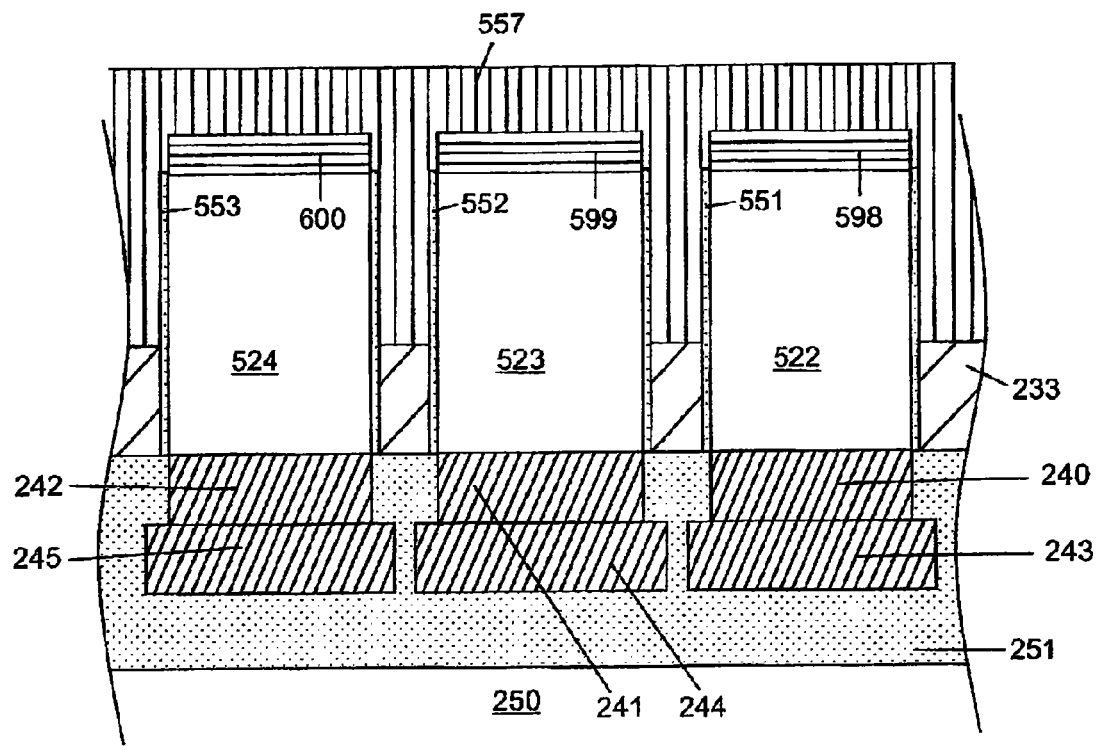
FIG. 56(b) is a process drawing in a sectional view taken along the $Y_3$-$Y_3$' line of FIG. 55 illustrating the exemplary production of a solid-state imaging device according to the present invention.

The polysilicon is etched to form the gate (reset) 231, 232, 233 (FIG. 55 and FIGS. 56(*a*) and 56(*b*)).

Figure 57:
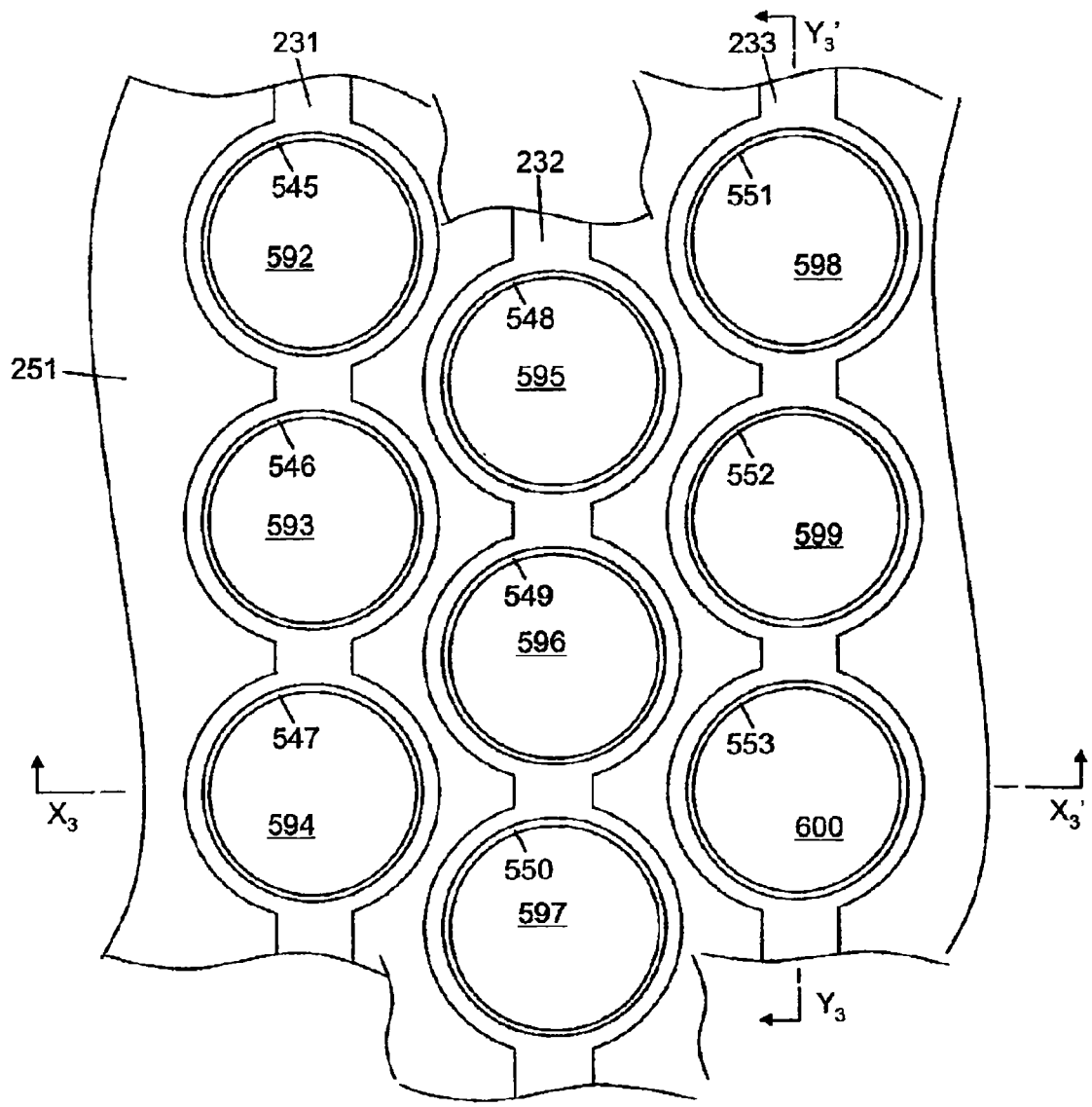
FIG. 57 is a top view showing an exemplary production of a solid-state imaging device according to the present invention.
Figure 58A:
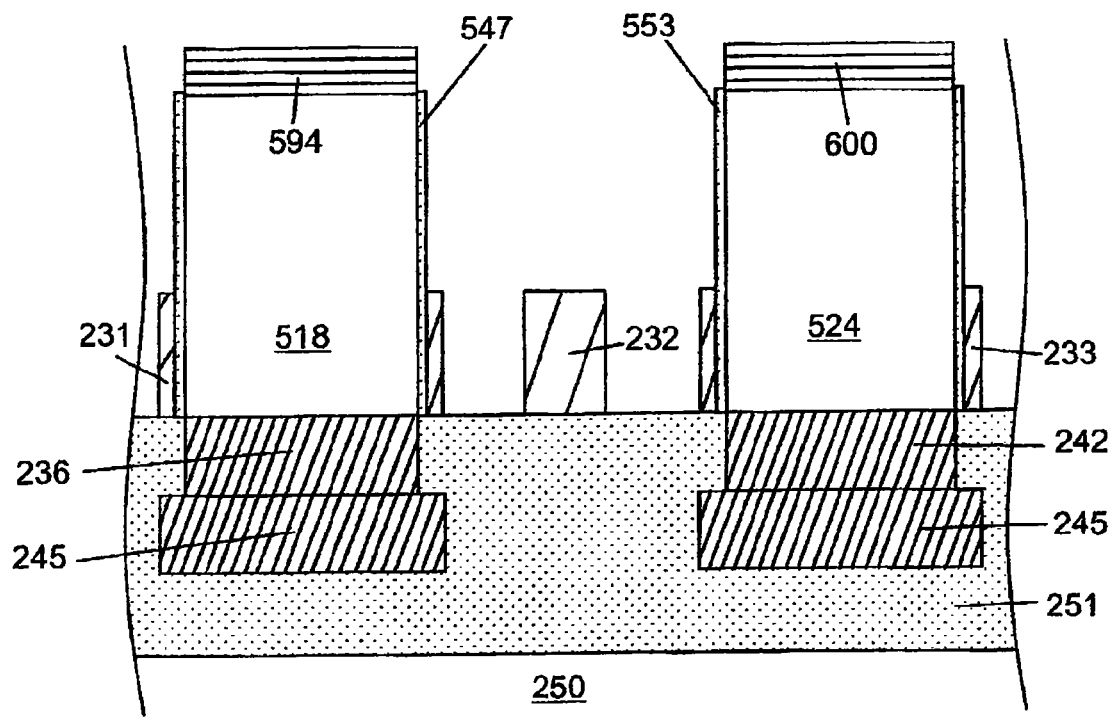
FIG. 58(a) is a process drawing in a sectional view taken along the $X_3$-$X_3$' line of FIG. 57 illustrating the exemplary production of a solid-state imaging device according to the present invention.
Figure 58B:
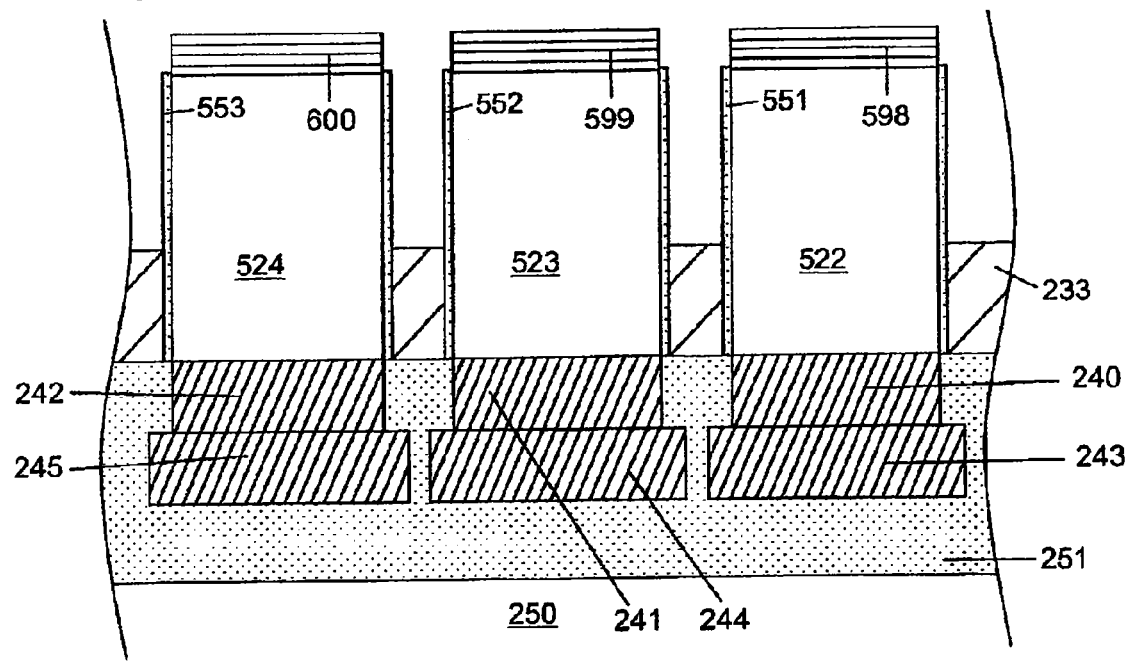
FIG. 58(b) is a process drawing in a sectional view taken along the $Y_3$-$Y_3$' line of FIG. 57 illustrating the exemplary production of a solid-state imaging device according to the present invention.

The resist is removed (FIG. 57 and FIGS. 58(*a*) and 58(*b*)).

Figure 59:
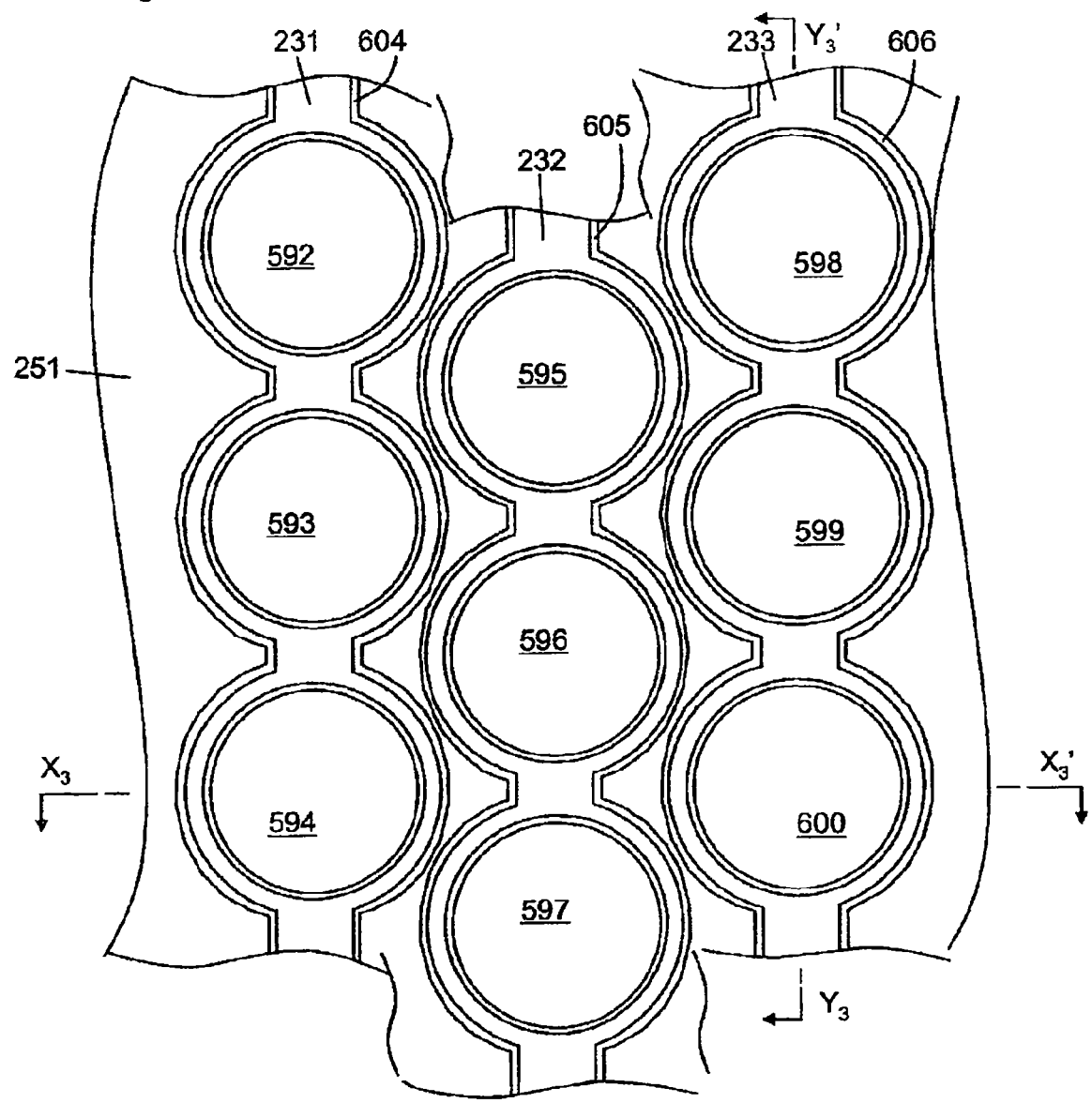
FIG. 59 is a top view showing an exemplary production of a solid-state imaging device according to the present invention.
Figure 60A:
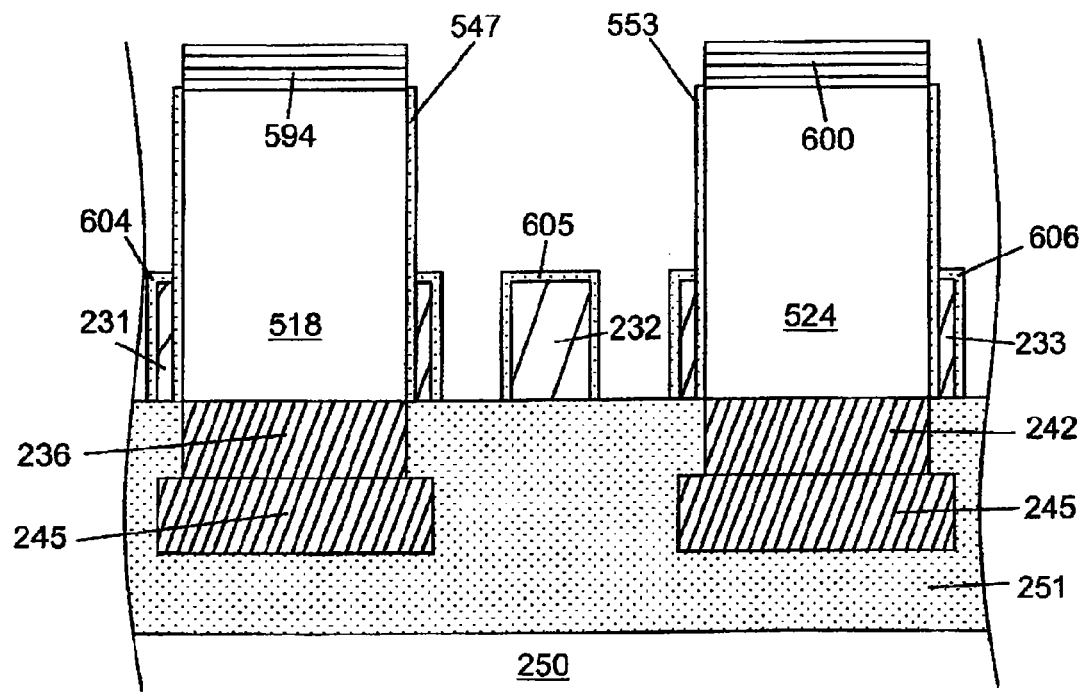
FIG. 60(a) is a process drawing in a sectional view taken along the $X_3$-$X_3$' line of FIG. 59 illustrating the exemplary production of a solid-state imaging device according to the present invention.
Figure 60B:
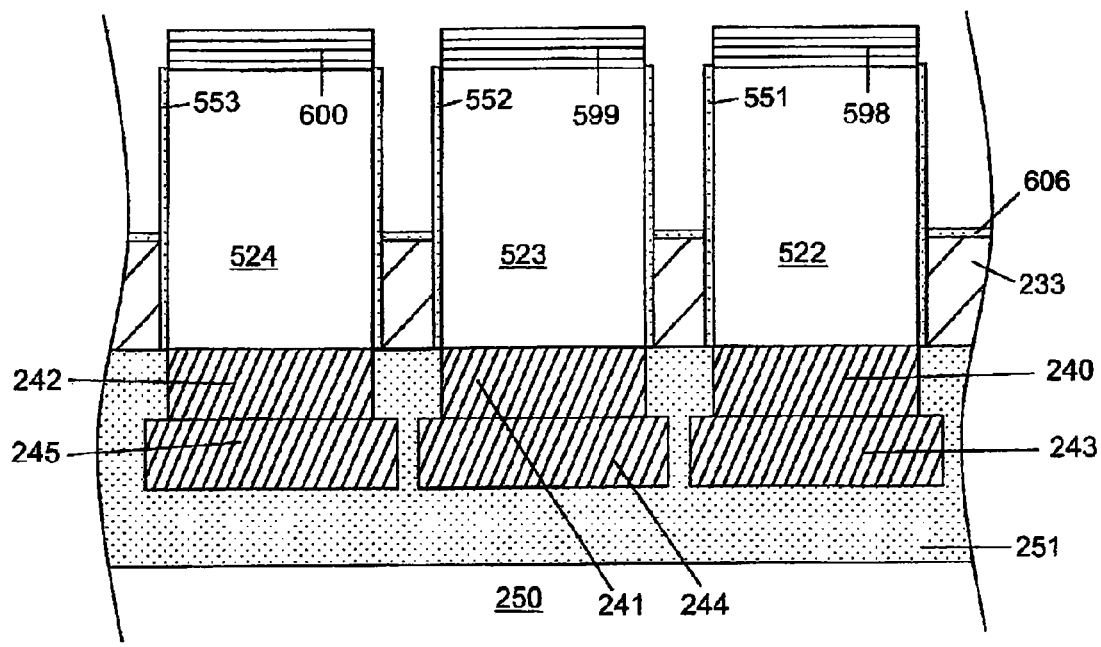
FIG. 60(b) is a process drawing in a sectional view taken along the $Y_3$-$Y_3$' line of FIG. 59 illustrating the exemplary production of a solid-state imaging device according to the present invention.

The thin oxide film on the sidewall of the silicon column is removed, and then, for the purpose of preventing the ion channeling during the ion implantation, the silicon column sidewall and the polysilicon of the gate are oxidized to form an oxide film 604, 605, 606 (FIG. 59 and FIGS. 60(*a*) and 69(*b*)).

Figure 61:
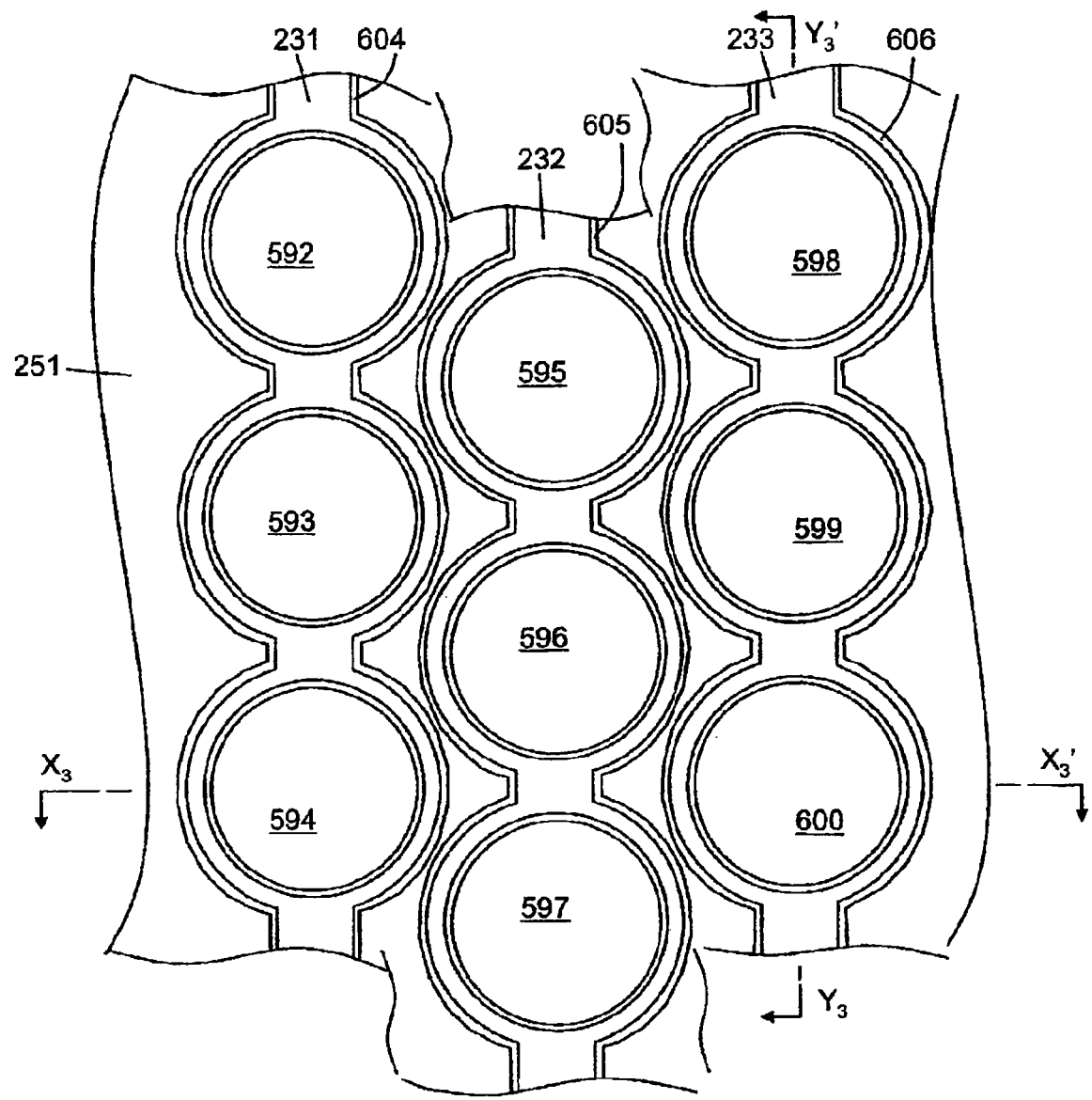
FIG. 61 is a top view showing an exemplary production of a solid-state imaging device according to the present invention.
Figure 62A:
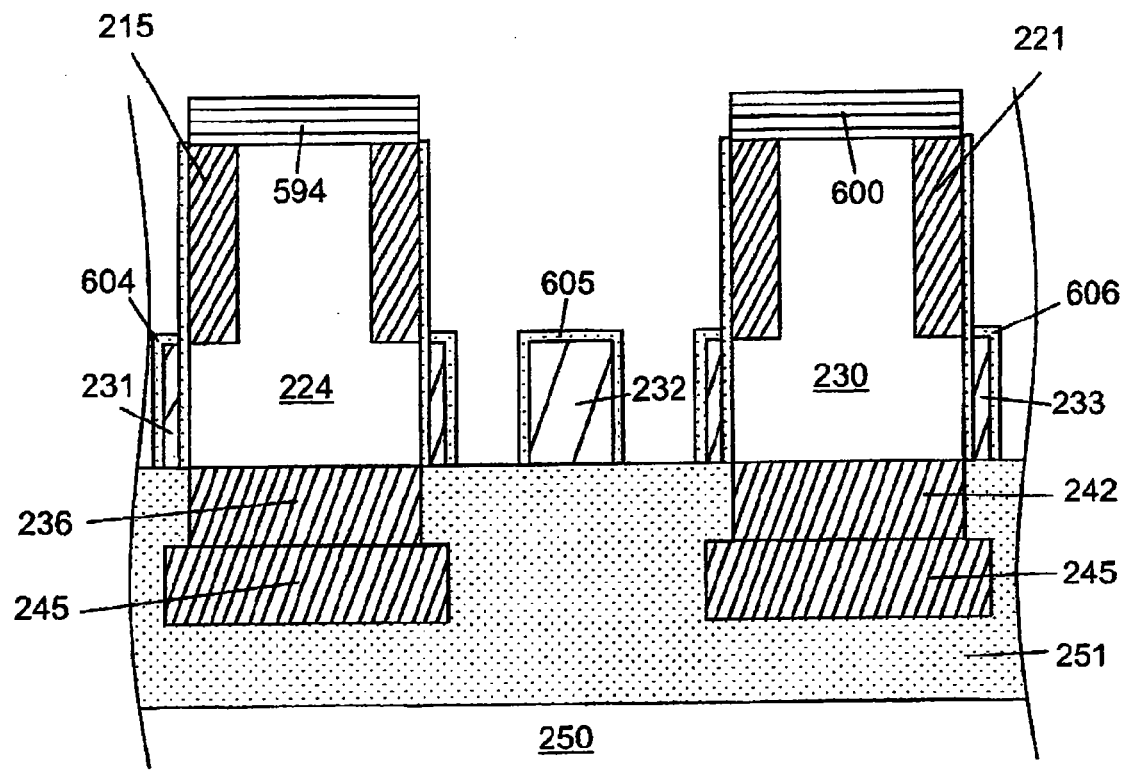
FIG. 62(a) is a process drawing in a sectional view taken along the $X_3$-$X_3$' line of FIG. 61 illustrating the exemplary production of a solid-state imaging device according to the present invention.
Figure 62B:
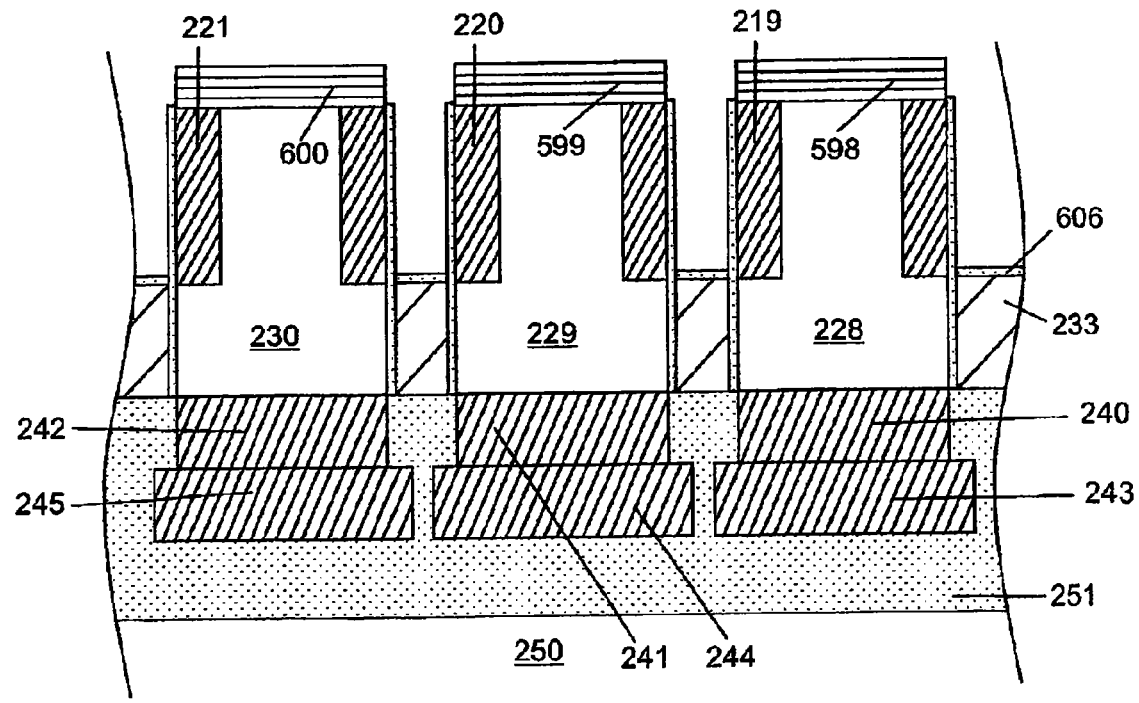
FIG. 62(b) is a process drawing in a sectional view taken along the $Y_3$-$Y_3$' line of FIG. 61 illustrating the exemplary production of a solid-state imaging device according to the present invention.

The phosphorous is implanted to form the n type diffusion layer 213, 214, 215, 216, 217, 218, 219, 220, 222 (FIG. 61 and FIGS. 62(*a*) and 62(*b*)).

Figure 63:
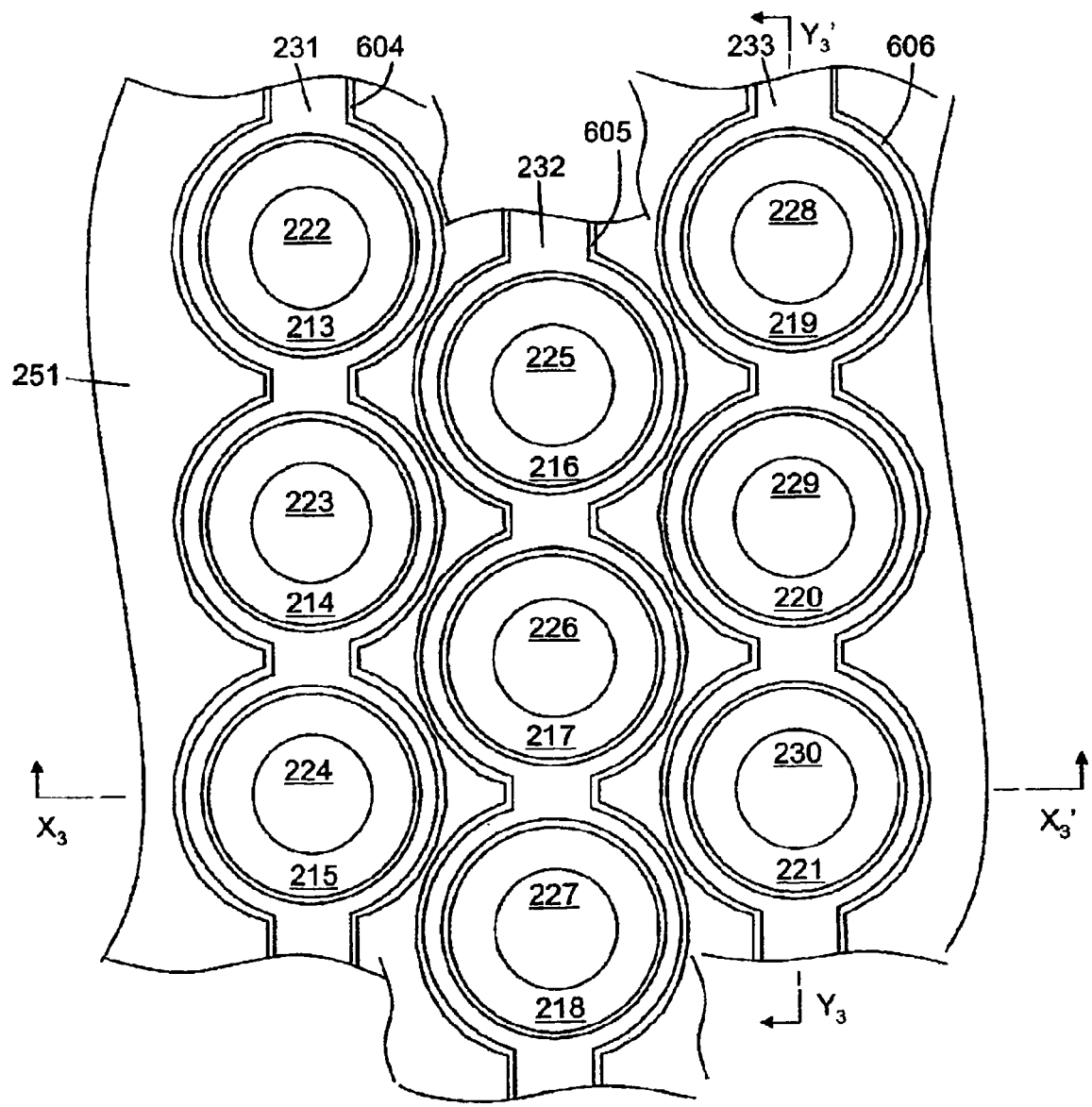
FIG. 63 is a top view showing an exemplary production of a solid-state imaging device according to the present invention.
Figure 64A:
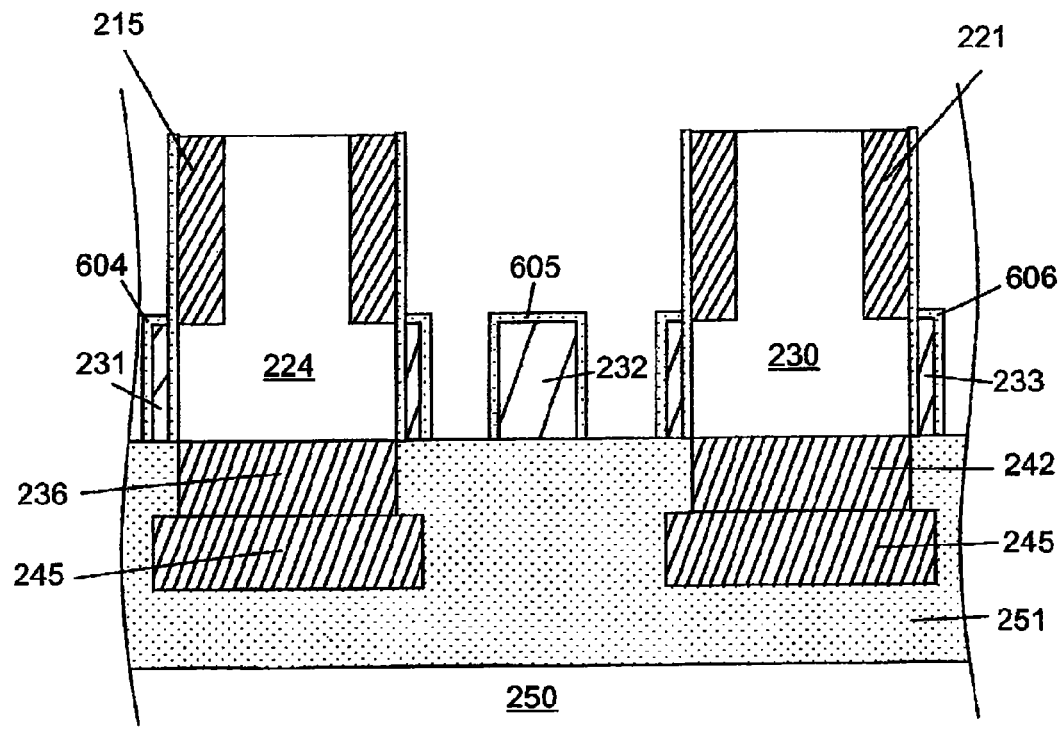
FIG. 64(a) is a process drawing in a sectional view taken along the $X_3$-$X_3$' line of FIG. 63 illustrating the exemplary production of a solid-state imaging device according to the present invention.
Figure 64B:
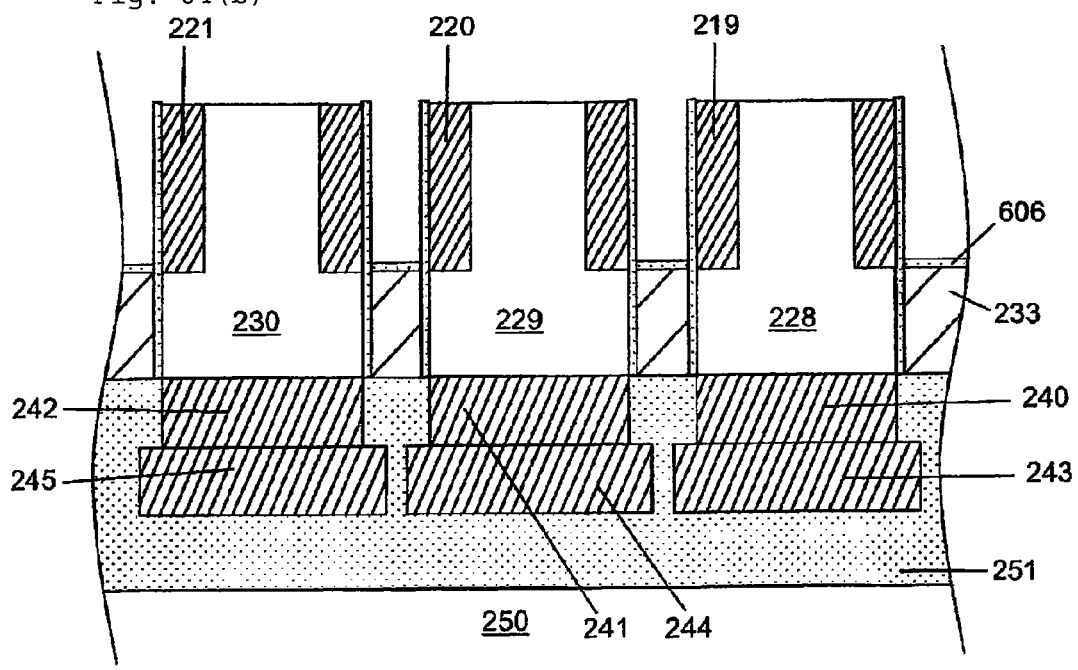
FIG. 64(b) is a process drawing in a sectional view taken along the $Y_3$-$Y_3$' line of FIG. 63 illustrating the exemplary production of a solid-state imaging device according to the present invention.

The nitride film is removed (FIG. 63 and FIGS. 64(a) and 64(b)).

Figure 65:
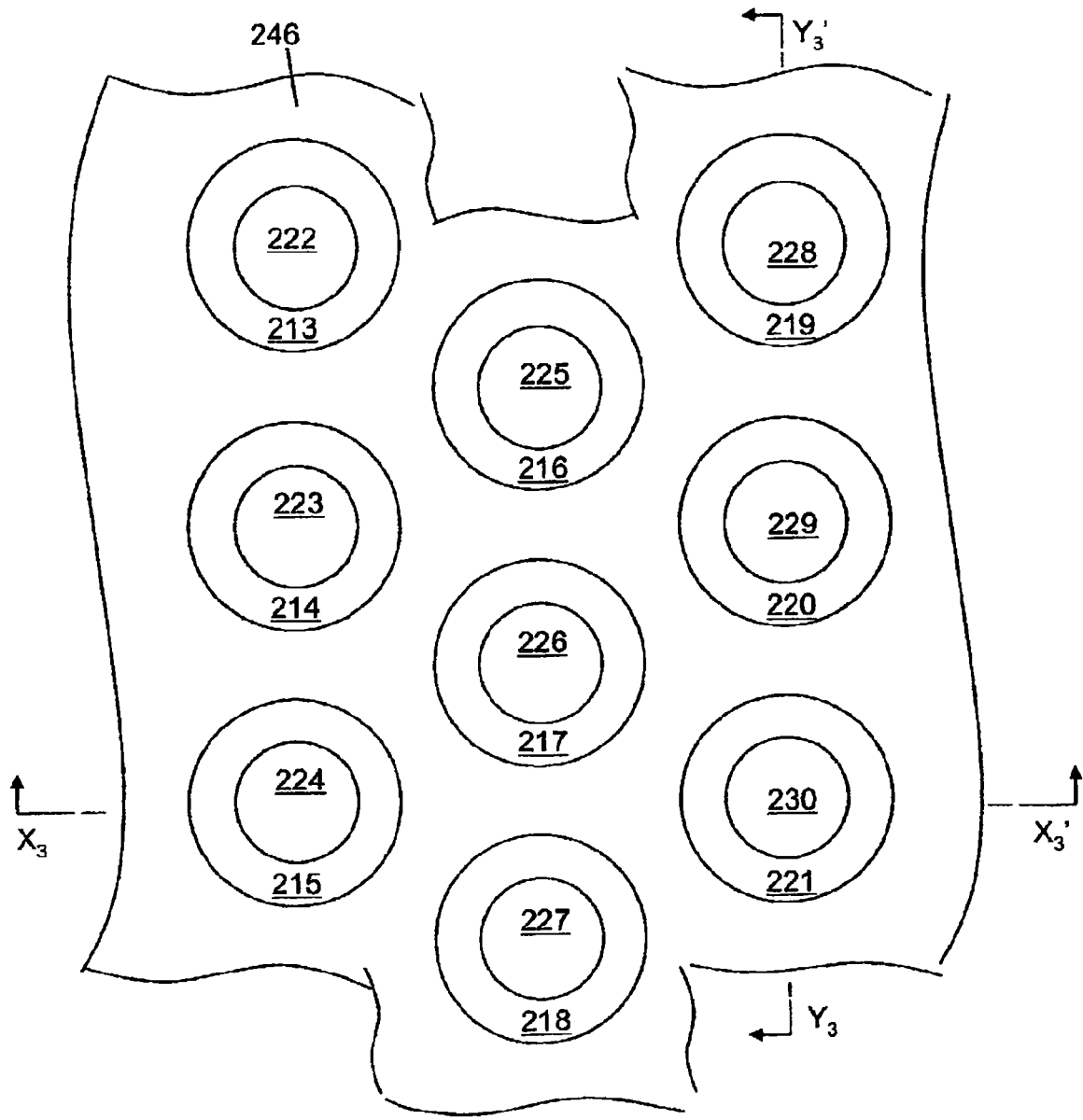
FIG. 65 is a top view showing an exemplary production of a solid-state imaging device according to the present invention.
Figure 66A:
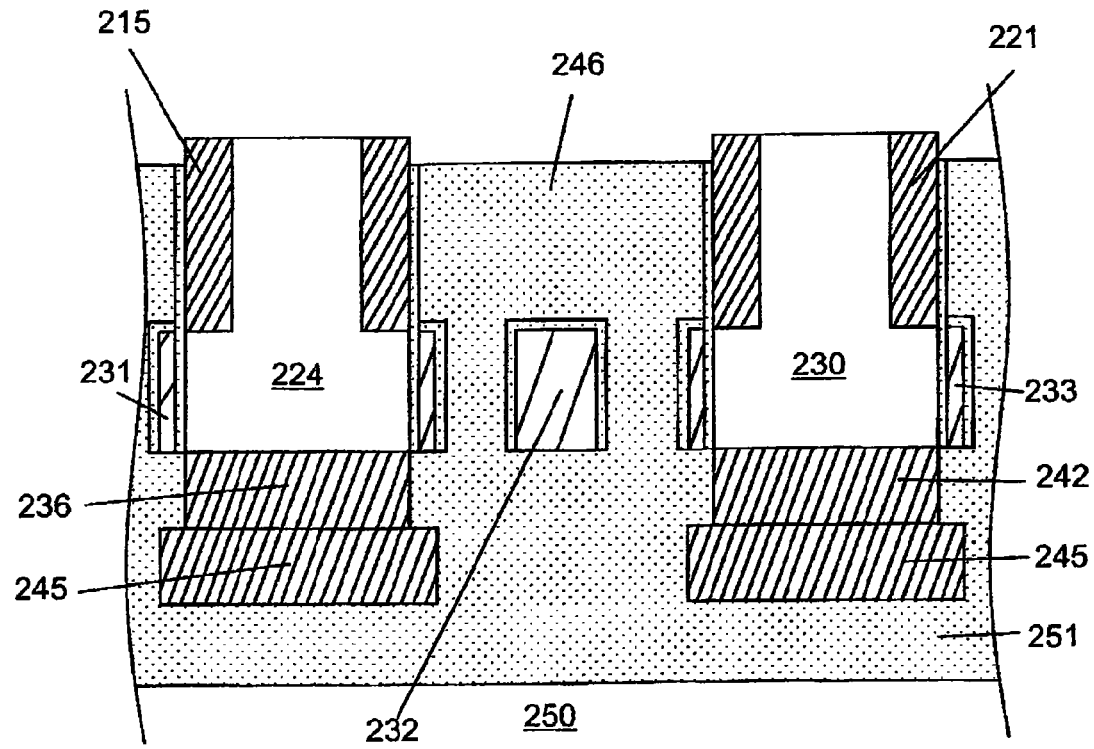
FIG. 66(a) is a process drawing in a sectional view taken along the $X_3$-$X_3$' line of FIG. 65 illustrating the exemplary production of a solid-state imaging device according to the present invention.
Figure 66B:
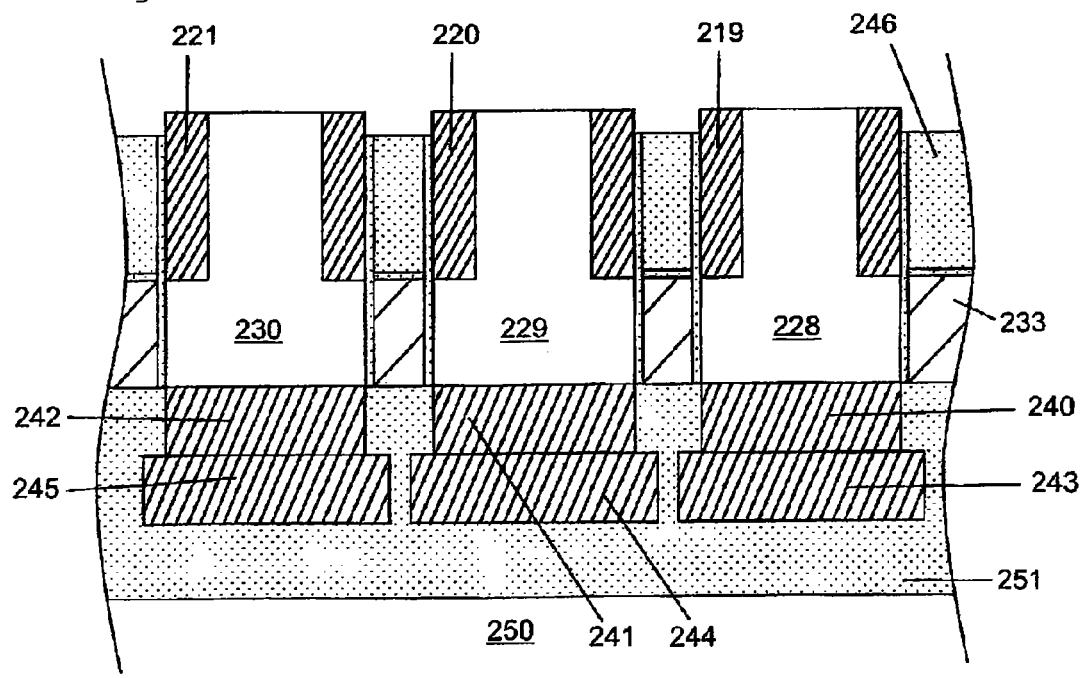
FIG. 66(b) is a process drawing in a sectional view taken along the $Y_3$-$Y_3$' line of FIG. 65 illustrating the exemplary production of a solid-state imaging device according to the present invention.

The oxide film is deposited, planarized and etched back to form the oxide film 246 (FIG. 65 and FIGS. 66(a) and 66(b)).

Figure 67:
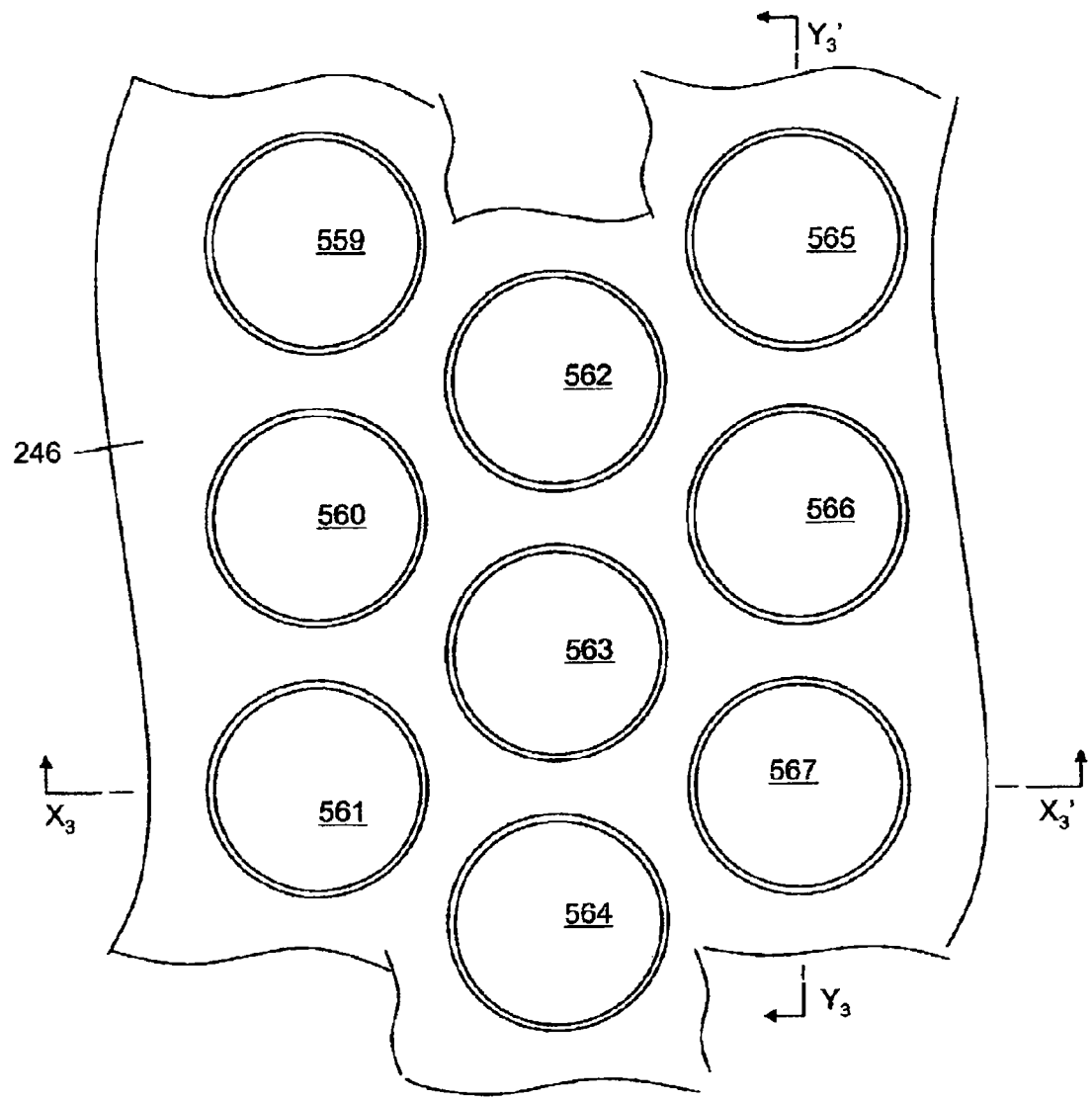
FIG. 67 is a top view showing an exemplary production of a solid-state imaging device according to the present invention.
Figure 68A:
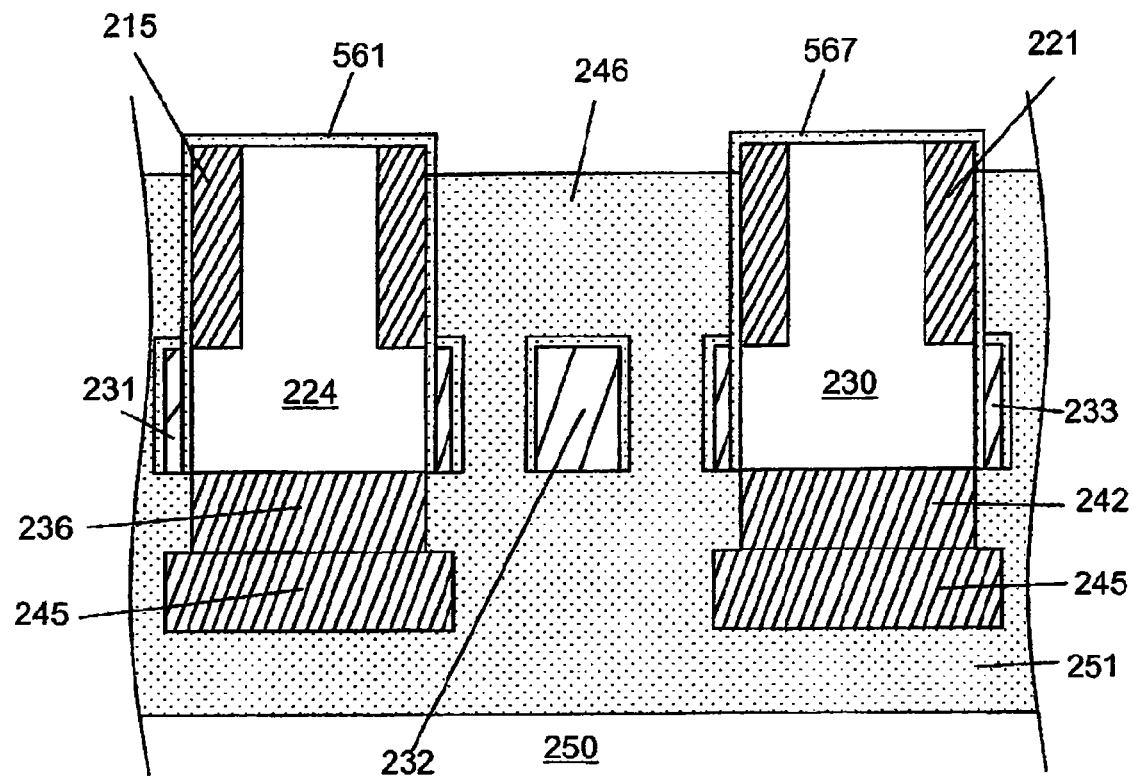
FIG. 68(a) is a process drawing in a sectional view taken along the $X_3$-$X_3$' line of FIG. 67 illustrating the exemplary production of a solid-state imaging device according to the present invention.
Figure 68B:
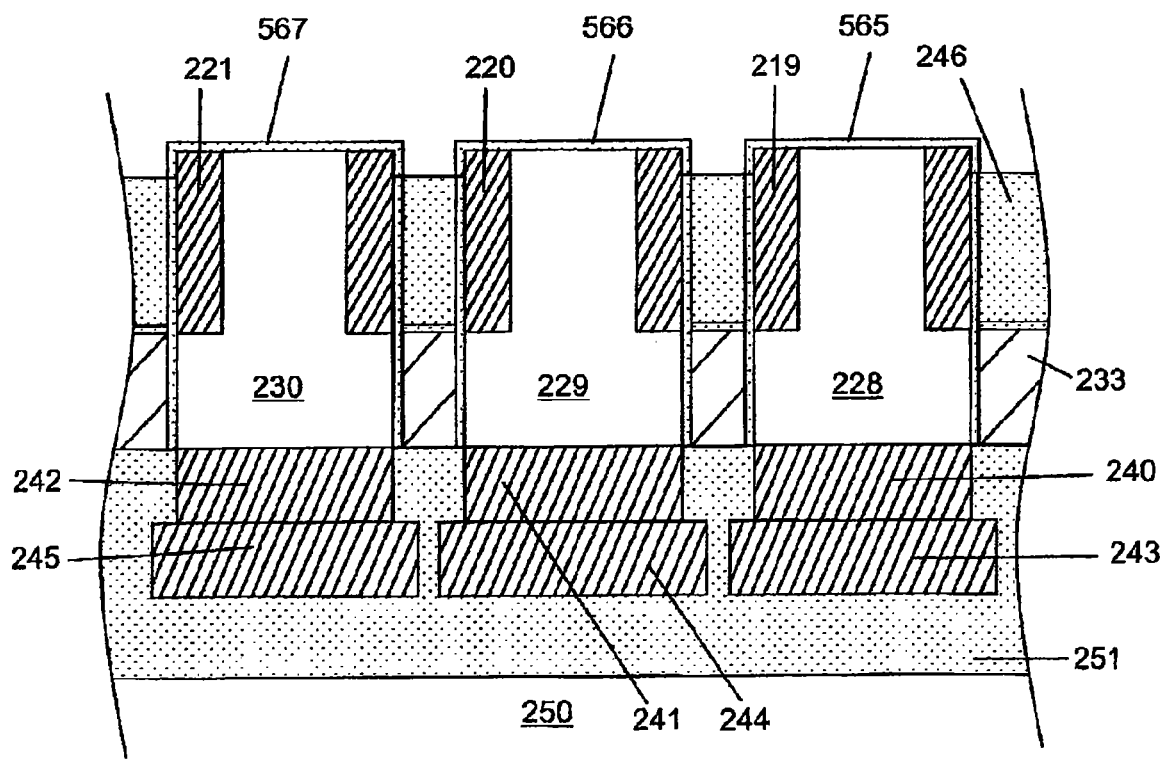
FIG. 68(b) is a process drawing in a sectional view taken along the $Y_3$-$Y_3$' line of FIG. 67 illustrating the exemplary production of a solid-state imaging device according to the present invention.

For the purpose of preventing the ion channeling during the ion implantation, the oxidation is applied to form an oxide film 559, 560, 561, 562, 563, 564, 565, 566, 567 (FIG. 67 and FIGS. 68(a) and 68(b)).

Figure 69:
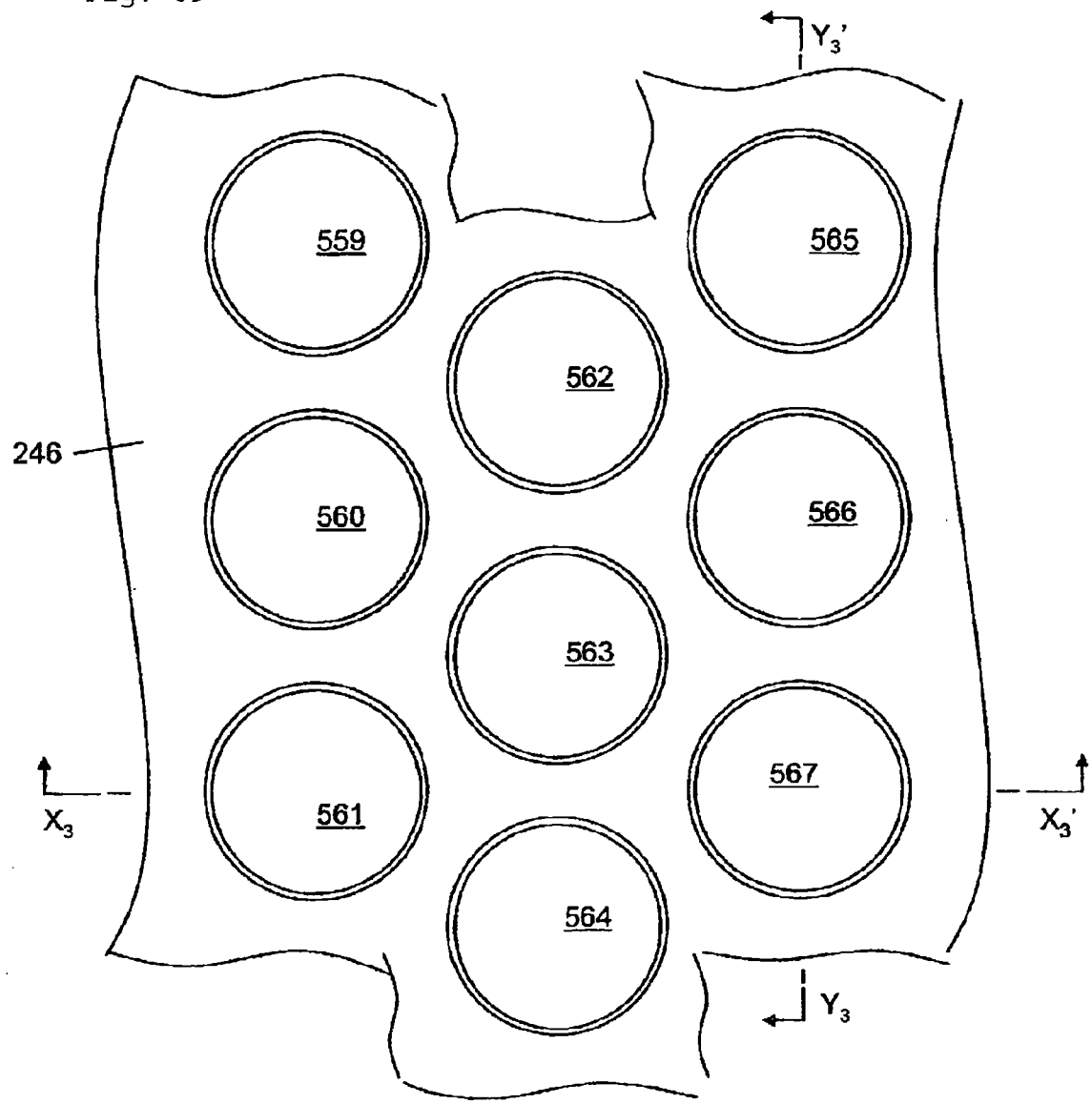
FIG. 69 is a top view showing an exemplary production of a solid-state imaging device according to the present invention.
Figure 70A:
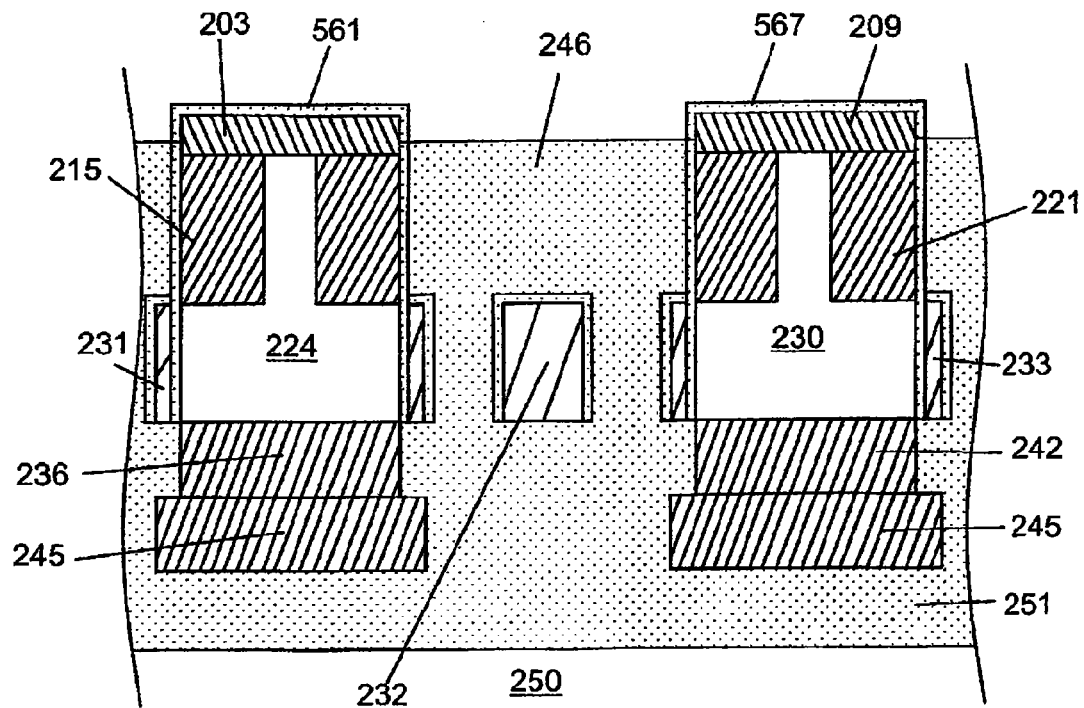
FIG. 70(a) is a process drawing in a sectional view taken along the $X_3$-$X_3$' line of FIG. 69 illustrating the exemplary production of a solid-state imaging device according to the present invention.
Figure 70B:
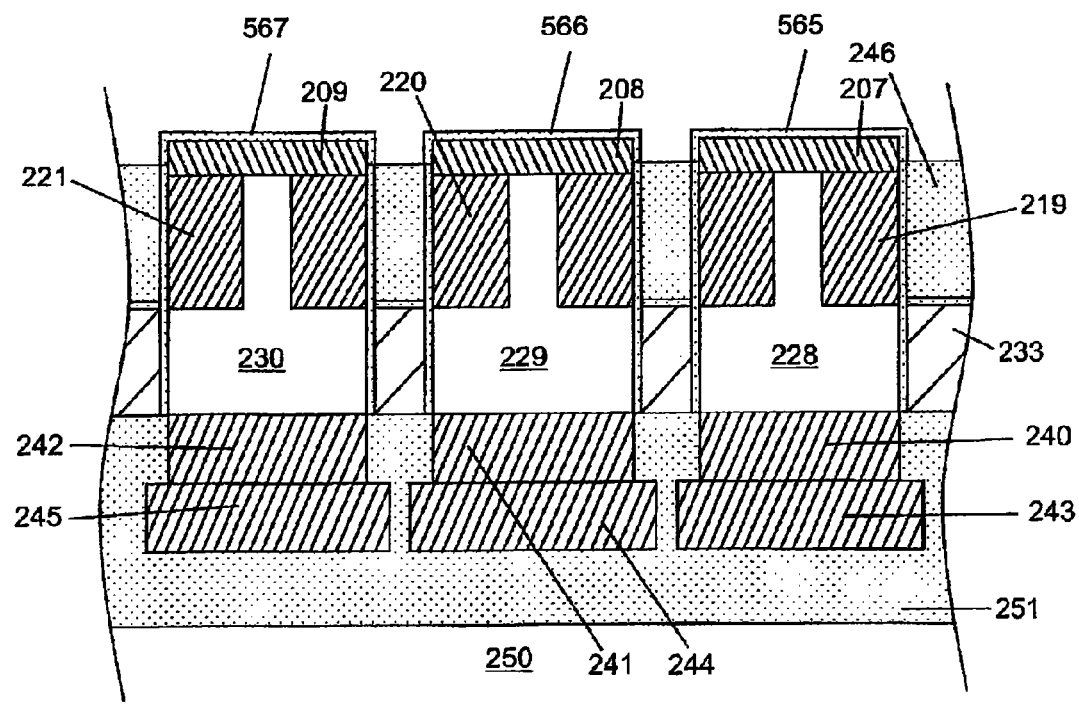
FIG. 70(b) is a process drawing in a sectional view taken along the Y₃-Y₃' line of FIG. 69 illustrating the exemplary production of a solid-state imaging device according to the present invention.

Boron is implanted and annealed to form the p+ type diffusion layer 201, 202, 203, 204, 205, 206, 207, 208, 209 (FIG. 69 and FIGS. 70(a) and 70(b)).

Figure 71:
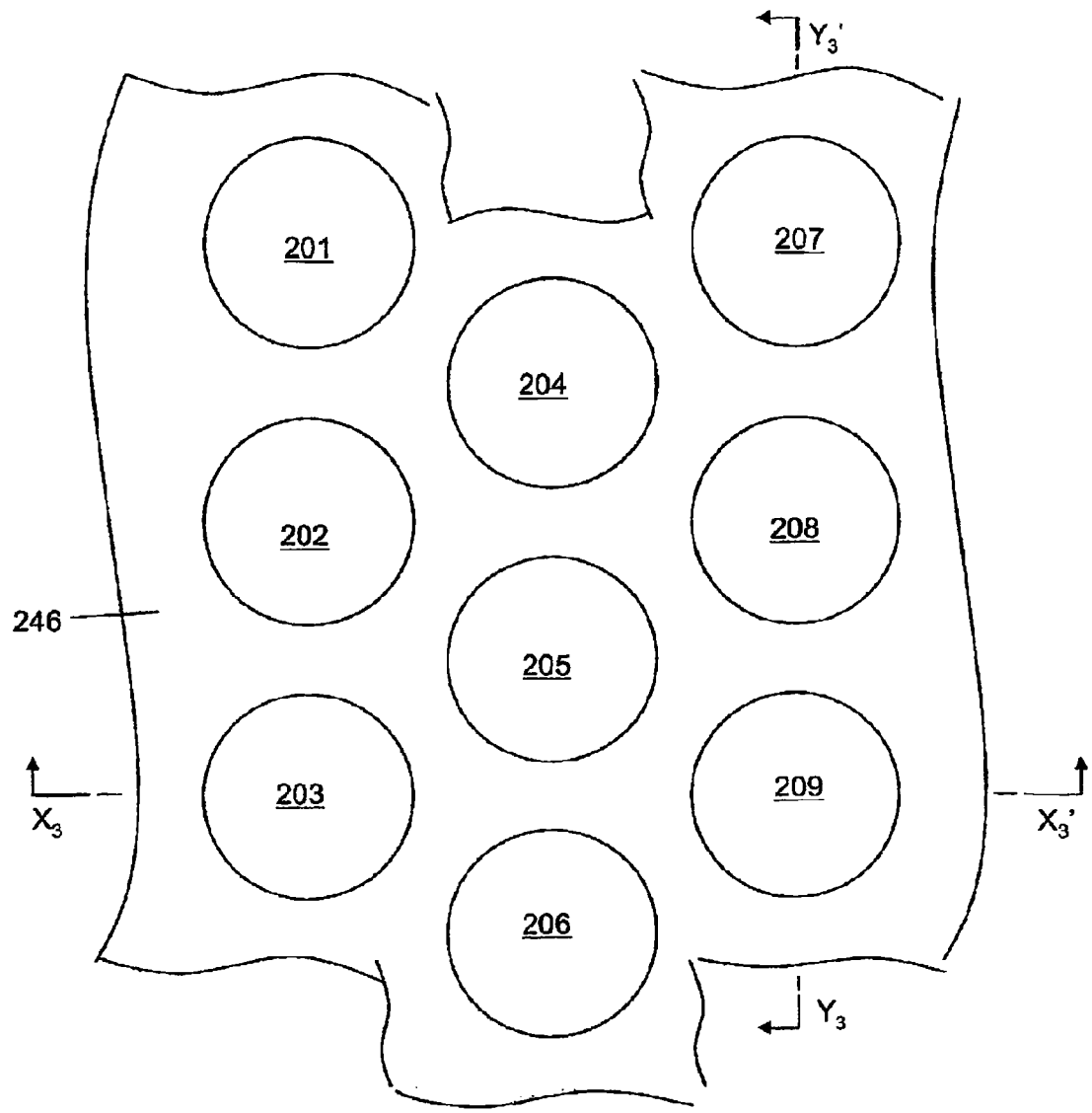
FIG. 71 is a top view showing an exemplary production of a solid-state imaging device according to the present invention.
Figure 72A:
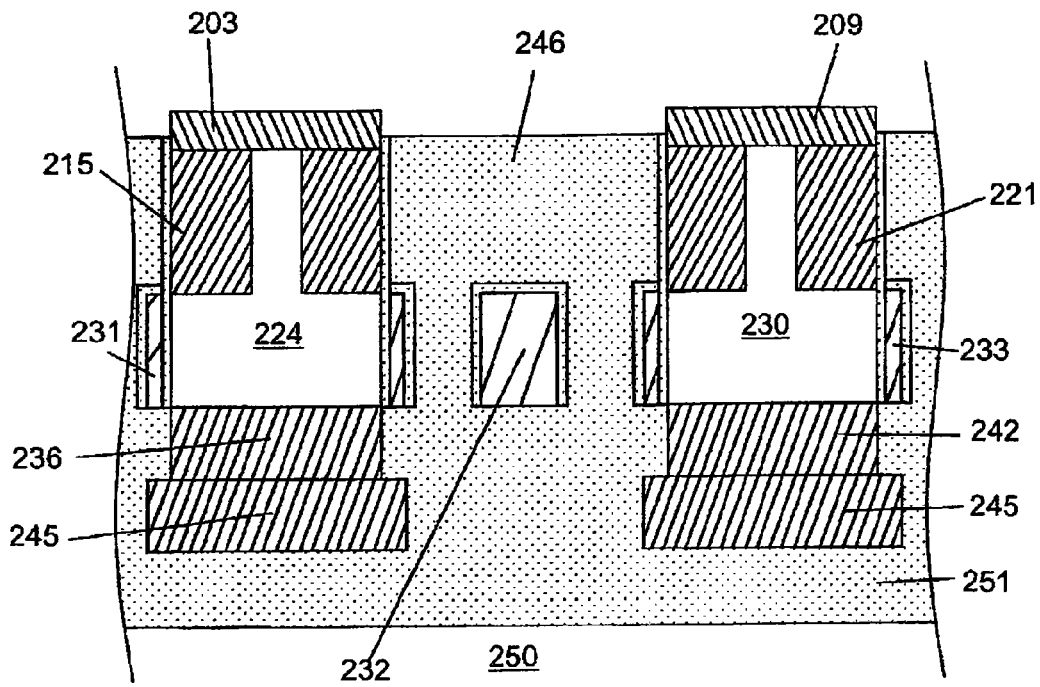
FIG. 72(a) is a process drawing in a sectional view taken along the X₃-X₃' line of FIG. 71 illustrating the exemplary production of a solid-state imaging device according to the present invention.
Figure 72B:
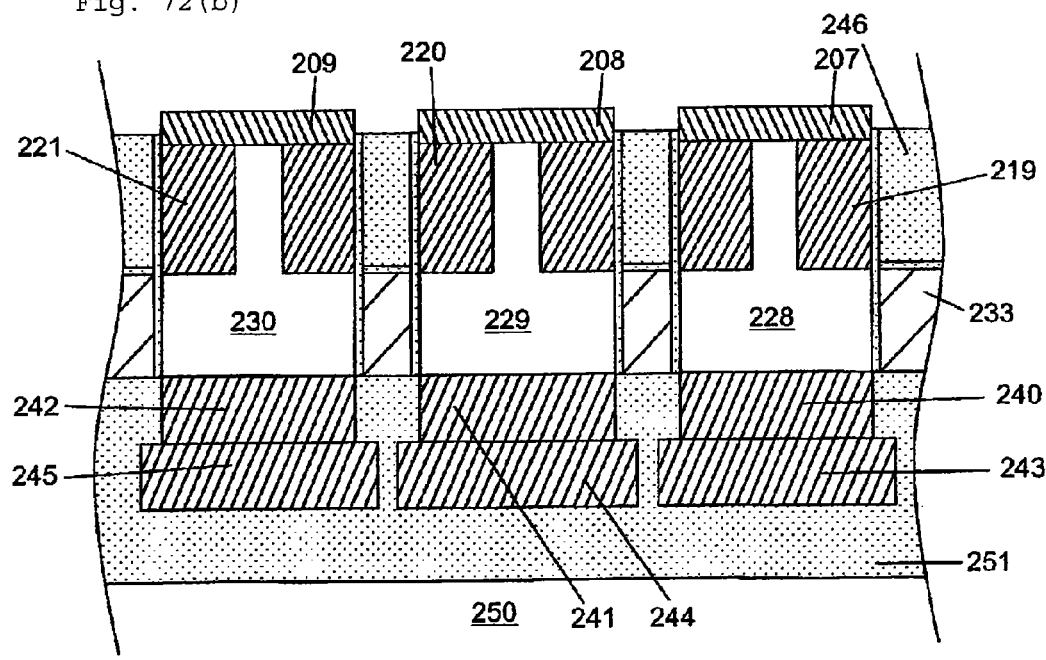
FIG. 72(b) is a process drawing in a sectional view taken along the Y₃-Y₃' line of FIG. 71 illustrating the exemplary production of a solid-state imaging device according to the present invention.

The oxide film is removed (FIG. 71 and FIGS. 72(a) and 72(b).

Figure 73:
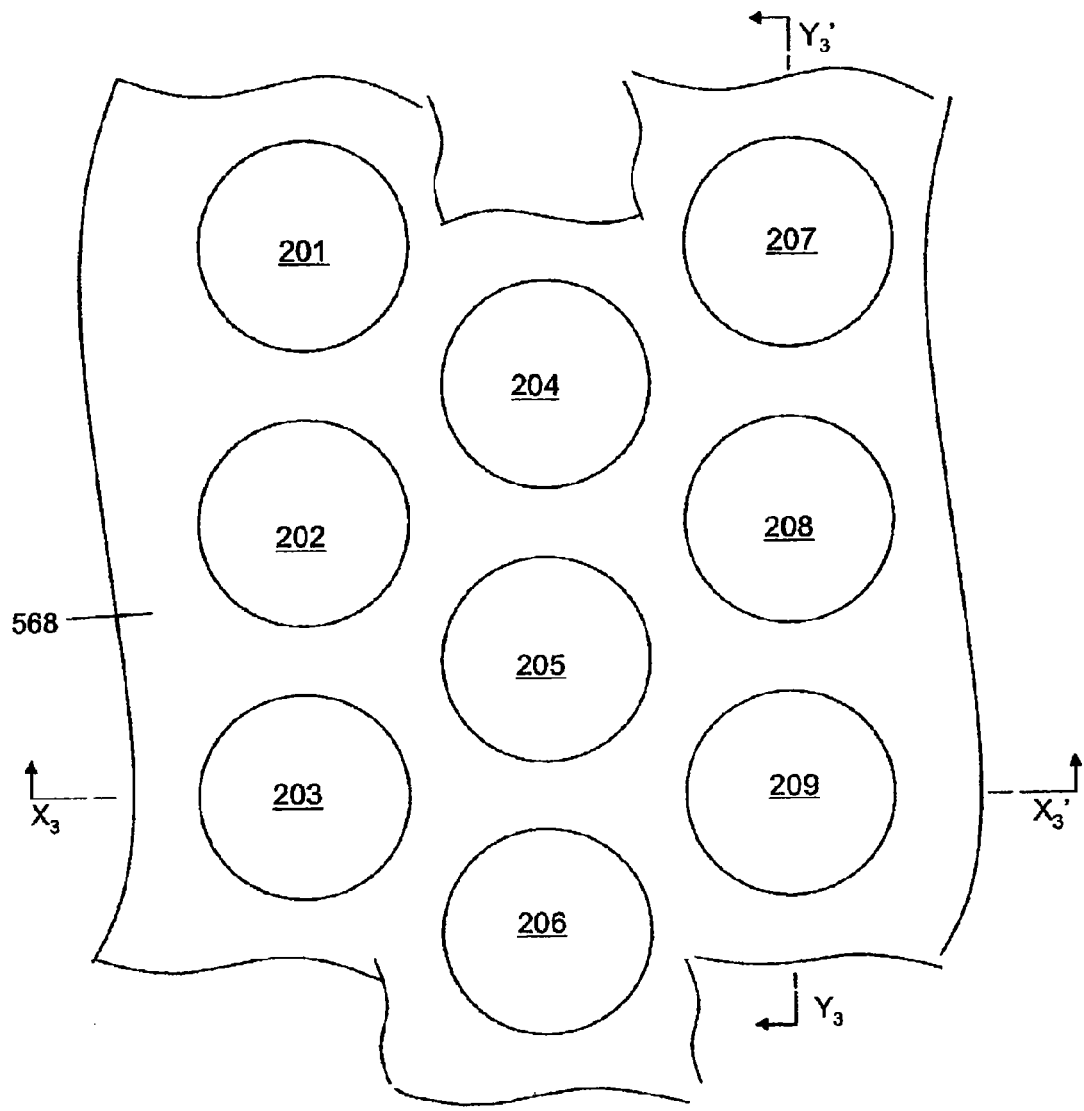
FIG. 73 is a top view showing an exemplary production of a solid-state imaging device according to the present invention.
Figure 74A:
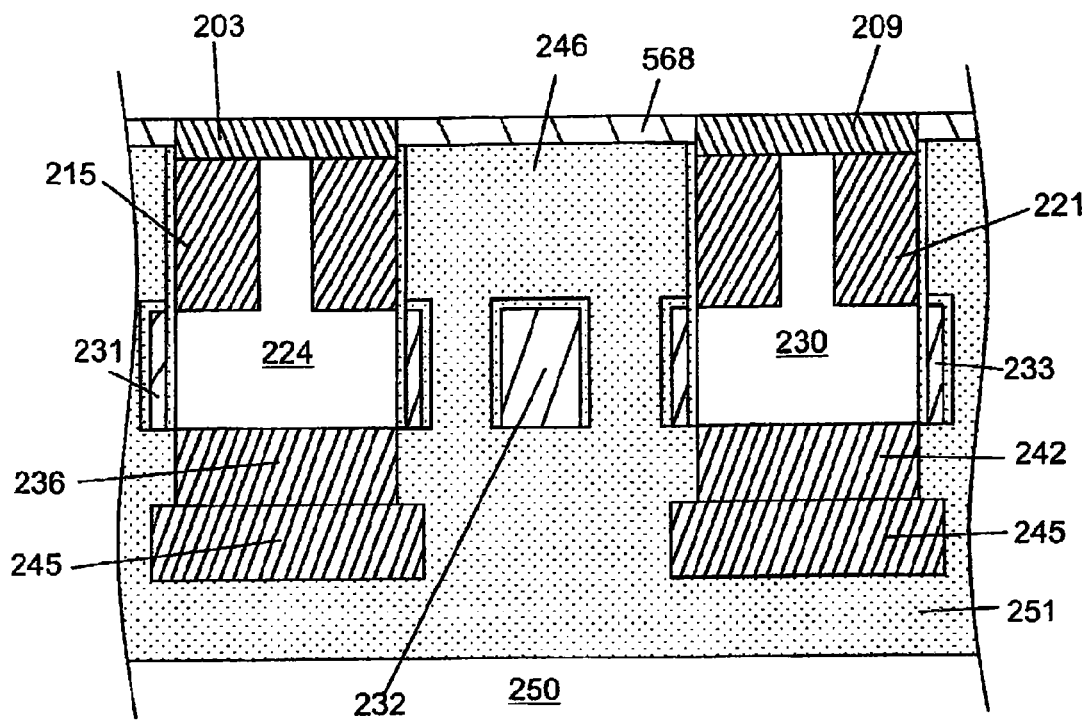
FIG. 74(a) is a process drawing in a sectional view taken along the X₃-X₃' line of FIG. 73 illustrating the exemplary production of a solid-state imaging device according to the present invention.
Figure 74B:
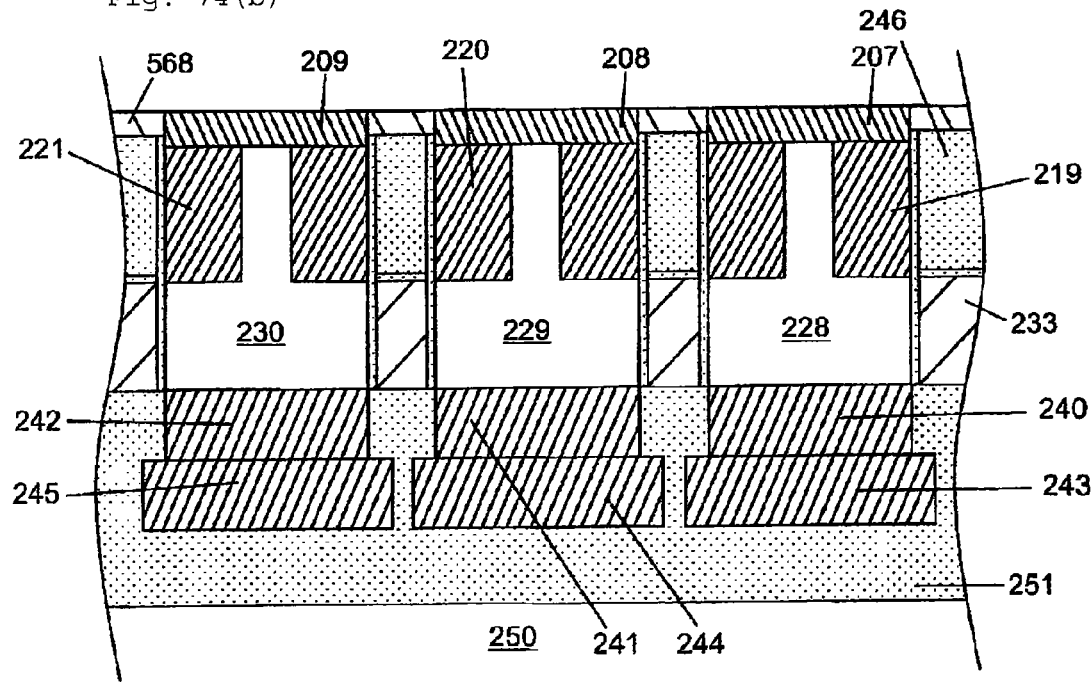
FIG. 74(b) is a process drawing in a sectional view taken along the Y₃-Y₃' line of FIG. 73 illustrating the exemplary production of a solid-state imaging device according to the present invention.

Metal 568 is deposited, planarized and etched back (FIG. 73 and FIGS. 74(a) and 74(b)).

Figure 75:
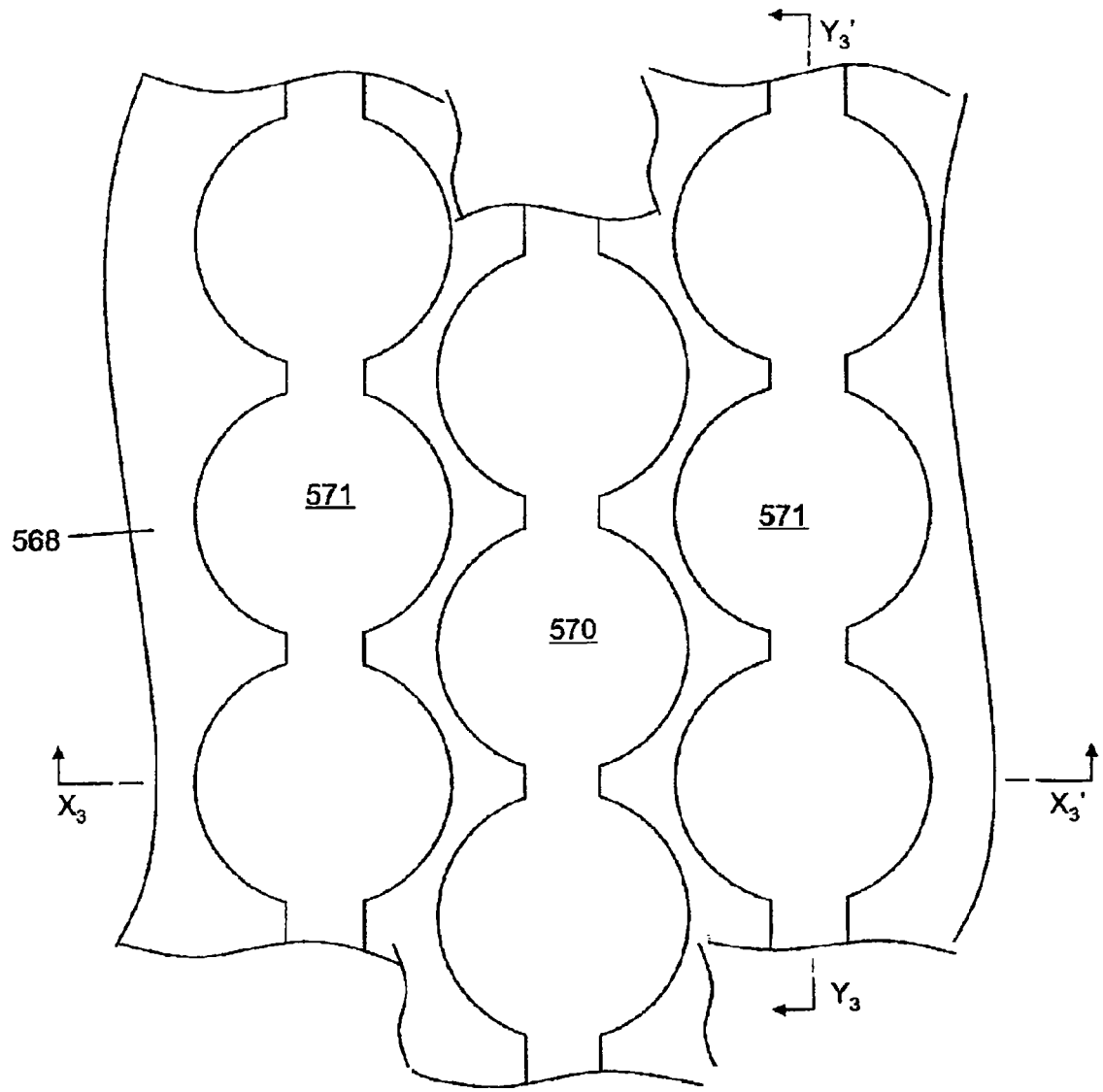
FIG. 75 is a top view showing an exemplary production of a solid-state imaging device according to the present invention.
Figure 76A:
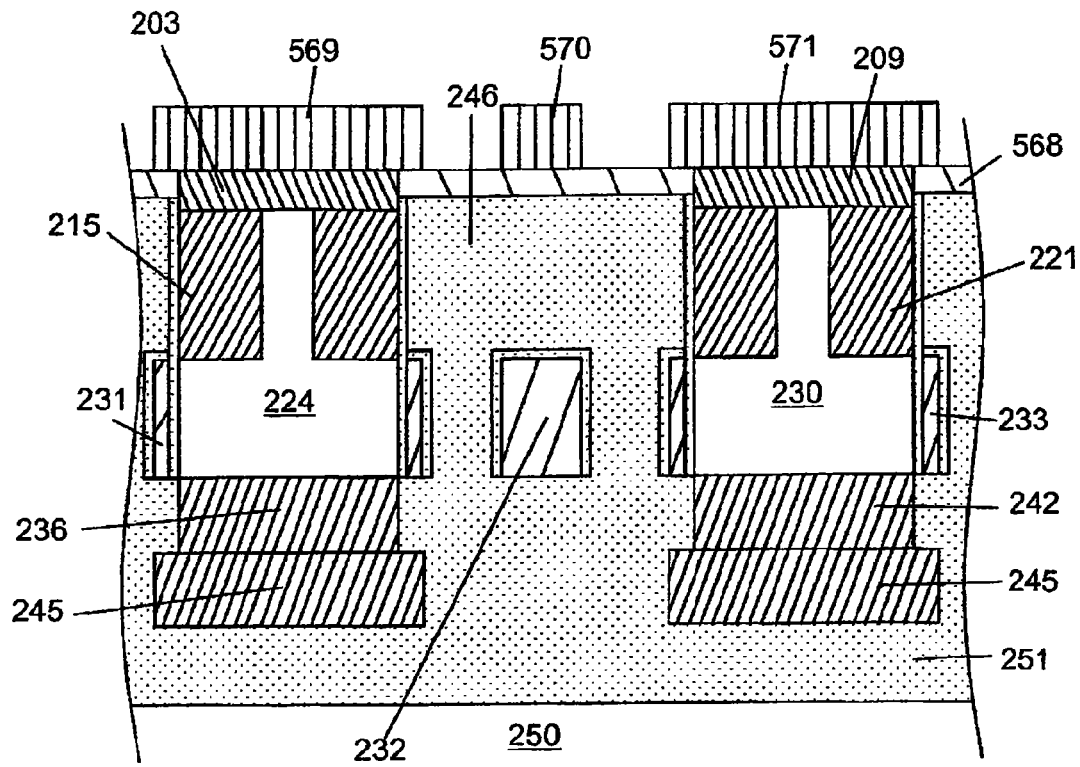
FIG. 76(a) is a process drawing in a sectional view taken along the X₃-X₃' line of FIG. 75 illustrating the exemplary production of a solid-state imaging device according to the present invention.
Figure 76B:
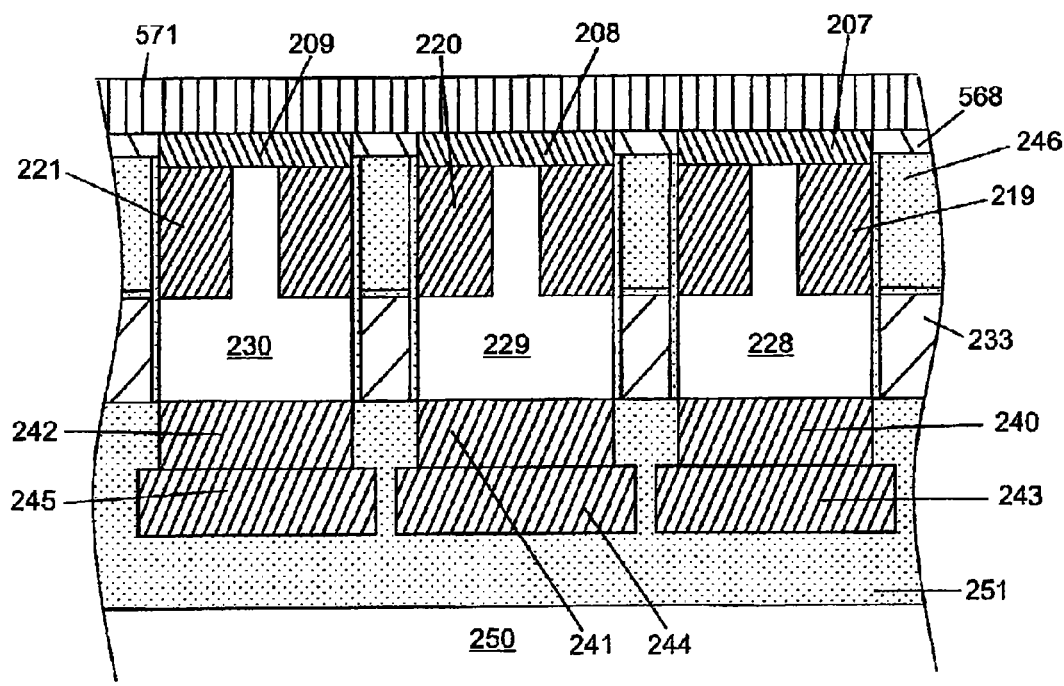
FIG. 76(b) is a process drawing in a sectional view taken along the Y₃-Y₃' line of FIG. 75 illustrating the exemplary production of a solid-state imaging device according to the present invention.

A resist 569, 570, 571 for the pixel selection line is formed (FIG. 75 and FIGS. 76(a) and 76(b)).

Figure 77:
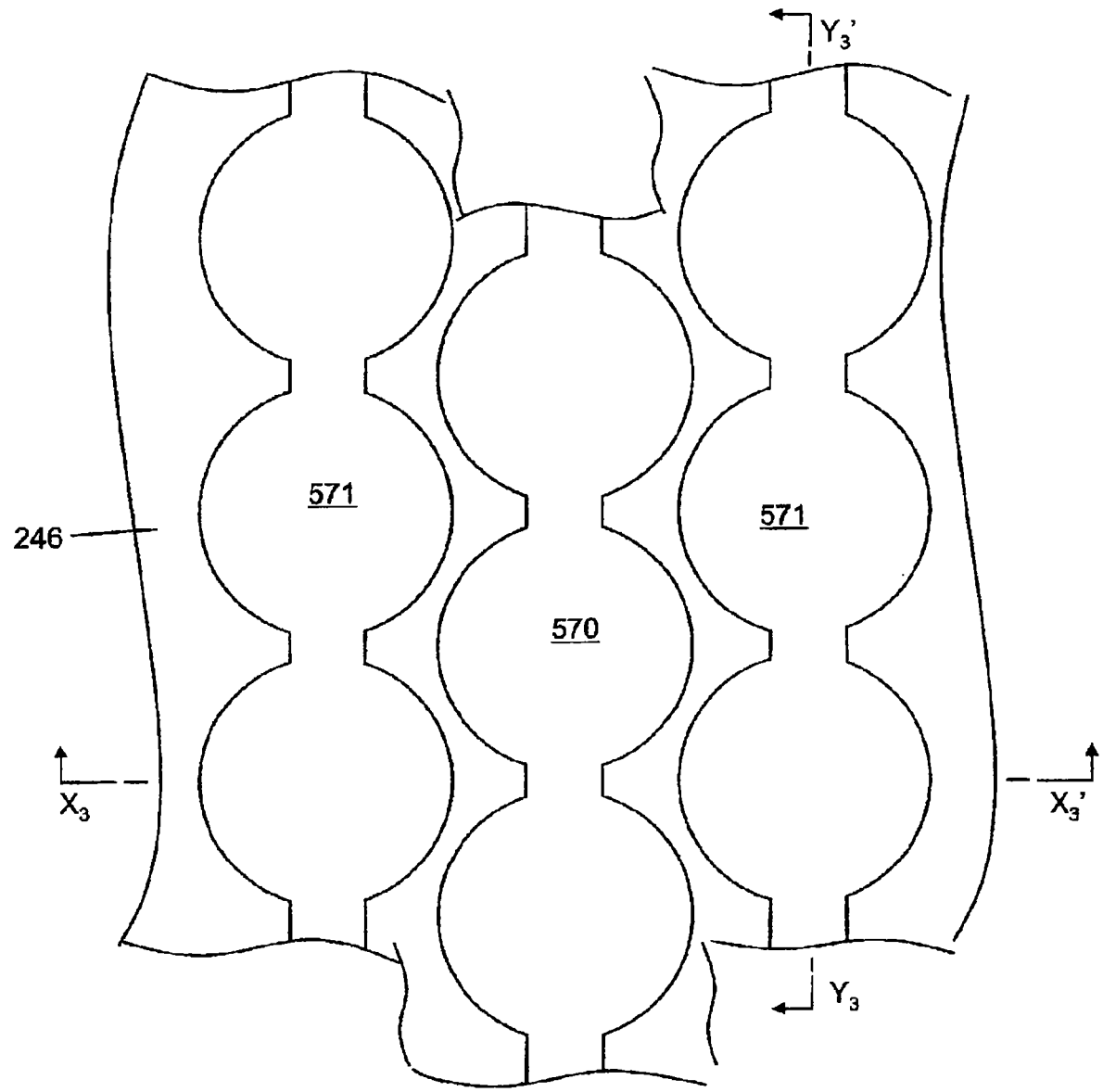
FIG. 77 is a top view showing an exemplary production of a solid-state imaging device according to the present invention.
Figure 78A:
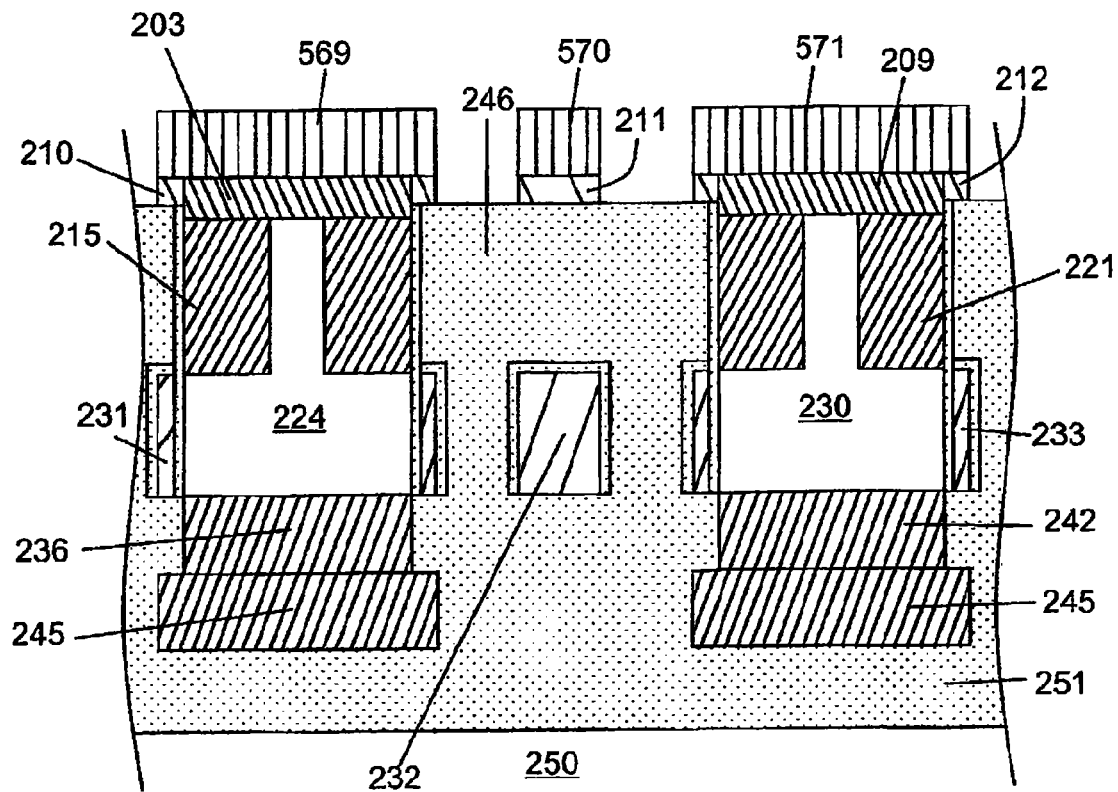
FIG. 78(a) is a process drawing in a sectional view taken along the X₃-X₃' line of FIG. 77 illustrating the exemplary production of a solid-state imaging device according to the present invention.
Figure 78B:
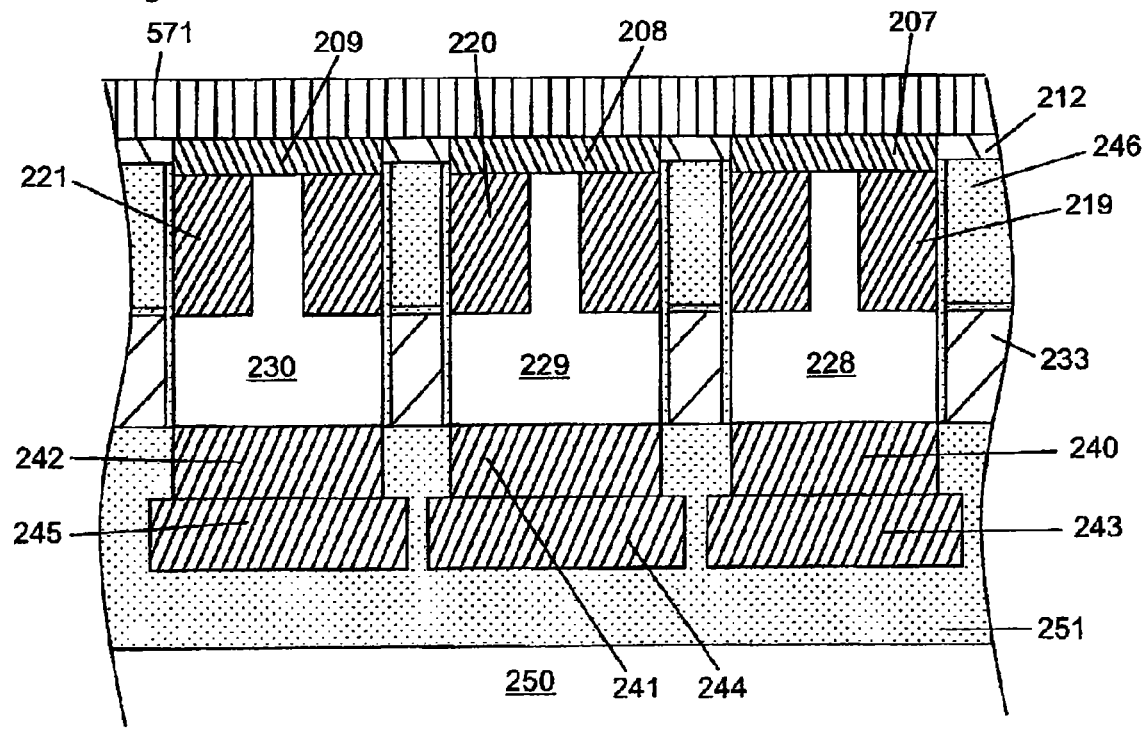
FIG. 78(b) is a process drawing in a sectional view taken along the Y₃-Y₃' line of FIG. 77 illustrating the exemplary production of a solid-state imaging device according to the present invention.

The metal is etched to form the pixel selection line 210, 211, 212 (FIG. 77 and FIGS. 78(a) and 78(b).

Figure 79:
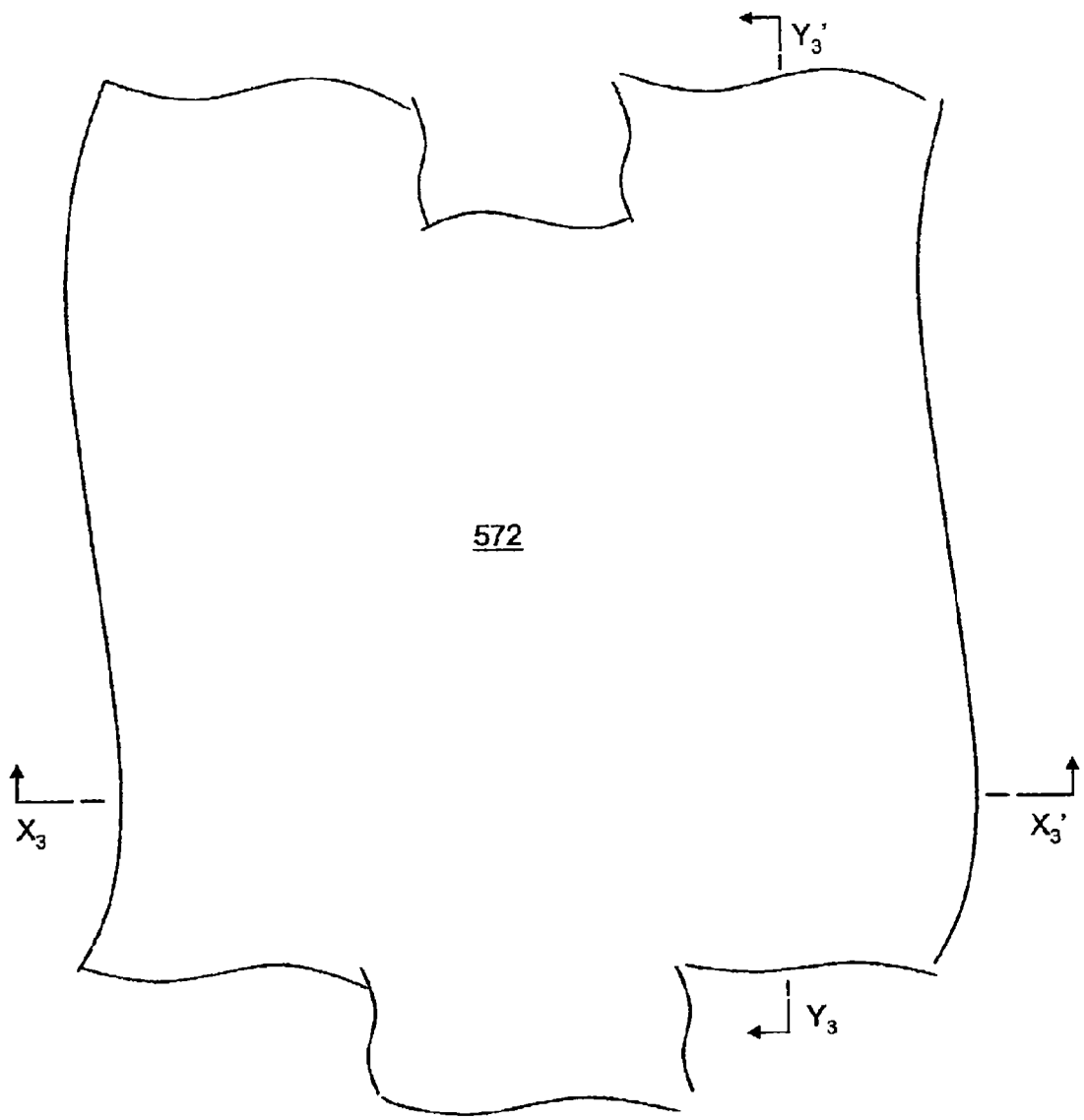
FIG. 79 is a top view showing an exemplary production of a solid-state imaging device according to the present invention.
Figure 80A:
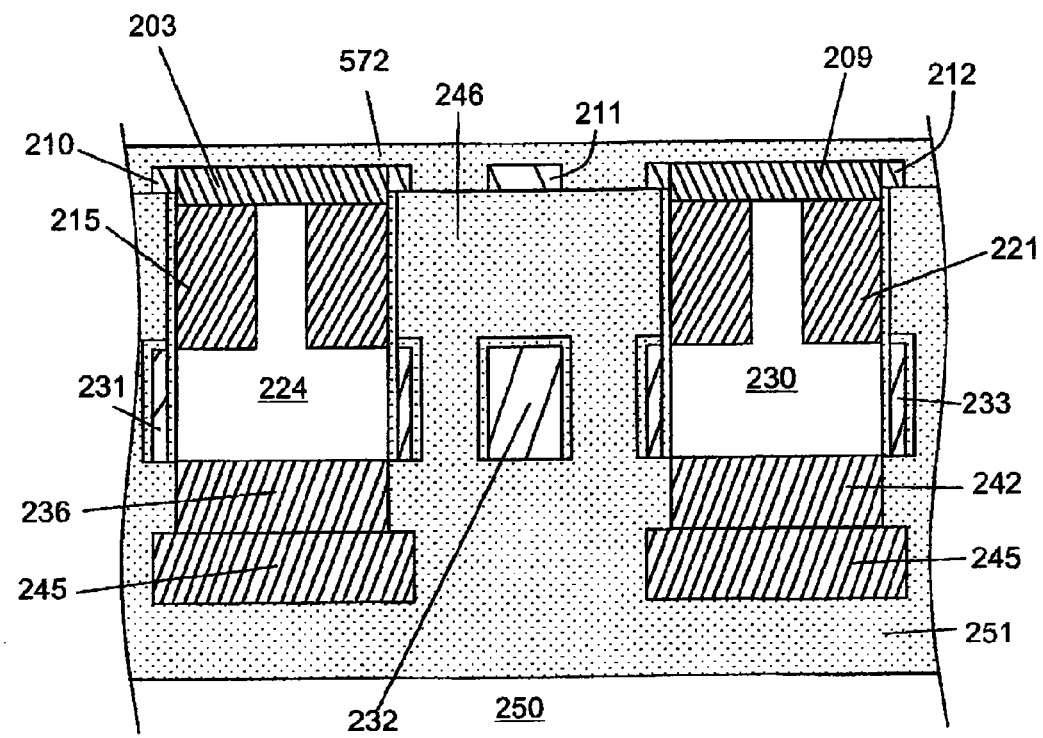
FIG. 80(a) is a process drawing in a sectional view taken along the X₃-X₃' line of FIG. 79 illustrating the exemplary production of a solid-state imaging device according to the present invention.
Figure 80B:
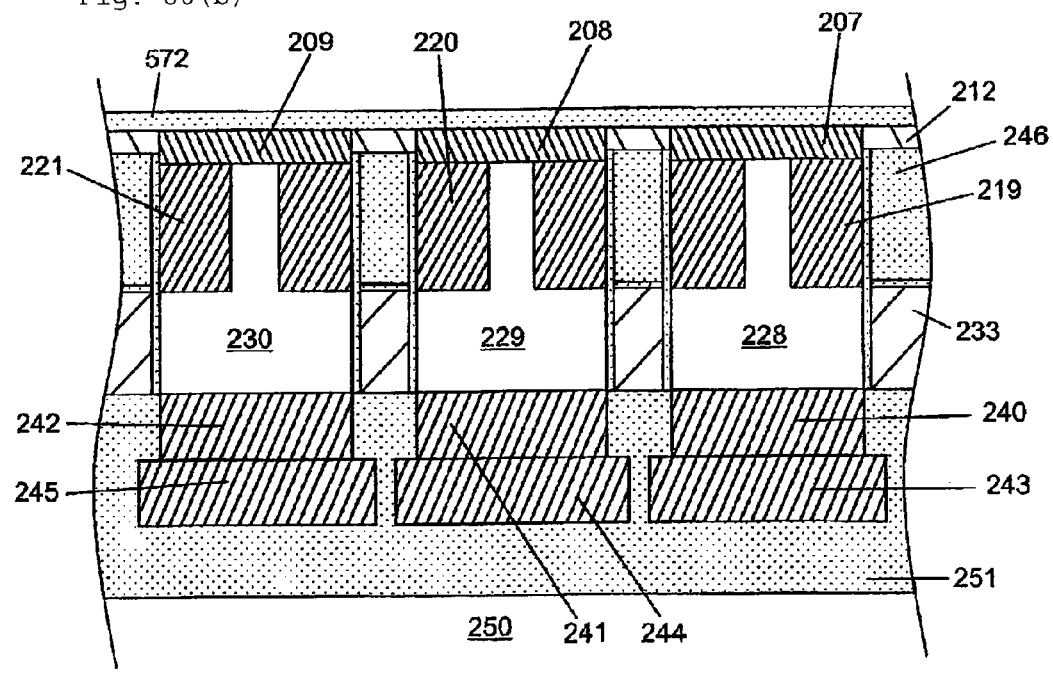
FIG. 80(b) is a process drawing in a sectional view taken along the Y₃-Y₃' line of FIG. 79 illustrating the exemplary production of a solid-state imaging device according to the present invention.

The resist is removed to form a surface protective film 572 (FIG. 79 and FIGS. 80(a) and 80(b)).

Figure 81:
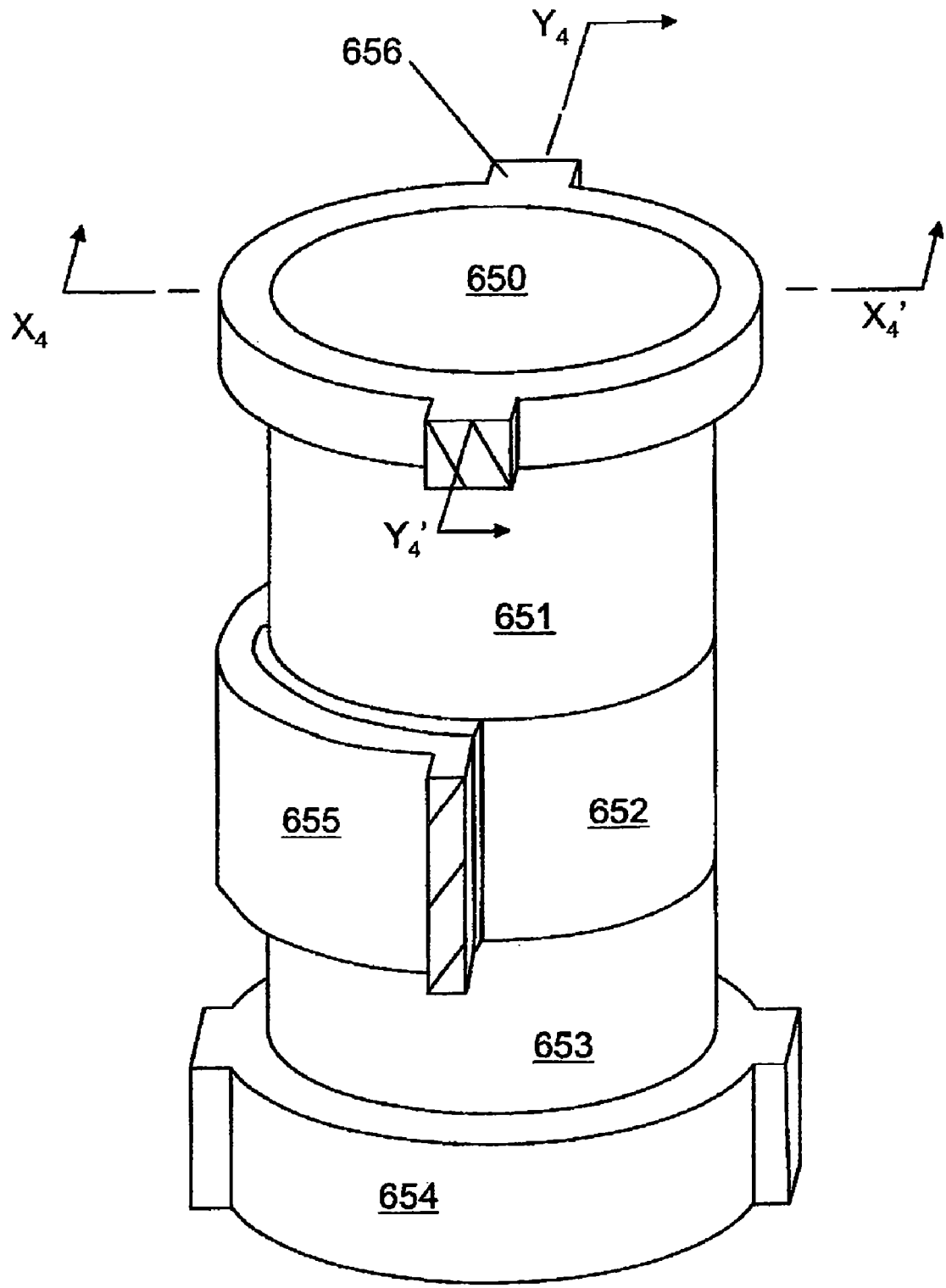
FIG. 81 is a bird's eye view showing an alternative embodiment according to the present invention.

Although, the illustrated embodiment uses the solid-state imaging device having such a construction, in which the p type impurity-doped region is surrounded by the electric charge accumulator; and the p type impurity-doped region is surrounded by the gate via the insulating film, a part of a p type impurity-doped region 652 may be surrounded by a gate 655 via the insulating film, as shown in FIG. 81.

Figure 82A:
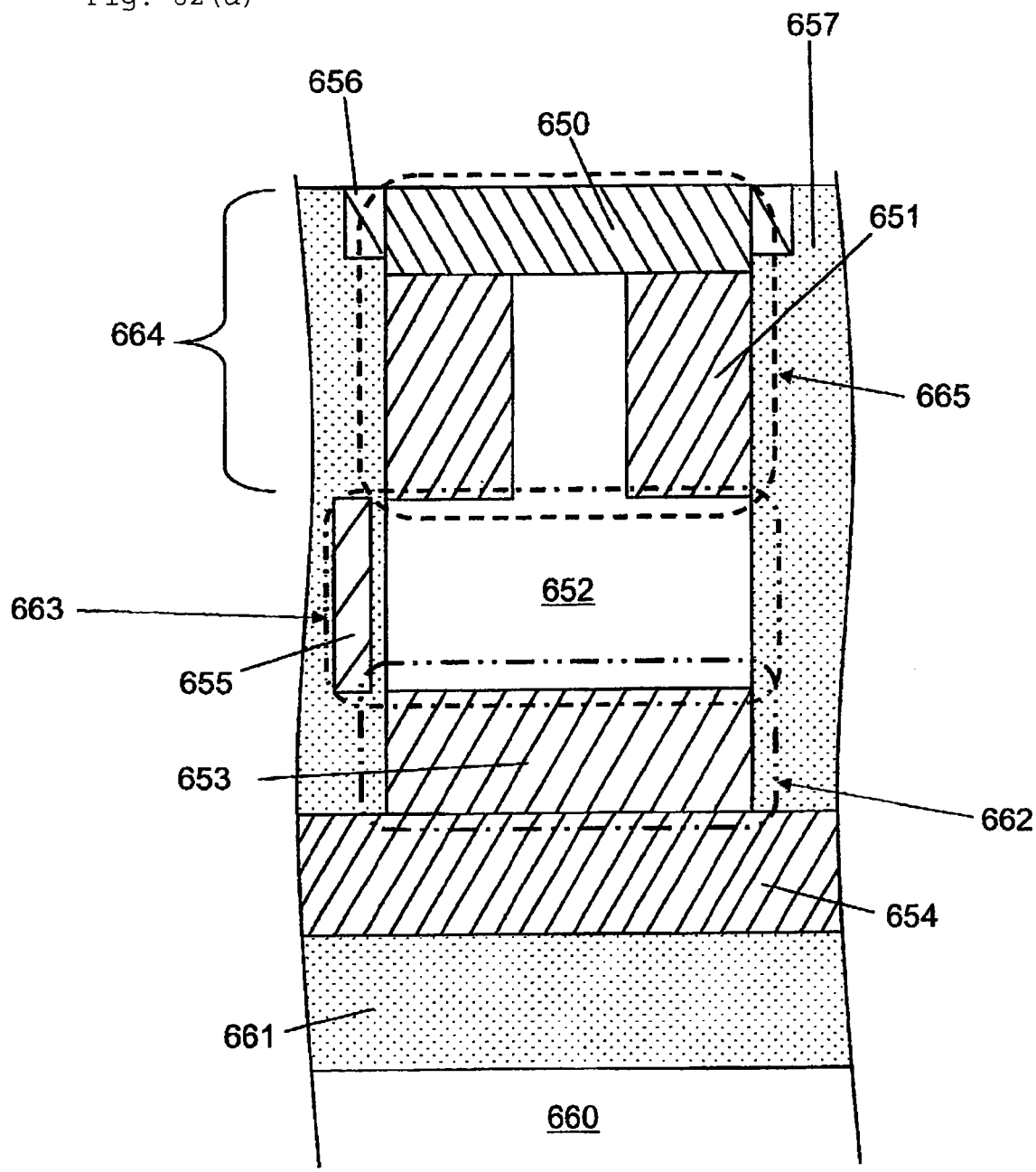
FIG. 82(a) is a sectional view taken along X₄-X₄' line of FIG. 81.
Figure 82B:
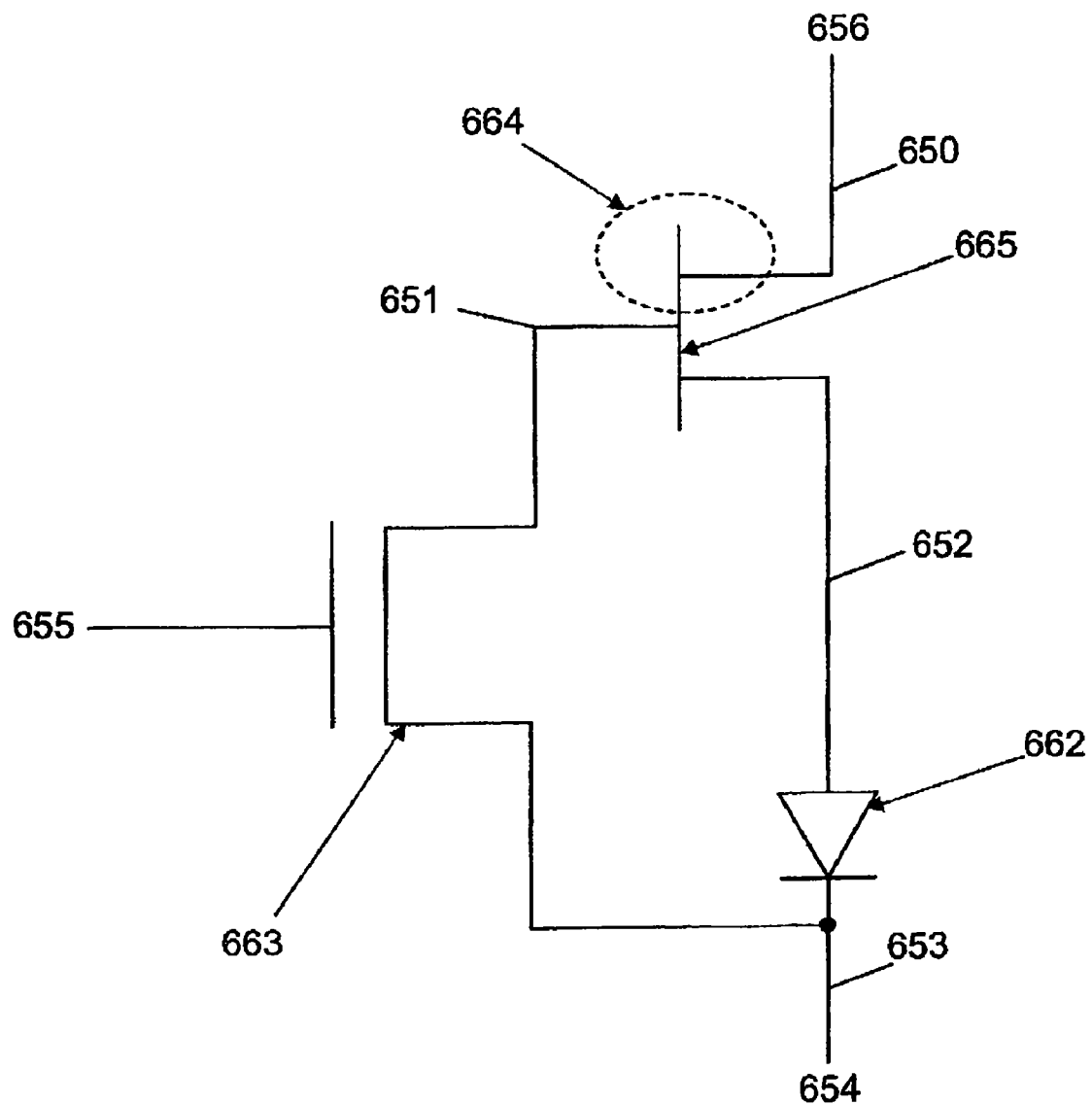
FIG. 82(b) is an equivalent circuit diagram of FIG. 82(a)
Figure 83A:
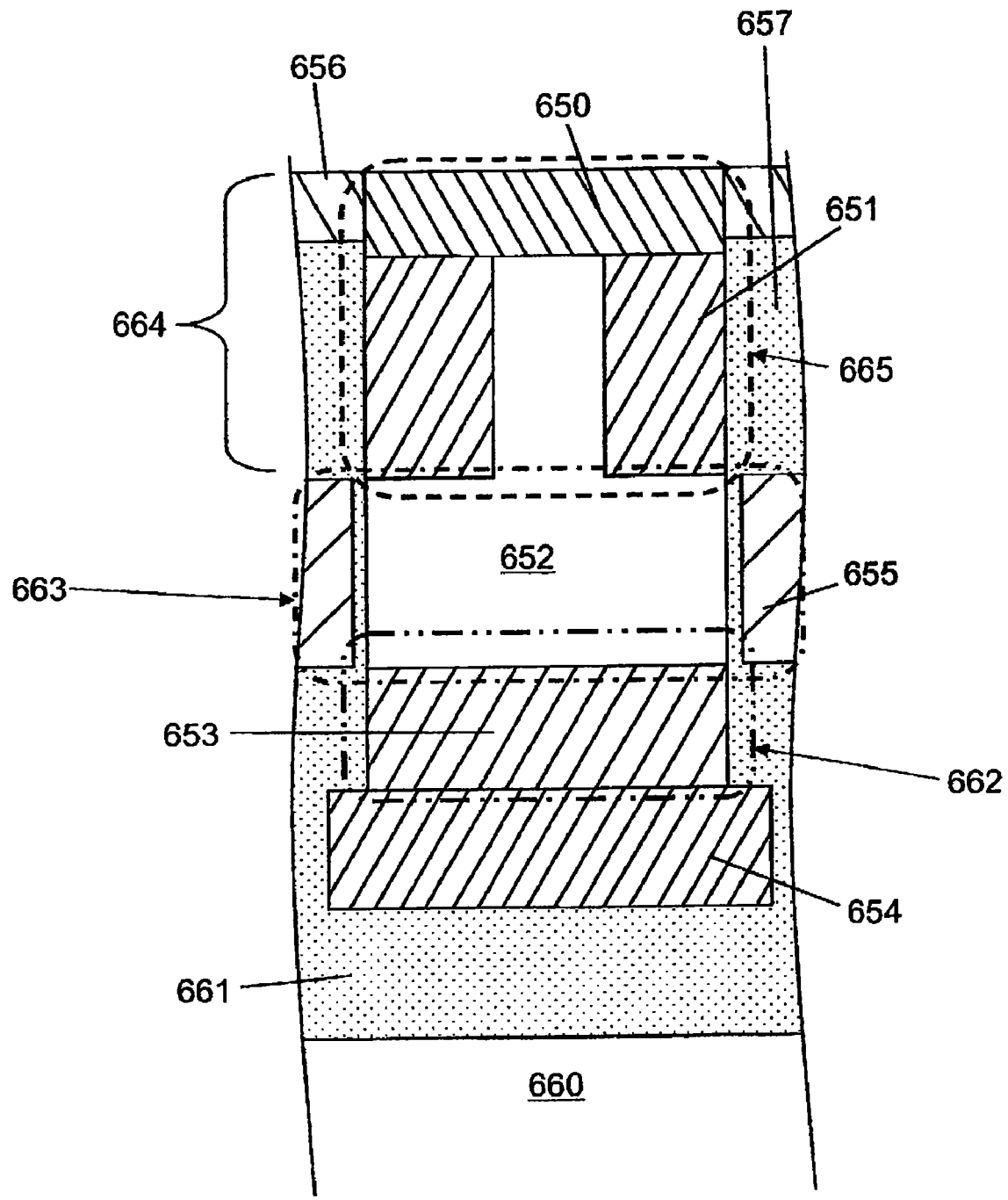
FIG. 83(a) is a sectional view taken along Y₄-Y₄' line of FIG. 81.
Figure 83B:
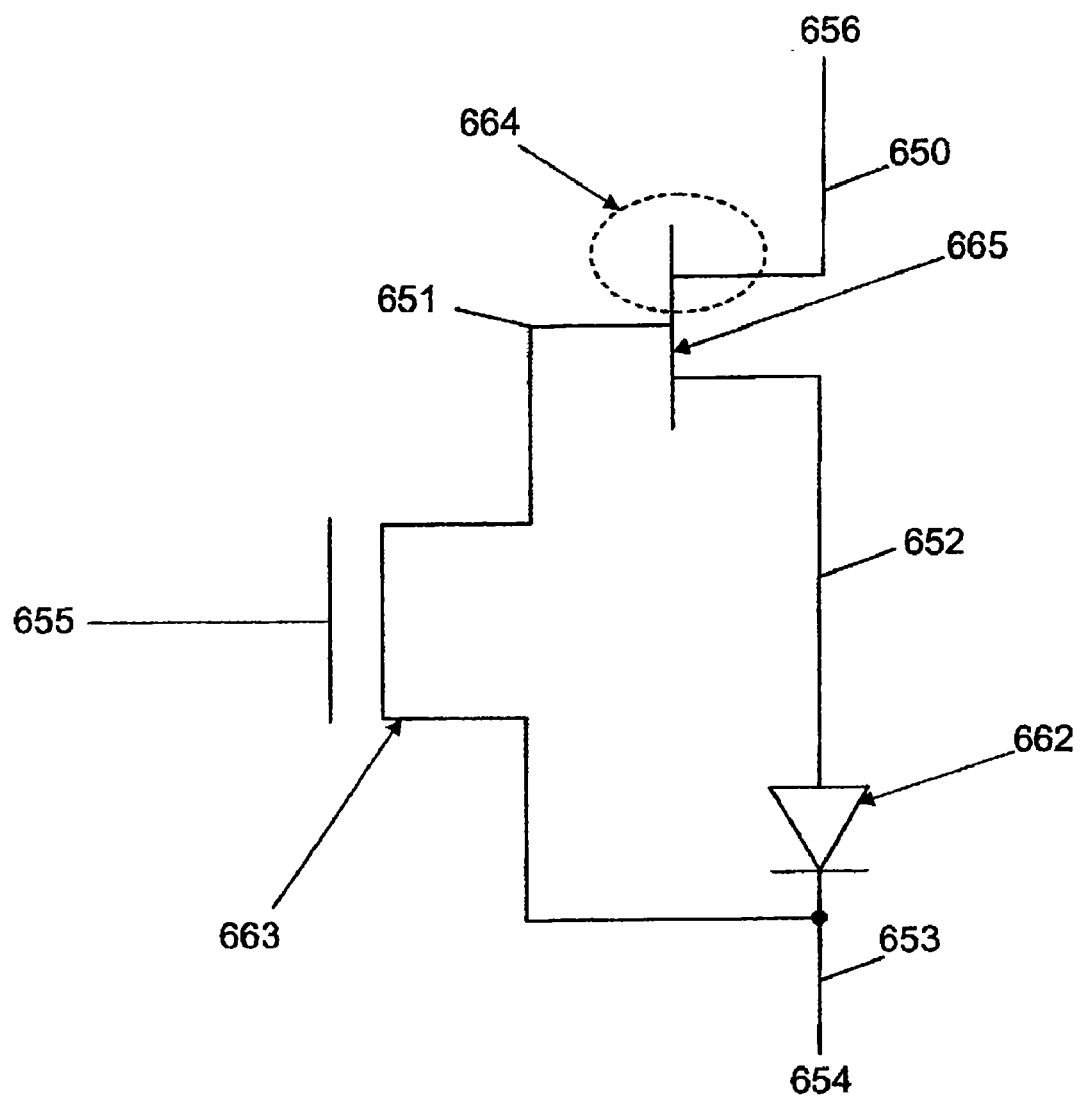
FIG. 83(b) is an equivalent circuit diagram of FIG. 83(a)

FIG. 81 is a bird's eye view showing an alternative embodiment according to the present invention, while FIG. 82(a) is a sectional view taken along $X_4$-$X_4$' line of FIG. 81, FIG. 82(b) is an equivalent circuit diagram of FIG. 82(a), FIG. 83(a) is a sectional view taken along $Y_4$-$Y_4$' line of FIG. 81, and FIG. 83(b) is an equivalent circuit diagram of FIG. 83(a).

An oxide film 661 is formed over a silicon substrate 660 and a signal line 654 is formed over the oxide film 661, and an island shaped semiconductor is formed over the signal line, which island shaped semiconductor comprises:

an n+ type diffusion layer 653 disposed in a lower portion of the island shaped semiconductor and connected to the signal line;

the p type impurity-doped region 652 disposed adjacent to an upper side of the n+ type diffusion layer;

the gate 655 connected to the p type impurity-doped region via an insulating film;

an electric charge accumulator 651 comprising an n type diffusion layer connected to the p type impurity-doped region and carrying a quantity of electric charges which varies in response to a light reception; and a p+ type diffusion layer 650 disposed adjacent to an upper side of the p type impurity-doped region and the n type diffusion layer, and a pixel selection line 656 is formed, which is connected to the p+ type diffusion layer in an upper portion of the island shaped semiconductor.

An oxide film 657 is formed to serve as an interlayer insulating film.

The p+ type diffusion layer 650 and the n type diffusion layer 651 together serve as a photoelectric converting photodiode 664;

the p+ type diffusion layer 650, the n type diffusion layer 651 and the p type impurity-doped region 652 together serve as a amplifying transistor 665;

the n+ type diffusion layer 653, the p type impurity-doped region 652, the n type diffusion layer 651 and the gate 655 together serve as a reset transistor 663; and the p type impurity-doped region 652 and the n+ type diffusion layer 653 together serve as a diode 662.

Figure 84:
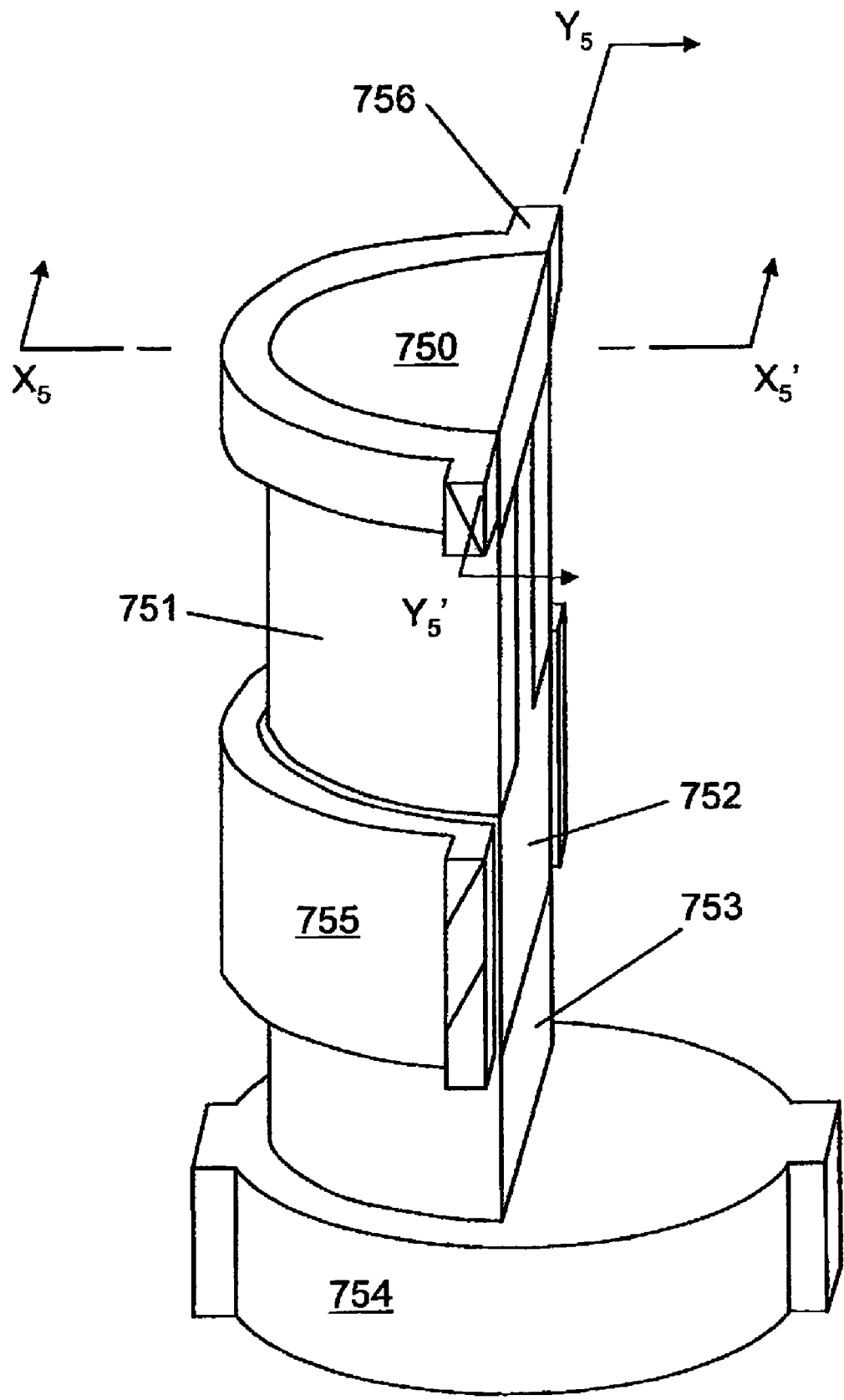
FIG. 84 is a bird's eye view showing another alternative embodiment according to the present invention.

Further, as shown in FIG. 84, an electric charge accumulator 751 may surround a part of a p type impurity-doped region 752, and a gate 755 may surround a part of the p type impurity-doped region 752 via an insulating film.

Figure 85A:
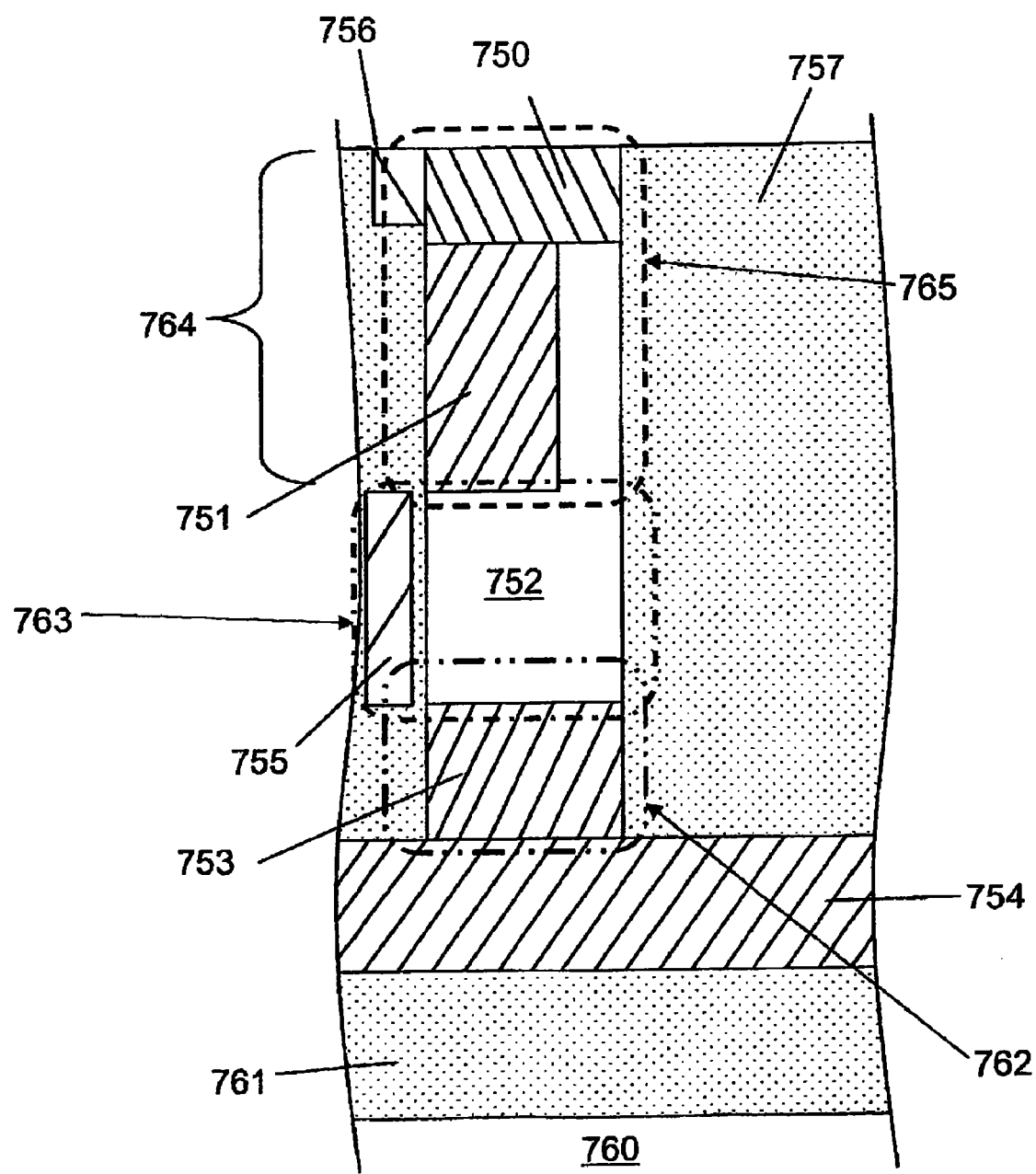
Figure 85B:
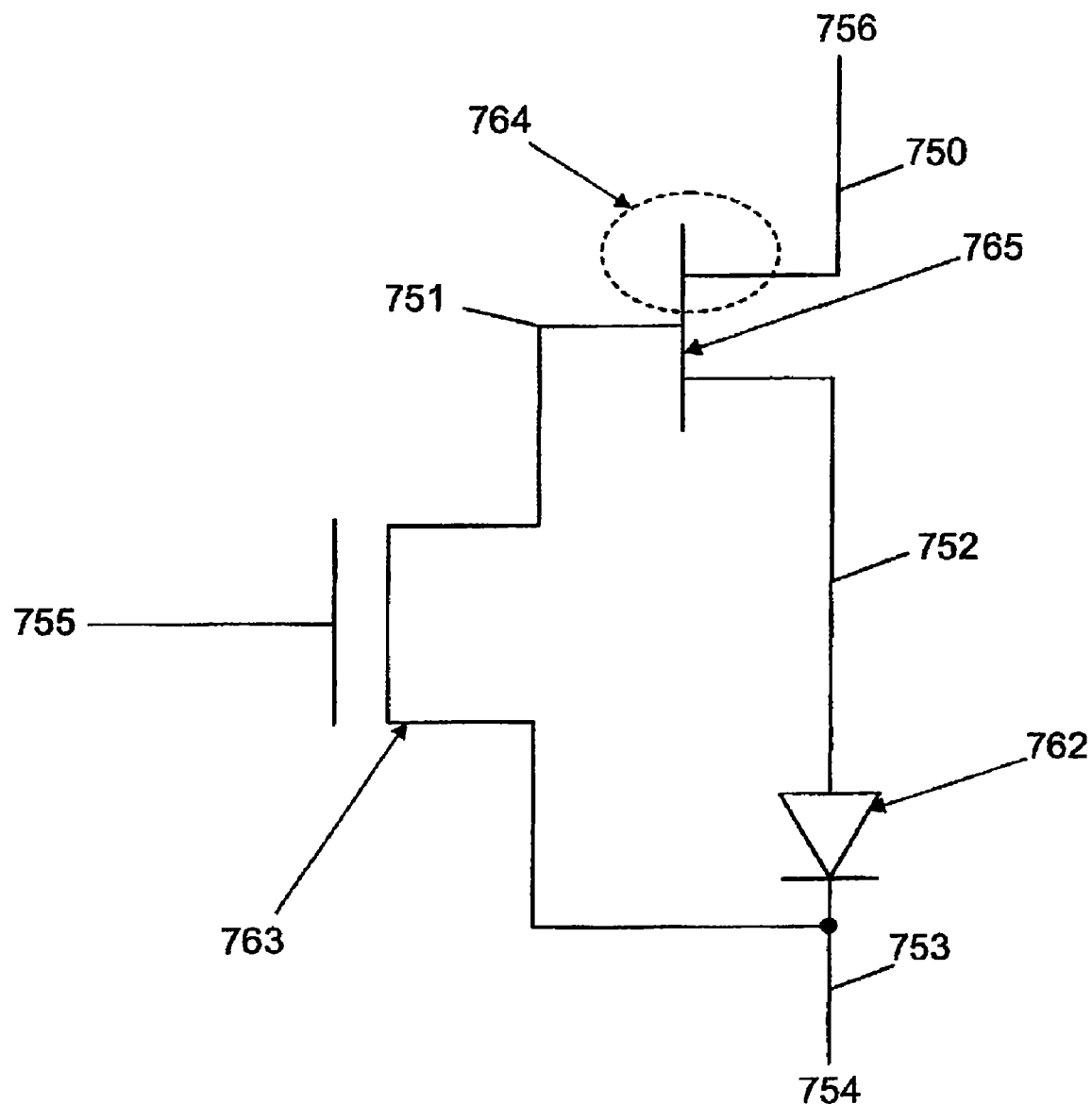
Figure 86A:
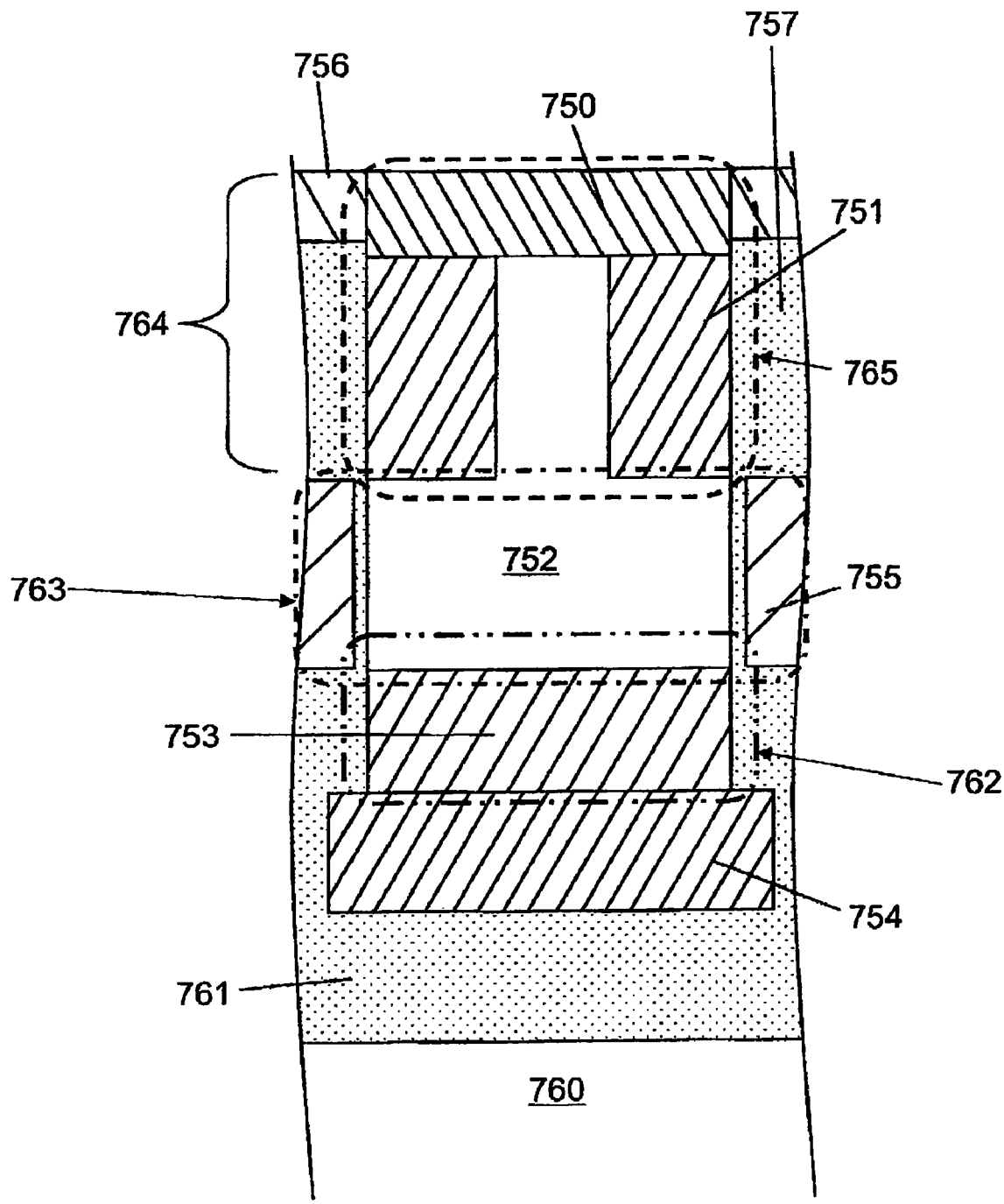
Figure 86B:
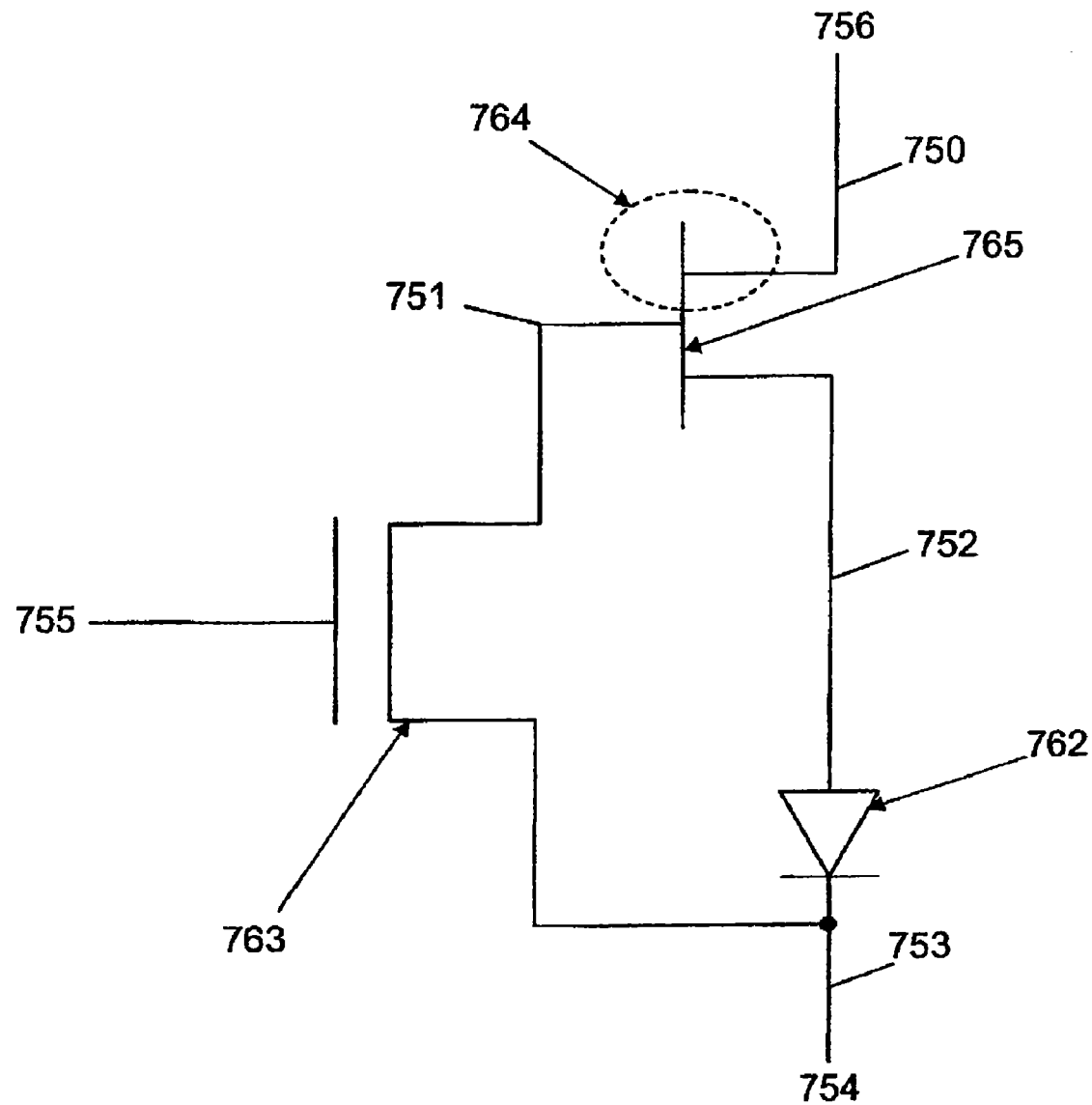

FIG. 84 is a bird's eye view showing an alternative embodiment according to the present invention, while FIG. 85(a) is a sectional view taken along $X_5$-$X_5$' line of FIG. 84, FIG. 85(b) is an equivalent circuit diagram of FIG. 85(a), FIG. 86(a) is a sectional view taken along $Y_5$-$Y_5$' line of FIG. 84, and FIG. 86(b) is an equivalent circuit diagram of FIG. 86(a).

An oxide film 761 is formed over a silicon substrate 760 and a signal line 754 is formed over the oxide film 761, and an island shaped semiconductor is formed over the signal line, which island shaped semiconductor comprises:

an n+ type diffusion layer 753 disposed in a lower portion of the island shaped semiconductor and connected to the signal line;

the p type impurity-doped region 752 disposed adjacent to an upper side of the n+ type diffusion layer;

the gate 755 connected to the p type impurity-doped region via an insulating film;

the electric charge accumulator 751 comprising an n type diffusion layer connected to the p type impurity-doped region and carrying a quantity of electric charges which varies in response to a light reception; and a p+ type diffusion layer 750 disposed adjacent to an upper side of the p type impurity-doped region and the n type diffusion layer, and a pixel selection line 756 is formed, which is connected to the p+ type diffusion layer in an upper portion of the island shaped semiconductor.

An oxide film 757 is formed to serve as an interlayer insulating film.

The p+ type diffusion layer 750 and the n type diffusion layer 751 together serve as a photoelectric converting photodiode 764;

the p+ type diffusion layer 750, the n type diffusion layer 751 and the p type impurity-doped region 752 together serve as a amplifying transistor 765;

the n+ type diffusion layer 753, the p type impurity-doped region 752, the n type diffusion layer 751 and the gate 755 together serve as a reset transistor 763; and the p type impurity-doped region 752 and the n+ type diffusion layer 753 together serve as a diode 762.

The present invention provides a solid-state imaging device comprising:

an amplifying transistor comprising a junction transistor whose gate and source together serve as a photoelectric converting photodiode and whose gate serves as an electric charge accumulator, the junction transistor operable to amplify electric charges in the electric charge accumulator;

a reset transistor comprising a MOS transistor whose source is connected to the gate of the amplifying transistor, the MOS transistor operable to reset the electric charge accumulator, a diode whose anode is connected to a drain of the amplifying transistor and whose cathode is connected to a drain of the reset transistor;

a pixel selection line connected to the source of the amplifying transistor; and a signal line connected to the cathode of the diode.

More specifically, since the structure to be composed of the photoelectric converter, the amplifier, the pixel selector and the resetting element can be now constructed with a total of three elements including the amplifying transistor comprising the junction transistor, the reset transistor comprising the MOS transistor and the diode, according to the present invention, therefore advantageously the number of elements in one pixel can be reduced.

Further, the present invention provides a solid-state imaging device, comprising:

a signal line formed on a substrate;

an island shaped semiconductor disposed over the signal line; and a pixel selection line connected to an upper portion of the island shaped semiconductor, in which the island shaped semiconductor comprises:

a first semiconductor layer disposed in a lower portion of the island shaped semiconductor and connected to the signal line;

a second semiconductor layer disposed adjacent to an upper side of the first semiconductor layer;

a gate connected to the second semiconductor layer via an insulating film;

an electric charge accumulator comprising a third semiconductor layer connected to the second semiconductor layer and carrying a quantity of electric charges which varies in response to a light reception; and a fourth semiconductor layer disposed adjacent to an upper side of the second semiconductor layer and the third semiconductor layer and connected to the pixel selection line.

The third semiconductor layer and the fourth semiconductor layer together serve as the photoelectric converting photodiode;

the second semiconductor layer, the third semiconductor layer and the fourth semiconductor layer together serve as the amplifying transistor; and the first semiconductor layer, the second semiconductor layer, the third semiconductor layer and the gate together serve as the reset transistor.

The above arrangement, in which the photoelectric converter, the amplifier, the pixel selector and the resetting element can be achieved with an area of the photodiode, allows for an image sensor having a higher ratio of the surface area of the light receiving element to the surface area of one pixel.

Figure 87:
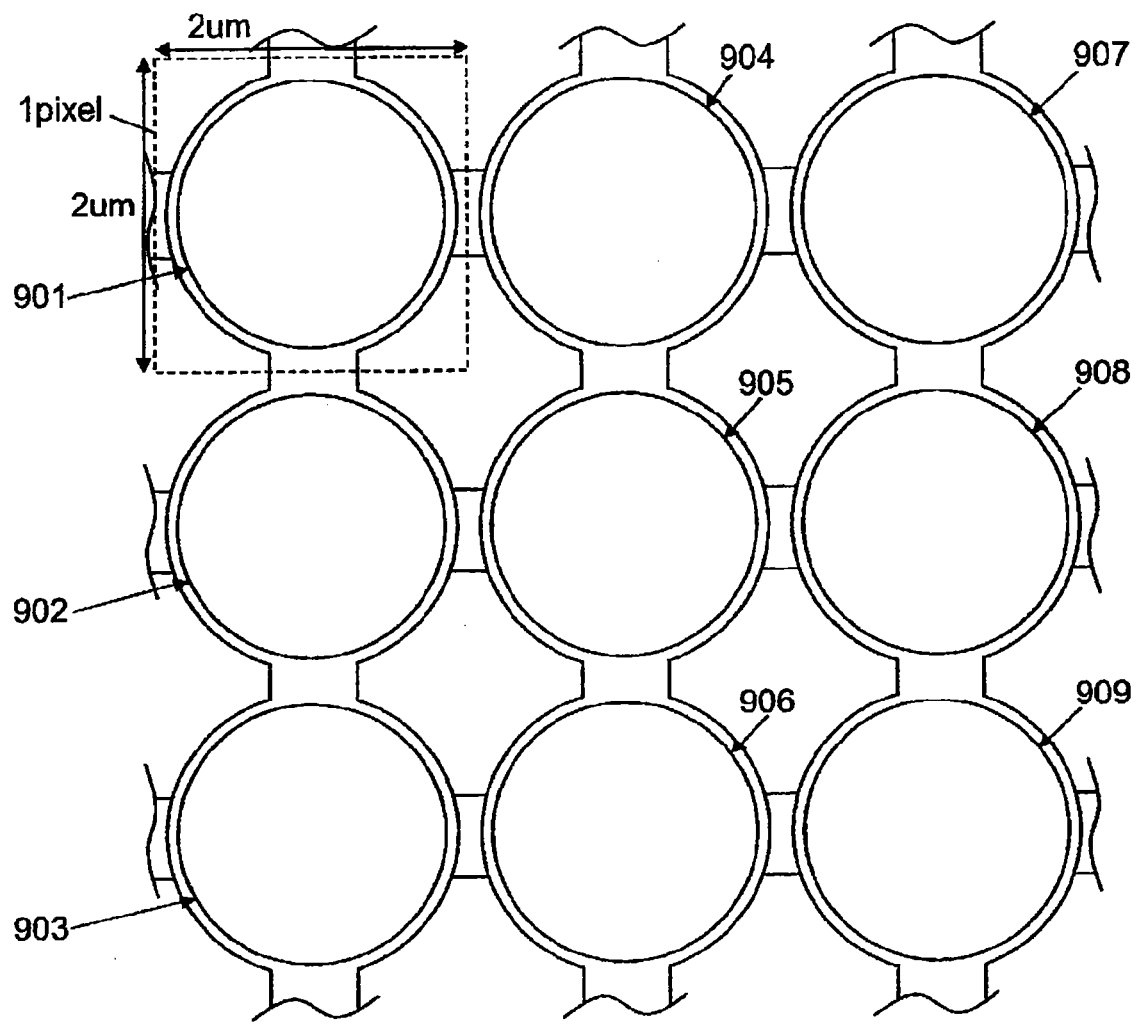
Figure 88:
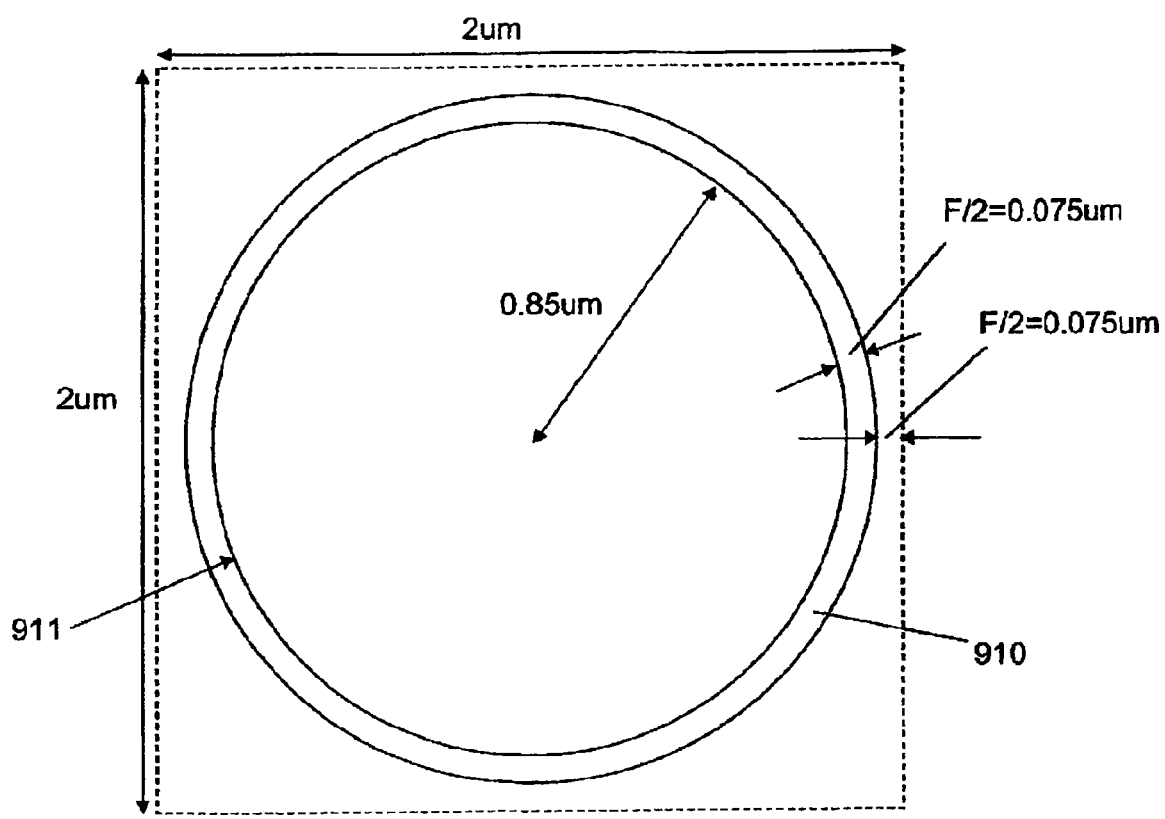

The ratio of the surface area of the light receiving element (photo diode) to the surface area of one pixel in the CMOS image sensor of the prior art has been reported as 30%. The ratio of the surface area of the light receiving element (photodiode) to the surface area of one pixel in an image sensor according to the present invention, where the image sensors are arranged in a matrix, will now be estimated. FIG. 87 is a plan view of image sensors 901, 902, 903, 904, 905, 906, 907, 908 and 909, each having an island shaped semiconductor in a circular column configuration, arranged in a matrix, and FIG. 88 is an enlarged plan view of one of the pixels, showing a light receiving element 911 and a pixel selection line 910. In this drawing, symbol "F" denotes a wiring rule. The illustrated image sensor has employed a surface area of 2 µm×2 µm as per pixel and the 0.15 µm wiring rule process. The surface area of the light receiving element (photodiode) is 3.14×0.85 µm×0.85 µm. The ratio of the surface area of the light receiving element (photodiode) to the surface area of one pixel in the image sensor having the island shaped semiconductor in the circular column configuration of the present invention, where the image sensors are arranged in the matrix, will be 56.7%.

Figure 89:
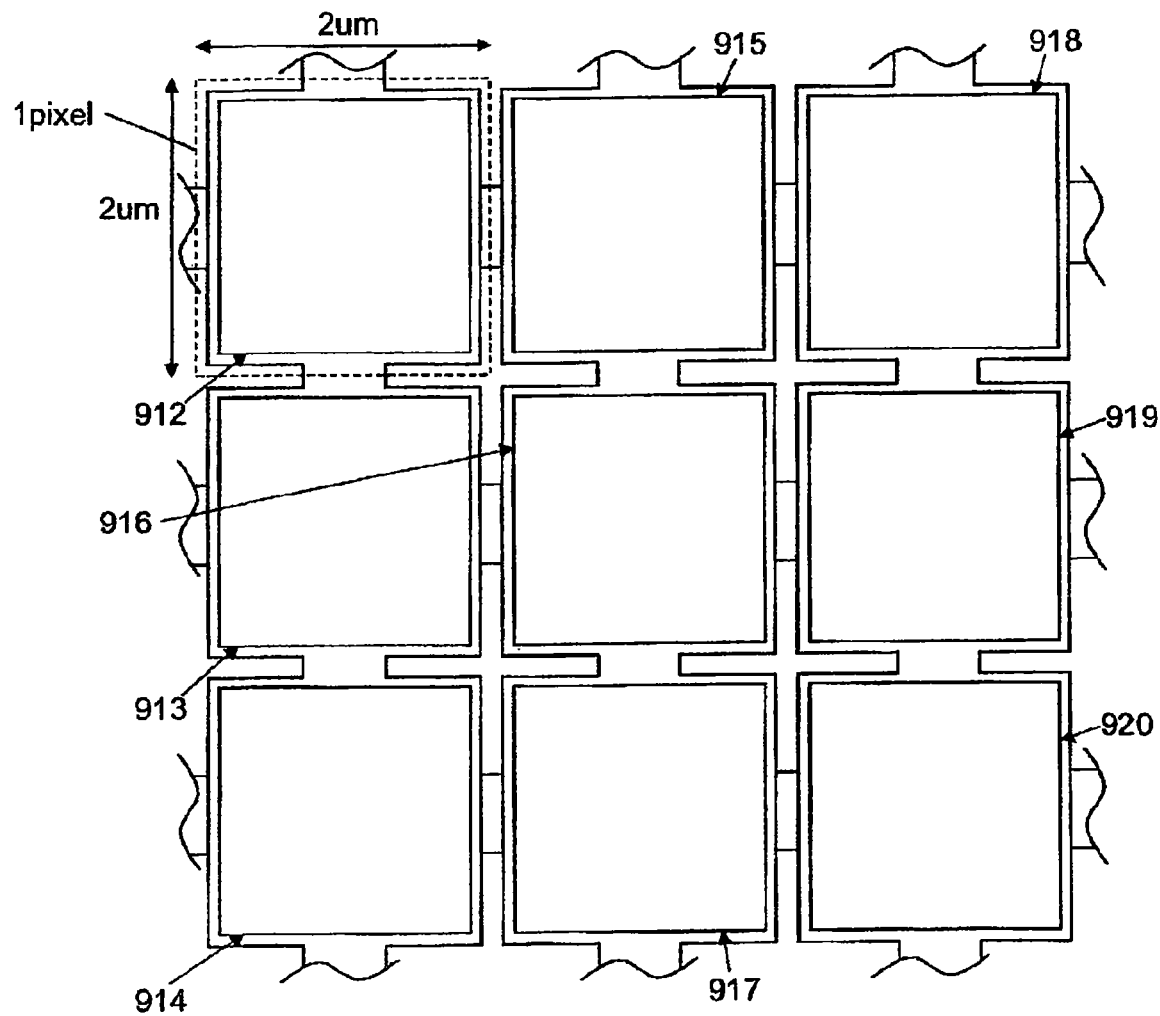
Figure 90:
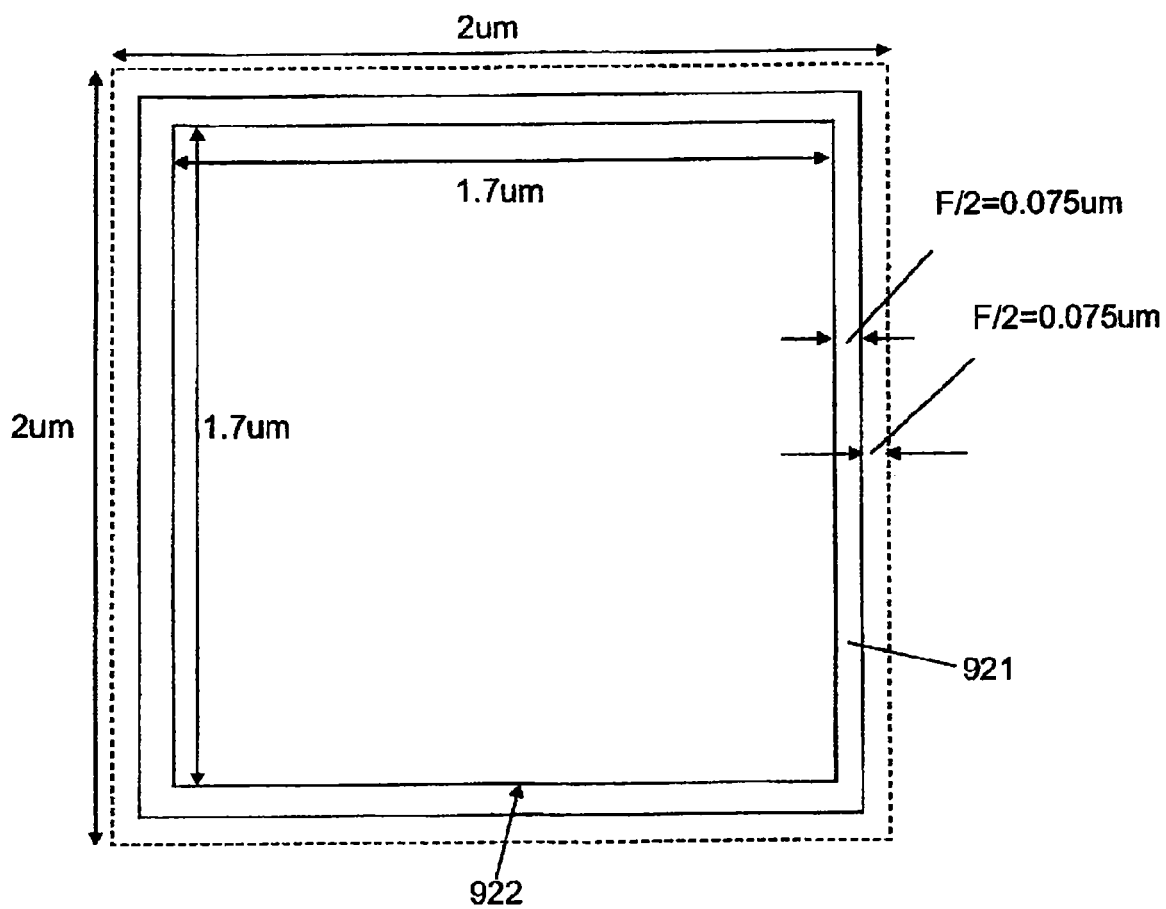

FIG. 89 is a plan view showing image sensors 912, 913, 914, 915, 916, 917, 918, 919 and 920, each having an island shaped semiconductor in a square column configuration according to the present invention, arranged in a matrix, and FIG. 90 is an enlarged plan view of one of the pixels, showing a light receiving element 922 and a pixel selection line 921. In this drawing, symbol "F" denotes a wiring rule. The illustrated image sensor has employed a surface area of 2 µm×2 µm as per pixel and the 0.15 µm wiring rule process. The surface area of the light receiving element (photodiode) is 1.7 µm×1.7 µm. The ratio of the surface area of the light receiving element (photodiode) to the surface area of one pixel in the image sensor having the island shaped semiconductor in the square column configuration of the present invention, where the image sensors are arranged in the matrix, will be 72.25%. More specifically, the construction according to the present invention, in which the unit pixel in the image sensor can be achieved with the area of the photodiode, allows for an image sensor having a higher ratio of the surface area of the light receiving element to the surface area of one pixel.

Further, a solid-state imaging device unit of the present invention, in which the solid-state imaging devices are arranged in a honey comb configuration on the substrate, allows for the image sensor having a higher ratio of the surface area of the light receiving element to the surface area of one pixel.

Figure 91:
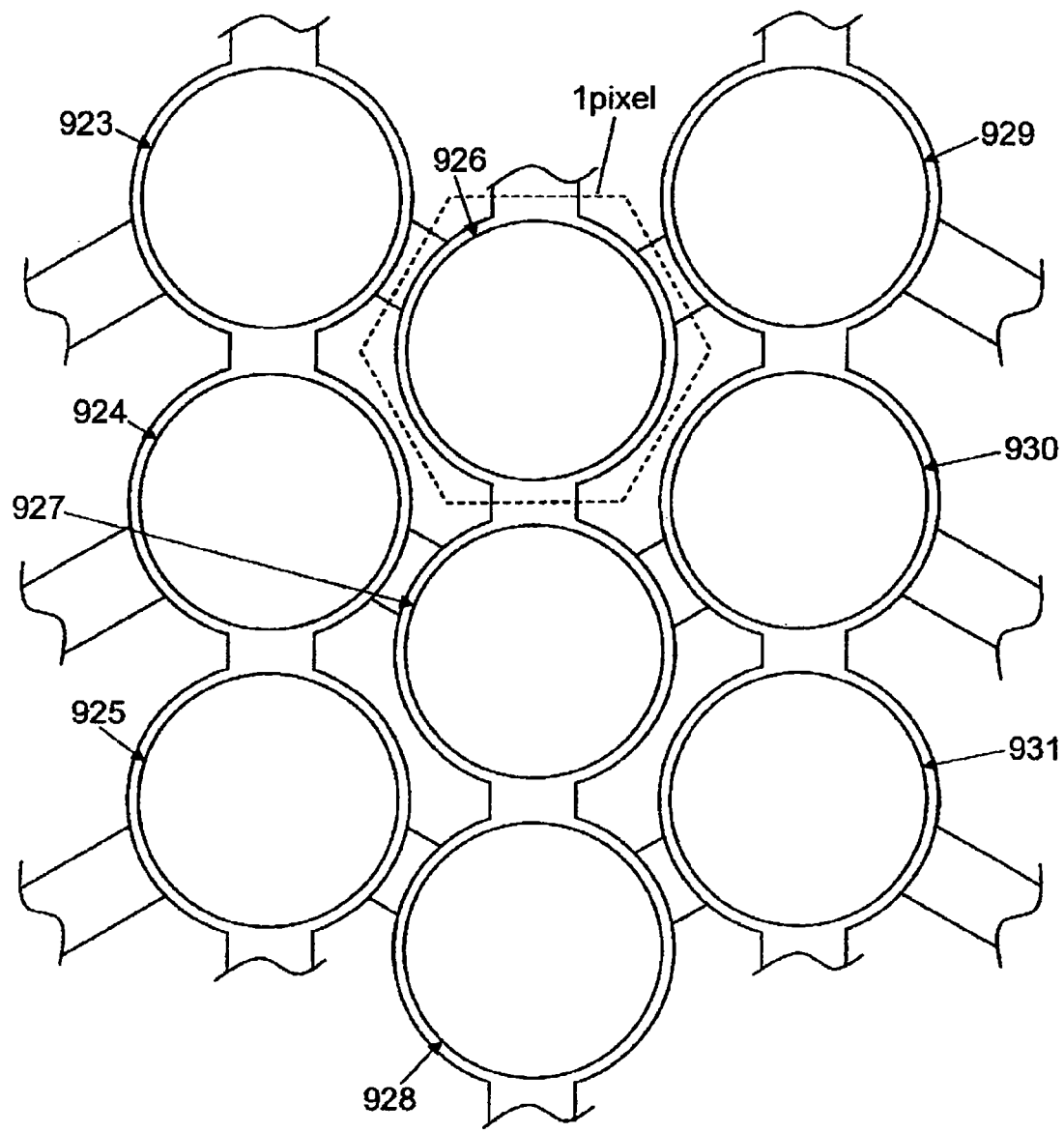
Figure 92:
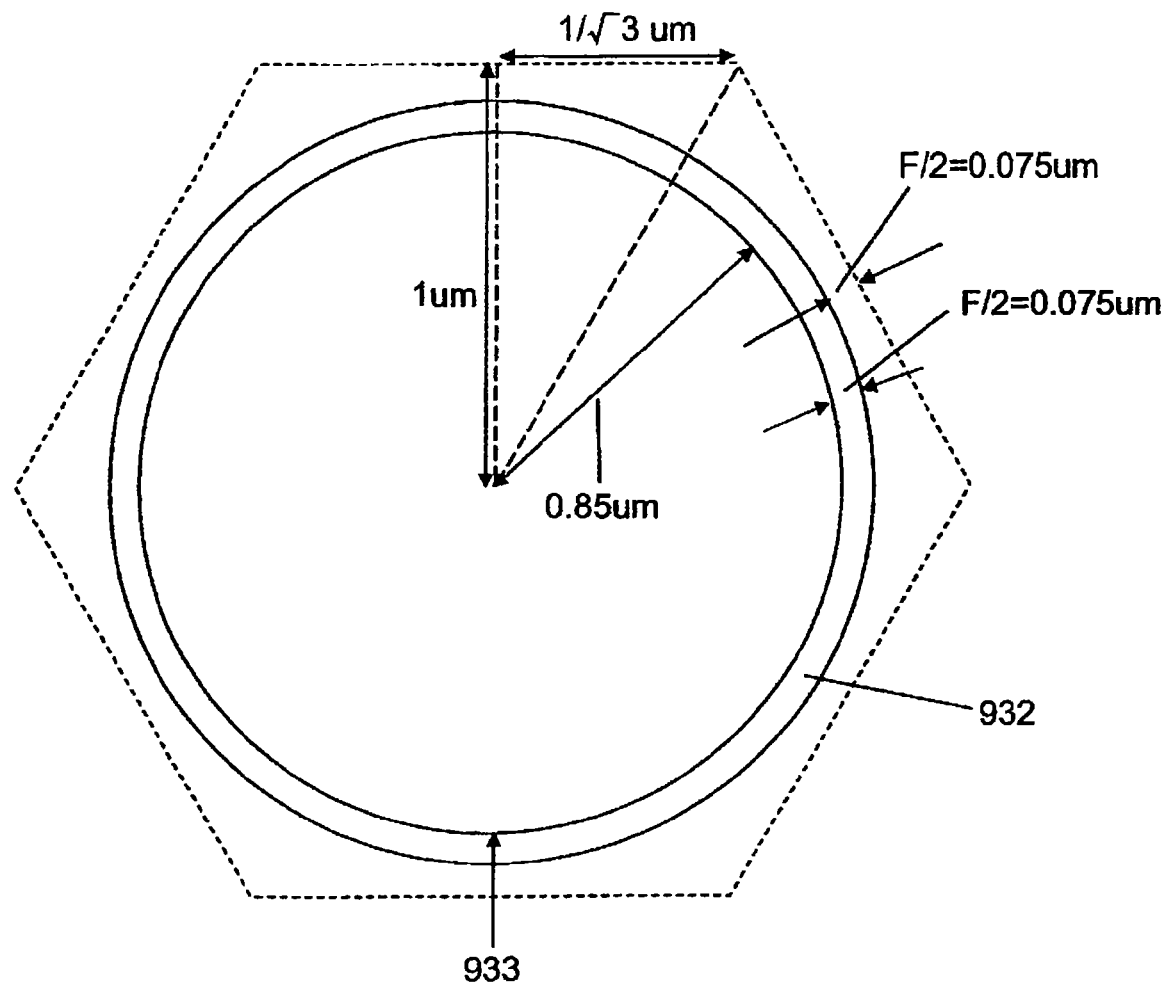
Figure 93:
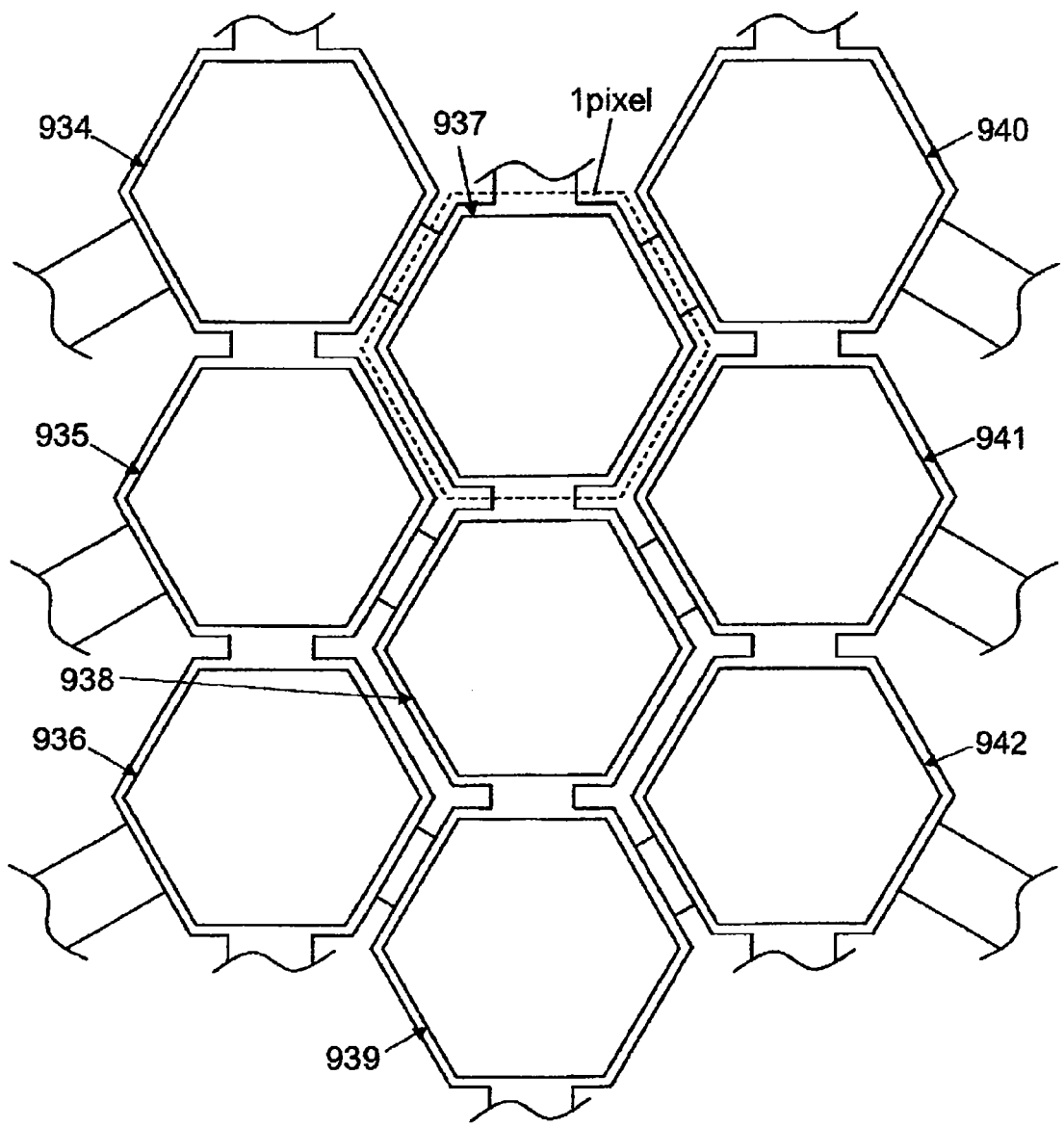
Figure 94:
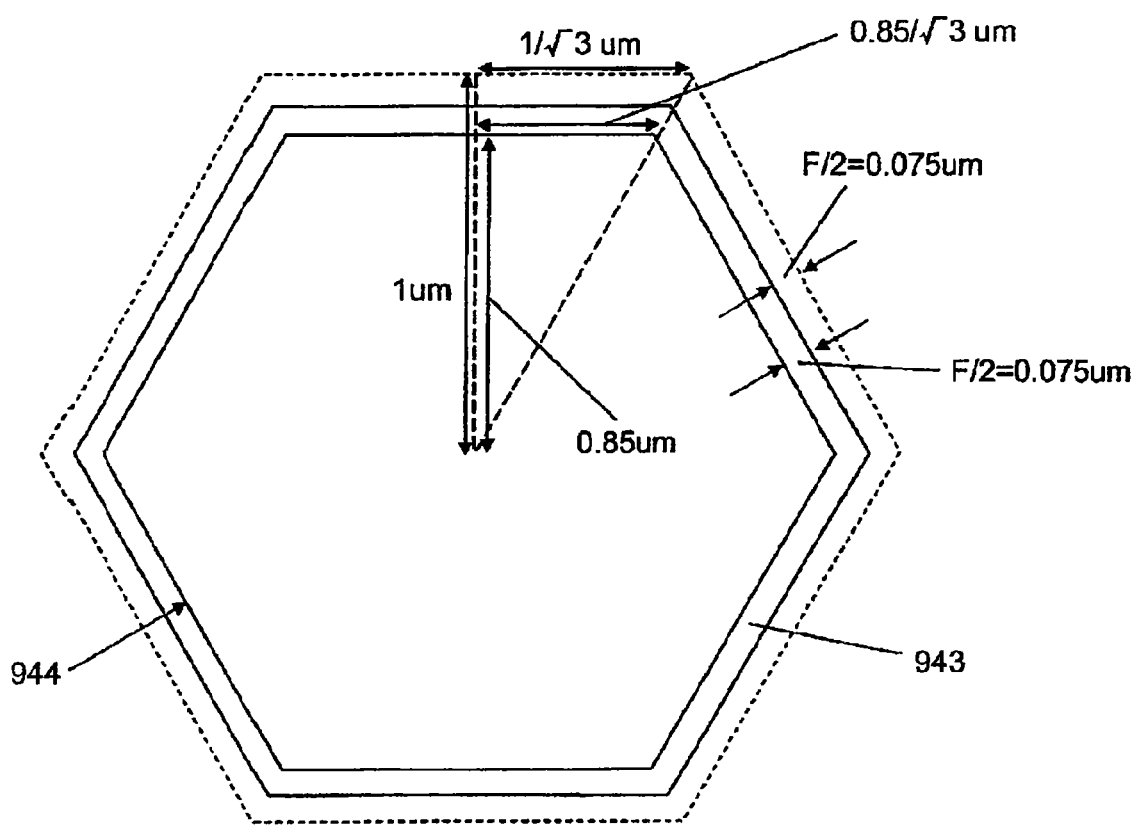

The ratio of the surface area of the light receiving element (photodiode) to the surface area of one pixel in the image sensor of the present invention, where the image sensors are arranged in the honey comb configuration, will now be estimated. FIG. 91 is a plan view showing image sensors 923, 924, 925, 926, 927, 928, 929, 930 and 931, each having an island shaped semiconductor in a circular column configuration according to the present invention, arranged in a honey comb configuration, and FIG. 92 is an enlarged plan view of one of the pixels, showing a light receiving element 933 and a pixel selection line 932. In the drawing, symbol "F" denotes a wiring rule. The illustrated image sensor has employed a photodiode radius of 0.85 µm and the 0.15 µm wiring rule process. The surface area of the light receiving element (photodiode) is 3.14×0.85 µm×0.85 µm. The surface area of one pixel is 6×(1 µm×2√3 µm)/2. The ratio of the surface area of the light receiving element (photodiode) to the surface area of one pixel in the image sensor having the island shaped semiconductor in the circular column configuration of the present invention, where the image sensors are arranged in the matrix, will be 65.5%. FIG. 93 is a plan view showing image sensors 934, 935, 936, 937, 938, 939, 940, 941 and 942, each having an island shaped semiconductor in a hexagonal column configuration according to the present invention, arranged in a honey comb configuration, and FIG. 94 is an enlarged plan view of one of the pixels, showing a light receiving element 944 and a pixel selection line 943. In the drawing, symbol "F" denotes a wiring rule. The illustrated image sensor has employed a surface area of one pixel of 6×(1 µm×2√3 µm)/2 and the 0.15 µm wiring rule process. The surface area of the light receiving element (photodiode) is 6×(0.85 µm×2×0.85/√3 µm)/2. The surface area of one pixel is 6×(1 µm×2√3 µm)/2. The ratio of the surface area of the light receiving element (photodiode) to the surface area of one pixel in the image sensor having the island shaped semiconductor in the hexagonal column configuration of the present invention, where the image sensors are arranged in the matrix, will be 72.25%. More specifically, arranging the image sensors in the honey comb configuration allows for the image sensor having a higher ratio of the surface area of the light receiving element to the surface area of one pixel.

What is claimed is:

1. A solid-state imaging device unit comprising solid-state imaging devices arranged on a substrate,
said solid-state imaging devices each comprising:
a signal line formed on the substrate;
an island shaped semiconductor placed over said signal line; and
a pixel selection line connected to an upper portion of said island shaped semiconductor,
said island shaped semiconductor comprising:
a first semiconductor layer disposed in a lower portion of said island shaped semiconductor and connected to said signal line;
a second semiconductor layer disposed adjacent to an upper side of said first semiconductor layer;
a gate connected to said second semiconductor layer via an insulating film;
an electric charge accumulator comprising a third semiconductor layer connected to said second semiconductor layer and carrying a quantity of electric charges which varies in response to a light reception; and
a fourth semiconductor layer disposed adjacent to an upper side of said second semiconductor layer and said third semiconductor layer and connected to said pixel selection line, wherein
said solid-state imaging devices are arranged on said substrate in a honeycomb configuration.

2. A solid-state imaging device unit in accordance with claim 1, in which said signal line is defined by an n+ type diffusion layer, said first semiconductor layer is defined by an n+ type diffusion layer, said second semiconductor layer is defined by a p type impurity-doped region, said third semiconductor layer is defined by an n type diffusion layer and said fourth semiconductor layer is defined by a p+ type diffusion layer.

3. A solid-state imaging device unit in accordance with claim 2, in which
said p+ type diffusion layer and said n type diffusion layer together serve as a photoelectric converting photodiode,
said p+ type diffusion layer, said n type diffusion layer and said p type impurity-doped region together serve as an amplifying transistor,
said n+ type diffusion layer of said first semiconductor layer, said p type impurity-doped region, said n type diffusion layer and said gate together serve as a reset transistor, and
said p type impurity-doped region and said n+ type diffusion layer together serve as a diode.

4. A solid-state imaging device unit in accordance with claim 1, in which said island shaped semiconductor has a circular column configuration.

5. A solid-state imaging device unit in accordance with claim 2, in which said island shaped semiconductor has a circular column configuration.

6. A solid-state imaging device unit in accordance with claim 3, in which said island shaped semiconductor has a circular column configuration.

7. A solid-state imaging device unit in accordance with claim 1, in which said island shaped semiconductor has a hexagonal column configuration.

8. A solid-state imaging device unit in accordance with claim 2, in which said island shaped semiconductor has a hexagonal column configuration.

9. A solid-state imaging device unit in accordance with claim 3, in which said island shaped semiconductor has a hexagonal column configuration.

10. A solid-state imaging device unit comprising solid-state imaging devices arranged on a substrate,
said solid-state imaging devices each comprising:
a signal line formed on the substrate;
an island shaped semiconductor placed over said signal line; and
a pixel selection line connected to an upper portion of said island shaped semiconductor,
said island shaped semiconductor comprising:
a first semiconductor layer disposed in a lower portion of said island shaped semiconductor and connected to said signal line;
a second semiconductor layer disposed adjacent to an upper side of said first semiconductor layer;
a gate connected to said second semiconductor layer via an insulating film;
an electric charge accumulator comprising a third semiconductor layer connected to said second semiconductor layer and carrying a quantity of electric charges which varies in response to a light reception; and
a fourth semiconductor layer disposed adjacent to an upper side of said second semiconductor layer and said third semiconductor layer and connected to said pixel selection line, wherein
said solid-state imaging devices are arranged on said substrate in a matrix of n-row×m-column (n and m no smaller than 1), and said island shaped semiconductor has a circular column configuration.

11. A solid-state imaging device unit comprising solid-state imaging devices arranged on a substrate,
said solid-state imaging devices each including:
a signal line formed on the substrate;
an island shaped semiconductor placed over said signal line; and
a pixel selection line connected to an upper portion of said island shaped semiconductor,
said island shaped semiconductor comprising:
a first semiconductor layer disposed in a lower portion of said island shaped semiconductor and connected to said signal line;
a second semiconductor layer disposed adjacent to an upper side of said first semiconductor layer;
a gate connected to said second semiconductor layer via an insulating film;
an electric charge accumulator comprising a third semiconductor layer connected to said second semiconductor layer and carrying a quantity of electric charges which varies in response to a light reception; and
a fourth semiconductor layer disposed adjacent to an upper side of said second semiconductor layer and said third semiconductor layer and connected to said pixel selection line, wherein
said solid-state imaging devices are arranged on said substrate in a matrix of n-row×m-column (n and m no smaller than 1), and said island shaped semiconductor has a square column configuration.

12. A solid-state imaging device unit in accordance with claim 10, in which said signal line is defined by an n+ type diffusion layer, said first semiconductor layer is defined by an n+ type diffusion layer, said second semiconductor layer is defined by a p type impurity-doped region, said third semiconductor layer is defined by an n type diffusion layer and said fourth semiconductor layer is defined by a p+ type diffusion layer.

13. A solid-state imaging device unit in accordance with claim 11, in which said signal line is defined by an n+ type diffusion layer, said first semiconductor layer is defined by an n+ type diffusion layer, said second semiconductor layer is defined by a p type impurity-doped region, said third semiconductor layer is defined by an n type diffusion layer and said fourth semiconductor layer is defined by a p+ type diffusion layer.

14. A solid-state imaging device unit in accordance with claim 12, in which
said p+ type diffusion layer and said n type diffusion layer together serve as a photoelectric converting photodiode,
said p+ type diffusion layer, said n type diffusion layer and said p type impurity-doped region together serve as an amplifying transistor,
said n+ type diffusion layer of said first semiconductor layer, said p type impurity-doped region, said n type diffusion layer and said gate together serve as a reset transistor, and
said p type impurity-doped region and said n+ type diffusion layer together serve as a diode.

15. A solid-state imaging device unit in accordance with claim 13, in which
said p+ type diffusion layer and said n type diffusion layer together serve as a photoelectric converting photodiode,
said p+ type diffusion layer, said n type diffusion layer and said p type impurity-doped region together serve as an amplifying transistor,
said n+ type diffusion layer of said first semiconductor layer, said p type impurity-doped region, said n type diffusion layer and said gate together serve as a reset transistor, and
said p type impurity-doped region and said n+ type diffusion layer together serve as a diode.

16. A method for fabricating a solid-state imaging device, said solid-state imaging device being solid-state imaging devices in accordance with claim 1 and said method characterized in comprising the steps of:
forming a signal line on a substrate;
forming an island shaped semiconductor over said signal line:
forming a first semiconductor layer connected to said signal line in a lower portion of said island shaped semiconductor;
forming a second semiconductor layer disposed adjacent to an upper side of said first semiconductor layer;
forming a gate connected, via an insulating film, to said second semiconductor layer disposed adjacent to the upper side of said first semiconductor layer;
forming a third semiconductor layer connected to said second semiconductor layer;
forming a fourth semiconductor layer disposed adjacent to an upper portion of said second semiconductor layer and said third semiconductor layer; and
forming a pixel selection line connected to said fourth semiconductor layer.

17. A method for fabricating a solid-state imaging device, said solid-state imaging device being solid-state imaging devices in accordance with claim 2 and said method characterized in comprising the steps of:
forming a signal line on a substrate;
forming an island shaped semiconductor over said signal line:
forming a first semiconductor layer connected to said signal line in a lower portion of said island shaped semiconductor;
forming a second semiconductor layer disposed adjacent to an upper side of said first semiconductor layer;
forming a gate connected, via an insulating film, to said second semiconductor layer disposed adjacent to the upper side of said first semiconductor layer;
forming a third semiconductor layer connected to said second semiconductor layer;
forming a fourth semiconductor layer disposed adjacent to an upper portion of said second semiconductor layer and said third semiconductor layer; and
forming a pixel selection line connected to said fourth semiconductor layer.

18. A method for fabricating a solid-state imaging device, said solid-state imaging device being solid-state imaging devices in accordance with claim 3 and said method characterized in comprising the steps of:
forming a signal line on a substrate;
forming an island shaped semiconductor over said signal line:
forming a first semiconductor layer connected to said signal line in a lower portion of said island shaped semiconductor;
forming a second semiconductor layer disposed adjacent to an upper side of said first semiconductor layer;
forming a gate connected, via an insulating film, to said second semiconductor layer disposed adjacent to the upper side of said first semiconductor layer;
forming a third semiconductor layer connected to said second semiconductor layer;
forming a fourth semiconductor layer disposed adjacent to an upper portion of said second semiconductor layer and said third semiconductor layer; and
forming a pixel selection line connected to said fourth semiconductor layer.

19. A method for fabricating a solid-state imaging device, said solid-state imaging device being solid-state imaging devices in accordance with claim 4 and said method characterized in comprising the steps of:
forming a signal line on a substrate;
forming an island shaped semiconductor over said signal line:
forming a first semiconductor layer connected to said signal line in a lower portion of said island shaped semiconductor;
forming a second semiconductor layer disposed adjacent to an upper side of said first semiconductor layer;
forming a gate connected, via an insulating film, to said second semiconductor layer disposed adjacent to the upper side of said first semiconductor layer;
forming a third semiconductor layer connected to said second semiconductor layer;
forming a fourth semiconductor layer disposed adjacent to an upper portion of said second semiconductor layer and said third semiconductor layer; and
forming a pixel selection line connected to said fourth semiconductor layer.

20. A method for fabricating a solid-state imaging device, said solid-state imaging device being solid-state imaging devices in accordance with claim 5 and said method characterized in comprising the steps of:
forming a signal line on a substrate;
forming an island shaped semiconductor over said signal line:
forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

21. A method for fabricating a solid-state imaging device, said solid-state imaging device being solid-state imaging devices in accordance with claim 6 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

22. A method for fabricating a solid-state imaging device, said solid-state imaging device being solid-state imaging devices in accordance with claim 7 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

23. A method for fabricating a solid-state imaging device, said solid-state imaging device being solid-state imaging devices in accordance with claim 8 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

24. A method for fabricating a solid-state imaging device, said solid-state imaging device being solid-state imaging devices in accordance with claim 9 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

25. A method for fabricating a solid-state imaging device, said solid-state imaging device being solid-state imaging devices in accordance with claim 10 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

26. A method for fabricating a solid-state imaging device, said solid-state imaging device being solid-state imaging devices in accordance with claim 11 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

27. A method for fabricating a solid-state imaging device, said solid-state imaging device being solid-state imaging devices in accordance with claim 12 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

28. A method for fabricating a solid-state imaging device, said solid-state imaging device being solid-state imaging devices in accordance with claim 13 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

29. A method for fabricating a solid-state imaging device, said solid-state imaging device being solid-state imaging devices in accordance with claim 14 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

30. A method for fabricating a solid-state imaging device, said solid-state imaging device being solid-state imaging devices in accordance with claim 15 and said method characterized in comprising the steps of:

forming a signal line on a substrate;

forming an island shaped semiconductor over said signal line:

forming a first semiconductor layer connected to said signal line in a lower portion of said island shaped semiconductor;

forming a second semiconductor layer disposed adjacent to an upper side of said first semiconductor layer;

forming a gate connected, via an insulating film, to said second semiconductor layer disposed adjacent to the upper side of said first semiconductor layer;

forming a third semiconductor layer connected to said second semiconductor layer;

forming a fourth semiconductor layer disposed adjacent to an upper portion of said second semiconductor layer and said third semiconductor layer; and forming a pixel selection line connected to said fourth semiconductor layer.

31. A method for fabricating a solid-state imaging device in accordance with claim 16, said method characterized in further comprising the steps of:

forming a signal line by:
  forming a p type silicon over an oxide film, and depositing a nitride film and then a silicon oxide film over said p type silicon;
  forming a resist, performing oxide film etching and then nitride film etching and removing said resist to thereby form an oxide film mask and a nitride film mask for forming said signal line; and
  etching said p type silicon, to thereby form said signal line;

forming an island shaped semiconductor by:
  forming a resist for forming said island shaped semiconductor;
  etching said oxide film and said nitride film;
  removing said resist; and
  etching said p type silicon, to thereby form said island shaped semiconductor;

further processing by:
  depositing an oxide film, planarizing and performing etch back on said oxide film;
  performing oxidation to form an oxide film;
  depositing polysilicon and etching back the polysilicon to be left in a sidewall configuration for serving as a mask in an ion implantation;

forming a signal line and an n+ type diffusion layer by:
  removing said oxide film to expose a site for phosphorus to be implanted;
  forming an oxide film for the purpose of preventing ion channeling during the ion implantation; and ion-implanting the phosphorus and performing a thermal process, to thereby form said signal line and said n+ diffusion layer;
forming a gate by:
  removing the polysilicon and the oxide film:
  depositing, planarizing and etching back an oxide film to form an oxide layer;
  performing gate oxidation to form a gate oxide film, depositing polysilicon and performing planarization and etch back; and
  forming a resist for said gate; and
  etching said polysilicon, to thereby form said gate;
forming an n type diffusion layer by:
  removing said resist;
  removing said thin oxide film on said sidewall of said silicon column, and oxidize said sidewall of said silicon column and said polysilicon of said gate to form an oxide film for the purpose of preventing the ion channeling during the ion implantation; and
  implanting the phosphorus, to thereby form said n type diffusion layer;
forming a p+ type diffusion layer by:
  removing said nitride film;
  depositing, planarizing and etching back an oxide film to form an oxide film layer;
  performing oxidation to form an oxide film for the purpose of preventing the ion channeling during the ion implantation; and
  implanting boron and performing a thermal process, to thereby form the p+ type diffusion layer; and
forming a pixel selection line by:
  removing said oxide film;
  depositing, planarizing and etching back metal;
  forming a resist for said pixel selection line; and
  etching said metal, to thereby form said pixel selection line.

32. A method for fabricating a solid-state imaging device in accordance with claim 17, said method characterized in further comprising the steps of:
forming a signal line by:
  forming a p type silicon over an oxide film, and depositing a nitride film and then a silicon oxide film over said p type silicon;
  forming a resist, performing oxide film etching and then nitride film etching and removing said resist to thereby form an oxide film mask and a nitride film mask for forming said signal line; and
  etching said p type silicon, to thereby form said signal line;
forming an island shaped semiconductor by:
  forming a resist for forming said island shaped semiconductor;
  etching said oxide film and said nitride film;
  removing said resist; and
  etching said p type silicon, to thereby form said island shaped semiconductor;
further processing by:
  depositing an oxide film, planarizing and performing etch back on said oxide film;
  performing oxidation to form an oxide film;
  depositing polysilicon and etching back the polysilicon to be left in a sidewall configuration for serving as a mask in an ion implantation;
forming a signal line and an n+ type diffusion layer by:
  removing said oxide film to expose a site for phosphorus to be implanted;
  forming an oxide film for the purpose of preventing ion channeling during the ion implantation; and
  ion-implanting the phosphorus and performing a thermal process, to thereby form said signal line and said n+ diffusion layer;
forming a gate by:
  removing the polysilicon and the oxide film:
  depositing, planarizing and etching back an oxide film to form an oxide layer;
  performing gate oxidation to form a gate oxide film, depositing polysilicon and performing planarization and etch back; and
  forming a resist for said gate; and
  etching said polysilicon, to thereby form said gate;
forming an n type diffusion layer by:
  removing said resist;
  removing said thin oxide film on said sidewall of said silicon column, and oxidize said sidewall of said silicon column and said polysilicon of said gate to form an oxide film for the purpose of preventing the ion channeling during the ion implantation; and
  implanting the phosphorus, to thereby form said n type diffusion layer;
forming a p+ type diffusion layer by:
  removing said nitride film;
  depositing, planarizing and etching back an oxide film to form an oxide film layer;
  performing oxidation to form an oxide film for the purpose of preventing the ion channeling during the ion implantation; and
  implanting boron and performing a thermal process, to thereby form the p+ type diffusion layer; and
forming a pixel selection line by:
  removing said oxide film;
  depositing, planarizing and etching back metal;
  forming a resist for said pixel selection line; and
  etching said metal, to thereby form said pixel selection line.

33. A method for fabricating a solid-state imaging device in accordance with claim 18, said method characterized in further comprising the steps of:
forming a signal line by:
  forming a p type silicon over an oxide film, and depositing a nitride film and then a silicon oxide film over said p type silicon;
  forming a resist, performing oxide film etching and then nitride film etching and removing said resist to thereby form an oxide film mask and a nitride film mask for forming said signal line; and
  etching said p type silicon, to thereby form said signal line;
forming an island shaped semiconductor by:
  forming a resist for forming said island shaped semiconductor;
  etching said oxide film and said nitride film;
  removing said resist; and
  etching said p type silicon, to thereby form said island shaped semiconductor;
further processing by:
  depositing an oxide film, planarizing and performing etch back on said oxide film;
  performing oxidation to form an oxide film;
  depositing polysilicon and etching back the polysilicon to be left in a sidewall configuration for serving as a mask in an ion implantation;

forming a signal line and an n+ type diffusion layer by:
  removing said oxide film to expose a site for phosphorus to be implanted;
  forming an oxide film for the purpose of preventing ion channeling during the ion implantation; and
  ion-implanting the phosphorus and performing a thermal process, to thereby form said signal line and said n+ diffusion layer;
forming a gate by:
  removing the polysilicon and the oxide film:
  depositing, planarizing and etching back an oxide film to form an oxide layer;
  performing gate oxidation to form a gate oxide film, depositing polysilicon and performing planarization and etch back; and
  forming a resist for said gate; and
  etching said polysilicon, to thereby form said gate;
forming an n type diffusion layer by:
  removing said resist;
  removing said thin oxide film on said sidewall of said silicon column, and oxidize said sidewall of said silicon column and said polysilicon of said gate to form an oxide film for the purpose of preventing the ion channeling during the ion implantation; and
  implanting the phosphorus, to thereby form said n type diffusion layer;
forming a p+ type diffusion layer by:
  removing said nitride film;
  depositing, planarizing and etching back an oxide film to form an oxide film layer;
  performing oxidation to form an oxide film for the purpose of preventing the ion channeling during the ion implantation; and
  implanting boron and performing a thermal process, to thereby form the p+ type diffusion layer; and
forming a pixel selection line by:
  removing said oxide film;
  depositing, planarizing and etching back metal;
  forming a resist for said pixel selection line; and
  etching said metal, to thereby form said pixel selection line.

34. A method for fabricating a solid-state imaging device in accordance with claim 19, said method characterized in further comprising the steps of:
forming a signal line by:
  forming a p type silicon over an oxide film, and depositing a nitride film and then a silicon oxide film over said p type silicon;
  forming a resist, performing oxide film etching and then nitride film etching and removing said resist to thereby form an oxide film mask and a nitride film mask for forming said signal line; and
  etching said p type silicon, to thereby form said signal line;
forming an island shaped semiconductor by:
  forming a resist for forming said island shaped semiconductor;
  etching said oxide film and said nitride film;
  removing said resist; and
  etching said p type silicon, to thereby form said island shaped semiconductor;
further processing by:
  depositing an oxide film, planarizing and performing etch back on said oxide film;
  performing oxidation to form an oxide film;
  depositing polysilicon and etching back the polysilicon to be left in a sidewall configuration for serving as a mask in an ion implantation;
forming a signal line and an n+ type diffusion layer by:
  removing said oxide film to expose a site for phosphorus to be implanted;
  forming an oxide film for the purpose of preventing ion channeling during the ion implantation; and
  ion-implanting the phosphorus and performing a thermal process, to thereby form said signal line and said n+ diffusion layer;
forming a gate by:
  removing the polysilicon and the oxide film:
  depositing, planarizing and etching back an oxide film to form an oxide layer;
  performing gate oxidation to form a gate oxide film, depositing polysilicon and performing planarization and etch back; and
  forming a resist for said gate; and
  etching said polysilicon, to thereby form said gate;
forming an n type diffusion layer by:
  removing said resist;
  removing said thin oxide film on said sidewall of said silicon column, and oxidize said sidewall of said silicon column and said polysilicon of said gate to form an oxide film for the purpose of preventing the ion channeling during the ion implantation; and
  implanting the phosphorus, to thereby form said n type diffusion layer;
forming a p+ type diffusion layer by:
  removing said nitride film;
  depositing, planarizing and etching back an oxide film to form an oxide film layer;
  performing oxidation to form an oxide film for the purpose of preventing the ion channeling during the ion implantation; and
  implanting boron and performing a thermal process, to thereby form the p+ type diffusion layer; and
forming a pixel selection line by:
  removing said oxide film;
  depositing, planarizing and etching back metal;
  forming a resist for said pixel selection line; and
  etching said metal, to thereby form said pixel selection line.

35. A method for fabricating a solid-state imaging device in accordance with claim 20, said method characterized in further comprising the steps of:
forming a signal line by:
  forming a p type silicon over an oxide film, and depositing a nitride film and then a silicon oxide film over said p type silicon;
  forming a resist, performing oxide film etching and then nitride film etching and removing said resist to thereby form an oxide film mask and a nitride film mask for forming said signal line; and
  etching said p type silicon, to thereby form said signal line;
forming an island shaped semiconductor by:
  forming a resist for forming said island shaped semiconductor;
  etching said oxide film and said nitride film;
  removing said resist; and
  etching said p type silicon, to thereby form said island shaped semiconductor;
further processing by:
  depositing an oxide film, planarizing and performing etch back on said oxide film;

performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

36. A method for fabricating a solid-state imaging device in accordance with claim 21, said method characterized in further comprising the steps of:
forming a signal line by:
forming a p type silicon over an oxide film, and depositing a nitride film and then a silicon oxide film over said p type silicon;
forming a resist, performing oxide film etching and then nitride film etching and removing said resist to thereby form an oxide film mask and a nitride film mask for forming said signal line; and
etching said p type silicon, to thereby form said signal line;
forming an island shaped semiconductor by:
forming a resist for forming said island shaped semiconductor;
etching said oxide film and said nitride film;
removing said resist; and
etching said p type silicon, to thereby form said island shaped semiconductor;
further processing by:
depositing an oxide film, planarizing and performing etch back on said oxide film;
performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

37. A method for fabricating a solid-state imaging device in accordance with claim 22, said method characterized in further comprising the steps of:
forming a signal line by:
forming a p type silicon over an oxide film, and depositing a nitride film and then a silicon oxide film over said p type silicon;
forming a resist, performing oxide film etching and then nitride film etching and removing said resist to thereby form an oxide film mask and a nitride film mask for forming said signal line; and
etching said p type silicon, to thereby form said signal line;
forming an island shaped semiconductor by:
forming a resist for forming said island shaped semiconductor;
etching said oxide film and said nitride film;
removing said resist; and etching said p type silicon, to thereby form said island shaped semiconductor;
further processing by:
depositing an oxide film, planarizing and performing etch back on said oxide film;
performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

38. A method for fabricating a solid-state imaging device in accordance with claim 23, said method characterized in further comprising the steps of:
forming a signal line by:
forming a p type silicon over an oxide film, and depositing a nitride film and then a silicon oxide film over said p type silicon;
forming a resist, performing oxide film etching and then nitride film etching and removing said resist to thereby form an oxide film mask and a nitride film mask for forming said signal line; and
etching said p type silicon, to thereby form said signal line;
forming an island shaped semiconductor by:
forming a resist for forming said island shaped semiconductor;
etching said oxide film and said nitride film;

removing said resist; and
etching said p type silicon, to thereby form said island shaped semiconductor;
further processing by:
depositing an oxide film, planarizing and performing etch back on said oxide film;
performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

39. A method for fabricating a solid-state imaging device in accordance with claim 24, said method characterized in further comprising the steps of:
forming a signal line by:
forming a p type silicon over an oxide film, and depositing a nitride film and then a silicon oxide film over said p type silicon;
forming a resist, performing oxide film etching and then nitride film etching and removing said resist to thereby form an oxide film mask and a nitride film mask for forming said signal line; and
etching said p type silicon, to thereby form said signal line;
forming an island shaped semiconductor by:
forming a resist for forming said island shaped semiconductor;

etching said oxide film and said nitride film;
removing said resist; and
etching said p type silicon, to thereby form said island shaped semiconductor;
further processing by:
depositing an oxide film, planarizing and performing etch back on said oxide film;
performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

40. A method for fabricating a solid-state imaging device in accordance with claim 25, said method characterized in further comprising the steps of:
forming a signal line by:
forming a p type silicon over an oxide film, and depositing a nitride film and then a silicon oxide film over said p type silicon;
forming a resist, performing oxide film etching and then nitride film etching and removing said resist to thereby form an oxide film mask and a nitride film mask for forming said signal line; and
etching said p type silicon, to thereby form said signal line;
forming an island shaped semiconductor by:
forming a resist for forming said island shaped semiconductor;
etching said oxide film and said nitride film;
removing said resist; and
etching said p type silicon, to thereby form said island shaped semiconductor;
further processing by:
depositing an oxide film, planarizing and performing etch back on said oxide film;
performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

41. A method for fabricating a solid-state imaging device in accordance with claim 26, said method characterized in further comprising the steps of:
forming a signal line by:
forming a p type silicon over an oxide film, and depositing a nitride film and then a silicon oxide film over said p type silicon;
forming a resist, performing oxide film etching and then nitride film etching and removing said resist to thereby form an oxide film mask and a nitride film mask for forming said signal line; and etching said p type silicon, to thereby form said signal line;
forming an island shaped semiconductor by:
  forming a resist for forming said island shaped semiconductor;
  etching said oxide film and said nitride film;
  removing said resist; and
  etching said p type silicon, to thereby form said island shaped semiconductor;
further processing by:
  depositing an oxide film, planarizing and performing etch back on said oxide film;
  performing oxidation to form an oxide film;
  depositing polysilicon and etching back the polysilicon to be left in a sidewall configuration for serving as a mask in an ion implantation;
forming a signal line and an n+ type diffusion layer by:
  removing said oxide film to expose a site for phosphorus to be implanted;
  forming an oxide film for the purpose of preventing ion channeling during the ion implantation; and
  ion-implanting the phosphorus and performing a thermal process, to thereby form said signal line and said n+ diffusion layer;
forming a gate by:
  removing the polysilicon and the oxide film:
  depositing, planarizing and etching back an oxide film to form an oxide layer;
  performing gate oxidation to form a gate oxide film, depositing polysilicon and performing planarization and etch back; and
  forming a resist for said gate; and
  etching said polysilicon, to thereby form said gate;
forming an n type diffusion layer by:
  removing said resist;
  removing said thin oxide film on said sidewall of said silicon column, and oxidize said sidewall of said silicon column and said polysilicon of said gate to form an oxide film for the purpose of preventing the ion channeling during the ion implantation; and
  implanting the phosphorus, to thereby form said n type diffusion layer;
forming a p+ type diffusion layer by:
  removing said nitride film;
  depositing, planarizing and etching back an oxide film to form an oxide film layer;
  performing oxidation to form an oxide film for the purpose of preventing the ion channeling during the ion implantation; and
  implanting boron and performing a thermal process, to thereby form the p+ type diffusion layer; and
forming a pixel selection line by:
  removing said oxide film;
  depositing, planarizing and etching back metal;
  forming a resist for said pixel selection line; and
  etching said metal, to thereby form said pixel selection line.

42. A method for fabricating a solid-state imaging device in accordance with claim 27, said method characterized in further comprising the steps of:
forming a signal line by:
  forming a p type silicon over an oxide film, and depositing a nitride film and then a silicon oxide film over said p type silicon;
  forming a resist, performing oxide film etching and then nitride film etching and removing said resist to thereby form an oxide film mask and a nitride film mask for forming said signal line; and
  etching said p type silicon, to thereby form said signal line;
forming an island shaped semiconductor by:
  forming a resist for forming said island shaped semiconductor;
  etching said oxide film and said nitride film;
  removing said resist; and
  etching said p type silicon, to thereby form said island shaped semiconductor;
further processing by:
  depositing an oxide film, planarizing and performing etch back on said oxide film;
  performing oxidation to form an oxide film;
  depositing polysilicon and etching back the polysilicon to be left in a sidewall configuration for serving as a mask in an ion implantation;
forming a signal line and an n+ type diffusion layer by:
  removing said oxide film to expose a site for phosphorus to be implanted;
  forming an oxide film for the purpose of preventing ion channeling during the ion implantation; and
  ion-implanting the phosphorus and performing a thermal process, to thereby form said signal line and said n+ diffusion layer;
forming a gate by:
  removing the polysilicon and the oxide film:
  depositing, planarizing and etching back an oxide film to form an oxide layer;
  performing gate oxidation to form a gate oxide film, depositing polysilicon and performing planarization and etch back; and
  forming a resist for said gate; and
  etching said polysilicon, to thereby form said gate;
forming an n type diffusion layer by:
  removing said resist;
  removing said thin oxide film on said sidewall of said silicon column, and oxidize said sidewall of said silicon column and said polysilicon of said gate to form an oxide film for the purpose of preventing the ion channeling during the ion implantation; and
  implanting the phosphorus, to thereby form said n type diffusion layer;
forming a p+ type diffusion layer by:
  removing said nitride film;
  depositing, planarizing and etching back an oxide film to form an oxide film layer;
  performing oxidation to form an oxide film for the purpose of preventing the ion channeling during the ion implantation; and
  implanting boron and performing a thermal process, to thereby form the p+ type diffusion layer; and
forming a pixel selection line by:
  removing said oxide film;
  depositing, planarizing and etching back metal;
  forming a resist for said pixel selection line; and
  etching said metal, to thereby form said pixel selection line.

43. A method for fabricating a solid-state imaging device in accordance with claim 28, said method characterized in further comprising the steps of:
forming a signal line by:
  forming a p type silicon over an oxide film, and depositing a nitride film and then a silicon oxide film over said p type silicon;

forming a resist, performing oxide film etching and then nitride film etching and removing said resist to thereby form an oxide film mask and a nitride film mask for forming said signal line; and
etching said p type silicon, to thereby form said signal line;
forming an island shaped semiconductor by:
forming a resist for forming said island shaped semiconductor;
etching said oxide film and said nitride film;
removing said resist; and
etching said p type silicon, to thereby form said island shaped semiconductor;
further processing by:
depositing an oxide film, planarizing and performing etch back on said oxide film;
performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

44. A method for fabricating a solid-state imaging device in accordance with claim 29, said method characterized in further comprising the steps of:

forming a signal line by:
forming a p type silicon over an oxide film, and depositing a nitride film and then a silicon oxide film over said p type silicon;
forming a resist, performing oxide film etching and then nitride film etching and removing said resist to thereby form an oxide film mask and a nitride film mask for forming said signal line; and
etching said p type silicon, to thereby form said signal line;
forming an island shaped semiconductor by:
forming a resist for forming said island shaped semiconductor;
etching said oxide film and said nitride film;
removing said resist; and
etching said p type silicon, to thereby form said island shaped semiconductor;
further processing by:
depositing an oxide film, planarizing and performing etch back on said oxide film;
performing oxidation to form an oxide film;
depositing polysilicon and etching back the polysilicon to be left in a sidewall configuration for serving as a mask in an ion implantation;
forming a signal line and an n+ type diffusion layer by:
removing said oxide film to expose a site for phosphorus to be implanted;
forming an oxide film for the purpose of preventing ion channeling during the ion implantation; and
ion-implanting the phosphorus and performing a thermal process, to thereby form said signal line and said n+ diffusion layer;
forming a gate by:
removing the polysilicon and the oxide film:
depositing, planarizing and etching back an oxide film to form an oxide layer;
performing gate oxidation to form a gate oxide film, depositing polysilicon and performing planarization and etch back; and
forming a resist for said gate; and
etching said polysilicon, to thereby form said gate;
forming an n type diffusion layer by:
removing said resist;
removing said thin oxide film on said sidewall of said silicon column, and oxidize said sidewall of said silicon column and said polysilicon of said gate to form an oxide film for the purpose of preventing the ion channeling during the ion implantation; and
implanting the phosphorus, to thereby form said n type diffusion layer;
forming a p+ type diffusion layer by:
removing said nitride film;
depositing, planarizing and etching back an oxide film to form an oxide film layer;
performing oxidation to form an oxide film for the purpose of preventing the ion channeling during the ion implantation; and
implanting boron and performing a thermal process, to thereby form the p+ type diffusion layer; and
forming a pixel selection line by:
removing said oxide film;
depositing, planarizing and etching back metal;
forming a resist for said pixel selection line; and
etching said metal, to thereby form said pixel selection line.

45. A method for fabricating a solid-state imaging device in accordance with claim 30, said method characterized in further comprising the steps of:

forming a signal line by:
- forming a p type silicon over an oxide film, and depositing a nitride film and then a silicon oxide film over said p type silicon;
- forming a resist, performing oxide film etching and then nitride film etching and removing said resist to thereby form an oxide film mask and a nitride film mask for forming said signal line; and
- etching said p type silicon, to thereby form said signal line;

forming an island shaped semiconductor by:
- forming a resist for forming said island shaped semiconductor;
- etching said oxide film and said nitride film;
- removing said resist; and
- etching said p type silicon, to thereby form said island shaped semiconductor;

further processing by:
- depositing an oxide film, planarizing and performing etch back on said oxide film;
- performing oxidation to form an oxide film;
- depositing polysilicon and etching back the polysilicon to be left in a sidewall configuration for serving as a mask in an ion implantation;

forming a signal line and an n+ type diffusion layer by:
- removing said oxide film to expose a site for phosphorus to be implanted;
- forming an oxide film for the purpose of preventing ion channeling during the ion implantation; and
- ion-implanting the phosphorus and performing a thermal process, to thereby form said signal line and said n+ diffusion layer;

forming a gate by:
- removing the polysilicon and the oxide film:
- depositing, planarizing and etching back an oxide film to form an oxide layer;
- performing gate oxidation to form a gate oxide film, depositing polysilicon and performing planarization and etch back; and
- forming a resist for said gate; and
- etching said polysilicon, to thereby form said gate;

forming an n type diffusion layer by:
- removing said resist;
- removing said thin oxide film on said sidewall of said silicon column, and oxidize said sidewall of said silicon column and said polysilicon of said gate to form an oxide film for the purpose of preventing the ion channeling during the ion implantation; and
- implanting the phosphorus, to thereby form said n type diffusion layer;

forming a p+ type diffusion layer by:
- removing said nitride film;
- depositing, planarizing and etching back an oxide film to form an oxide film layer;
- performing oxidation to form an oxide film for the purpose of preventing the ion channeling during the ion implantation; and
- implanting boron and performing a thermal process, to thereby form the p+ type diffusion layer; and forming a pixel selection line by:
- removing said oxide film;
- depositing, planarizing and etching back metal;
- forming a resist for said pixel selection line; and
- etching said metal, to thereby form said pixel selection line.

46. A solid-state imaging device in a solid-state imaging device unit in accordance with claim 1, in which
a part of said second semiconductor layer has a circular column configuration and said gate surrounds an outer perimeter of said part of said second semiconductor layer via said insulating film.

47. A solid-state imaging device in a solid-state imaging device unit in accordance with claim 46, in which
the remaining part of said second semiconductor layer has a circular column configuration and said third semiconductor layer surround an outer perimeter of said remaining part of said second semiconductor layer.

* * * * *